(12) United States Patent
Shinohara et al.

(10) Patent No.: US 9,184,768 B2
(45) Date of Patent: Nov. 10, 2015

(54) DATA-PROCESSING DEVICE AND DATA-PROCESSING METHOD

(75) Inventors: Yuji Shinohara, Kanagawa (JP); Makiko Yamamoto, Tokyo (JP)

(73) Assignee: SONY CORPORATION, Tokyo (JP)

( * ) Notice: Subject to any disclaimer, the term of this patent is extended or adjusted under 35 U.S.C. 154(b) by 99 days.

(21) Appl. No.: 13/997,853

(22) PCT Filed: Jan. 12, 2012

(86) PCT No.: PCT/JP2012/050462
§ 371 (c)(1),
(2), (4) Date: Jun. 25, 2013

(87) PCT Pub. No.: WO2012/098983
PCT Pub. Date: Jul. 26, 2012

(65) Prior Publication Data
US 2013/0305113 A1 Nov. 14, 2013

(30) Foreign Application Priority Data
Jan. 19, 2011 (JP) ................................. 2011-008753

(51) Int. Cl.
*H03M 13/00* (2006.01)
*H03M 13/11* (2006.01)
(Continued)

(52) U.S. Cl.
CPC ........ *H03M 13/1148* (2013.01); *H03M 13/036* (2013.01); *H03M 13/1165* (2013.01); *H03M 13/255* (2013.01); *H03M 13/271* (2013.01); *H03M 13/2707* (2013.01); *H03M 13/2906* (2013.01); *H03M 13/356* (2013.01); *H03M 13/6552* (2013.01); *H04L 1/0041* (2013.01); *H04L 1/0045* (2013.01);
(Continued)

(58) Field of Classification Search
CPC ............ H03M 13/13; H03M 13/1148; H03M 13/1165; H03M 13/152; H03M 13/2707; H03M 13/358
See application file for complete search history.

(56) References Cited

U.S. PATENT DOCUMENTS

2004/0174939 A1* 9/2004 Wang ............................. 375/316
2007/0033510 A1* 2/2007 Xu ................................ 714/796
(Continued)

FOREIGN PATENT DOCUMENTS

EP 2 214 318 A1 8/2010
EP 2 675 068 A1 12/2013
(Continued)

OTHER PUBLICATIONS

U.S. Appl. No. 14/111,045, filed Oct. 10, 2013, Shinohara, et al.
(Continued)

*Primary Examiner* — M. Mujtaba K Chaudry
(74) *Attorney, Agent, or Firm* — Oblon, McClelland, Maier & Neustadt, L.L.P.

(57) ABSTRACT

When an LDPC code having a code length of 16200 bits is mapped to 16 signal points, a demultiplexer performs exchanging such that when a (#i+1)-th bit from a most significant bit of code bits of 4×2 bits and a (#i+1)-th bit from a most significant bit of symbol bits of 4×2 bits of 2 consecutive symbols are represented by a bit b#i and a bit y#i, respectively, for an LDPC codes having coding rates of 7/15, b0 is allocated to y0, b1 is allocated to y2, b2 is allocated to y6, b3 is allocated to y3, b4 is allocated to y4, b5 is allocated to y1, b6 is allocated to y5, and b7 is allocated to y7.

10 Claims, 114 Drawing Sheets

(51) Int. Cl.
*H04L 1/00* (2006.01)
*H03M 13/03* (2006.01)
*H03M 13/25* (2006.01)
*H03M 13/27* (2006.01)
*H03M 13/29* (2006.01)
*H03M 13/35* (2006.01)
*H03M 13/15* (2006.01)
*H04L 27/34* (2006.01)

(52) U.S. Cl.
CPC ........... *H04L 1/0057* (2013.01); *H04L 1/0058* (2013.01); *H03M 13/152* (2013.01); *H04L 27/34* (2013.01)

(56) References Cited

U.S. PATENT DOCUMENTS

| | | | |
|---|---|---|---|
| 2008/0002581 A1* | 1/2008 | Gorsetman et al. | 370/232 |
| 2009/0217130 A1* | 8/2009 | Myung et al. | 714/752 |
| 2009/0282320 A1* | 11/2009 | Liao et al. | 714/784 |
| 2010/0122143 A1* | 5/2010 | Lee et al. | 714/752 |
| 2010/0275100 A1 | 10/2010 | Yokokawa et al. | |
| 2010/0299572 A1 | 11/2010 | Yokokawa et al. | |
| 2010/0325512 A1* | 12/2010 | Yokokawa et al. | 714/752 |
| 2011/0047435 A1* | 2/2011 | Eroz et al. | 714/755 |
| 2011/0138262 A1* | 6/2011 | Myung et al. | 714/806 |
| 2011/0202820 A1* | 8/2011 | Eroz et al. | 714/782 |
| 2013/0166992 A1 | 6/2013 | Shinohara et al. | |
| 2013/0227378 A1 | 8/2013 | Yamamoto et al. | |
| 2013/0311850 A1 | 11/2013 | Shinohara et al. | |

FOREIGN PATENT DOCUMENTS

| | | |
|---|---|---|
| WO | WO 2009/104319 A1 | 8/2009 |
| WO | WO 2009/107990 A2 | 9/2009 |
| WO | WO 2009/116204 A1 | 9/2009 |

OTHER PUBLICATIONS

U.S. Appl. No. 14/112,972, filed Oct. 21, 2013, Shinohara, et al.
Extended European Search Report issued Jun. 10, 2014 in Patent Application No. 12736675.5.
Makiko Kan, "Updated Data for New 16k LDPC Codes", Digital Video Broadcasting, XP-017834323, Feb. 16, 2011, p. 1-6.
"Digital Video Broadcasting (DVB); Frame Structure Channel Coding and Modulation for a Second Generation Digital Terrestrial Television Broadcasting System (DVB-T2)", DVB Bluebook A122, XP-055075830, Jun. 1, 2010, p. 1-179.
Makiko Kan, "New 16k LDPC Codes for DVB-NGH", New 16k LDPC Codes for DVB-NGH, DVB, XP-008142457, Dec. 12, 2010, p. 1-27.
U.S. Appl. No. 14/386,830, filed Sep. 22, 2014, Shinohara, et al.
U.S. Appl. No. 14/386,868, filed Sep. 22, 2014, Shinohara, et al.
"ETSI EN 302 307, Digital Video Broadcasting", European Broadcasting Union, vol. 1.1.2, Jun. 2006, pp. 1-74.
U.S. Appl. No. 13/818,709, filed Jun. 7, 2013, Shinohara, et al.
U.S. Appl. No. 13/996,108, filed Jun. 20, 2013, Yamamoto, et al.
U.S. Appl. No. 13/997,695, filed Jun. 25, 2013, Shinohara, et al.
U.S. Appl. No. 14/412,718, filed Jan. 5, 2015, Shinohara, et al.

\* cited by examiner

FIG. 3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

CHECK NODE

VARIABLE NODE

PARITY MATRIX $H_T$

FIG. 13

| Nominal CODING RATE | N=64800 | | | | | N=16200 | | | | |
|---|---|---|---|---|---|---|---|---|---|---|
| | X | KX | K3 | M | | X | KX | K3 | M | |
| 1/4 | 12 | 5400 | 10800 | 48600 | | 12 | 1440 | 1800 | 12960 | |
| 1/3 | 12 | 7200 | 14400 | 43200 | | 12 | 1800 | 3600 | 10800 | |
| 2/5 | 12 | 8640 | 17280 | 38880 | | 12 | 2160 | 4320 | 9720 | |
| 1/2 | 8 | 12960 | 19440 | 32400 | | 8 | 1800 | 5400 | 9000 | |
| 3/5 | 12 | 12960 | 25920 | 25920 | | 12 | 3240 | 6480 | 6480 | |
| 2/3 | 13 | 4320 | 38880 | 21600 | | 13 | 1080 | 9720 | 5400 | |
| 3/4 | 12 | 5400 | 43200 | 16200 | | 12 | 360 | 11520 | 4320 | |
| 4/5 | 11 | 6480 | 45360 | 12960 | | — | 0 | 12600 | 3600 | |
| 5/6 | 13 | 5400 | 48600 | 10800 | | 13 | 360 | 12960 | 2880 | |
| 8/9 | 4 | 7200 | 50400 | 7200 | | 4 | 1800 | 12600 | 1800 | |
| 9/10 | 4 | 6480 | 51840 | 6480 | | — | — | — | — | |

COLUMN NUMBERS OF COLUMN WEIGHTS

FIG. 25

| NECESSARY MEMORY COLUMN NUMBER mb | b=1 (FIRST TO THIRD EXCHANGE METHODS) | b=2 (FOURTH EXCHANGE METHOD) | WRITE START POSITIONS OF mb COLUMNS | | | | | | | | | | | | | | | | | | | | | | |
|---|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 7 | 15 | 16 | 20 | 22 | 22 | 27 | 27 | 28 | 32 | | | | | | | | |
| 20 | | 1024QAM | 0 | 1 | 3 | 4 | 5 | 6 | 6 | 9 | 13 | 14 | 14 | 16 | 21 | 21 | 23 | 25 | 25 | 26 | 28 | 30 | | | | |
| 24 | | 4096QAM | 0 | 5 | 8 | 8 | 8 | 10 | 10 | 10 | 10 | 12 | 13 | 16 | 17 | 19 | 22 | 23 | 26 | 26 | 37 | 39 | 40 | 41 | 41 | 41 |

FIG. 26

| NECESSARY MEMORY COLUMN NUMBER mb | b=1 (FIRST TO THIRD EXCHANGE METHODS) | b=2 (FOURTH EXCHANGE METHOD) | WRITE START POSITIONS OF mb COLUMNS | | | | | | | | | | | | | | | | | | | | | | |
|---|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | QPSK | 0 | 0 | | | | | | | | | | | | | | | | | | | | | | |
| 4 | 16QAM | QPSK | 0 | 2 | 3 | 3 | | | | | | | | | | | | | | | | | | | | |
| 6 | 64QAM | | 0 | 0 | 2 | 3 | 7 | 7 | | | | | | | | | | | | | | | | | | |
| 8 | 256QAM | 16QAM | 0 | 0 | 0 | 1 | 7 | 20 | 20 | 21 | | | | | | | | | | | | | | | | |
| 10 | 1024QAM | | 0 | 1 | 2 | 2 | 3 | 3 | 4 | 4 | 5 | 7 | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | |
| 20 | | 1024QAM | 0 | 0 | 0 | 2 | 2 | 2 | 2 | 2 | 1 | 1 | 2 | 2 | 3 | 5 | 7 | 7 | 7 | 8 | 10 | 10 | | | | |
| 24 | | 4096QAM | 0 | 0 | 0 | 0 | 0 | 0 | 0 | 1 | 1 | 1 | 2 | 2 | 3 | 5 | 7 | 7 | 9 | 9 | 10 | 10 | 10 | 10 | 10 | 11 |

FIG. 28

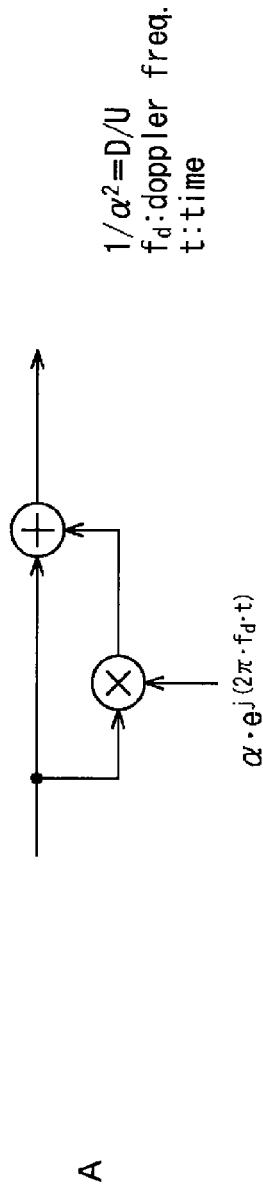

EQUIVALENT REDUCTION MODEL OF Flutter $1/\alpha^2 = D/U$
$f_d$: doppler freq.
$t$: time $\alpha \cdot e^{j(2\pi \cdot f_d \cdot t)}$

A simulation WAS PERFORMED IN MODEL IN WHICH OFDM SYMBOL IS TRANSMITTED THROUGH THIS CHANNEL AND EXTRACTED BY 1 carrier AFTER FFT AT RECEPTION SIDE.

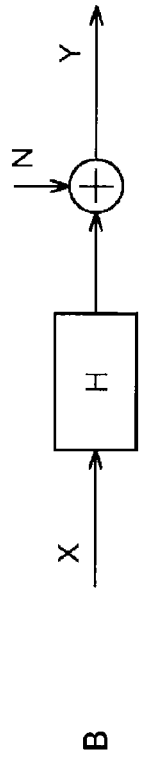

$$Y = \underbrace{\left[1 + \alpha \cdot \exp\left(j2\pi \cdot m \cdot f_d \cdot T_s + j2\pi \cdot \frac{(N_u-1) \cdot f_d \cdot T_u}{N_u}\right) \cdot \frac{\text{sinc}(\pi \cdot f_d \cdot T_u)}{\text{sinc}(\pi \cdot f_d \cdot T_u/N_u)}\right]}_{H} \cdot X + N$$

$$E[N^2] = \alpha^2 \cdot \underbrace{\left\{1 - \left|\frac{\text{sinc}(\pi \cdot f_d \cdot T_u)}{\text{sinc}(\pi \cdot f_d \cdot T_u/N_u)}\right|^2\right\}}_{\text{POWER OF }|C|\text{ : APPROXIMATE BY AWGN}}$$

$m$: symbol number
$T_s$: symbol length (sec)
$T_u$: effective symbol length (sec)
$N_u$: number of OFDM carriers

B

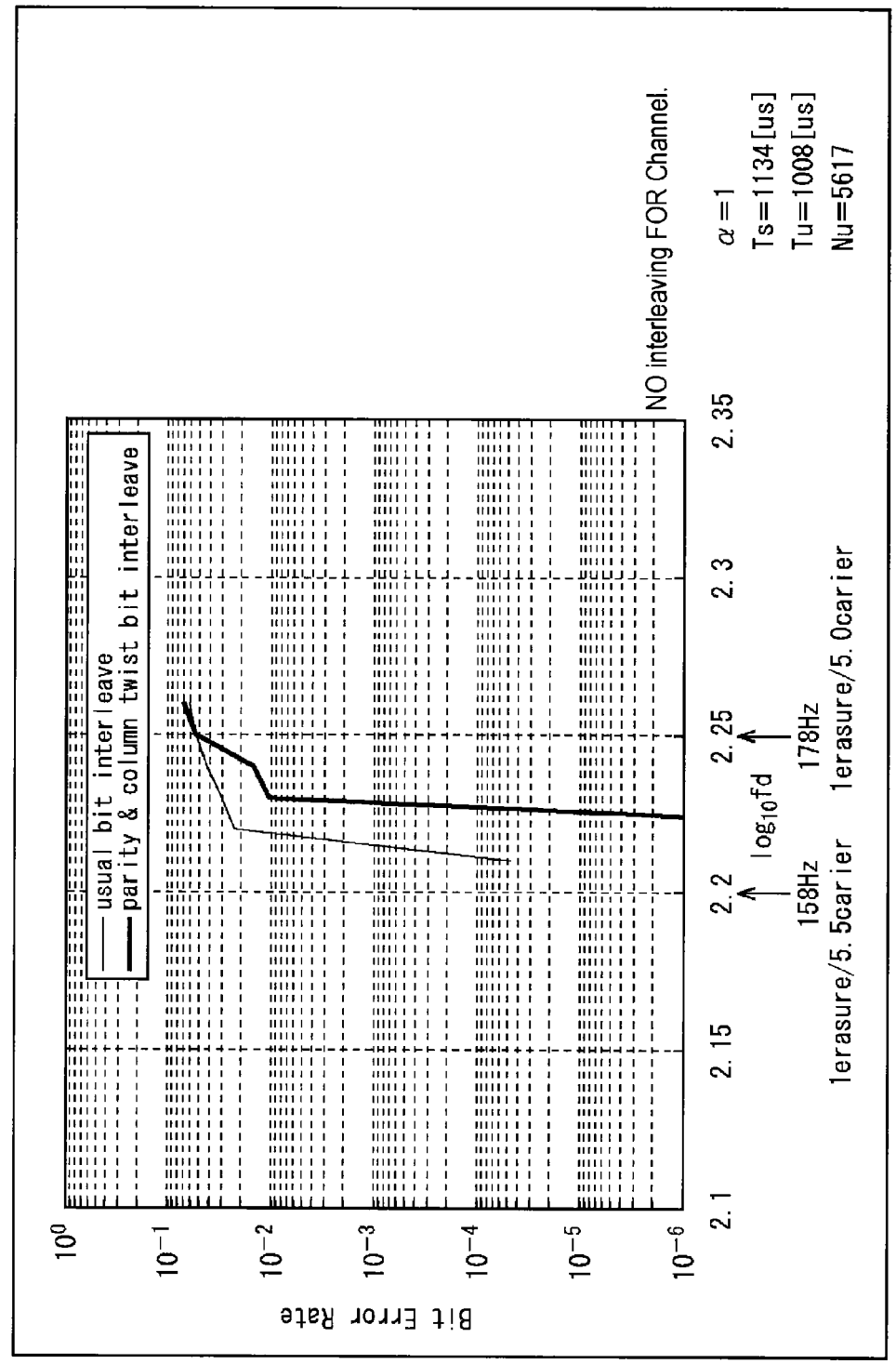

FIG. 34

DISPLAY ROW NUMBER OF PARITY CHECK MATRIX
(INFORMATION MATRIX H$_A$) OF FIRST COLUMN TO 360-TH COLUMN
ROW NUMBER OF PARITY CHECK MATRIX

```
0  2084 1613 1548 1286 1460 3196 4297 2481 3369 3451 4620 2622
1  122  1516 3448 2880 1407 1847 3799 3529 373  971  4358 3108
2  259  3399 929  2650 864  3996 3833 107  5287 164  3125 2350
3  342  3529
4  4198 2147
5  1880 4836
6  3864 4910
7  243  1542
8  3011 1436
9  2167 2512
10 4606 1003
11 2835 705
12 3426 2365
13 3848 2474
14 1360 1743
0  163  2536
1  2583 1180
2  1542 509
3  4418 1005
4  5212 5117
5  2155 2922
6  347  2696
7  226  4296
8  1560 487
9  3926 1640
10 149  2928
11 2364 563
12 635  688
13 231  1684
14 1129 3894
``` h$_{3,5}$

FIRST COLUMN OF H$_A$
361-TH COLUMN OF H$_A$
721-TH COLUMN OF H$_A$
1081-TH COLUMN OF H$_A$

PARITY CHECK MATRIX INITIAL VALUE TABLE

FIG. 35

PARITY CHECK MATRIX INITIAL VALUE TABLE OF N=16200 AND r=1/5

PARITY CHECK MATRIX INITIAL VALUE TABLE OF N=16200 AND r=4/15

PARITY CHECK MATRIX INITIAL VALUE TABLE OF N=16200 AND r=1/3

PARITY CHECK MATRIX INITIAL VALUE TABLE OF N=16200 AND r=2/5

PARITY CHECK MATRIX INITIAL VALUE TABLE OF N=16200 AND r=4/9

PARITY CHECK MATRIX INITIAL VALUE TABLE OF N=16200 AND r=7/15

PARITY CHECK MATRIX INITIAL VALUE TABLE OF N=16200 AND r=8/15

```
PARITY CHECK MATRIX INITIAL VALUE TABLE
OF N=16200 AND r=3/5

```
 PARITY CHECK MATRIX INITIAL VALUE TABLE OF N=16200 AND r=2/3 
76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742
```

| CODING RATE | MINIMUM CYCLE LENGTH | PERFORMANCE THRESHOLD VALUE (Eb/No) |
|---|---|---|
| 1/5 | 8 | 0.15 |
| 4/15 | 8 | −0.21 |
| 1/3 | 6 | −0.01 |
| 2/5 | 6 | 0.01 |
| 4/9 | 6 | 0.17 |
| 7/15 | 6 | 0.36 |
| 8/15 | 6 | 0.64 |
| 3/5 | 8 | 1.00 |
| 2/3 | 6 | 1.35 |

FIG. 48

| rate | X | KX | Y1 | KY1 | Y2 | KY2 | M |
|---|---|---|---|---|---|---|---|
| 1/5 | 36 | 720 | 5 | 360 | 4 | 2160 | 12960 |
| 4/15 | 21 | 1080 | 4 | 2160 | 3 | 1080 | 11880 |
| 1/3 | 30 | 1080 | 4 | 2880 | 3 | 1440 | 10800 |
| 2/5 | 32 | 1080 | 4 | 3240 | 3 | 2160 | 9720 |
| 4/9 | 25 | 1440 | 4 | 1440 | 3 | 4320 | 9000 |
| 7/15 | 24 | 1440 | 4 | 2880 | 3 | 3240 | 8640 |
| 8/15 | 21 | 1800 | 4 | 1800 | 3 | 5040 | 7560 |
| 3/5 | 13 | 2520 | 3 | 7200 | — | 0 | 6480 |
| 2/3 | 18 | 1440 | 4 | 5400 | 3 | 3960 | 5400 |

FIG. 54
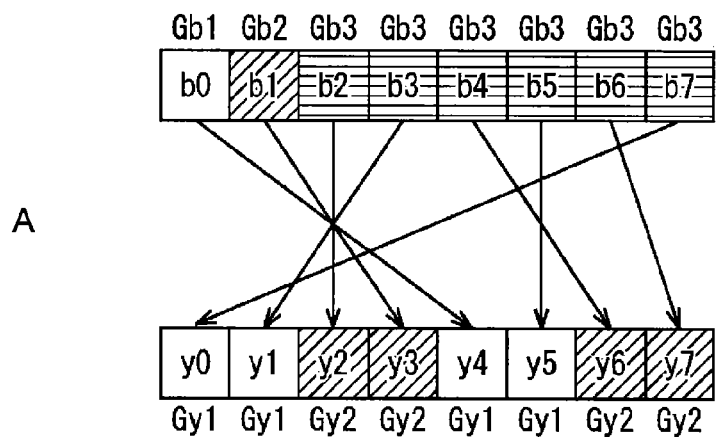
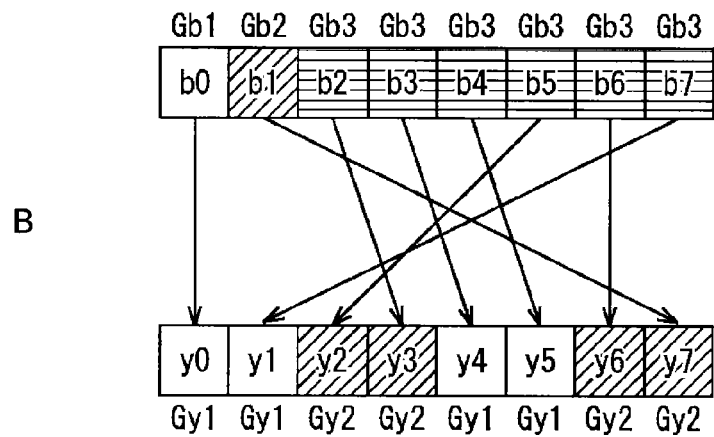

FIG. 63
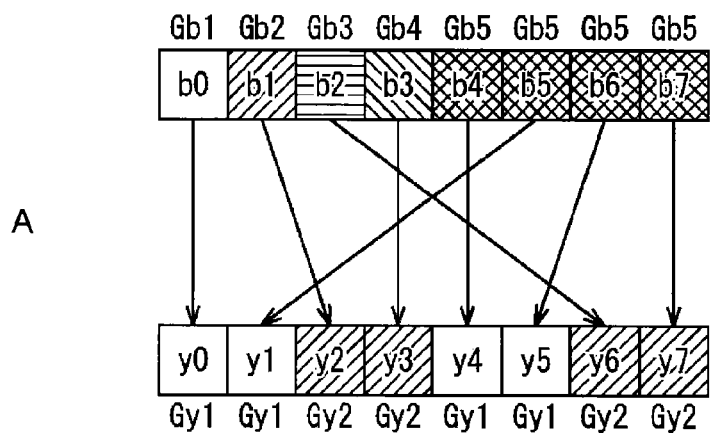
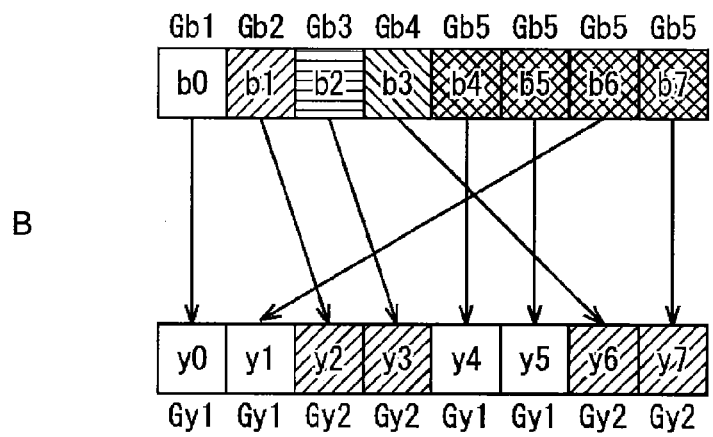

FIG. 78
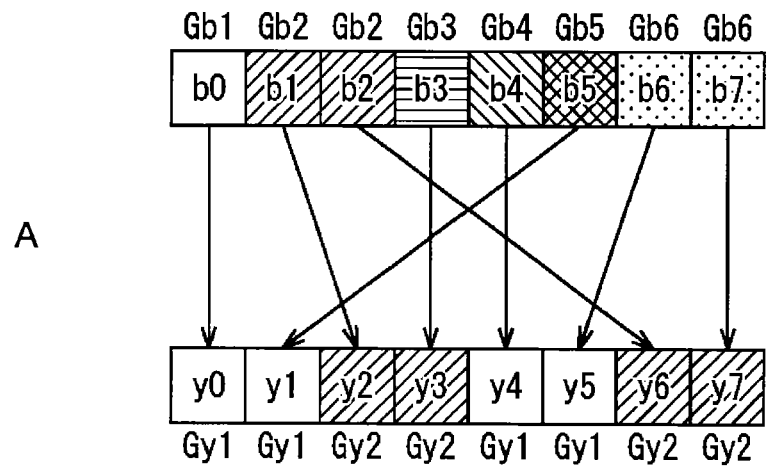
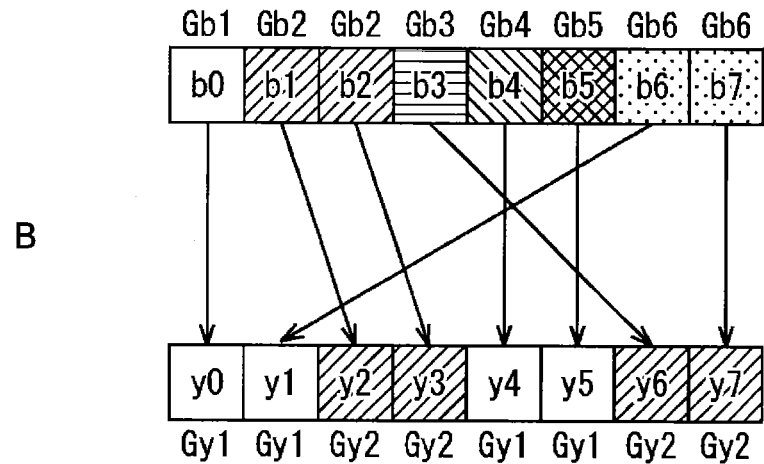

FIG. 79

64QAM r1/5 16k

FIG. 82
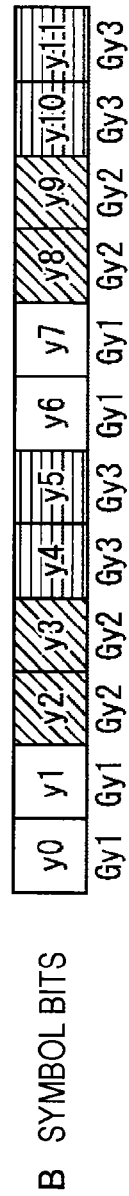

FIG. 85

64QAM r1/3 16k

A CODE BITS

B SYMBOL BITS

FIG. 88
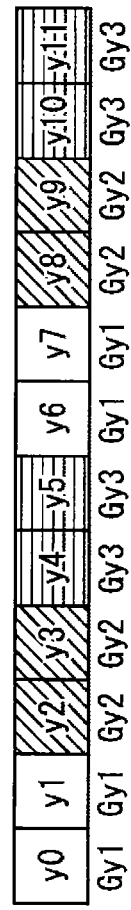

FIG. 94

64QAM r7/15 16k

A CODE BITS

Gb1 Gb2 Gb3 Gb4 Gb5 Gb6 Gb7 Gb7 Gb7 Gb7 Gb7 Gb7
| b0 | b1 | b2 | b3 | b4 | b5 | b6 | b7 | b8 | b9 | b10 | b11 |

B SYMBOL BITS

| y0 | y1 | y2 | y3 | y4 | y5 | y6 | y7 | y8 | y9 | y10 | y11 |
Gy1 Gy1 Gy2 Gy2 Gy3 Gy3 Gy1 Gy1 Gy2 Gy2 Gy3 Gy3

FIG. 97

64QAM r8/15 16k

A CODE BITS

Gb1 Gb2 Gb3 Gb4 Gb4 Gb4 Gb5 Gb6 Gb6 Gb6 Gb6 Gb6
b0 b1 b2 b3 b4 b5 b6 b7 b8 b9 b10 b11

B SYMBOL BITS y0 y1 y2 y3 y4 y5 y6 y7 y8 y9 y10 y11
Gy1 Gy1 Gy2 Gy2 Gy3 Gy3 Gy1 Gy1 Gy2 Gy2 Gy3 Gy3

*FIG. 103*

64QAM r2/3 16k

A CODE BITS

B SYMBOL BITS

FIG. 111

DATA-PROCESSING DEVICE AND DATA-PROCESSING METHOD

TECHNICAL FIELD

The present technology relates to a data-processing device and a data-processing method, and more particularly, to a data-processing device and a data-processing method which are capable of improving tolerance for an error of data.

BACKGROUND ART

An LDPC (Low Density Parity Check) code has a high error correction capability and is recently beginning to be employed in a transmission scheme including satellite digital broadcasting such as DVB (Digital Video Broadcasting)-S.2 conducted in Europe (for example, see Non-Patent Document 1). Further, employing the LDPC code in next generation terrestrial digital broadcasting is under consideration.

Recent studies have revealed that the LDPC code shows performance close to the Shannon limit as a code length increases, similarly to a turbo code or the like. Further, since the LDPC code has a property that a minimum distance is in proportion to a code length, there are advantageous, as features thereof, in that a block error probability characteristic is good, and a so-called error floor phenomenon observed in a decoding characteristic of a turbo code or the like hardly occurs.

The LDPC code will be concretely described below. The LDPC code is a linear code, and need not necessarily be binary, but the LDPC will be here described to be binary.

The most distinctive feature of the LDPC code is that a parity check matrix defining an LDPC code is sparse. Here, the sparse matrix is a matrix in which the number of elements "1s" of a matrix is very small (a matrix in which most of elements are "0").

FIG. 1 illustrates an example of a parity check matrix H of an LDPC code.

In the parity check matrix H of FIG. 1, a weight (a column weight) (the number of "1s") of each column is "3," and a weight (row weight) of each row is "6."

In encoding (LDPC coding) by an LDPC code, a code word (an LDPC code) is generated, for example, by generating a generator matrix G based on the parity check matrix H and multiplying a binary information bit by the generator matrix G.

Specifically, an encoding device performing LDPC coding first calculates the generator matrix G in which a formula $GH^T=0$ is established with a transposed matrix $H^T$ of the parity check matrix H. Here, when the generator matrix G is a K×N matrix, the encoding device multiplies the generator matrix G by a bit string (a vector u) of information bits including K bits, and generates a code word c (=uG) including N bits. The code word (the LDPC code) generated by the encoding device is received at a reception side through a predetermined communication path.

The LDPC code can be decoded by a message passing algorithm that has been proposed as probabilistic decoding by Gallager and is based on belief propagation on the so-called tanner graph including a variable node (which is also called a message node) and a check node. Here, the variable node and the check node are hereinafter appropriately referred to simply as a node.

FIG. 2 illustrates an LDPC code decoding process.

Hereinafter, a real number value (reception LLR) in which a "0" likelihood of a value of an i-th code bit of an LDPC code (one code word) received at a reception side is represented by a log likelihood ratio is also appropriately referred to as a reception value $u_{0i}$. Further, a message output from a check node is represented by $u_j$, and a message output from a variable node is represented by $v_i$.

First of all, in decoding of an LDPC code, as illustrated in FIG. 2, in step S11, an LDPC code is received, a message (check node message) $u_j$ is initialized to "0," a variable k having an integer as a counter of a repeating process is initialize to "0," and the process proceeds to step S12. In step S12, as a calculation (variable node calculation) represented by Formula (1) is performed based on the reception value $u_{0i}$ obtained when the LDPC code is received, a message (variable node message) $v_i$ is obtained, and as a calculation (check node calculation) represented by Formula (2) is performed based on the message $v_i$, a message $u_j$ is obtained.

[Mathematical Formula 1]

$$v_i = u_{0i} + \sum_{i=1}^{d_v-1} u_j \tag{1}$$

[Mathematical Formula 2]

$$\tanh\left(\frac{u_j}{2}\right) = \prod_{i=1}^{d_c-1} \tanh\left(\frac{v_i}{2}\right) \tag{2}$$

Here, in Formulas (1) and (2), $d_v$ and $d_c$ are parameters, which are arbitrarily selectable, representing the number of "1s" of the parity check matrix H in the longitudinal direction (column) and the lateral direction (row), and for example, in case of a (3, 6) code, $d_v$ is 3, and $d_c$ is 6.

In the variable node calculation of Formula (1) and the check node calculation of Formula (2), since a message input from an edge (a line connecting a variable node with a check node) from which a message is desired to be output is not a calculation target, a calculation range is 1 to $d_v-1$ or 1 to $d_c-1$. Further, actually, the check node calculation of Formula (2) is perform by generating a table of a function R ($v_1$, $v_2$) represented by Formula (3) defined by one output to two inputs $v_1$ and $v_2$ in advance and using the table consecutively (recursively) as represented by Formula (4).

[Mathematical Formula 3]

$$x=2\tan h^{-1}[\tan h(v_1/2)\tan h(v_2/2)]=R(v_1,v_2) \tag{3}$$

[Mathematical Formula 4]

$$u_j=R(v_1,R(v_2,R(v_3,\ldots R(v_{d_c-2},v_{d_c-1})))) \tag{4}$$

In step S12, the variable k increases by "1," and the process proceeds to step S13. In step S13, it is determined whether or not the variable k is larger than a predetermined repeated decoding number C. When it is determined in step S13 that the variable k is not larger than C, the process returns to step S12, and the same process is repeated.

Further, when it is determined in step S13 that the variable k is larger than C, the process proceeds to step S14, and the message $v_i$ is obtained and output as a decoding result finally output as a calculation represented by Formula (5) is performed, and then the LDPC code decoding process ends.

[Mathematical Formula 5]

$$v_i = u_{0i} + \sum_{j=1}^{d_v} u_j \quad (5)$$

Here, the calculation of Formula (5) is performed using the message $u_j$ from all edges connected to the variable node, unlike the variable node calculation of Formula (1).

FIG. 3 illustrates an example of the parity check matrix H of a (3, 6) LDPC code (a coding rate is 1/2, and a code length is 12).

In the parity check matrix H of FIG. 3, a weight of a column is 3, and a weigh of a row is 6, similarly to FIG. 1.

FIG. 4 illustrates a tanner graph of the parity check matrix H of FIG. 3.

Here, in FIG. 4, a check node is represented by plus "+," a variable node is represented by equal "=." The check node and the variable node correspond to a row and a column of the parity check matrix H, respectively. A connection line between the check node and the variable node is an edge, and corresponds to an element "1" of the parity check matrix.

In other words, in FIG. 4, when an element of a j-th row and an i-th column of the parity check matrix is "1," an i-th variable node (a node of "=") from the top is connected with a j-th check node (a node of "+") from the top by an edge. The edge represents that a code bit corresponding to a variable node has a constraint condition on a check node.

In a sum product algorithm used as an LDPC code decoding method, the variable node calculation and the check node calculation are repeatedly performed.

FIG. 5 illustrates the variable node calculation performed at the variable node.

In the variable node, a message $v_i$ corresponding to an edge that is desired to be calculated is obtained by the variable node calculation of Formula (1) using messages $u_1$ and $u_2$ from the remaining edges connected to the variable node and the reception value $u_{0i}$. The messages corresponding to the other edges are similarly obtained.

FIG. 6 illustrates the check node calculation performed at the check node.

Here, the check node calculation of Formula (2) may be rewritten to Formula (6) using a relation of a formula $a \times b = \exp\{\ln(|a|) + \ln(|b|)\} \times \text{sign}(a) \times \text{sign}(b)$. Here, $\text{sign}(x)$ is 1 when $x \geq 0$ and $-1$ when $x < 0$.

[Mathematical Formula 6]

$$\begin{aligned}u_j &= 2\tanh^{-1}\left(\prod_{i=1}^{d_c-1} \tanh\left(\frac{v_i}{2}\right)\right) \\&= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right] \\&= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]\end{aligned} \quad (6)$$

In case of $x \geq 0$, when a function $\phi(x)$ is defined as a formula $\phi(x) = \ln(\tan h(x/2))$, since a formula $\phi^{-1}(x) = 2 \tan h^{-1}(e^{-x})$ is established, Formula (6) may be changed to Formula (7).

[Mathematical Formula 7]

$$u_j = \phi^{-1}\left(\sum_{i=1}^{d_c-1} \phi(|v_i|)\right) \times \prod_{i=1}^{d_c-1} \text{sign}(v_i) \quad (7)$$

In the check node, the check node calculation of Formula (2) is performed according to Formula (7).

In other words, in the check node, a message $u_j$ corresponding to an edge that is desired to be calculated is obtained by the check node calculation of Formula (7) using messages $v_1$, $v_2$, $v_3$, $v_4$, and $v_5$ from remaining edges connected to the check node as illustrated FIG. 6. The messages corresponding to the other edges are similarly obtained.

The function $\phi(x)$ of Formula (7) may be represented by a formula $\phi(x) = \ln((e^x+1)/(e^x-1))$, and is $\phi(x) = \phi^{-1}(x)$ when $x > 0$. When the functions $\phi(x)$ and $\phi^{-1}(x)$ are implemented as hardware, an implementation method using an LUT (Look Up Table) may be used, but both become the same LUT.

CITATION LIST

Non-Patent Document

Non-Patent Document 1: DVB-S.2: ETSI EN 302 307 V1.1.2 (2006-06)

SUMMARY OF THE INVENTION

Problems to be Solved by the Invention

The LDPC code is being employed in DVB-S.2 which is a satellite digital broadcasting standard and DVB-T.2 which is a next generation terrestrial digital broadcasting. Further, the LDPC code is planned to be employed in DVB-C.2 which is a next generation CATV (Cable Television) digital broadcasting standard.

In digital broadcasting conforming to the DVB standard such as DVB-S.2, an LDPC code is converted (symbolized) into a symbol of quadrature modulation (digital modulation) such as QPSK (Quadrature Phase Shift Keying), and the symbol is mapped with a signal point and transmitted.

In symbolization of an LDPC code, exchanging of code bits of an LDPC code is performed in code bit units of two or more bits, and an exchanged code bit is regarded as a bit of a symbol.

As a method of exchanging code bits for symbolization of an LDPC code, various methods have been proposed, and for example, it is specified even in DVB-T.2.

Meanwhile, DVB-T.2 is a digital broadcasting standard for fixed terminals such as television receivers installed at home, and may not be appropriate to digital broadcasting for mobile terminals.

In other words, mobile terminals need be smaller in circuit size and lower in power consumption than fixed terminals. Thus, in digital broadcasting for mobile terminals, in order to reduce a load necessary for processing such as decoding of an LDPC code in a mobile terminal, for example, the number of times of decoding of an LDPC code (the repeated decoding number C) or a code length of an LDPC code may be more restricted than in digital broadcasting for fixed terminals.

However, even under the restriction, tolerance for an error needs be maintained to some extent.

The present technology is made in light of the foregoing and directed to improving tolerance for an error of data such as an LDPC code.

Solutions to Problems

A data-processing device/data-processing method according to a first aspect of the present technology includes an encoding unit/step of performing LDPC coding in which a code length is 16200 bits and a coding rate is 7/15 based on a parity check matrix of an LDPC code and an exchange unit/step of exchanging code bits of the LDPC code for symbol bits of a symbol corresponding to one of 16 signal points set in 16QAM, wherein in an exchange process of exchanging code bits of 4×2 bits grouped into 5 code bit groups according to an error probability to be allocated to symbol bits of 4×2 bits grouped into 2 symbol bit groups according to an error probability, the exchange unit/step allocates/includes allocating 1 bit of code bits of a code bit group having the highest error probability to 1 bit of symbol bits of a symbol bit group having the highest error probability, allocates/includes allocating 1 bit of code bits of a code bit group having the second highest error probability to 1 bit of symbol bits of a symbol bit group having the second highest error probability, allocates/includes allocating 1 bit of code bits of a code bit group having the third highest error probability to 1 bit of symbol bits of a symbol bit group having the second highest error probability, allocates/includes allocating 1 bit of code bits of a code bit group having the fourth highest error probability to 1 bit of symbol bits of a symbol bit group having the second highest error probability, allocates/includes allocating 3 bits of code bits of a code bit group having the fifth highest error probability to 3 bits of symbol bits of a symbol bit group having the highest error probability, and allocates/includes allocating 1 bit of code bits of a code bit group having the fifth highest error probability to 1 bit of symbol bits of a symbol bit group having the second highest error probability, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represented for every 360 columns and is formed as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
   56 1955 3000 8242
   1809 4094 7991 8489
   2220 6455 7849 8548
   1006 2576 3247 6976
   2177 6048 7795 8295
   1413 2595 7446 8594
   2101 3714 7541 8531
   10 5961 7484
   3144 4636 5282
   5708 5875 8390
   3322 5223 7975
   197 4653 8283
   598 5393 8624
   906 7249 7542
   1223 2148 8195
   976 2001 5005.

A data-processing device/data-processing method according to a second aspect of the present technology includes an encoding unit/step of performing LDPC coding in which a code length is 16200 bits and a coding rate is 7/15 based on a parity check matrix of an LDPC code and an exchange unit/step of exchanging code bits of the LDPC code for symbol bits of a symbol corresponding to one of 16 signal points set in 16QAM, wherein when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, the exchange unit/step exchanges/includes exchanging a bit b0 for a bit y0, a bit b1 for a bit y2, a bit b2 for a bit y6, a bit b3 for a bit y3, a bit b4 for a bit y4, a bit b5 for a bit y1, a bit b6 for a bit y5, and a bit b7 for a bit y7, respectively, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represented for every 360 columns and is formed as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
   56 1955 3000 8242
   1809 4094 7991 8489
   2220 6455 7849 8548
   1006 2576 3247 6976
   2177 6048 7795 8295
   1413 2595 7446 8594
   2101 3714 7541 8531
   10 5961 7484
   3144 4636 5282
   5708 5875 8390
   3322 5223 7975
   197 4653 8283
   598 5393 8624
   906 7249 7542
   1223 2148 8195
   976 2001 5005.

A data-processing device according to a third aspect of the present technology includes an reverse exchange unit that exchanges symbol bits of a symbol corresponding to one of 16 signal points set in 16QAM for code bits of an LDPC code in which a code length is 16200 bits and a coding rate is 7/15 and a decoding unit that decodes the LDPC code exchanged by the reverse exchange unit based on a parity check matrix of the LDPC code, wherein when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, the reverse exchange unit exchanges a bit y0 for a bit b0, a bit y2 for a bit b1, a bit y6 for a bit b2, a bit y3 for a bit b3, a bit y4 for a bit b4, a bit y1 for a bit b5, a bit y5 for a bit b6, and a bit y7 for a bit b7, respectively, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represented for every 360 columns and is formed as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

In the first aspect of the present technology, LDPC coding in which a code length is 16200 bits and a coding rate is 7/15 is performed based on a parity check matrix of an LDPC code, and code bits of the LDPC code are exchanged for symbol bits of a symbol corresponding to one of 16 signal points set in 16QAM. In the exchanging, an exchange process of exchanging code bits of 4×2 bits grouped into 5 code bit groups according to an error probability to be allocated to symbol bits of 4×2 bits grouped into 2 symbol bit groups according to an error probability is performed, 1 bit of code bits of a code bit group having the highest error probability is allocated to 1 bit of symbol bits of a symbol bit group having the highest error probability, 1 bit of code bits of a code bit group having the second highest error probability is allocated to 1 bit of symbol bits of a symbol bit group having the second highest error probability, 1 bit of code bits of a code bit group having the third highest error probability is allocated to 1 bit of symbol bits of a symbol bit group having the second highest error probability, 1 bit of code bits of a code bit group having the fourth highest error probability is allocated to 1 bit of symbol bits of a symbol bit group having the second highest error probability, 3 bits of code bits of a code bit group having the fifth highest error probability are allocated to 3 bits of symbol bits of a symbol bit group having the highest error probability, and 1 bit of code bits of a code bit group having the fifth highest error probability is allocated to 1 bit of symbol bits of a symbol bit group having the second highest error probability. The LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represented for every 360 columns and is formed as follows:

3 137 314 327 983 1597 2028 3043 3217 4109 6020 6178 6535 6560 7146 7180 7408 7790 7893 8123 8313 8526 8616 8638

356 1197 1208 1839 1903 2712 3088 3537 4091 4301 4919 5068 6025 6195 6324 6378 6686 6829 7558 7745 8042 8382 8587 8602

18 187 1115 1417 1463 2300 2328 3502 3805 4677 4827 5551 5968 6394 6412 6753 7169 7524 7695 7976 8069 8118 8522 8582

714 2713 2726 2964 3055 3220 3334 3459 5557 5765 5841 6290 6419 6573 6856 7786 7937 8156 8286 8327 8384 8448 8539 8559

3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

In the second aspect of the present technology, LDPC coding in which a code length is 16200 bits and a coding rate is 7/15 is performed based on a parity check matrix of an LDPC code, and code bits of the LDPC code are exchanged for symbol bits of a symbol corresponding to one of 16 signal points set in 16QAM. In the exchanging, code bits of 8 bits that are stored in 8 storing units having a storage capacity of 16200/8 bits and each of which is read from each storing unit are allocated to 2 consecutive symbols. Specifically, when a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, a bit b0 is exchanged for y0, a bit b1 is exchanged for bit y2, a bit b2 is exchanged for bit y6, a bit b3 is exchanged for bit y3, a bit b4 is exchanged for bit y4, a bit b5 is exchanged for bit y1, a bit b6 is exchanged for bit y5, and a bit b7 is exchanged for bit y7. The LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represented for every 360 columns and is formed as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
   3452 7935 8092 8623
   56 1955 3000 8242
   1809 4094 7991 8489
   2220 6455 7849 8548
   1006 2576 3247 6976
   2177 6048 7795 8295
   1413 2595 7446 8594
   2101 3714 7541 8531
   10 5961 7484
   3144 4636 5282
   5708 5875 8390
   3322 5223 7975
   197 4653 8283
   598 5393 8624
   906 7249 7542
   1223 2148 8195
   976 2001 5005.

In the data-processing device according to the third aspect of the present technology, symbol bits of a symbol corresponding to one of 16 signal points set in 16QAM are exchanged for code bits of an LDPC code in which a code length is 16200 bits and a coding rate is 7/15, and the exchanged LDPC code is decoded based on a parity check matrix of the LDPC code. In the exchanging, when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, a bit y0 is exchanged for bit b0, a bit y2 is exchanged for bit b1, a bit y6 is exchanged for bit b2, a bit y3 is exchanged for bit b3, a bit y4 is exchanged for bit b4, a bit y1 is exchanged for bit b5, a bit y5 is exchanged for bit b6, and a bit y7 is exchanged for bit b7. The LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represented for every 360 columns and is formed as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
   3452 7935 8092 8623
   56 1955 3000 8242
   1809 4094 7991 8489
   2220 6455 7849 8548
   1006 2576 3247 6976
   2177 6048 7795 8295
   1413 2595 7446 8594
   2101 3714 7541 8531
   10 5961 7484
   3144 4636 5282
   5708 5875 8390
   3322 5223 7975
   197 4653 8283
   598 5393 8624
   906 7249 7542
   1223 2148 8195
   976 2001 5005.

Further, the data-processing device may be an independent device or may be an internal block configuring a single device.

Effects of the Invention

According to the present technology, tolerance for an error can be improved.

BRIEF DESCRIPTION OF DRAWINGS

FIG. 3 is a diagram illustrating an example of a parity check matrix of an LDPC code.
FIG. 13 is a diagram for describing a parity check matrix of an LDPC code specified in a DVB-S.2 standard.

FIG. 25 is a diagram illustrating a column number of a memory 31 necessary for column twist interleaving and an address of a write start position.

FIG. 26 is a diagram illustrating a column number of the memory 31 necessary for column twist interleaving and an address of a write start position.

FIG. 28 is a diagram illustrating a model of a communication path employed in a simulation.

FIG. 29 is a diagram illustrating a relation between an error rate obtained in a simulation and a Doppler frequency $f_d$ of a flutter.

FIG. 34 is a diagram for describing a method of obtaining a parity check matrix H from a parity check matrix initial value table.

FIG. 35 is a diagram illustrating an example of a parity check matrix initial value table in which a coding rate is 1/5 and a code length is 16200.

FIG. 36 is a diagram illustrating an example of a parity check matrix initial value table in which a coding rate is 4/15 and a code length is 16200.

FIG. 37 is a diagram illustrating an example of a parity check matrix initial value table in which a coding rate is 1/3 and a code length is 16200.

FIG. 38 is a diagram illustrating an example of a parity check matrix initial value table in which a coding rate is 2/5 and a code length is 16200.

FIG. 39 is a diagram illustrating an example of a parity check matrix initial value table in which a coding rate is 4/9 and a code length is 16200.

FIG. 40 is a diagram illustrating an example of a parity check matrix initial value table in which a coding rate is 7/15 and a code length is 16200.

FIG. 41 is a diagram illustrating an example of a parity check matrix initial value table in which a coding rate is 8/15 and a code length is 16200.

FIG. 42 is a diagram illustrating an example of a parity check matrix initial value table in which a coding rate is 3/5 and a code length is 16200.

FIG. 43 is a diagram illustrating an example of a parity check matrix initial value table in which a coding rate is 2/3 and a code length is 16200.

FIG. 48 is a diagram for describing a parity check matrix of an LDPC code having a code length of 16200.

FIG. 54 is a diagram illustrating exchanging of code bits according to an allocation rule when an LDPC code having a code length of 16200 and a coding rate of 1/5 is modulated by 16QAM, and a multiple b is 2.

FIG. 63 is a diagram illustrating exchanging of code bits according to an allocation rule when an LDPC code having a code length of 16200 and a coding rate of 2/5 is modulated by 16QAM, and a multiple b is 2.

FIG. 78 is a diagram illustrating exchanging of code bits according to an allocation rule when an LDPC code having a code length of 16200 and a coding rate of 2/3 is modulated by 16QAM, and a multiple b is 2.

FIG. 79 is a diagram illustrating a code bit group and a symbol bit group when an LDPC code having a code length of 16200 and a coding rate of 1/5 is modulated by 64QAM, and a multiple b is 2.

FIG. 82 is a diagram illustrating a code bit group and a symbol bit group when an LDPC code having a code length of 16200 and a coding rate of 4/15 is modulated by 64QAM, and a multiple b is 2.

FIG. 85 is a diagram illustrating a code bit group and a symbol bit group when an LDPC code having a code length of 16200 and a coding rate of 1/3 is modulated by 64QAM, and a multiple b is 2.

FIG. 88 is a diagram illustrating a code bit group and a symbol bit group when an LDPC code having a code length of 16200 and a coding rate of 2/5 is modulated by 64QAM, and a multiple b is 2.

FIG. 94 is a diagram illustrating a code bit group and a symbol bit group when an LDPC code having a code length of 16200 and a coding rate of 7/15 is modulated by 64QAM, and a multiple b is 2.

FIG. 97 is a diagram illustrating a code bit group and a symbol bit group when an LDPC code having a code length of 16200 and a coding rate of 8/15 is modulated by 64QAM, and a multiple b is 2.

FIG. 103 is a diagram illustrating a code bit group and a symbol bit group when an LDPC code having a code length of 16200 and a coding rate of 2/3 is modulated by 64QAM, and a multiple b is 2.

FIG. 111 is a diagram illustrating a conversion parity check matrix divided into 5×5 units.

MODE FOR CARRYING OUT THE INVENTION

[Configuration Example of Transmission System According to Present Technology]

Figure 7:
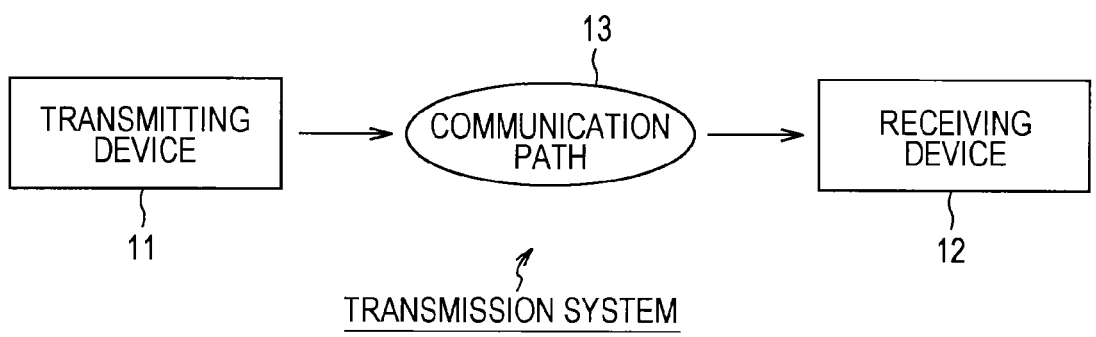
FIG. 7 is a diagram illustrating an example of a configuration of a transmission system according to an embodiment of the present technology.

FIG. 7 illustrates a configuration example of an embodiment of a transmission system (a system refers to one in which a plurality of devices are logically assembled, and it does not matter whether or not devices of respective configurations are present in a single housing) according to the present technology.

Referring to FIG. 7, the transmission system includes a transmitting device 11 and a receiving device 12.

The transmitting device 11 transmits (broadcasts) (sends) a program for a fixed terminal or a mobile terminal. In other words, for example, the transmitting device 11 encodes target data, which is a transmission target, such as image data or audio data serving as a program for a fixed terminal or a mobile terminal into an LDPC code, and transmits the LDPC code, for example, through a communication path 13 which is a ground wave.

For example, the receiving device 12 is a mobile terminal, and receives the LDPC code transmitted from the transmitting device 11 through the communication path 13, decodes the LDPC code into target data, and outputs the decoded target data.

Here, the LDPC code used in the transmission system of FIG. 7 is known to show extremely high capability in an AWGN (Additive White Gaussian Noise) communication path.

However, the communication path 13 such as a ground wave is likely to be subjected to a burst error or an erasure. For example, in an OFDM (Orthogonal Frequency Division Multiplexing) system, in a multi-path environment in which a D/U (Desired to Undesired Ratio) is 0 dB (power of Undesired=echo is equal to power of Desired=main path), power of a specific symbol may become zero (0) (erasure) according to a delay of an echo (a path other than a main path).

Further, even in a flutter (a communication path to which an echo having a Doppler frequency is added with a delay of 0), when the D/U is 0 dB, power of all OFDM symbols of a certain time may become zero (0) (erasure) due to the Doppler frequency.

In addition, a burst error may occur due to a status of an interconnection from a receiving unit (not illustrated) at the receiving device 12 side such as an antenna receiving a signal from the transmitting device 11 to the receiving device 12 or instability of power of the receiving device 12.

Figure 1:
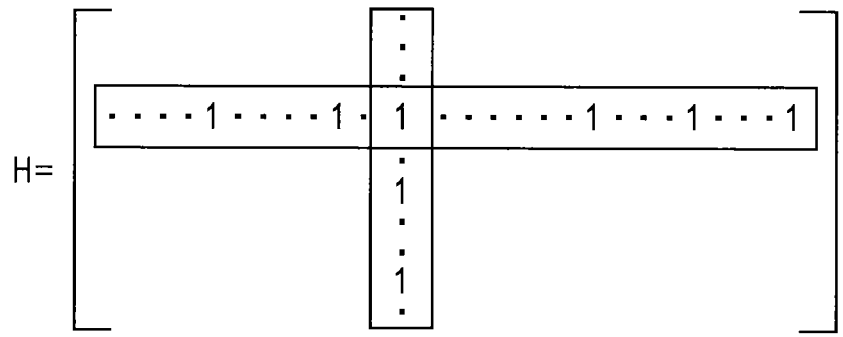
FIG. 1 is a diagram for describing a parity check matrix H of an LDPC code.
Figure 2:
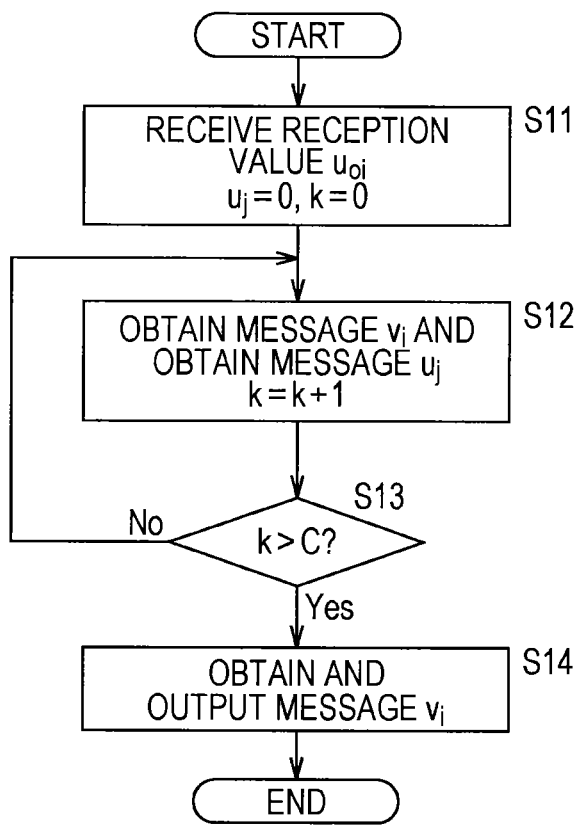
FIG. 2 is a flowchart for describing an LDPC code decoding process.
Figure 4:
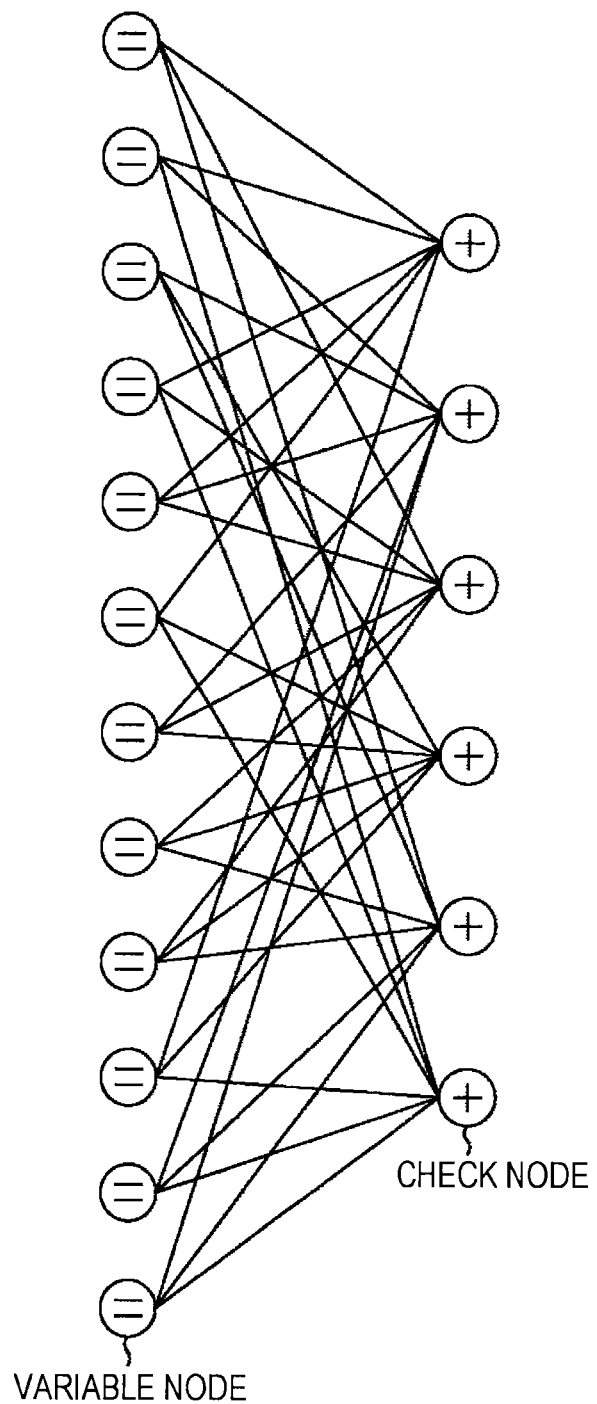
FIG. 4 is a diagram illustrating a tanner graph of a parity check matrix.
Figure 5:
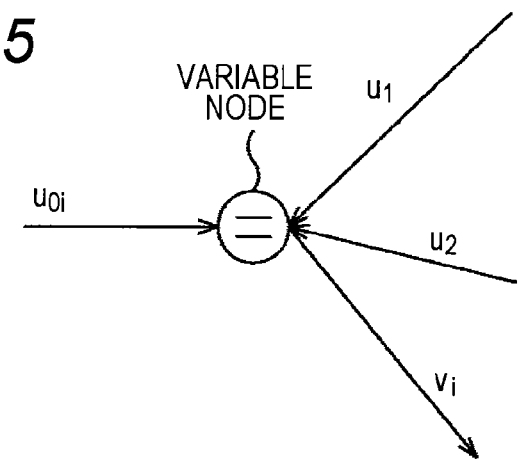
FIG. 5 is a diagram illustrating a variable node.
Figure 6:
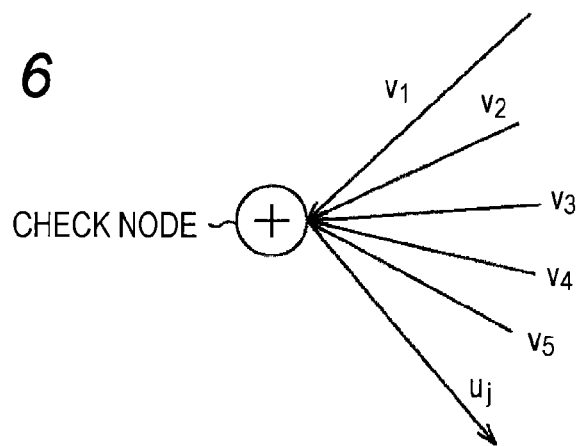
FIG. 6 is a diagram illustrating a check node.

Meanwhile, in decoding of an LDPC code, in a column of a parity check matrix H, that is, in a variable node corresponding to a code bit of an LDPC code, the variable node calculation of Formula (1) is performed with the addition of the code bit (the reception value $u_{0i}$) of the LDPC code as illustrated in FIG. 5, and thus when an error occurs in the code bit used for the variable node calculation, the accuracy of an obtained message decreases.

Further, in LDPC code decoding, in a check node, the check node calculation of Formula (7) is performed using a message obtained by a variable node connected to the check node, and thus when many check nodes are connected to (code bits of an LDPC code corresponding to) a plurality of variable nodes that have an error (includes an erasure) at the same time, decoding performance deteriorates.

In other words, for example, when two or more variable nodes connected to a check node have erasure at the same time, the check node returns a message in which a probability that a valve is 0 is equal to a probability that a value is 1 to all variable nodes. In this case, the check node returning a message of an equal probability does not contribute to a single decoding process (a set of variable node calculation and check node calculation), and as a result, it is necessary to increase a repeat count of the decoding process, and thus decoding performance deteriorates, and power consumption of the receiving device 12 performing LDPC code decoding increases.

In this regard, the transmission system of FIG. 7 is configured to improve tolerance for a burst error or erasure while maintaining performance in the AWGN communication path.

[Configuration Example of Transmitting Device 11]

Figure 8:
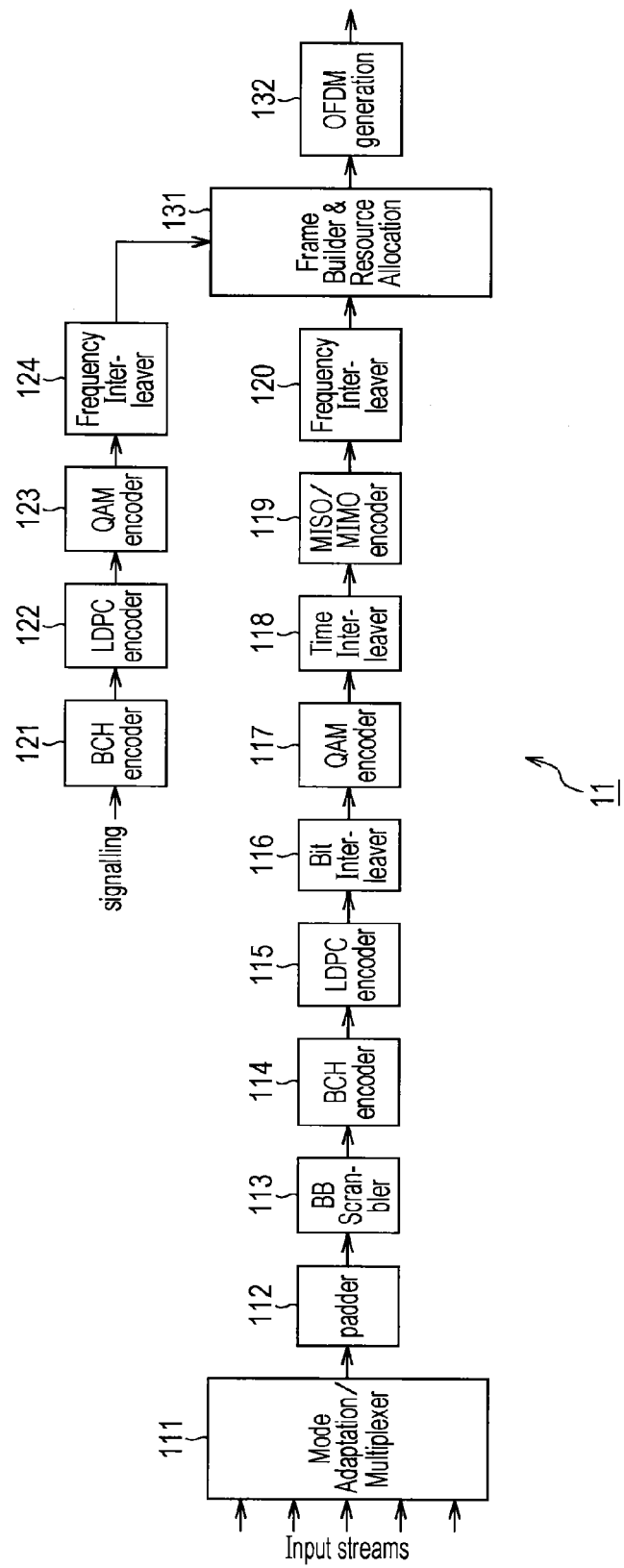
FIG. 8 is a block diagram illustrating a configuration example of a transmitting device 11.

FIG. 8 is a block diagram illustrating a configuration example of the transmitting device 11 of FIG. 7.

In the transmitting device 11, one or more input streams serving as target data are supplied to a mode adaptation/multiplexer 111.

The mode adaptation/multiplexer 111 performs mode selection and multiplexing of one or more input stream supplied thereto, and supplies the resultant data to a padder 112.

The padder 112 performs necessary zero padding (null insertion) on the data from the mode adaptation/multiplexer 111, and supplies the resultant data to a BB scrambler 113.

The BB scrambler 113 executes an energy diffusion process on the data from the padder 112, and supplies the resultant data to a BCH encoder 114.

The BCH encoder 114 performs BCH coding on the data from the BB scrambler 113, and supplies the resultant data to an LDPC encoder 115 as LDPC target data that is an LDPC coding target.

The LDPC encoder 115 performs LDPC coding according to a parity check matrix in which a parity matrix corresponding to a parity bit of an LDPC code has a staircase structure on the LDPC target data from the BCH encoder 114, and outputs an LDPC code having the LDPC target data as an information bit.

In other words, the LDPC encoder 115 performs LDPC coding of encoding the LDPC target data to an LDPC code such as an LDPC code specified in, for example, the DVB-T.2 standard, and outputs the resultant LDPC code.

Here, in the DVB-T.2 standard, an LDPC code specified in the DVB-S.2 standard is employed except when a code length is 16200 bits and a coding rate is 3/5 . An LDPC code is specified in the DVB-T.2 standard is an IRA (Irregular Repeat Accumulate) code, and a parity matrix in a parity check matrix of the LDPC code has a staircase structure. The parity matrix and the staircase structure will be described later. Further, an IRA code is described in, for example, "Irregular Repeat-Accumulate Codes," H. Jin, A. Khandekar, and R. J. McEliece, in Proceedings of 2nd International Symposium on Turbo codes and Related Topics, pp. 1-8, September 2000.

The LDPC code output from the LDPC encoder 115 is supplied to a bit interleaver 116.

The bit interleaver 116 performs bit interleaving which will be described later on the LDPC code from the LDPC encoder 115, and supplies a bit-interleaved LDPC code to a QAM encoder 117.

The QAM encoder 117 maps the LDPC code from the bit interleaver 116 to a signal point representing a symbol of quadrature modulation in units of one or more code bits (symbols) of the LDPC code, and performs quadrature modulation (multi-level modulation).

In other words, the QAM encoder 117 maps the LDPC code from the bit interleaver 116 to a signal point, which is decided by a modulation scheme performing quadrature modulation of the LDPC code, on an IQ plane (IQ constellation) specified by an I axis representing an I component of an in-phase on a carrier wave and a Q axis representing a Q component orthogonal to a carrier wave, and performs quadrature modulation.

Here, examples of a modulation scheme of the quadrature modulation performed by the QAM encoder 117 includes a modulation scheme including a modulation scheme specified in the DVB-T standard, that is, QPSK (Quadrature Phase Shift Keying), 16QAM (Quadrature Amplitude Modulation), 64QAM, 256QAM, 1024QAM, and 4096QAM. A modulation scheme by which the QAM encoder 117 performs quadrature modulation is set in advance, for example, according to an operation of an operator of the transmitting device 11. Further, in the QAM encoder 117, any other quadrature modulation such as 4 PAM (Pulse Amplitude Modulation) may be performed.

The data (the symbol mapped to the signal point) obtained by the processing of the QAM encoder 117 is supplied to a time interleaver 118.

The time interleaver 118 performs time interleaving (interleaving in a time direction) on the data (symbol) from the QAM encoder 117 in units of symbols, and supplies the resultant data to a MISO/MIMO encoder 119.

The MISO/MIMO encoder 119 executes space-time encoding on the data (symbol) from the time interleaver 118, and supplies the resultant data to a frequency interleaver 120.

The frequency interleaver 120 performs frequency interleaving (interleaving in a frequency direction) on the data (symbols) from the MISO/MIMO encoder 119 in units of symbols, and supplies the resultant data to a frame builder/resource allocation unit 131.

Meanwhile, a BCH encoder 121 is supplied with control data (signalling) for transmission control of a preamble called L1 or the like.

The BCH encoder 121 performs BCH coding on the supplied control data, similarly to the BCH encoder 114, and supplies the resultant data to an LDPC encoder 122.

The LDPC encoder 122 performs LDPC coding on the data from the BCH encoder 121 as LDPC target data, similarly to the LDPC encoder 115, and supplies the resultant LDPC code to a QAM encoder 123.

The QAM encoder 123 maps the LDPC code from the LDPC encoder 122 to a signal point representing a symbol of quadrature modulation in units of one or more code bits (symbols) of the LDPC code, similarly to the QAM encoder 117, performs quadrature modulation, and supplies the resultant data (symbol) to a frequency interleaver 124.

The frequency interleaver 124 performs frequency interleaving on the data (symbol) from the QAM encoder 123 in units of symbols, similarly to the frequency interleaver 120, and supplies the resultant data to the frame builder/resource allocation unit 131.

The frame builder/resource allocation unit 131 inserts a pilot symbol to a necessary position of the data (symbol) from the frequency interleavers 120 and 124, generates a frame configured with a predetermined number of symbols from the resultant data (symbol), and supplies the frame to an OFDM generation unit 132.

The OFDM generation unit 132 generates an OFDM signal corresponding to the frame from the frame from the frame builder/resource allocation unit 131, and transmits the OFDM signal via the communication path 13 (FIG. 7).

Figure 9:
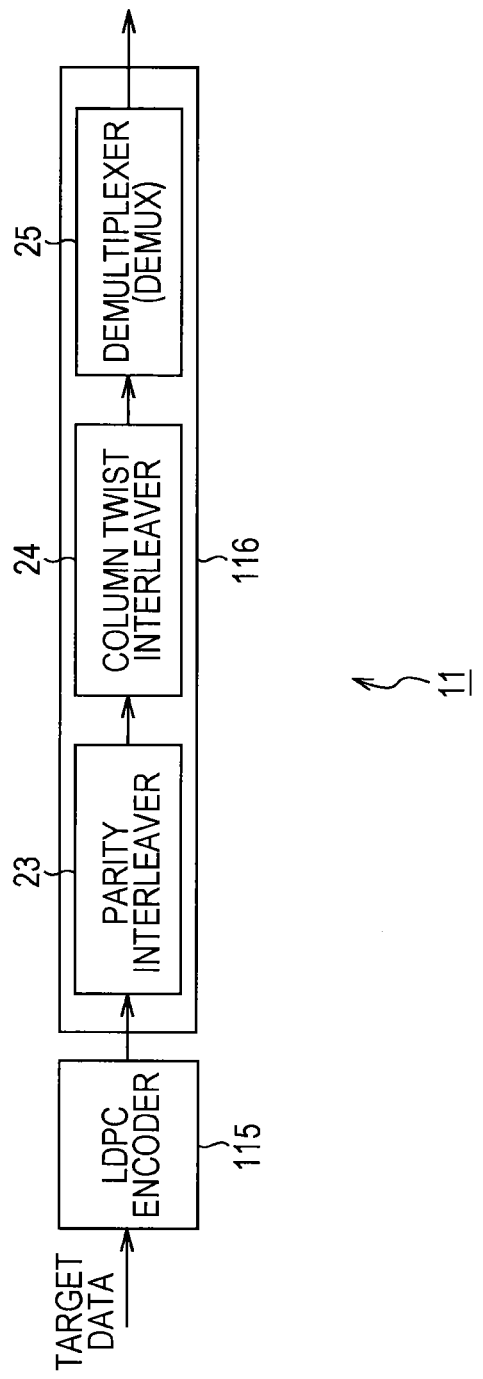
FIG. 9 is a block diagram illustrating a configuration example of a bit interleaver 116.

FIG. 9 illustrates a configuration example of the bit interleaver 116 of FIG. 8.

The bit interleaver 116 is a data-processing device that interleaves data, and includes a parity interleaver 23, a column twist interleaver 24, and a demultiplexer (DEMUX) 25.

The parity interleaver 23 performs parity interleaving of interleaving a parity bit of the LDPC code from the LDPC encoder 115 to the position of another parity bit, and supplies the parity-interleaved LDPC code to the column twist interleaver 24.

The column twist interleaver 24 performs column twist interleaving on the LDPC code from the parity interleaver 23, and supplies the column-twist-interleaved LDPC code to the demultiplexer 25.

In other words, the LDPC code is transmitted after one or more code bits of the LDPC code are mapped to a signal point representing a symbol of quadrature modulation in the QAM encoder 117 of FIG. 8.

The column twist interleaver 24 performs, for example, column twist interleaving which will be described later as an sorting process of sorting code bits of the LDPC code from the parity interleaver 23 so that a plurality of code bits of the LDPC code corresponding to "1" present in an arbitrary row of the parity check matrix used by the LDPC encoder 115 are not included in a single symbol.

The demultiplexer 25 performs an exchange process of exchanging positions of two or more code bits of the LDPC code serving as a symbol on the LDPC code from the column twist interleaver 24, and obtains an LDPC code in which tolerance for AWGN is enhanced. Further, the demultiplexer 25 supplies the two or more code bits of the LDPC code obtained by the exchange process to the QAM encoder 117 (FIG. 8) as a symbol.

Figure 10:
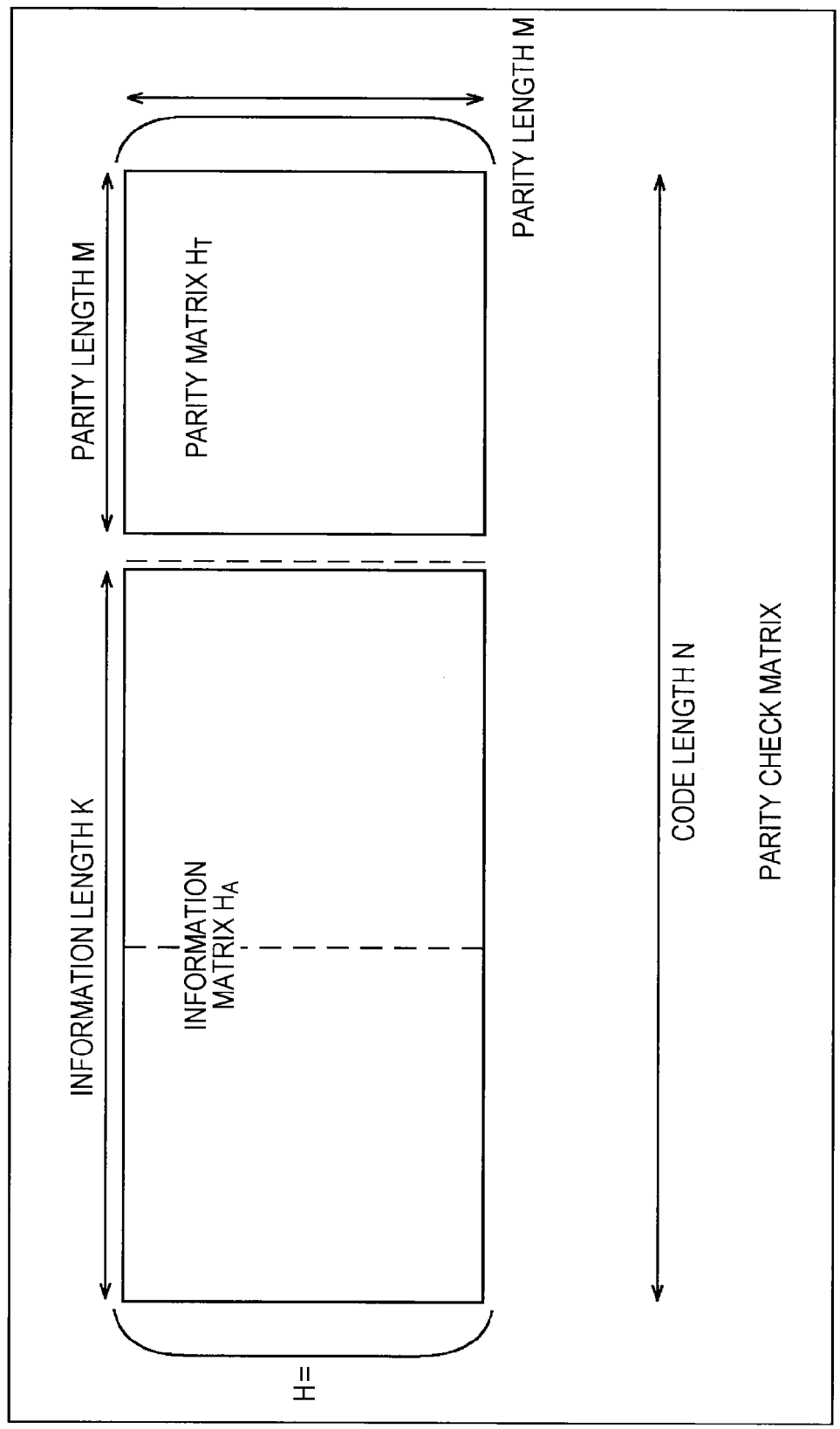
FIG. 10 is a diagram illustrating a parity check matrix.

Next, FIG. 10 illustrates the parity check matrix H used for LDPC coding by the LDPC encoder 115 of FIG. 8.

The parity check matrix H has an LDGM (Low-Density Generation Matrix) structure, and may be expressed by a formula $H=[H_A|H_T]$ (a matrix in which elements of an information matrix $H_A$ serve as left elements, and elements of a parity matrix $H_T$ serve as right elements) based on an information matrix $H_A$ of a portion corresponding to information bits among code bits of the LDPC code and a parity matrix $H_T$ corresponding to parity bits.

Here, the number of information bits among code bits of one LDPC code (one code word) and the number of parity bits are referred to as an information length K and a parity length M, respectively, and the number of code bits of one LDPC code is referred to as a code length N (=K+M).

The information length K and the parity length M of the LDPC code having the code length N are decided depending on the coding rate. Further, the parity check matrix H is a matrix in which row×column is M×N. Further, the information matrix $H_A$ is an M×K matrix, and the parity matrix $H_T$ is an M×M matrix.

Figure 11:
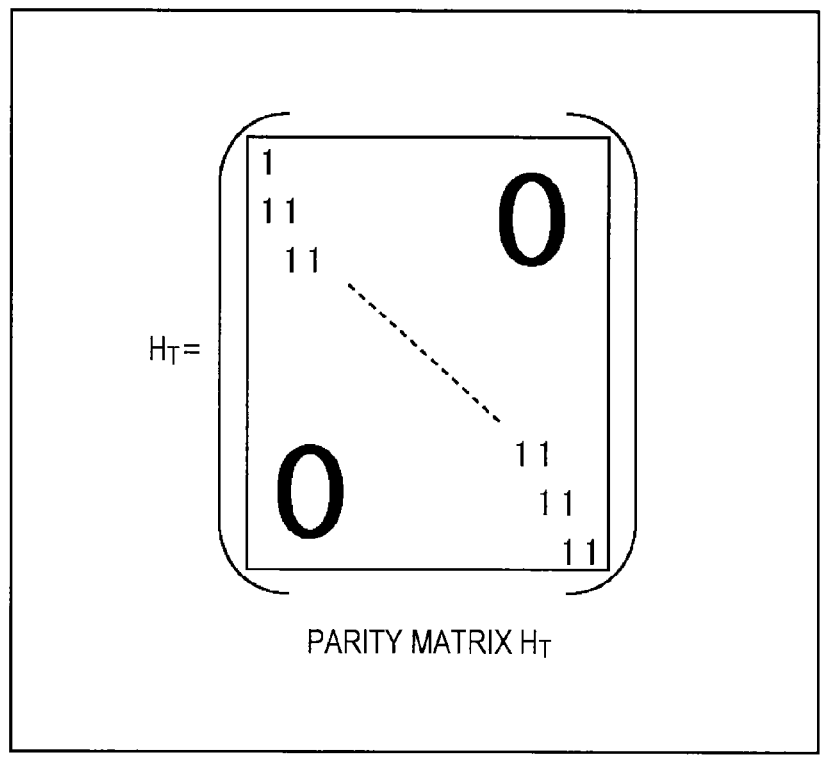
FIG. 11 is a diagram illustrating a parity matrix.

FIG. 11 illustrates the parity matrix $H_T$ of the parity check matrix H of the LDPC code specified in the DVB-T.2 (and DVB-S.2) standard.

The parity matrix $H_T$ of the parity check matrix H of the LDPC code specified in the DVB-T.2 standard has a staircase structure in which elements of "1" are arranged in the form of a staircase as illustrated in FIG. 11. The row weight of the parity matrix $H_T$ is 1 in a first row and 2 in the remaining rows. Further, the column weight is 1 in the last 1 column and 2 in the remaining columns.

As described above, the LDPC code of the parity check matrix H in which the parity matrix $H_T$ has the staircase structure can be easily generated using the parity check matrix H.

In other words, an LDPC code (one code word) is represented by a row vector c, and a column vector obtained by transposing the row vector is represented by $c^T$. Further, a portion of an information bit in the row vector c that is the LDPC code is represented by a row vector A, and a portion of a parity bit is represented by a row vector T.

In this case, the row vector c can be expressed by a formula c=[A|T] (a row vector in which an element of the row vector A serves as a left element and an element of the row vector T serves as a right element) based on the row vector A serving as the information bit and the row vector T serving as the parity bit.

The parity check matrix H and the row vector c=[A|T] serving as the LDPC code need to satisfy a formula $Hc^T=0$, and the row vector T serving as the parity bit configuring the row vector c=[A|T] satisfying the formula $Hc^T=0$ may be obtained sequentially (in order) by causing an element of each row to be zero (0) in order starting from an element of a first row of a column vector $Hc^T$ in the formula $Hc^T=0$ when the parity matrix $H_T$ of the parity check matrix $H=[H_A|H_T]$ has the staircase structure illustrated in FIG. 11.

Figure 12:
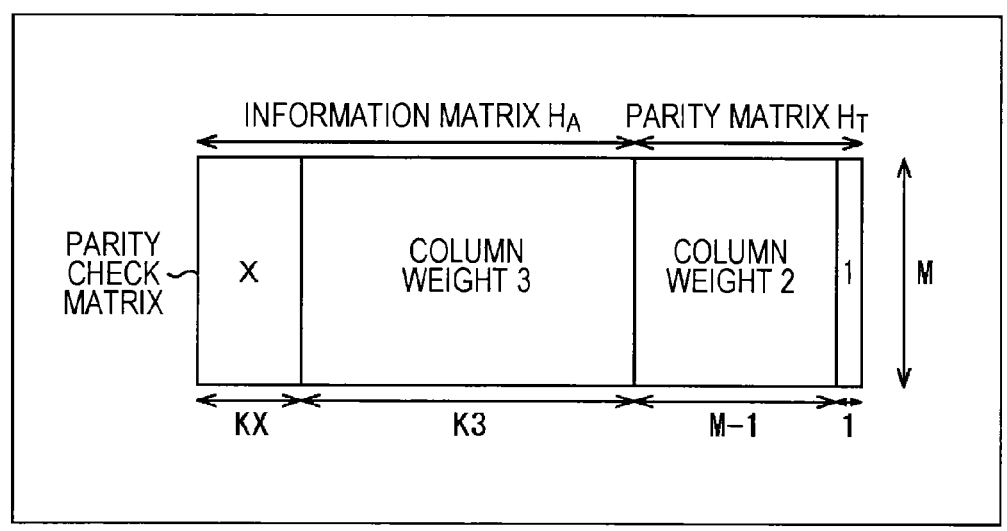
FIG. 12 is a diagram for describing a parity check matrix of an LDPC code specified in a DVB-S.2 standard.

FIG. 12 is a diagram for describing the parity check matrix H of the LDPC code specified in the DVB-T.2 standard.

The column weight is set to X for a KX column from a first column of the parity check matrix H of the LDPC code specified in the DVB-T.2 standard, the column weight is set to 3 for a subsequent K3 column, the column weight is set to 2 for a subsequent M−1 column, and the column weight is set to 1 for a last 1 column.

Here, KX+K3+M−1+1 is equal to the code length N.

FIG. 13 is a diagram illustrating column numbers KX, K3, and M and a column weight X on coding rates r of the LDPC code specified in the DVB-T.2 standard.

In the DVB-T.2 standard, an LDPC code having a code length N of 64800 bits and an LDPC code having a code length N of 16200 bits are specified.

For the LDPC code having the code length N of 64800 bits, 11 coding rates (nominal rates) 1/4, 1/3, 2/5, 1/2, 3/5, 2/3, 3/4, 4/5, 5/6, 8/9, and 9/10, and for the LDPC code having the code length N of 16200 bits, 10 coding rates 1/4, 1/3, 2/5, 1/2, 3/5, 2/3, 3/4, 4/5, 5/6, and 8/9 are specified.

Here, hereinafter, the code length N of 64800 bits is also referred to as 64 k bits, and the code length N of 16200 bits is also referred to as 16 k bits.

In the LDPC code, it is known that a code bit corresponding to a column that is large in the column weight of the parity check matrix H is low in the error rate.

In the parity check matrix H specified in the DVB-T.2 standard illustrated in FIGS. 12 and 13, a column at the beginning side (left side) tends to be large in the column weight, and thus in the LDPC code corresponding to the parity check matrix H, a code bit at the beginning tends to be robust to an error (has tolerance for an error), and a code bit at the end tends to be weak to an error.

Figure 14:
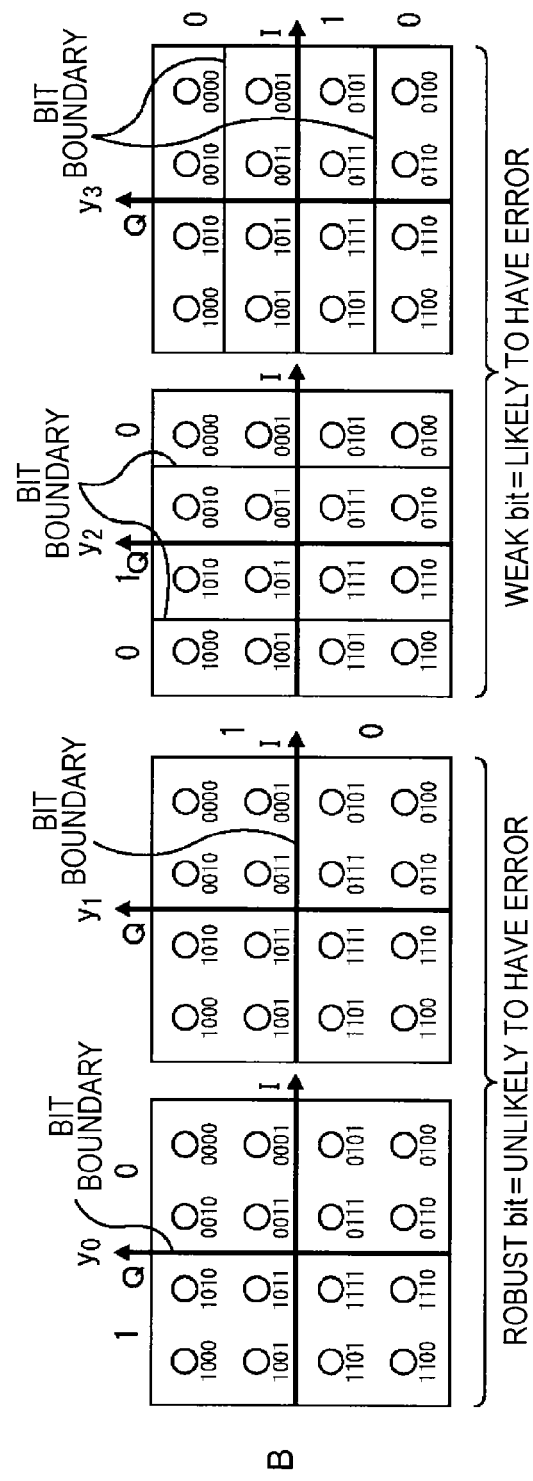
FIG. 14 is a diagram illustrating a signal point arrangement of 16QAM.

Next, FIG. 14 illustrates an arrangement of (signal points corresponding to) 16 symbols on an IQ plane when 16QAM is performed by the QAM encoder 117 of FIG. 8.

In other words, A of FIG. 14 illustrates symbols of 16QAM of DVB-T.2.

In 16QAM, one symbol is represented by 4 bits, and 16 (=$2^4$) symbols are presented. The 16 symbols are arranged centering on the original point of the IQ plane in the form of a square in which I direction×Q direction is 4×4.

Here, when an (i+1)-th bit from a most significant bit in a bit string represented by one symbol is represented by a bit $y_i$, 4 bits represented by one symbol of 16QAM can be represented as bits $y_0$, $y_1$, $y_2$, and $y_3$ in order from the most significant bit. When the modulation scheme is 16QAM, 4 bits of code bits of the LDPC code are converted (symbolized) into symbols (symbol values) of 4 bits $y_0$ to $y_3$.

B FIG. 14 illustrates a bit boundary on each of 4 bits (hereinafter, also referred to as symbol bits) $y_0$ to $y_3$ represented by symbols of 16QAM.

Here, the bit boundary on the symbol bit $y_i$ (i=0, 1, 2, and 3 in FIG. 14) means the boundary between a symbol in which the symbol bit $y_i$ is 0 and a symbol in which the symbol bit $y_i$ is 1.

As illustrated in B of FIG. 14, for a most significant symbol bit $y_0$ among 4 symbol bits $y_0$ to $y_3$ represented by symbols of 16QAM, only one portion on the Q axis of the IQ plane becomes the bit boundary, and for the second (second from the most significant bit) symbol bit $y_1$, only one portion on the I axis of the IQ plane becomes the bit boundary.

Further, for the third symbol bit $y_2$, among 4×4 symbols, two portions between first and second columns from the left and between third and fourth columns become the bit boundary.

Further, for the fourth symbol bit $y_3$, among 4×4 symbols, two portions between first and second rows from the top and between third and fourth rows become the bit boundary.

The symbol bit $y_i$ represented by the symbol is unlikely to have an error (low in an error probability) when many symbols are distant from the bit boundary and is likely to have an error (high in an error probability) when many symbols are close to the bit boundary.

Here, when a bit unlikely to have an error (robust to an error) is referred to as a "robust bit" and a bit likely to have an error is referred to as a "weak bit," for 4 symbol bits $y_0$ to $y_3$ of symbols of 16QAM, the most significant symbol bit $y_0$ and the second symbol bit $y_1$ are robust bits, and the third symbol bit $y_2$ and the fourth symbol bit $y_3$ are weak bits.

Figure 15:
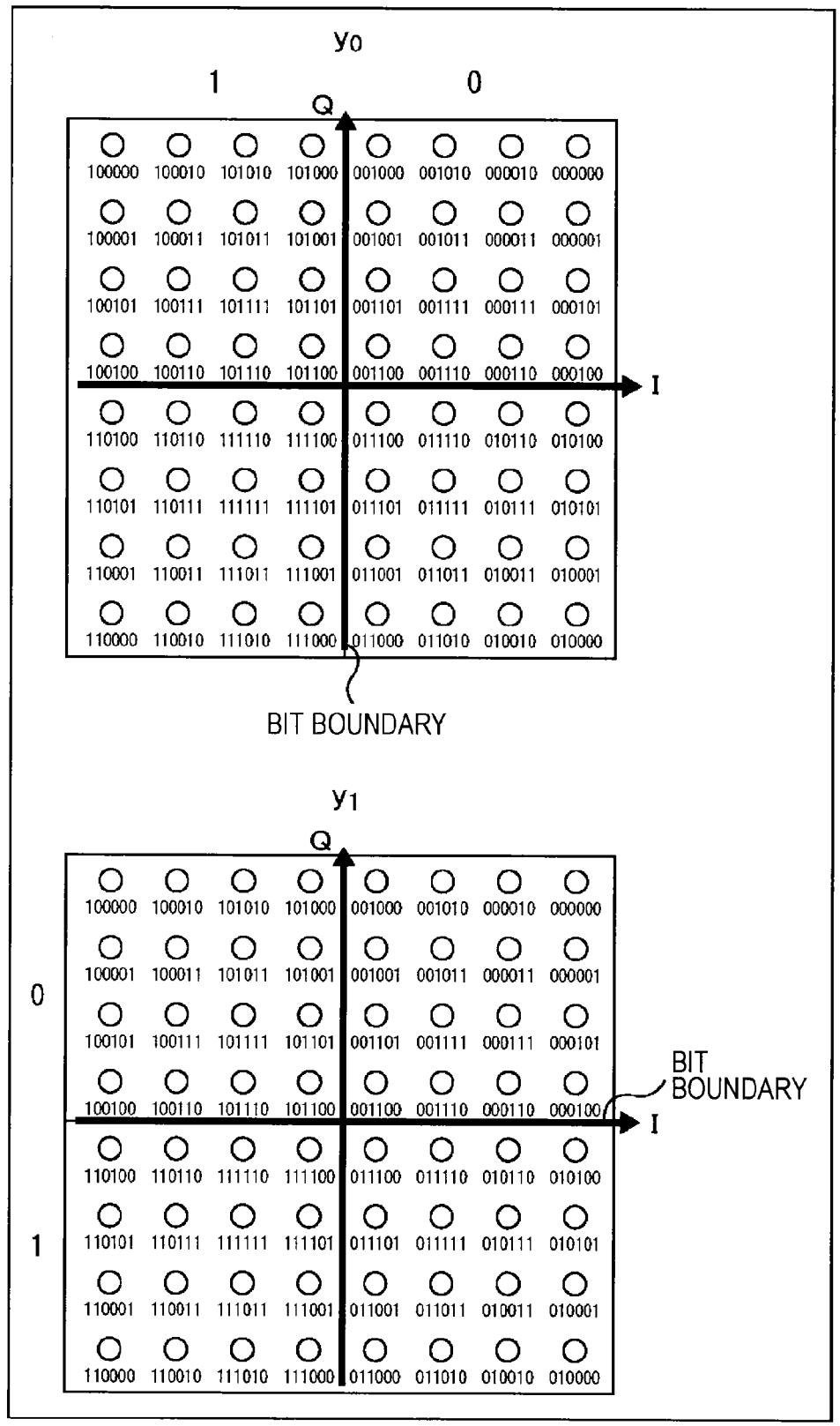
FIG. 15 is a diagram illustrating a signal point arrangement of 64QAM.
Figure 16:
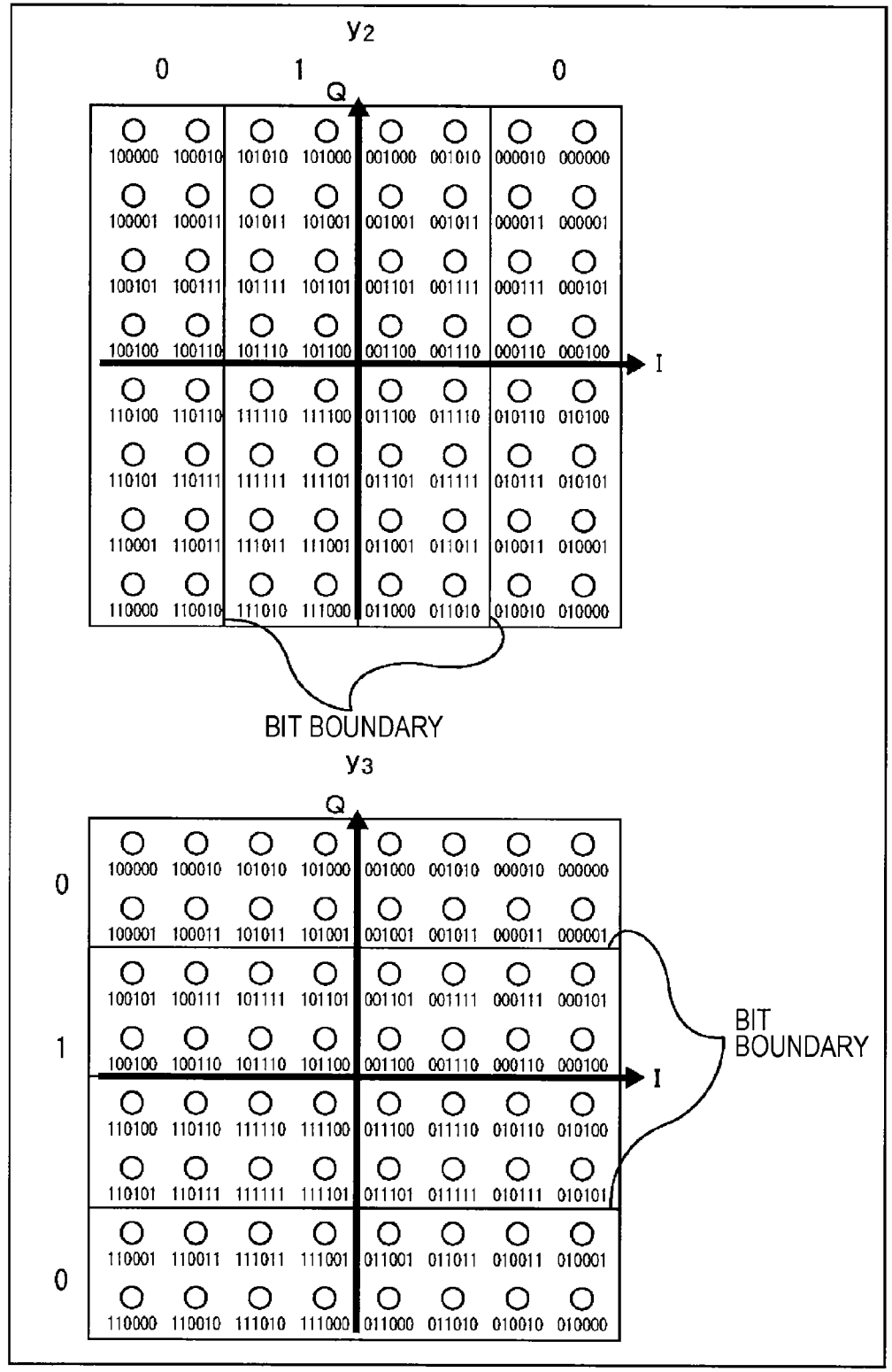
FIG. 16 is a diagram illustrating a signal point arrangement of 64QAM.
Figure 17:
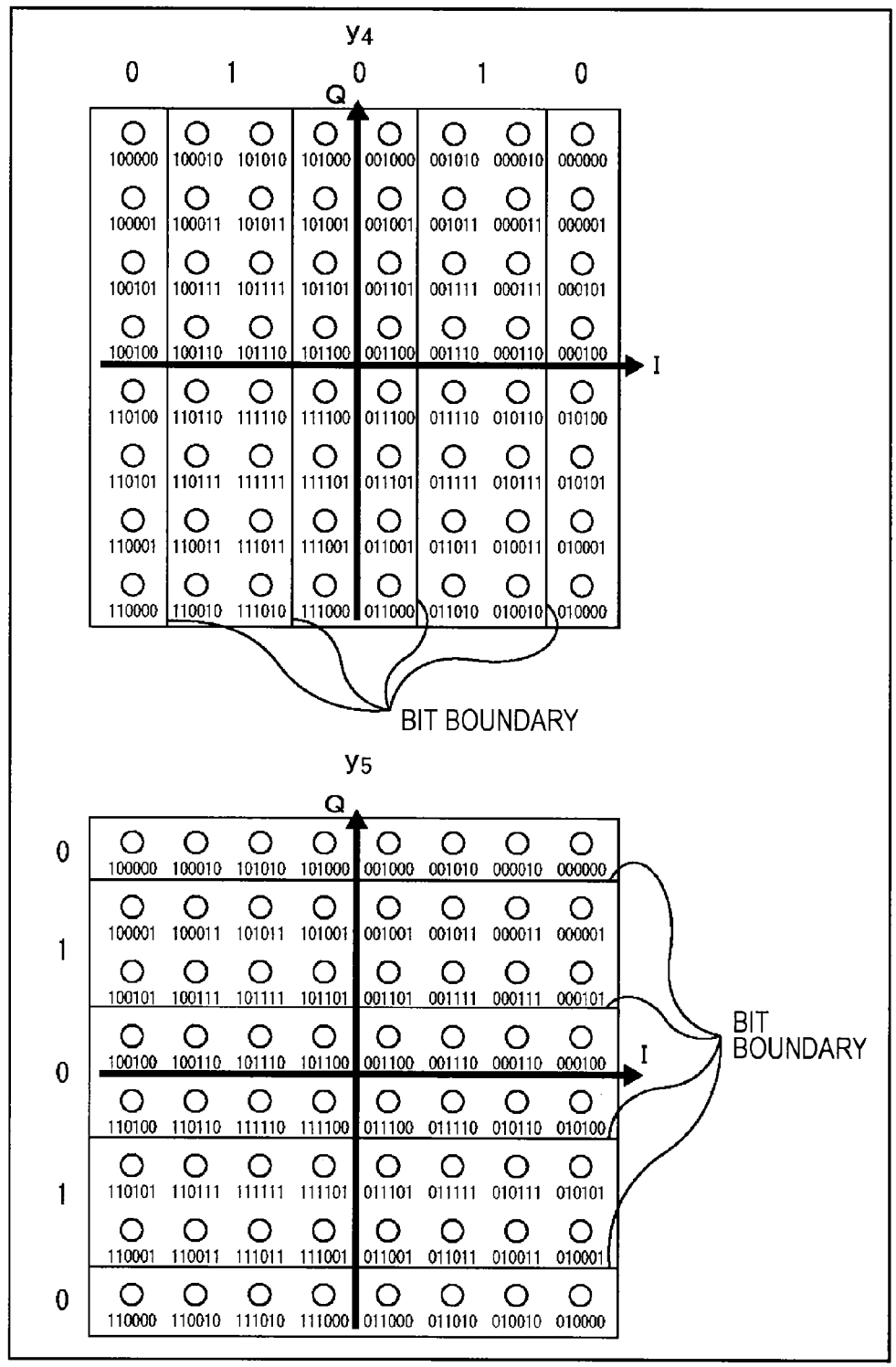
FIG. 17 is a diagram illustrating a signal point arrangement of 64QAM.

FIGS. 15 to 17 illustrate an arrangement of (signal points corresponding to) 64 symbols on the IQ plane when 64QAM is performed by the QAM encoder 117 of FIG. 8, that is, symbols of 16QAM of DVB-T.2.

In 64QAM, one symbol is represented by 6 bits, and 64 (=$2^6$) symbols are presented. The 64 symbols are arranged centering on the original point of the IQ plane in the form of a square in which I direction×Q direction is 8×8.

The symbol bits of one symbol of 64QAM can be represented as bits $y_0$, $y_1$, $y_2$, $y_3$, $y_4$, and $y_5$ in order from the most significant bit. When the modulation scheme is 64QAM, 6 bits of code bits of the LDPC code are converted into symbols of 6 bits $y_0$ to $y_5$.

Here, FIG. 15 illustrates bit boundaries on the most significant symbol bit $y_0$ and the second symbol bit $y_1$ among the symbol bits $y_0$ to $y_5$ of the symbol of 64QAM, FIG. 16 illustrates bit boundaries on the third symbol bit $y_2$ and the fourth symbol bit $y_3$, and FIG. 17 illustrates bit boundaries on the fifth symbol bit $y_4$ and the sixth symbol bit $y_5$.

The bit boundary on each of the most significant symbol bit $y_0$ and the second symbol bit $y_1$ is one portion as illustrated in FIG. 15. Further, the bit boundaries on each of the third symbol bit $y_2$ and the fourth symbol bit $y_3$ are two portions as illustrated in FIG. 16, and the bit boundaries on each of the fifth symbol bit $y_4$ and the sixth symbol bit $y_5$ are four portions as illustrated in FIG. 17.

Thus, for the symbol bits $y_0$ to $y_5$ of the symbol of 64QAM, the most significant symbol bit $y_0$ and the second symbol bit $y_1$ are robust bits, and the third symbol bit $y_2$ and the fourth symbol bit $y_3$ are next robust bits. The fifth symbol bit $y_4$ and the sixth symbol bit $y_5$ are weak bits.

It can be understood from FIG. 14 and FIGS. 15 to 17 that for the symbol bits of the symbol of the quadrature modulation, a high-order bit is likely to be a robust bit, and a low-order bit is likely to be a weak bit.

Here, as described above with reference to FIGS. 12 and 13, the LDPC code output from the LDPC encoder 115 (FIG. 8) includes a code bit robust to an error and a code bit weak to an error.

Further, as described above with reference to FIGS. 14 to 17, as a symbol bit of a symbol of quadrature modulation performed by the QAM encoder 117, there are a robust bit and a weak bit.

Thus, when a code bit of the LDPC code that is weak to an error is allocated to a weak symbol bit of a symbol of the quadrature modulation, tolerance for an error decreases as a whole.

In this regard, an interleaver of interleaving code bits of the LDPC code such that a code bit of the LDPC code that is weak to an error is allocated to a robust bit (symbol bit) of a symbol of quadrature modulation has been proposed.

The demultiplexer 25 of FIG. 9 can perform processing of the interleaver.

Figure 18:
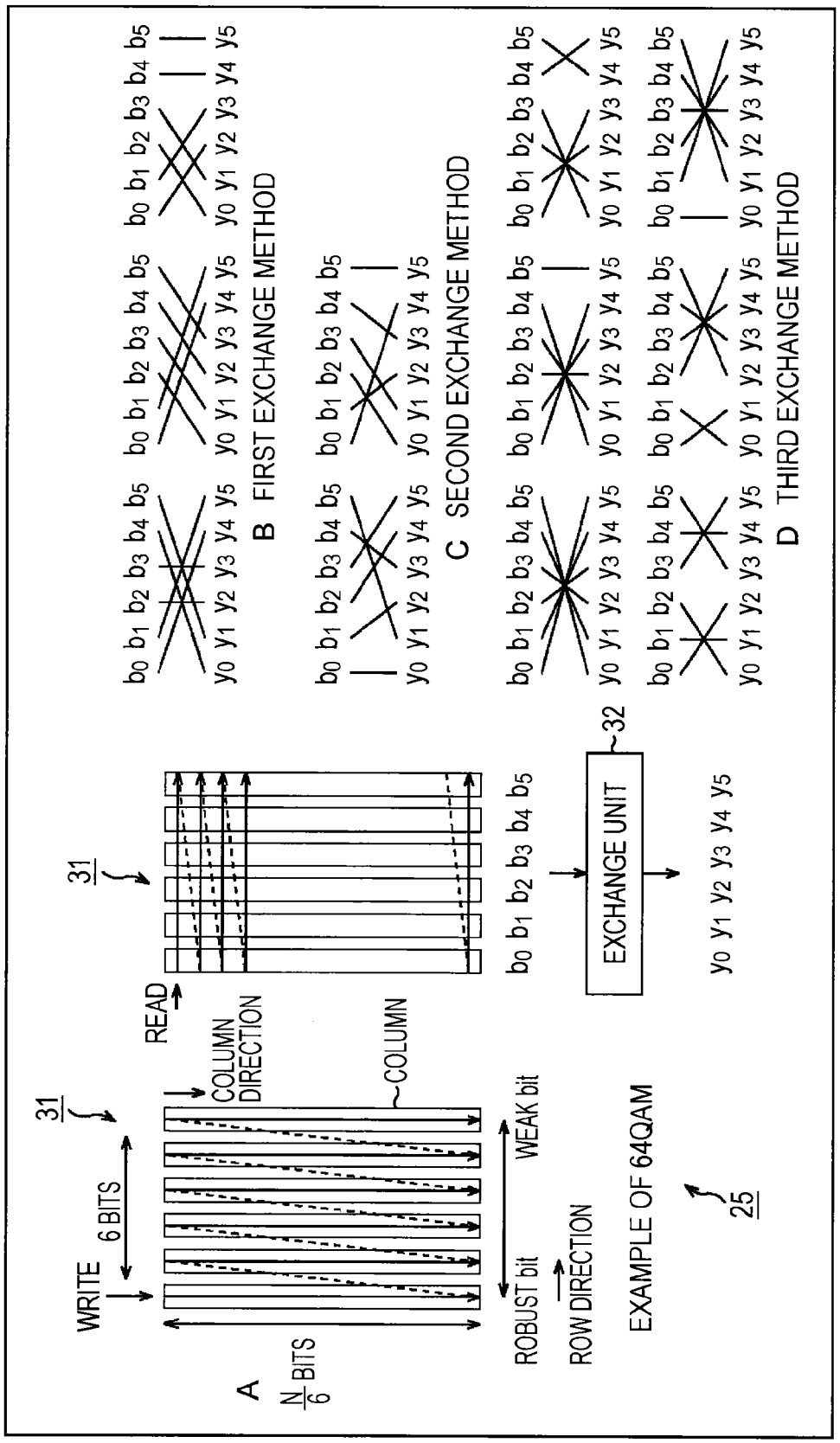
FIG. 18 is a diagram for describing processing of a demultiplexer 25.

FIG. 18 is a diagram for describing processing of the demultiplexer 25 of FIG. 9.

In other words, A of FIG. 18 illustrates a functional configuration example of the demultiplexer 25.

The demultiplexer 25 includes a memory 31 and an exchange unit 32.

The memory 31 is supplied with the LDPC code from the LDPC encoder 115.

The memory 31 has a storage capacity of storing mb bits in a row (lateral) direction and storing N/(mb) bits in a column (longitudinal) direction, and writes code bits of an LDPC code supplied thereto in the column direction, reads code bits in the row direction, and supplies the code bits to the exchange unit 32.

Here, N (=the information length K+the parity length M) represents a code length of an LDPC code as described above.

Further, m represents a bit number of code bits of an LDPC code serving as one symbol, and b is a predetermined positive integer and a multiple used to cause m to be an integral multiple. The demultiplexer 25 converts (symbolizes) a code bit of an LDPC code into a symbol as described above, and the multiple b represents the number of symbols obtained by single symbolization by the demultiplexer 25.

A of FIG. 18 illustrates a configuration example of the demultiplexer 25 when the modulation scheme is 64QAM, and thus the bit number m of code bits of an LDPC code serving as one symbol is 6.

Further, in A of FIG. 18, the multiple b is 1, and thus the memory 31 has a storage capacity in which column direction× row direction is N/(6×1)×(6×1) bits.

Here, a storage region of the memory 31, in which the row direction is 1 bit, extending in the column direction is hereinafter appropriately referred to as a column (storing unit). In A of FIG. 18, the memory 31 is configured with 6 (=6×1) columns.

In the demultiplexer 25, writing code bits of an LDPC code downward (in the column direction) from the top of columns configuring the memory 31 is performed from the left column to the right column.

Further, when writing of code bits ends up to the bottom of the rightmost column, code bits are read in the row direction in units of 6 bits (mb bits) starting from the first column of all columns configuring the memory 31 and supplied to the exchange unit 32.

The exchange unit 32 performs the exchange process of exchanging the positions of code bits of 6 bits from the memory 31, and outputs the resultant 6 bits as 6 symbol bits $y_0$, $y_1$, $y_2$, $y_3$, $y_4$, and $y_5$ representing one symbol of 64QAM.

In other words, code bits of mb bits (here, 6 bits) are read from the memory 31 in the row direction, but when an i-th bit (i=0, 1, . . . , mb−1) from the most significant bit in the code bits of mb bits read from the memory 31 is represented by a bit $b_i$, the code bits of 6 bits read from the memory 31 in the row direction can be represented by bits $b_0$, $b_1$, $b_2$, $b_3$, $b_4$, and $b_5$ in order from the most significant bit.

Through the relation of the column weight described with reference to FIGS. 12 and 13, a code bit present in a direction of the bit $b_0$ is a code bit robust to an error, and a code bit present in a direction of the bit $b_5$ is a code bit weak to an error.

The exchange unit 32 can performs the exchange process of exchanging positions of the code bits $b_0$ to $b_5$ from 6 bits from the memory 31 so that among the code bits $b_0$ to $b_5$ from 6 bits from the memory 31, a code bit weak to an error is allocated to a robust bit among symbol bits $y_0$ to $y_5$ of one symbol of 64QAM.

Here, as a exchanging method of exchanging the code bits $b_0$ to $b_5$ from 6 bits from the memory 31 and allocating the code bits to 6 symbol bits $y_0$ to $y_5$ representing one symbol of 64QAM, various methods have been proposed from respective companies.

B of FIG. 18 illustrates a first exchanging method, C of FIG. 18 illustrates a second exchanging method, and D of FIG. 18 illustrates a third exchanging method.

In B to D of FIG. 18 (similar even in FIG. 19), a line segment connecting bits $b_i$ and $y_j$ means that the code bit $b_i$ is allocated to the symbol bit $y_j$ (exchanged for the position of the symbol bit $y_j$).

Any one of three types of exchanging methods is being proposed to be employed as the first exchanging method of B of FIG. 18, and any one of two types of exchanging methods is being proposed to be employed as the second exchanging method of C of FIG. 18.

Six types of exchanging methods are being proposed to be selected and used in order as the third exchanging method of D of FIG. 18.

Figure 19:
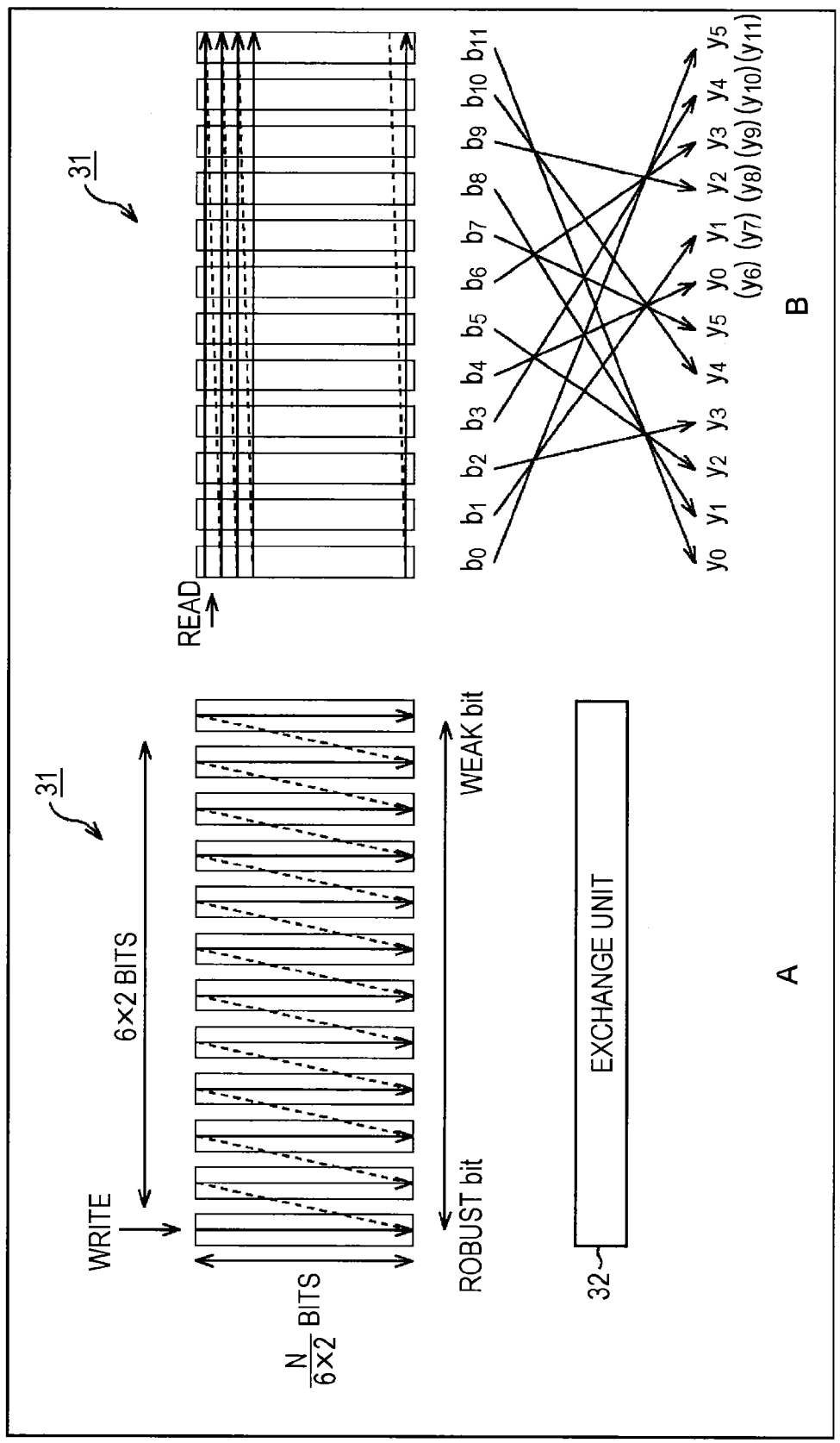
FIG. 19 is a diagram for describing processing of a demultiplexer 25.

FIG. 19 illustrates a configuration example of the demultiplexer 25 when the modulation scheme is 64QAM (thus, the bit number m of code bits of an LDPC code mapped to one symbol is 6, similarly to FIG. 18) and the multiple b is 2 and a fourth exchanging method.

When the multiple b is 2, the memory 31 has a storage capacity in which column direction×row direction is N/(6×2)×(6×2) bits and is configured with 12 (=6×2) columns.

A of FIG. 19 illustrates a writing sequence of an LDPC code to the memory 31.

In the demultiplexer 25, writing code bits of an LDPC code downward (in the column direction) from the top of columns configuring the memory 31 is performed from the left column to the right column as described with reference to FIG. 18.

Further, when writing of code bits ends up to the bottom of the rightmost column, code bits are read in the row direction in units of 12 bits (mb bits) starting from the first column of all columns configuring the memory 31 and supplied to the exchange unit 32.

The exchange unit 32 performs the exchange process of exchanging the positions of code bits of 12 bits from the memory 31 according to the fourth exchanging method, and outputs the resultant 12 bits as 12 symbol bits representing two symbols (b symbols) of 64QAM, that is, 6 symbol bits $y_0$, $y_1$, $y_2$, $y_3$, $y_4$, and $y_5$ representing one symbol of 64QAM and 6 symbol bits $y_0$, $y_1$, $y_2$, $y_3$, $y_4$, and $y_5$ representing next one symbol.

Here, B of FIG. 19 illustrates the fourth exchanging method of the exchange process by the exchange unit 32 by A of FIG. 19.

Further, when the multiple b is 2 (similar even when the multiple b is 3 or more), code bits of mb bits are allocated to symbol bits of mb bits of consecutive b symbols through the exchange process. In the following including FIG. 19, for the sake of convenience of description, an (i+1)-th bit from the most significant bit among symbol bits of mb bits of consecutive b symbols is represented by a bit (symbol bit) $y_i$.

An appropriate exchanging method, that is, an improvement in the error rate in the AWGN communication path differs, for example, according to the coding rate, the code length, or the modulation scheme of the LDPC code.

[Parity Interleaving]

Next, parity interleaving by the parity interleaver 23 of FIG. 9 will be described with reference to FIGS. 20 to 22.

Figure 20:
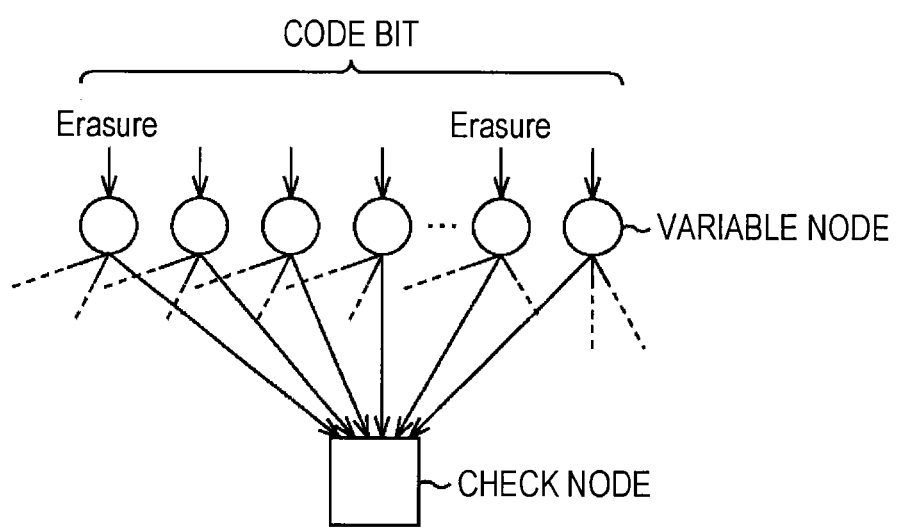
FIG. 20 is a diagram illustrating a tanner graph on LDPC code decoding.

FIG. 20 illustrates (a part of) a tanner graph of a parity check matrix of an LDPC code.

When two or more (code bits corresponding to) variable nodes connected to a check node have an error such as erasure at the same time as illustrated in FIG. 20, the check node returns a message in which a probability that a valve is 0 is equal to a probability that a value is 1 to all variable nodes connected to the check node. Thus, when a plurality of variable nodes connected to the same check node have erasure or the like at the same time, decoding performance deteriorates.

Meanwhile, an LDPC code, which is specified in the DVB-T.2 standard, output from the LDPC encoder 115 of FIG. 8 is an IRA code, and the parity matrix $H_T$ of the parity check matrix H has the staircase structure as illustrated in FIG. 11.

Figure 21:
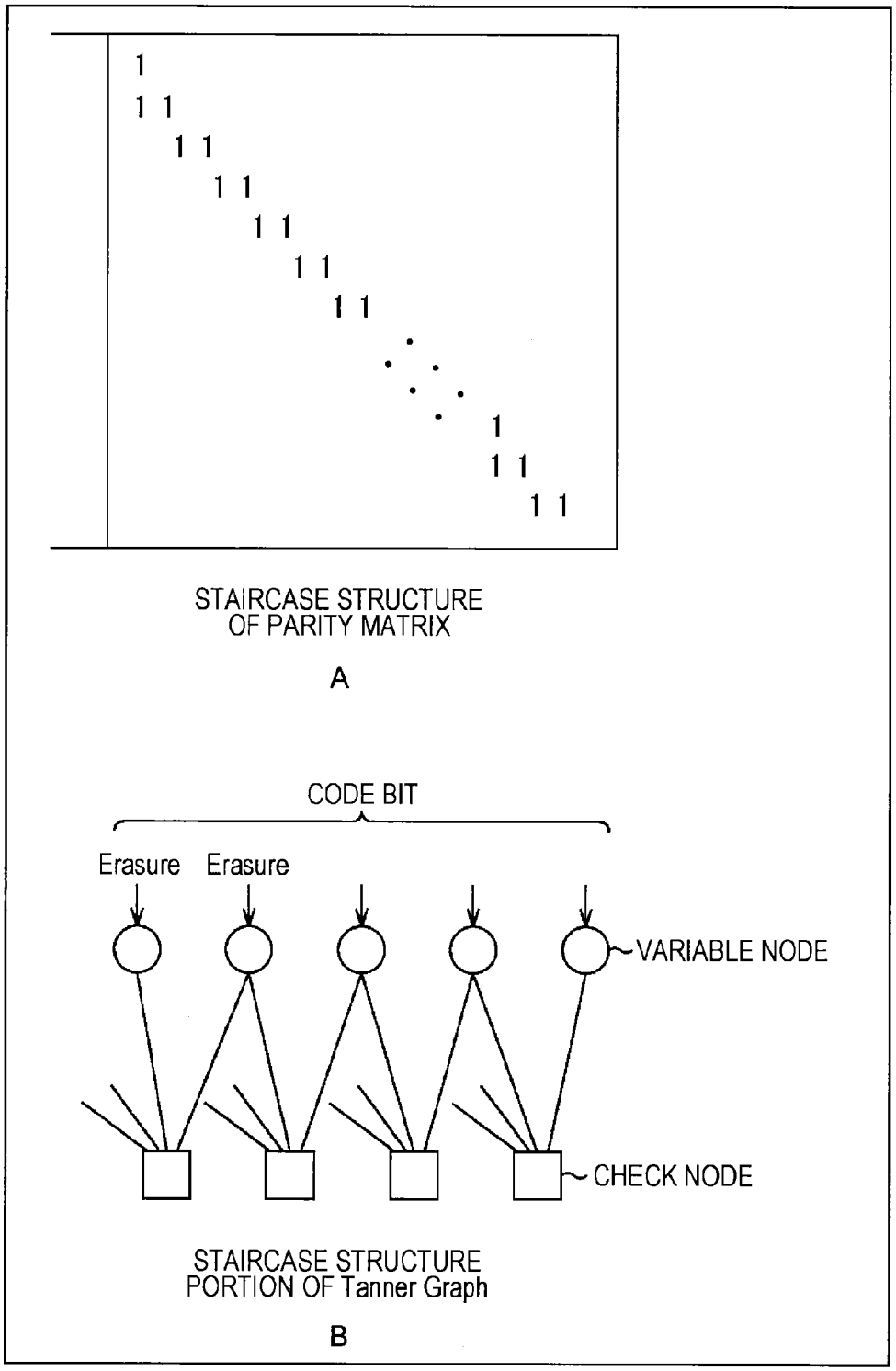
FIG. 21 is a diagram illustrating a parity matrix $H_T$ having a staircase structure and a tanner graph corresponding to the parity matrix $H_T$.

FIG. 21 illustrates a parity matrix $H_T$ having a staircase structure and a tanner graph corresponding to the parity matrix $H_T$.

In other words, A of FIG. 21 illustrates the parity matrix $H_T$ having the staircase structure, and B of FIG. 21 illustrates the tanner graph corresponding to the parity matrix $H_T$ of A of FIG. 21.

In the parity matrix $H_T$ having the staircase structure, elements of "1" are adjacent to each other in each row (except for a first row). Thus, in the tanner graph of the parity matrix $H_T$, two adjacent variable nodes corresponding to columns of two adjacent elements in which a value of the parity matrix $H_T$ is "1" are connected to the same check node.

Thus, when parity bits corresponding to two adjacent variable nodes have an error at the same time due to a burst error, erasure, or the like, the check node connected to the two variable nodes (variable nodes obtaining a message using a parity bit) corresponding to two parity bits having an error returns a message in which a probability that a value is 0 is equal to a probability that a value is 1 to the variable nodes connected to the check node, and thus, decoding performance deteriorates. Further, when a burst length (the number of parity bits consecutively having an error) increases, the check node returning a message of an equal probability increases, and decoding performance further deteriorates.

In this regard, the parity interleaver 23 (FIG. 9) performs parity interleaving of interleaving a parity bit of an LDPC code from the LDPC encoder 115 to the position of another parity bit in order to prevent deterioration in decoding performance.

Figure 22:
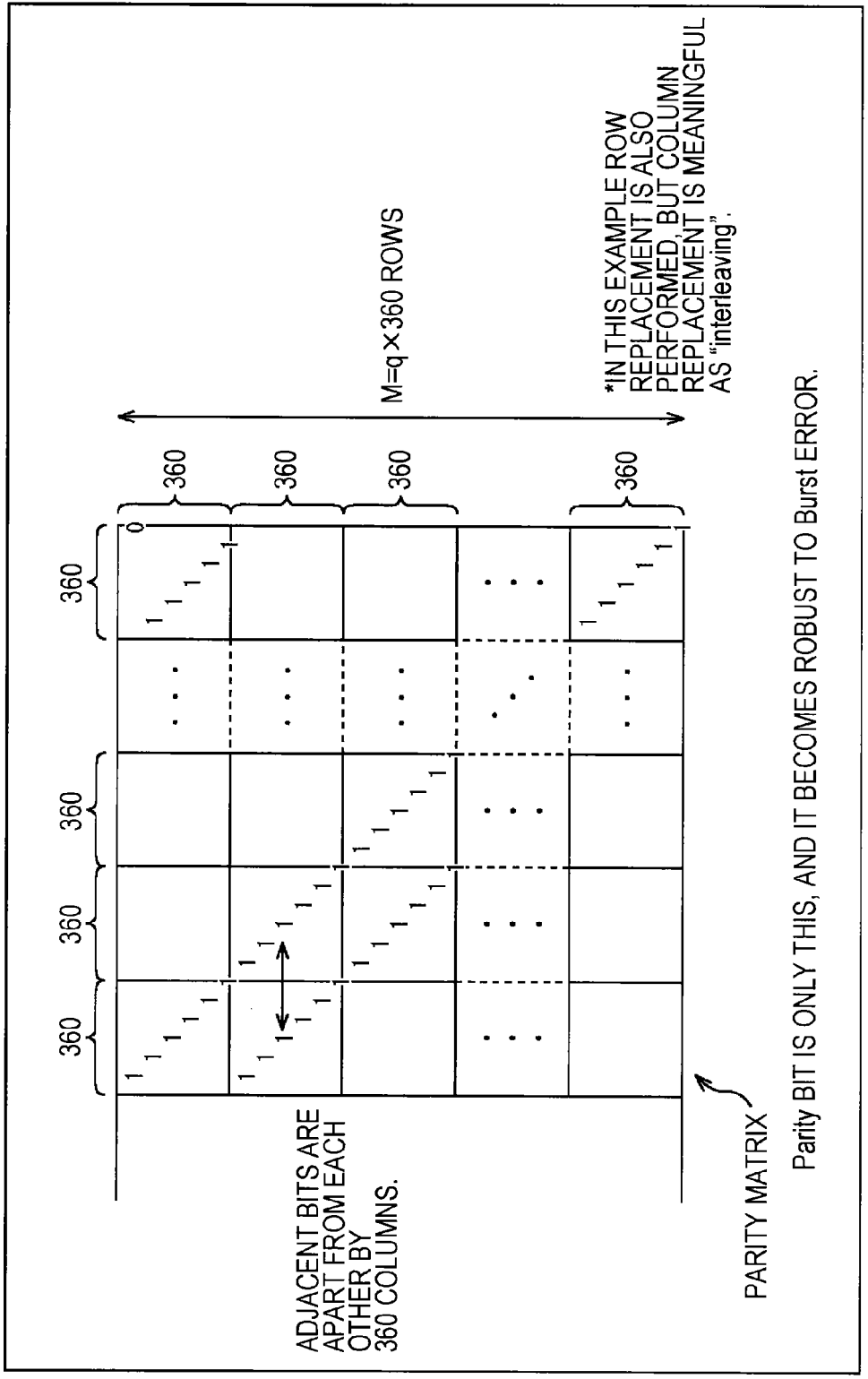
FIG. 22 is a diagram illustrating a parity matrix $H_T$ of a parity check matrix H corresponding to a parity-interleaved LDPC code.

FIG. 22 illustrates the parity matrix $H_T$ of the parity check matrix H corresponding to the LDPC code that has been subjects to parity interleaving performed by the parity interleaver 23 of FIG. 9.

Here, an information matrix $H_A$ of the parity check matrix H corresponding to the LDPC code, which is specified in the DVB-T.2 standard, output from the LDPC encoder 115 has a cyclic structure.

The cyclic structure represents a structure in which a certain column matches another cyclic-shifted column, and includes, for example, even a structure in which a position of "1" of each row of P columns becomes a position cyclic-shifted in the column direction by a value proportional to a value q obtained by dividing a first column of the P columns by the parity length M for every P columns. Hereinafter, the P columns in the cyclic structure are appropriately referred to as a unit column number of a cyclic structure.

As an LDPC code specified in the DVB-T.2 standard, there are two types of an LDCP code having a code length N of 64800 bits and a code length N of 16200 bits as described above with reference to FIGS. 12 and 13, and for both of the two types of the LDPC codes, the unit column number P of the cyclic structure is specified to be 360 that is one of divisors excluding 1 and M among divisors of the parity length M.

Further, the parity length M has a value other than a prime number expressed by a formula $M=q \times P=q \times 360$ using the value q differing according to the coding rate. Thus, the value q is another divisor excluding 1 and M among the divisors of the parity length M, similarly to the unit column number P of the cyclic structure, and obtained by dividing the parity length M by the unit column number P of the cyclic structure (the product of P and q which are the divisors of the parity length M is the parity length M).

When the information length is represented by K, an integer of 0 or more and less than P is represented by x, and an integer of 0 or more and less than q is represented by y as described above, the parity interleaver 23 performs parity interleaving of interleaving a (K+qx+y+1)-th code bit among code bits of an N-bit LDPC code to the position of a (K+Py+x+1)-th code bit.

Both of the (K+qx+y+1)-th code bit and the (K+Py+x+1)-th code bit are code bits after a (K+1)-th code bit and thus parity bits, and thus the positions of the parity bits of the LDPC code are shifted by parity interleaving.

According to such parity interleaving, since (parity bits corresponding to) variable nodes connected to the same check node are distant from each other by the unit column number P of the cyclic structure, that is, 360 bits, when the burst length is less than 360 bits, a phenomenon that a plurality of variable nodes connected to the same check node have an error at the same time can be avoided, and as a result, tolerance for a burst error can be improved.

Further, an LDPC code that has been subjected to parity interleaving of interleaving the (K+qx+y+1)-th code bit to the position of the (K+Py+x+1)-th code bit matches an LDPC code of a parity check matrix (hereinafter, also referred to as a "conversion parity check matrix") obtained by performing column replacement of replacing a (K+qx+y+1)-th column of an original parity check matrix H with a (K+Py+x+1)-th column.

Further, in the parity matrix of the conversion parity check matrix, a pseudo-cyclic structure having P columns (360 columns in FIG. 22) as a unit appears as illustrated in FIG. 22.

Here, the pseudo-cyclic structure means a structure in which a portion excluding a part has a cyclic structure. In the conversion parity check matrix obtained by executing column replacement corresponding to parity interleaving on the parity check matrix of the LDPC code specified in the DVB-T.2 standard, a portion (a shift matrix which will be described later) of 360 rows×360 columns of a right-hand corner portion is short of one element of "1" (has an element of "0"), and in that sense, a pseudo-cyclic structure rather than a (complete) cyclic structure is formed.

The conversion parity check matrix of FIG. 22 is a matrix obtained by executing replacement of a row (row replacement) causing a conversion parity check matrix to be configured with a constitutive matrix as well as column replacement corresponding to parity interleaving on the original parity check matrix H.

[Column Twist Interleaving]

Next, column twist interleaving used as the sorting process by the column twist interleaver 24 of FIG. 9 will be described with reference to FIGS. 23 to FIG. 26.

The transmitting device 11 of FIG. 8 transmits one or more code bits of an LDPC code as a single symbol. In other words, for example, when two code bits are transmitted as a single symbol, for example, QPSK is used as a modulation scheme, and when four code bits are transmitted as a single symbol, for example, 16QAM is used as a modulation scheme.

When two or more code bits are transmitted as a single symbol and erasure or the like occurs in a certain symbol, all of code bits of the symbol have an error (erasure).

Thus, in order to decrease a probability that a plurality of (code bits corresponding to) variable nodes connected to the same check node have erasure at the same time in order to improve decoding performance, it is necessary to prevent variable nodes corresponding to code bits of a single symbol from being connected to the same check node.

Meanwhile, as described above, in the parity check matrix H of the LDPC code, which is specified in the DVB-T.2 standard, output from the LDPC encoder 115, the information matrix $H_A$ has the cyclic structure, and the parity matrix $H_T$ has the staircase structure. Further, as described above with reference to FIG. 22, in the conversion parity check matrix that is the parity check matrix of the parity-interleaved LDPC code, the cyclic structure (exactly, pseudo-cyclic structure as described above) appears even in the parity matrix.

Figure 23:
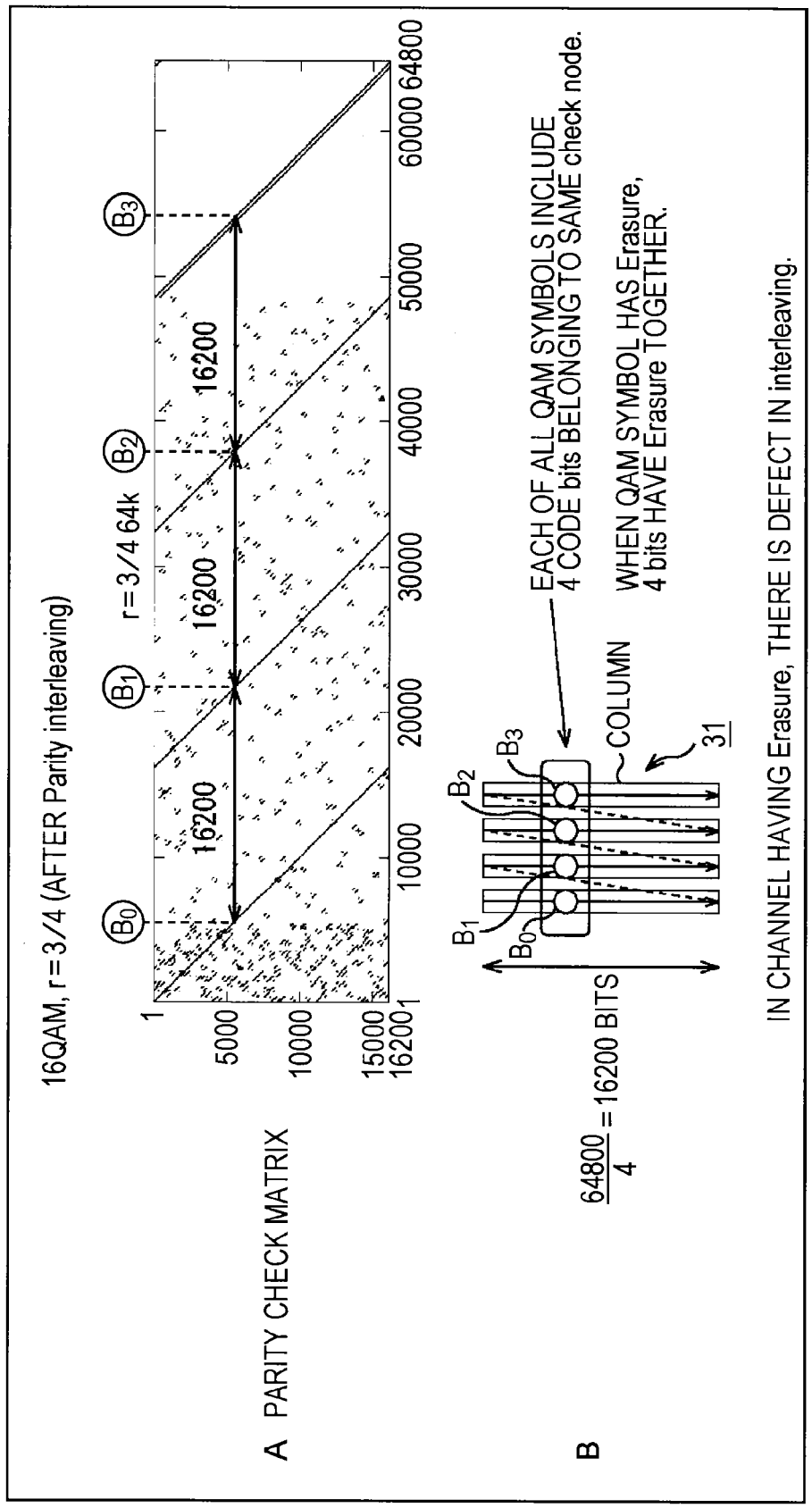
FIG. 23 is a diagram illustrating a conversion parity check matrix.

FIG. 23 illustrates a conversion parity check matrix.

In other words, A of FIG. 23 illustrates a conversion parity check matrix of a parity check matrix H of an LDPC code in which the code length N is 64800 bits and the coding rate (r) is 3/4.

In the conversion parity check matrix of A of FIG. 23, the position of an element having a value of "1" is indicated by a point (•).

B of FIG. 23 illustrates processing that is performed on the LDPC code of the conversion parity check matrix of A of FIG. 23, that is, the parity-interleaved LDPC code by the demultiplexer 25 (FIG. 9).

In B of FIG. 23, 16QAM is used as a modulation scheme, and code bits of the parity-interleaved LDPC code are written in four columns configuring the memory 31 of the demultiplexer 25 in the column direction.

The code bits written in the four columns configuring the memory 31 in the column direction are read in the row direction in units of 4 bits and used as a single symbol.

In this case, code bits $B_0$, $B_1$, $B_2$, and $B_3$ of four bits serving as a single symbol may be code bits corresponding to "1" present in an arbitrary row of the conversion parity check matrix of A of FIG. 23, and in this case, variable nodes respectively corresponding to the code bits $B_0$, $B_1$, $B_2$, and $B_3$ are connected to the same check node.

Thus, when the code bits $B_0$, $B_1$, $B_2$, and $B_3$ of four bits serving as a single symbol may be code bits corresponding to "1" present in an arbitrary row of the conversion parity check matrix, if erasure occurs in the symbol, it is difficult to obtain an appropriate message in the same check node connected with the variable nodes respectively corresponding to the code bits $B_0$, $B_1$, $B_2$, and $B_3$, and thus decoding performance deteriorates.

Even when coding rates other than 3/4 are used, similarly, there are cases in which a plurality of code bits corresponding to a plurality of variable nodes connected to the same check node are used as a single symbol of 16QAM.

In this regard, the column twist interleaver 24 performs column twist interleaving of interleaving the code bits of the parity-interleaved LDPC code from the parity interleaver 23 such that a plurality of code bits corresponding to "1" present in an arbitrary row of the conversion parity check matrix are not included in a single symbol.

Figure 24:
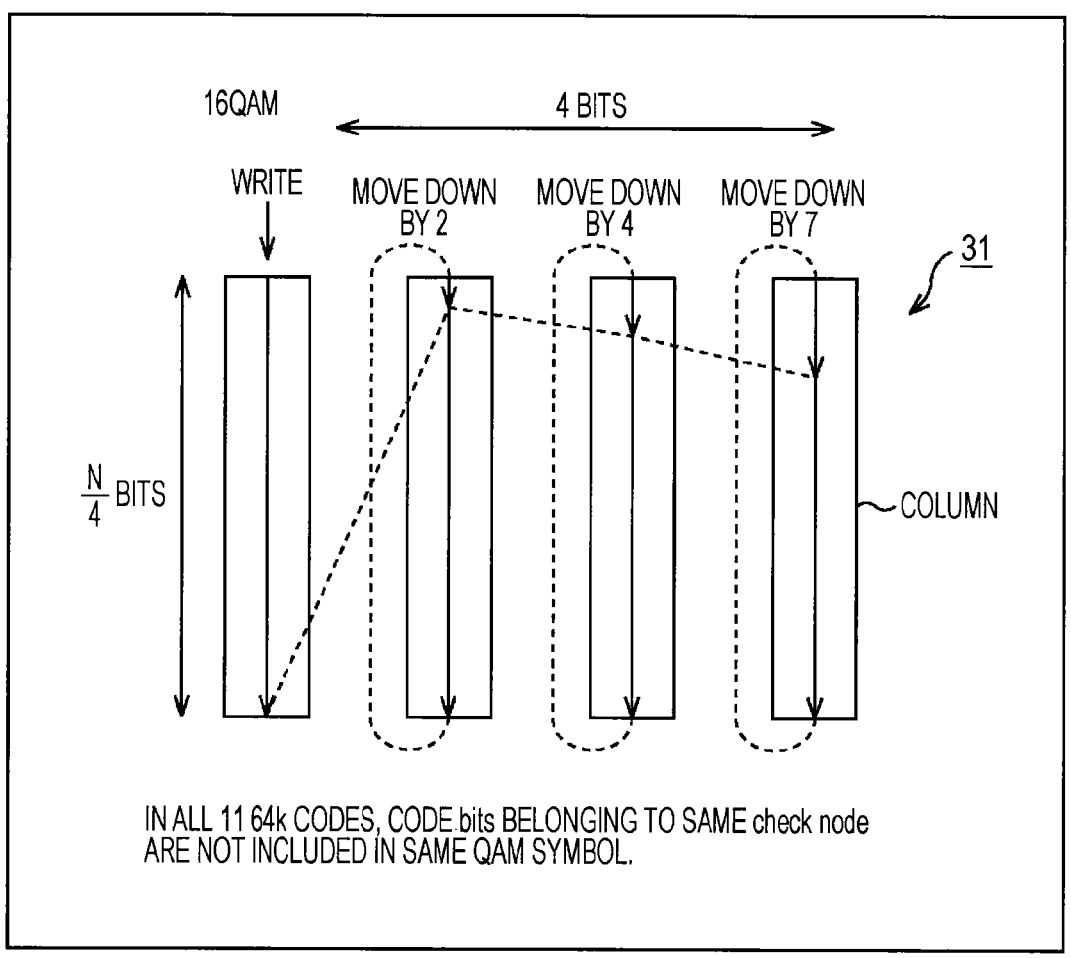
FIG. 24 is a diagram for describing processing of a column twist interleaver 24.

FIG. 24 is a diagram for describing column twist interleaving.

In other words, FIG. 24 illustrates the memory 31 of the demultiplexer 25 (FIGS. 18 and 19).

The memory 31 has a storage capacity of storing mb bits in the column (longitudinal) direction and storing N/(mb) bits in the row (lateral) direction, and is configured with mb columns as described above with reference to FIG. 18. Further, the column twist interleaver 24 performs column twist interleaving by controlling a write start position when the code bits of the LDPC code are written in the column direction and read in the row direction to and from the memory 31.

In other words, the column twist interleaver 24 appropriately changes the write start position to start writing of code bits in each of a plurality of columns such that a plurality of code bits serving as a single symbol read in the row direction do not become code bits corresponding to "1" present in an arbitrary row of a conversion parity check matrix (the code bits of the LDPC code are sorted such that a plurality of code bits corresponding to "1" present in an arbitrary row of a parity check matrix are not included in the same symbol).

Here, FIG. 24 illustrates a configuration example of the memory 31 when the modulation scheme is 16QAM and the multiple b described in FIG. 18 is 1. Thus, the bit number m of the code bits of the LDPC code serving as a single symbol is 4, and the memory 31 is configured with 4 (=mb) columns.

The column twist interleaver 24 (instead of the demultiplexer 25 of FIG. 18) performs writing the code bits of the LDPC code downward (in the column direction) from the top of 4 columns configuring the memory 31 from the left column to the right column.

Further, when writing of the code bits ends up to the rightmost column, the column twist interleaver 24 reads the code bits in the row direction in units of 4 bits (mb bits) starting from the first column of all columns configuring the memory 31, and outputs the code bits to the exchange unit 32 (FIGS. 18 and 19) of the demultiplexer 25 as the LDPC code that has been subjected to column twist interleaving.

Here, in the column twist interleaver 24, when an address of a beginning (top) position of each column is represented by 0 and addresses of respective positions in the column direction is represented by integers in the ascending order, a write start position of the leftmost column is set to the position having the address of 0, a write start position of a second column (from the left) is set to the position having the address of 2, a write start position of a third column is set to the position having the address of 4, and a write start position of a fourth column is set to the position having the address of 7.

Further, for a column whose write start position is a position other than the position having the address of 0, after code bits are written up to the lowest position, it returns to the beginning (the position having the address of 0), and writing is performed up to the position directly before the write start position. Thereafter, writing to a next (right) column is performed.

As such column twist interleaving is performed, the LDPC code specified in the DVB-T.2 standard can avoid a phenomenon that a plurality of code bits corresponding to a plurality of variable node connected to the same check node are used as a single symbol of 16QAM (included in the same symbol), and as a result, decoding performance in the communication path having erasure can be improved.

FIG. 25 illustrates a column number of the memory 31 necessary for column twist interleaving and an address of a write start position for LDPC codes of 11 coding rates, in which the code length N is 64800, specified in the DVB-T.2 standard for each modulation scheme.

When the multiple b is 1 and the bit number m of a single symbol is 2 as, for example, QPSK is employed as a modulation scheme, according to FIG. 25, the memory 31 includes two columns storing 2×1 (=mb) bits in the row direction, and stores 64800/(2×1) bits in the column direction.

Further, of the two columns of the memory 31, the write start position of the first column is the position having the address of 0, and the write start position of the second column is the position having the address of 2.

Further, for example, when any one of the first to third exchanging methods of FIG. 18 is employed as the exchanging method of the exchange process of the demultiplexer 25 (FIG. 9), the multiple b is 1.

When the multiple b is 2 and the bit number m of a single symbol is 2 as, for example, QPSK is employed as a modulation scheme, according to FIG. 25, the memory 31 includes four columns storing 2×2 bits in the row direction, and stores 64800/(2×2) bits in the column direction.

Further, among the four columns of the memory 31, the write start position of the first column is the position having the address of 0, the write start position of the second column is the position having the address of 2, the write start position of the third column is the position having the address of 4, and the write start position of the fourth column is the position having the address of 7.

Further, for example, when the fourth exchanging method of FIG. 19 is employed as the exchanging method of the exchange process of the demultiplexer 25 (FIG. 9), the multiple b is 2.

When the multiple b is 1 and the bit number m of a single symbol is 4 as, for example, 16QAM is employed as a modulation scheme, according to FIG. 25, the memory 31 includes four columns storing 4×1 bits in the row direction, and stores 64800/(4×1) bits in the column direction.

Further, among the four columns of the memory 31, the write start position of the first column is the position having the address of 0, the write start position of the second column is the position having the address of 2, the write start position of the third column is the position having the address of 4, and the write start position of the fourth column is the position having the address of 7.

When the multiple b is 2 and the bit number m of a single symbol is 4 as, for example, 16QAM is employed as a modulation scheme, according to FIG. 25, the memory 31 includes eight columns storing 4×2 bits in the row direction, and stores 64800/(4×2) bits in the column direction.

Further, among the eight columns of the memory 31, the write start position of the first column is the position having the address of 0, the write start position of the second column is the position having the address of 0, the write start position of the third column is the position having the address of 2, the write start position of the fourth column is the position having the address of 4, the write start position of the fifth column is the position having the address of 4, the write start position of the sixth column is the position having the address of 5, the write start position of the seventh column is the position having the address of 7, and the write start position of the eighth column is the position having the address of 7.

When the multiple b is 1 and the bit number m of a single symbol is 6 as, for example, 64QAM is employed as a modulation scheme, according to FIG. 25, the memory 31 includes six columns storing 6×1 bits in the row direction, and stores 64800/(6×1) bits in the column direction.

Further, among the six columns of the memory 31, the write start position of the first column is the position having the address of 0, the write start position of the second column is the position having the address of 2, the write start position of the third column is the position having the address of 5, the write start position of the fourth column is the position having the address of 9, the write start position of the fifth column is the position having the address of 10, and the write start position of the sixth column is the position having the address of 13.

When the multiple b is 2 and the bit number m of a single symbol is 6 as, for example, 64QAM is employed as a modulation scheme, according to FIG. 25, the memory 31 includes twelve columns storing 6×2 bits in the row direction, and stores 64800/(6×2) bits in the column direction.

Further, among the twelve columns of the memory 31, the write start position of the first column is the position having the address of 0, the write start position of the second column is the position having the address of 0, the write start position of the third column is the position having the address of 2, the write start position of the fourth column is the position having the address of 2, the write start position of the fifth column is the position having the address of 3, the write start position of the sixth column is the position having the address of 4, the write start position of the seventh column is the position having the address of 4, the write start position of the eighth column is the position having the address of 5, the write start position of the ninth column is the position having the address of 5, the write start position of the tenth column is the position having the address of 7, the write start position of the eleventh column is the position having the address of 8, and the write start position of the twelfth column is the position having the address of 9.

When the multiple b is 1 and the bit number m of a single symbol is 8 as, for example, 256QAM is employed as a modulation scheme, according to FIG. 25, the memory 31 includes eight columns storing 8×1 bits in the row direction, and stores 64800/(8×1) bits in the column direction.

Further, among the eight columns of the memory 31, the write start position of the first column is the position having the address of 0, the write start position of the second column is the position having the address of 0, the write start position of the third column is the position having the address of 2, the write start position of the fourth column is the position having the address of 4, the write start position of the fifth column is the position having the address of 4, the write start position of the sixth column is the position having the address of 5, the write start position of the seventh column is the position having the address of 7, and the write start position of the eighth column is the position having the address of 7.

When the multiple b is 2 and the bit number m of a single symbol is 8 as, for example, 256QAM is employed as a modulation scheme, according to FIG. 25, the memory 31 includes sixteen columns storing 8×2 bits in the row direction, and stores 64800/(8×2) bits in the column direction.

Further, among the sixteen columns of the memory 31, the write start position of the first column is the position having the address of 0, the write start position of the second column is the position having the address of 2, the write start position of the third column is the position having the address of 2, the write start position of the fourth column is the position having the address of 2, the write start position of the fifth column is the position having the address of 2, the write start position of the sixth column is the position having the address of 3, the write start position of the seventh column is the position having the address of 7, the write start position of the eighth column is the position having the address of 15, the write start position of the ninth column is the position having the address of 16, the write start position of the tenth column is the position having the address of 20, the write start position of the eleventh column is the position having the address of 22, the write start position of the twelfth column is the position having the address of 22, the write start position of the thirteenth column is the position having the address of 27, the write start position of the fourteenth column is the position having the address of 27, the write start position of the fifteenth column is the position having the address of 28, and the write start position of the sixteenth column is the position having the address of 32.

When the multiple b is 1 and the bit number m of a single symbol is 10 as, for example, 1024QAM is employed as a modulation scheme, according to FIG. 25, the memory 31 includes ten columns storing 10×1 bits in the row direction, and stores 64800/(10×1) bits in the column direction.

Further, among the ten columns of the memory 31, the write start position of the first column is the position having the address of 0, the write start position of the second column is the position having the address of 3, the write start position of the third column is the position having the address of 6, the write start position of the fourth column is the position having the address of 8, the write start position of the fifth column is the position having the address of 11, the write start position of the sixth column is the position having the address of 13, the write start position of the seventh column is the position having the address of 15, the write start position of the eighth column is the position having the address of 17, the write start position of the ninth column is the position having the address of 18, and the write start position of the tenth column is the position having the address of 20.

When the multiple b is 2 and the bit number m of a single symbol is 10 as, for example, 1024QAM is employed as a modulation scheme, according to FIG. 25, the memory 31 includes twenty columns storing 10×2 bits in the row direction, and stores 64800/(10×2) bits in the column direction.

Further, among the twenty columns of the memory 31, the write start position of the first column is the position having the address of 0, the write start position of the second column is the position having the address of 1, the write start position of the third column is the position having the address of 3, the write start position of the fourth column is the position having the address of 4, the write start position of the fifth column is the position having the address of 5, the write start position of the sixth column is the position having the address of 6, the write start position of the seventh column is the position having the address of 6, the write start position of the eighth column is the position having the address of 9, the write start position of the ninth column is the position having the address of 13, the write start position of the tenth column is the position having the address of 14, the write start position of the eleventh column is the position having the address of 14, the write start position of the twelfth column is the position having the address of 16, the write start position of the thirteenth column is the position having the address of 21, the write start position of the fourteenth column is the position having the address of 21, the write start position of the fifteenth column is the position having the address of 23, the write start position of the sixteenth column is the position having the address of 25, the write start position of the seventeenth column is the position having the address of 25, the write start position of the eighteenth column is the position having the address of 26, the write start position of the nineteenth column is the position having the address of 28, and the write start position of the twentieth column is the position having the address of 30.

When the multiple b is 1 and the bit number m of a single symbol is 12 as, for example, 4096QAM is employed as a modulation scheme, according to FIG. 25, the memory 31 includes twelve columns storing 12×1 bits in the row direction, and stores 64800/(12×1) bits in the column direction.

Further, among the twelve columns of the memory 31, the write start position of the first column is the position having the address of 0, the write start position of the second column is the position having the address of 0, the write start position of the third column is the position having the address of 2, the write start position of the fourth column is the position having the address of 2, the write start position of the fifth column is the position having the address of 3, the write start position of the sixth column is the position having the address of 4, the write start position of the seventh column is the position having the address of 4, the write start position of the eighth column is the position having the address of 5, the write start position of the ninth column is the position having the address of 5, the write start position of the tenth column is the position having the address of 7, the write start position of the eleventh column is the position having the address of 8, and the write start position of the twelfth column is the position having the address of 9.

When the multiple b is 2 and the bit number m of a single symbol is 12 as, for example, 4096QAM is employed as a modulation scheme, according to FIG. 25, the memory 31 includes twenty four columns storing 12×2 bits in the row direction, and stores 64800/(12×2) bits in the column direction.

Further, among the twenty four columns of the memory 31, the write start position of the first column is the position having the address of 0, the write start position of the second column is the position having the address of 5, the write start position of the third column is the position having the address of 8, the write start position of the fourth column is the position having the address of 8, the write start position of the fifth column is the position having the address of 8, the write start position of the sixth column is the position having the address of 8, the write start position of the seventh column is the position having the address of 10, the write start position of the eighth column is the position having the address of 10, the write start position of the ninth column is the position having the address of 10, the write start position of the tenth column is the position having the address of 12, the write start position of the eleventh column is the position having the address of 13, the write start position of the twelfth column is the position having the address of 16, the write start position of the thirteenth column is the position having the address of 17, the write start position of the fourteenth column is the position having the address of 19, the write start position of the fifteenth column is the position having the address of 21, the write start position of the sixteenth column is the position having the address of 22, the write start position of the seventeenth column is the position having the address of 23, the write start position of the eighteenth column is the position having the address of 26, the write start position of the nineteenth column is the position having the address of 37, the write start position of the twentieth column is the position having the address of 39, the write start position of the twenty first column is the position having the address of 40, the write start position of the twenty second column is the position having the address of 41, the write start position of the twenty third column is the position having the address of 41, and the write start position of the twenty fourth column is the position having the address of 41.

FIG. 26 illustrates a column number of the memory 31 necessary for column twist interleaving and an address of a write start position for LDPC codes of 10 coding rates, in which the code length N is 16200, specified in the DVB-T.2 standard for each modulation scheme.

When the multiple b is 1 and the bit number m of a single symbol is 2 as, for example, QPSK is employed as a modulation scheme, according to FIG. 26, the memory 31 includes two columns storing 2×1 bits in the row direction, and stores 16200/(2×1) bits in the column direction.

Further, of the two columns of the memory 31, the write start position of the first column is the position having the address of 0, and the write start position of the second column is the position having the address of 0.

When the multiple b is 2 and the bit number m of a single symbol is 2 as, for example, QPSK is employed as a modulation scheme, according to FIG. 26, the memory 31 includes four columns storing 2×2 bits in the row direction, and stores 16200/(2×2) bits in the column direction.

Further, among the four columns of the memory 31, the write start position of the first column is the position having the address of 0, the write start position of the second column is the position having the address of 2, the write start position of the third column is the position having the address of 3, and the write start position of the fourth column is the position having the address of 3.

When the multiple b is 1 and the bit number m of a single symbol is 4 as, for example, 16QAM is employed as a modulation scheme, according to FIG. 26, the memory 31 includes four columns storing 4×1 bits in the row direction, and stores 16200/(4×1) bits in the column direction.

Further, among the fourth columns of the memory 31, the write start position of the first column is the position having the address of 0, the write start position of the second column is the position having the address of 2, the write start position of the third column is the position having the address of 3, and the write start position of the fourth column is the position having the address of 3.

When the multiple b is 2 and the bit number m of a single symbol is 4 as, for example, 16QAM is employed as a modulation scheme, according to FIG. 26, the memory 31 includes eight columns storing 4×2 bits in the row direction, and stores 16200/(4×2) bits in the column direction.

Further, among the eighth columns of the memory 31, the write start position of the first column is the position having the address of 0, the write start position of the second column is the position having the address of 0, the write start position of the third column is the position having the address of 0, the write start position of the fourth column is the position having the address of 1, the write start position of the fifth column is the position having the address of 7, the write start position of the sixth column is the position having the address of 20, the write start position of the seventh column is the position having the address of 20, and the write start position of the eighth column is the position having the address of 21.

When the multiple b is 1 and the bit number m of a single symbol is 6 as, for example, 64QAM is employed as a modulation scheme, according to FIG. 26, the memory 31 includes six columns storing 6×1 bits in the row direction, and stores 16200/(6×1) bits in the column direction.

Further, among the six columns of the memory 31, the write start position of the first column is the position having the address of 0, the write start position of the second column is the position having the address of 0, the write start position of the third column is the position having the address of 2, the write start position of the fourth column is the position having the address of 3, the write start position of the fifth column is the position having the address of 7, and the write start position of the sixth column is the position having the address of 7.

When the multiple b is 2 and the bit number m of a single symbol is 6 as, for example, 64QAM is employed as a modulation scheme, according to FIG. 26, the memory 31 includes twelve columns storing 6×2 bits in the row direction, and stores 16200/(6×2) bits in the column direction.

Further, among twelve columns of the memory 31, the write start position of the first column is the position having the address of 0, the write start position of the second column is the position having the address of 0, the write start position of the third column is the position having the address of 0, the write start position of the fourth column is the position having the address of 2, the write start position of the fifth column is the position having the address of 2, the write start position of the sixth column is the position having the address of 2, the write start position of the seventh column is the position having the address of 3, the write start position of the eighth column is the position having the address of 3, the write start position of the ninth column is the position having the address of 3, the write start position of the tenth column is the position having the address of 6, the write start position of the eleventh column is the position having the address of 7, and the write start position of the twelfth column is the position having the address of 7.

When the multiple b is 1 and the bit number m of a single symbol is 8 as, for example, 256QAM is employed as a modulation scheme, according to FIG. 26, the memory 31 includes eight columns storing 8×1 bits in the row direction, and stores 16200/(8×1) bits in the column direction.

Further, among the eighth columns of the memory 31, the write start position of the first column is the position having the address of 0, the write start position of the second column is the position having the address of 0, the write start position of the third column is the position having the address of 0, the write start position of the fourth column is the position having the address of 1, the write start position of the fifth column is the position having the address of 7, the write start position of the sixth column is the position having the address of 20, the write start position of the seventh column is the position having the address of 20, and the write start position of the eighth column is the position having the address of 21.

When the multiple b is 1 and the bit number m of a single symbol is 10 as, for example, 1024QAM is employed as a modulation scheme, according to FIG. 26, the memory 31 includes ten columns storing 10×1 bits in the row direction, and stores 16200/(10×1) bits in the column direction.

Further, among the ten columns of the memory 31, the write start position of the first column is the position having the address of 0, the write start position of the second column is the position having the address of 1, the write start position of the third column is the position having the address of 2, the write start position of the fourth column is the position having the address of 2, the write start position of the fifth column is the position having the address of 3, the write start position of the sixth column is the position having the address of 3, the write start position of the seventh column is the position having the address of 4, the write start position of the eighth column is the position having the address of 4, the write start position of the ninth column is the position having the address of 5, and the write start position of the tenth column is the position having the address of 7.

When the multiple b is 2 and the bit number m of a single symbol is 10 as, for example, 1024QAM is employed as a modulation scheme, according to FIG. 26, the memory 31 includes twenty columns storing 10×2 bits in the row direction, and stores 16200/(10×2) bits in the column direction.

Further, among the twenty columns of the memory 31, the write start position of the first column is the position having the address of 0, the write start position of the second column is the position having the address of 0, the write start position of the third column is the position having the address of 0, the write start position of the fourth column is the position having the address of 2, the write start position of the fifth column is the position having the address of 2, the write start position of the sixth column is the position having the address of 2, the write start position of the seventh column is the position having the address of 2, the write start position of the eighth column is the position having the address of 2, the write start position of the ninth column is the position having the address of 5, the write start position of the tenth column is the position having the address of 5, the write start position of the eleventh column is the position having the address of 5, the write start position of the twelfth column is the position having the address of 5, the write start position of the thirteenth column is the position having the address of 5, the write start position of the fourteenth column is the position having the address of 7, the write start position of the fifteenth column is the position having the address of 7, the write start position of the sixteenth column is the position having the address of 7, the write start position of the seventeenth column is the position having the address of 7, the write start position of the eighteenth column is the position having the address of 8, the write start position of the nineteenth column is the position having the address of 8, and the write start position of the twentieth column is the position having the address of 10.

When the multiple b is 1 and the bit number m of a single symbol is 12 as, for example, 4096QAM is employed as a modulation scheme, according to FIG. 26, the memory 31 includes twelve columns storing 12×1 bits in the row direction, and stores 16200/(12×1) bits in the column direction.

Further, among twelve columns of the memory 31, the write start position of the first column is the position having the address of 0, the write start position of the second column is the position having the address of 0, the write start position of the third column is the position having the address of 0, the write start position of the fourth column is the position having the address of 2, the write start position of the fifth column is the position having the address of 2, the write start position of the sixth column is the position having the address of 2, the write start position of the seventh column is the position having the address of 3, the write start position of the eighth column is the position having the address of 3, the write start position of the ninth column is the position having the address of 3, the write start position of the tenth column is the position having the address of 6, the write start position of the eleventh column is the position having the address of 7, and the write start position of the twelfth column is the position having the address of 7.

When the multiple b is 2 and the bit number m of a single symbol is 12 as, for example, 4096QAM is employed as a modulation scheme, according to FIG. 26, the memory 31 includes twenty four columns storing 12×2 bits in the row direction, and stores 16200/(12×2) bits in the column direction.

Further, among the twenty four columns of the memory 31, the write start position of the first column is the position having the address of 0, the write start position of the second column is the position having the address of 0, the write start position of the third column is the position having the address of 0, the write start position of the fourth column is the position having the address of 0, the write start position of the fifth column is the position having the address of 0, the write start position of the sixth column is the position having the address of 0, the write start position of the seventh column is the position having the address of 0, the write start position of the eighth column is the position having the address of 1, the write start position of the ninth column is the position having the address of 1, the write start position of the tenth column is the position having the address of 1, the write start position of the eleventh column is the position having the address of 2, the write start position of the twelfth column is the position having the address of 2, the write start position of the thirteenth column is the position having the address of 2, the write start position of the fourteenth column is the position having the address of 3, the write start position of the fifteenth column is the position having the address of 7, the write start position of the sixteenth column is the position having the address of 9, the write start position of the seventeenth column is the position having the address of 9, the write start position of the eighteenth column is the position having the address of 9, the write start position of the nineteenth column is the position having the address of 10, the write start position of the twentieth column is the position having the address of 10, the write start position of the twenty first column is the position having the address of 10, the write start position of the twenty second column is the position having the address of 10, the write start position of the twenty third column is the position having the address of 10, and the write start position of the twenty fourth column is the position having the address of 11.

Figure 27:
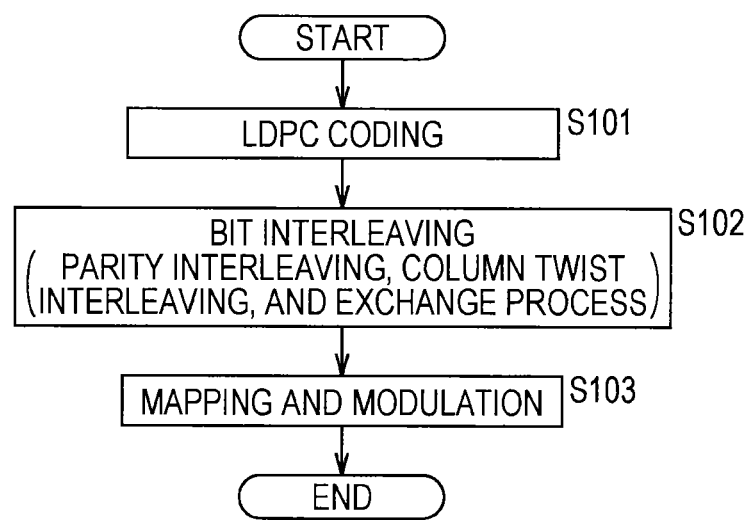
FIG. 27 is a flowchart for describing processing performed by a bit interleaver 116 and a QAM encoder 117.

FIG. 27 is a flowchart for describing processing by the LDPC encoder 115, the bit interleaver 116, and the QAM encoder 117 of FIG. 8.

The LDPC encoder 115 is on standby for supply of LDPC target data from the BCH encoder 114, and in step S101, the LDPC encoder 115 encodes the LDPC target data into an LDPC code, and supplies the LDPC code to the bit interleaver 116, and the process proceeds to step S102.

In step S102, the bit interleaver 116 performs bit interleaving on the LDPC code from the LDPC encoder 115, and supplies a symbol obtained by symbolizing the bit-interleaved LDPC code to the QAM encoder 117, and then the process proceeds to step S103.

In other words, in step S102, the parity interleaver 23 in the bit interleaver 116 (FIG. 9) performs parity interleaving on the LDPC code from the LDPC encoder 115, and supplies the parity-interleaved LDPC code to the column twist interleaver 24.

The column twist interleaver 24 performs column twist interleaving on the LDPC code from the parity interleaver 23, and supplies the resultant LDPC code to the demultiplexer 25.

The demultiplexer 25 performs the exchange process of exchanging the code bits of the LDPC code that has been subjected to column twist interleaving by the column twist interleaver 24 and using the exchanged code bits as symbol bits of a symbol (bits representing a symbol).

Here, the exchange process by the demultiplexer 25 can be performed according to not only the first to fourth exchanging methods illustrated in FIGS. 18 and 19 but also an allocation rule. The allocation rule is a rule for allocating code bits of an LDPC code to symbol bits representing a symbol, and the details thereof will be described later.

The symbol obtained by the exchange process by the demultiplexer 25 is supplied from the demultiplexer 25 to the QAM encoder 117.

In step S103, the QAM encoder 117 performs quadrature modulation by mapping the symbol from the demultiplexer 25 to a signal point decided by a modulation scheme of quadrature modulation performed by the QAM encoder 117, and supplies the resultant data to the time interleaver 118.

As described above, as parity interleaving and column twist interleaving are performed, it is possible to improve tolerance for erasure or a burst error occurring when a plurality of code bits of an LDPC code are transmitted as a single symbol.

Here, in FIG. 9, for the sake of convenience of description, the parity interleaver 23 serving as a block performing parity interleaving and the column twist interleaver 24 serving as a block performing column twist interleaving are separately configured, but the parity interleaver 23 and the column twist interleaver 24 may be configured integrally with each other.

In other words, both parity interleaving and column twist interleaving can be performed by writing and reading of code bits to and from a memory and represented by a matrix of converting an address (write address) used to write code bits into an address (read address) used to read code bits.

Thus, when a matrix is obtained by multiplying a matrix representing parity interleaving by a matrix representing column twist interleaving, by converting code bits through the matrix, a result of performing parity interleaving and further performing column twist interleaving on the parity-interleaved LDPC code can be obtained.

Further, the demultiplexer 25 can be integrally configured in addition to the parity interleaver 23 and the column twist interleaver 24.

In other words, the exchange process performed by the demultiplexer 25 can be also represented by a matrix of converting the write address of the memory 31 storing an LDPC code to the read address.

Thus, when a matrix is obtained by multiplying a matrix representing parity interleaving by a matrix representing column twist interleaving and a matrix representing the exchange process, parity interleaving, column twist interleaving, and the exchange process can be performed together through the matrix.

Further, either or both of parity interleaving and column twist interleaving may not be performed.

Next, simulation of measuring an error rate (bit error rate) performed on the transmitting device 11 of FIG. 8 will be described with reference to FIGS. 28 to 30.

The simulation was performed using a communication path that is a flutter having the D/U of 0 dB.

FIG. 28 illustrates a model of the communication path employed in the simulation.

In other words, A of FIG. 28 illustrates a model of a flutter employed in the simulation.

Further, B of FIG. 28 illustrates a model of the communication path that is the flutter represented by the model of A of FIG. 28.

In B of FIG. 28, H represents the model of the flutter of A of FIG. 28. Further, in B of FIG. 28, N represents ICI (Inter Carrier Interference), and in the simulation, an expectation value $E[N^2]$ of power thereof was approximated by the AWGN.

Figure 30:
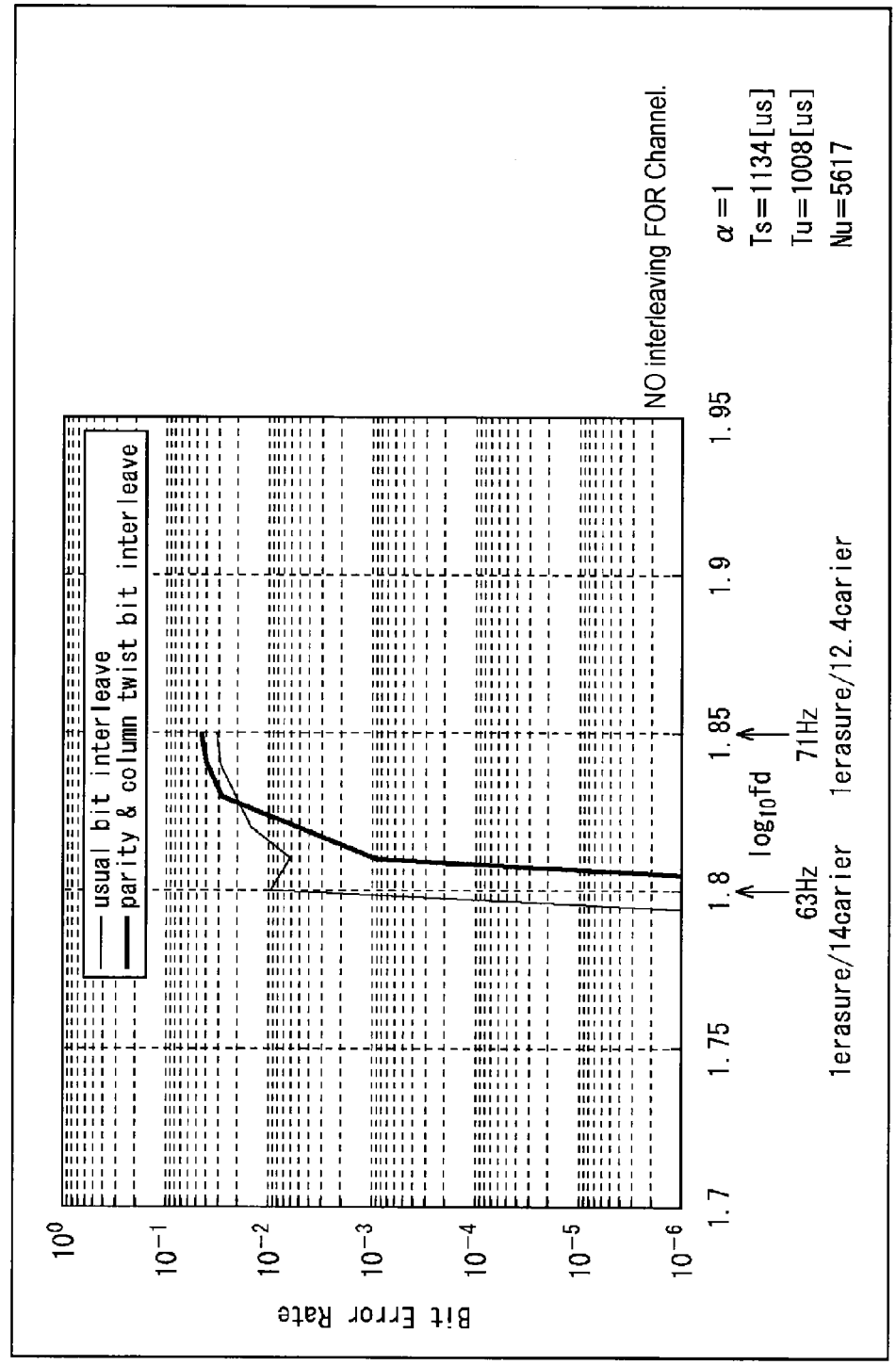
FIG. 30 is a diagram illustrating a relation between an error rate obtained in a simulation and a Doppler frequency $f_d$ of a flutter.

FIGS. 29 and 30 illustrate a relation between an error rate obtained in the simulation and a Doppler frequency $f_d$ of the flutter.

FIG. 29 illustrates a relation between the error rate and the Doppler frequency $f_d$ when the modulation scheme is 16QAM, the coding rate (r) is (3/4), and the exchanging method is the first exchanging method. FIG. 30 illustrates a relation between the error rate and the Doppler frequency $f_d$ when the modulation scheme is 64QAM, the coding rate (r) is (5/6), and the exchanging method is the first exchanging method.

Further, in FIGS. 29 and 30, a thick line represents a relation between the error rate and the Doppler frequency $f_d$ when all of parity interleaving, column twist interleaving, and the exchange process are performed, and a thin line represents a relation between the error rate and the Doppler frequency $f_d$ when among parity interleaving, column twist interleaving, and the exchange process, only the exchange process is performed.

In both FIGS. 29 and 30, it can be understood that the error rate is more improved (decreases) when all of parity interleaving, column twist interleaving, and the exchange process are performed than when only the exchange process is performed.

[Configuration Example of LDPC Encoder 115]

Figure 31:
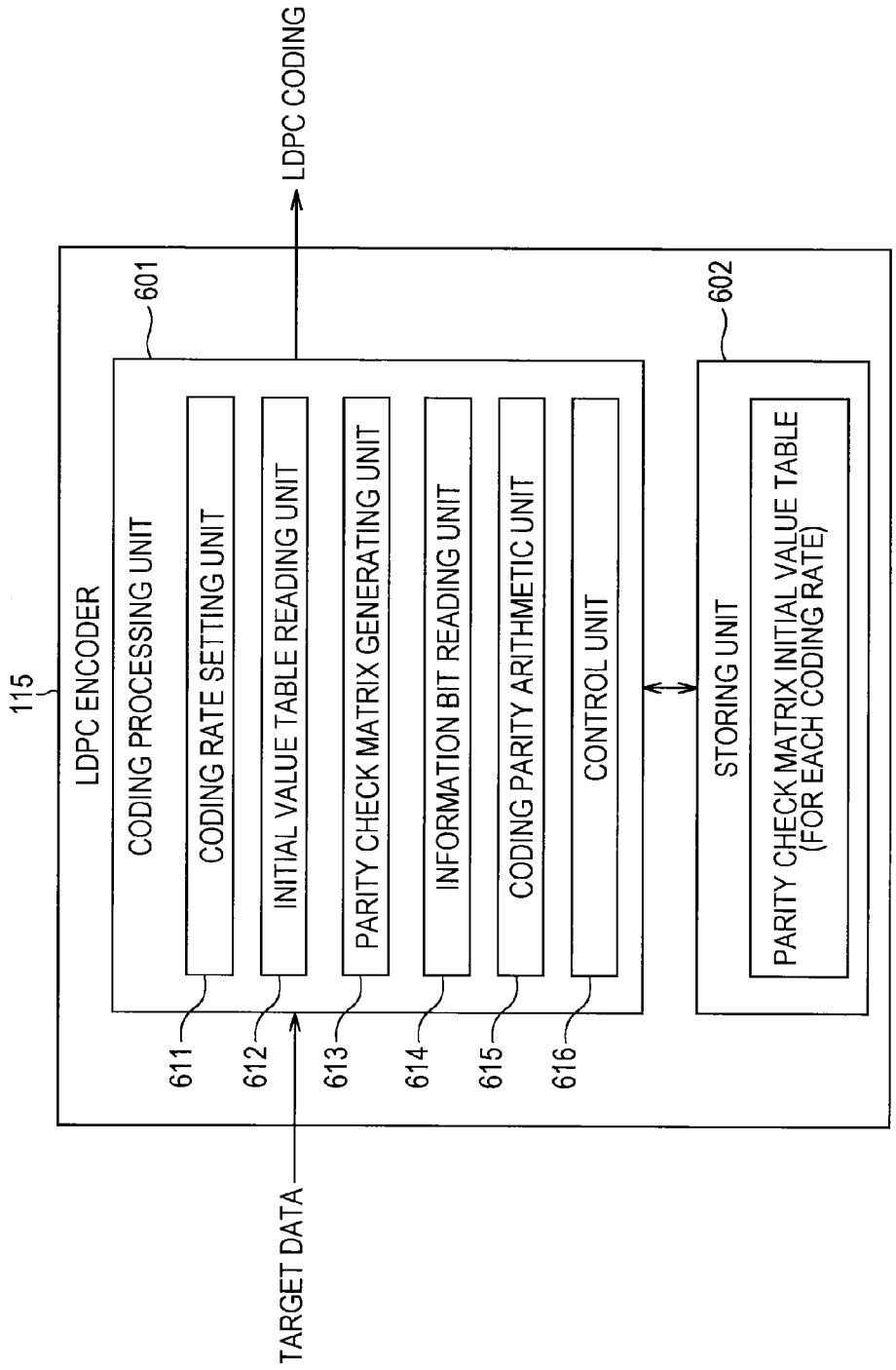
FIG. 31 is a block diagram illustrating a configuration example of an LDPC encoder 115.

FIG. 31 is a block diagram illustrating a configuration example of the LDPC encoder 115 of FIG. 8.

The LDPC encoder 122 of FIG. 8 has a similar configuration.

As described above with reference to FIGS. 12 and 13, LDPC codes having two types of code lengths N of 64800 bits and 16200 bits are specified in the DVB-T.2 standard.

For the LDPC code having the code length N of 64800 bits, 11 coding rates 1/4, 1/3, 2/5, 1/2, 3/5, 2/3, 3/4, 4/5, 5/6, 8/9, and 9/10 are specified, and for the LDPC code having the code length N of 16200 bits, 10 coding rates 1/4, 1/3, 2/5, 1/2, 3/5, 2/3, 3/4, 4/5, 5/6, and 8/9 are specified (FIGS. 12 and 13).

For example, the LDPC encoder 115 performs encoding (error correction coding) by an LDPC code of each coding rate having the code length N of 64800 bits or 16200 bits according to the parity check matrix H prepared for each code length N and each coding rate.

The LDPC encoder 115 includes a coding processing unit 601 and a storing unit 602.

The coding processing unit 601 includes a coding rate setting unit 611, an initial value table reading unit 612, a parity check matrix generating unit 613, an information bit reading unit 614, a coding parity arithmetic unit 615, and a control unit 616, and performs LDPC coding on the LDPC target data supplied to the LDPC encoder 115, and supplies the resultant LDPC code to the bit interleaver 116 (FIG. 8).

In other words, the coding rate setting unit 611 sets the code length N and the coding rate of the LDPC code, for example, according to the operator's operation.

The initial value table reading unit 612 reads a parity check matrix initial value (which will be described later) corresponding to the code length N and the coding rate set by the coding rate setting unit 611 from the storing unit 602.

The parity check matrix generating unit 613 arranges elements of "1" of the information matrix $H_A$ corresponding to the information length K (=the code length N−the parity length M) according to the code length N and the coding rate set by the coding rate setting unit 611 in the column direction with a period of 360 columns (the unit column number P of the cyclic structure) based on a parity check matrix initial value table read by the initial value table reading unit 612, generates the parity check matrix H, and stores the parity check matrix H in the storing unit 602.

The information bit reading unit 614 reads (extracts) information bits corresponding to the information length K from the LDPC target data supplied to the LDPC encoder 115.

The coding parity arithmetic unit 615 reads the parity check matrix H generated by the parity check matrix generating unit 613 from the storing unit 602, calculates a parity bit on the information bit read by the information bit reading unit 614 based on a predetermined formula using the parity check matrix H, and generates a code word (an LDPC code).

The control unit 616 controls the blocks configuring the coding processing unit 601.

For example, the storing unit 602 stores a plurality of parity check matrix initial value tables respectively corresponding to a plurality of coding rates illustrated in FIGS. 12 and 13 on each code length N such as 64800 bits and 16200 bits. Further, the storing unit 602 temporarily stores data necessary for processing of the coding processing unit 601.

Figures 32, 33:
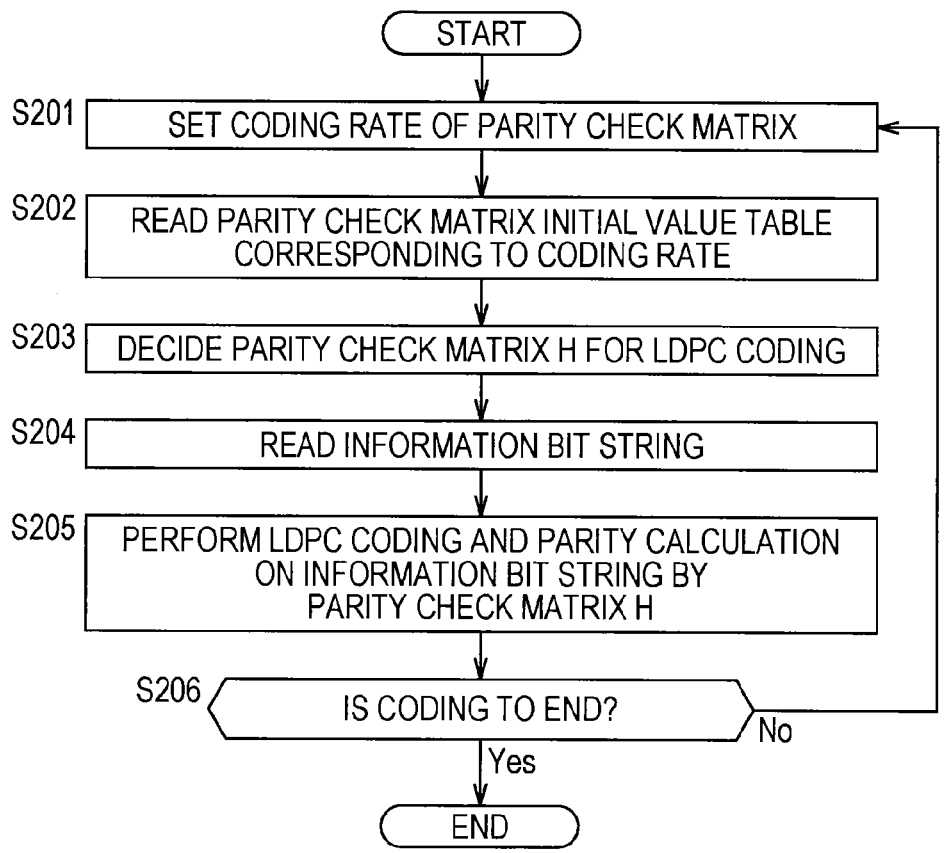
FIG. 32 is a flowchart for describing processing of the LDPC encoder 115.
FIG. 33 is a diagram illustrating an example of a parity check matrix initial value table in which a coding rate is 1/4 and a code length is 16200.

FIG. 32 is a flowchart for describing processing of the LDPC encoder 115 of FIG. 31.

In step S201, the coding rate setting unit 611 decides (sets) the code length N and the coding rate r which LDPC coding is performed based on.

In step S202, the initial value table reading unit 612 reads a predetermined parity check matrix initial value table corresponding to the code length N and the coding rate r decided by the coding rate setting unit 611 from the storing unit 602.

In step S203, the parity check matrix generating unit 613 obtains (generates) the parity check matrix H of the LDPC code of the code length N and the coding rate r decided by the coding rate setting unit 611 using the parity check matrix initial value table read from the storing unit 602 by the initial value table reading unit 612, and supplies the parity check matrix H to be stored in the storing unit 602.

In step S204, the information bit reading unit 614 reads information bits of the information length K (=N×r) corresponding to the code length N and the coding rate r decided by the coding rate setting unit 611 from the LDPC target data supplied to the LDPC encoder 115, reads the parity check matrix H obtained by the parity check matrix generating unit 613 from the storing unit 602, and supplies the read information bits and the parity check matrix H to the coding parity arithmetic unit 615.

In step S205, the coding parity arithmetic unit 615 sequentially calculates parity bits of the code word c satisfying Formula (8):

$$Hc^T=0 \quad (8)$$

In Formula (8), c represents the row vector serving as the code word (the LDPC code), and $c^T$ represents transposition of the row vector c.

Here, as described above, when a portion of the information bit in the row vector c serving as the LDPC code (one code word) is represented by the row vector A and a portion of the parity bit is represented by the row vector T, the row vector c can be expressed by a formula c=[A|T] by the row vector A serving as the information bit and the row vector T serving as the parity bit.

The parity check matrix H and the row vector c=[A|T] serving as the LDPC code need to satisfy a formula $Hc^T=0$, and the row vector T serving as the parity bit configuring the row vector c=[A|T] satisfying the formula $Hc^T=0$ may be sequentially obtained by causing an element of each row to be zero (0) in order starting from an element of a first row of a column vector $Hc^T$ in the formula $Hc^T=0$ when the parity matrix $H_T$ of the parity check matrix H=[$H_A|H_T$] has the staircase structure illustrated in FIG. 11.

When the parity bit T is obtained for the information bit A, the coding parity arithmetic unit 615 outputs the code word c=[A|T] represented by the information bit A and the parity bit T as an LDPC coding result of the information bit A.

Thereafter, in step S206, the control unit 616 determines whether or not LDPC coding is to end. When it is determined in step S206 that LDPC coding is not to end, that is, for example, when there is still LDPC target data that is to be subjected to LDPC coding, the process returns to step S201 (or step S204), and then the process of steps S201 (or step S204) to S206 is repeated.

Further, when it is determined in step S206 that LDPC coding is to end, that is, for example, when there is no LDPC target data that is to be subjected to LDPC coding, the LDPC encoder 115 ends the process.

As described above, the parity check matrix initial value table corresponding to each code length N and each coding rate r remains prepared, and the LDPC encoder 115 performs LDPC coding of a predetermined code length N and a predetermined coding rate r using the parity check matrix H generated from the parity check matrix initial value table corresponding to the predetermined code length N and the predetermined coding rate r.

[Example of Parity Check Matrix Initial Value Table]

The parity check matrix initial value table is a table that represents a position of an element of "1" of the information matrix $H_A$ (FIG. 10) of the parity check matrix H corresponding to the information length K according to the code length N and the coding rate r of the LDPC code (the LDPC code defined by the parity check matrix H) for every 360 columns (the unit column number P of the cyclic structure) and is generated in advance for each parity check matrix H of each code length N and each coding rate r.

FIG. 33 is a diagram illustrating an example of the parity check matrix initial value table.

In other words, FIG. 33 illustrates a parity check matrix initial value table corresponding to a parity check matrix H, in which the code length N is 16200 bits and the coding rate (the coding rate described in DVB-T.2) r is 1/4, specified in the DVB-T.2 standard.

The parity check matrix generating unit 613 (FIG. 31) obtains the parity check matrix H using the parity check matrix initial value table as follows.

In other words, FIG. 34 illustrates a method of obtaining the parity check matrix H from the parity check matrix initial value table.

The parity check matrix initial value table of FIG. 34 is a parity check matrix initial value table corresponding to a parity check matrix H, in which the code length N is 16200 bits and the coding rate r is 2/3, specified in the DVB-T.2 standard.

The parity check matrix initial value table is a table that represents a position of an element of "1" of the information matrix $H_A$ (FIG. 10) corresponding to the information length K according to the code length N and the coding rate r of the LDPC code for every 360 columns (the unit column number P of the cyclic structure) as described above, and in an i-th row thereof, row numbers (row numbers causing a first row number of the parity check matrix H to be 0) of elements of "1" of a (1+360×(i−1))-th column of the parity check matrix H are arranged by a number of a column weight of the (1+360×(i−1))-th column.

Here, since the parity matrix $H_T$ (FIG. 10) of the parity check matrix H corresponding to the parity length M is set as illustrated in FIG. 21, the information matrix $H_A$ (FIG. 10) of the parity check matrix H corresponding to the information length K is obtained according to the parity check matrix initial value table.

A row number k+1 of the parity check matrix initial value table differs according to the information length K.

A relation of Formula (9) is established between the information length K and the row number k+1 of the parity check matrix initial value table.

$$K=(k+1)\times 360 \qquad (9)$$

Here, 360 of Formula (9) is the unit column number P of the cyclic structure described in FIG. 22.

In the parity check matrix initial value table of FIG. 34, 13 numerical numbers are arranged in each of a first row to a third row, and 3 numerical numbers are arranged in each of a fourth row to a (k+1)-th row (a 30-th row in FIG. 34).

Thus, the column weight of the parity check matrix H obtained from the parity check matrix initial value table of FIG. 34 is 13 for columns from a first column to a (1+360×(3−1)−1)-th column, and 3 for columns from a (1+360×(3−1))-th column to a K-th column.

0, 2084, 1613, 1548, 1286, 1460, 3196, 4297, 2481, 3369, 3451, 4620, and 2622 are arranged in the first row of the parity check matrix initial value table of FIG. 34, and in the first column of the parity check matrix H, this represents that elements of rows whose row numbers are 0, 2084, 1613, 1548, 1286, 1460, 3196, 4297, 2481, 3369, 3451, 4620, and 2622 are "1" (other elements are "0").

Further, 1, 122, 1516, 3448, 2880, 1407, 1847, 3799, 3529, 373, 971, 4358, and 3108 are arranged in the second column of the parity check matrix initial value table of FIG. 34, and in the 361 (=1+360×(2−1))-th column of the parity check matrix H, this represents that elements of rows whose row numbers are 1, 122, 1516, 3448, 2880, 1407, 1847, 3799, 3529, 373, 971, 4358, and 3108 are "1."

As described above, the parity check matrix initial value table represents the position of an element of 1 of the information matrix $H_A$ of the parity check matrix H for every 360 columns.

Columns of the parity check matrix H other than a (1+360×(i−1))-th column, that is, columns from a (2+360×(i−1))-th column to a (360×i)-th column are ones in which elements of 1 of the (1+360×(i−1))-th column decided by the parity check matrix initial value table are periodically cyclic-shifted downward (downward in the column direction) according to the parity length M and arranged.

In other words, for example, the (2+360×(i−1))-th column is one which the (1+360×(i−1))-th column is cyclic-shifted downward by M/360 (=q), and a next (3+360×(i−1))-th column is one in which the (1+360×(i−1))-th column is cyclic-shifted downward by 2×M/360 (=2×q) (one in which the (2+360×(i−1))-th column is cyclic-shifted downward by M/360 (=q)). For example, in case of encoding in which the code length is 16 k bits and the coding rate is 4/15, since the parity length M is 11880 (=16200×11/15) and q is 33 (=M/360=11880/360), elements of 1 of the second row are ones in which elements of 1 of the first row are shifted downward by 33, and elements of 1 of the third row are ones in which elements of 1 of the second row are shifted downward by 33.

Here, when a numerical number of a j-th column (a j-th column from the left) of an i-th row (an i-th row from the top) of the parity check matrix initial value table is represented by $h_{i,j}$ and a row number of a j-th element of 1 of a w-th column of the parity check matrix H is represented by $H_{w\text{-}j}$, the row number $H_{w\text{-}j}$ of an element of 1 of the w-th column that is a column of the parity check matrix H other than the (1+360×(i−1))-th column may be obtained by Formula (10).

$$H_{w\text{-}j}=mod\{h_{i,j}+mod((w-1),P)\times q,M\} \qquad (10)$$

Here, mod(x, y) means a remainder when x is divided by y.

Further, P is the unit column number of the cyclic structure described above, and for example, 360 in the DVB-T.2 standard. Further, q is a value M/360 obtained by dividing the parity length M by the unit column number P of the cyclic structure (=360).

The parity check matrix generating unit 613 (FIG. 31) specifies the row number of an element of 1 of the (1+360×(i−1))-th column of the parity check matrix H based on the parity check matrix initial value table.

Further, the parity check matrix generating unit 613 (FIG. 31) obtains the row number of an element of 1 of the w-th column that is a column of the parity check matrix H other than the (1+360×(i−1))-th column according to Formula (10), and generates a parity check matrix H in which an element of the obtained row number is 1.

[LDPC Code Appropriate to Mobile Terminal]

Meanwhile, digital broadcasting for mobile terminals is advantages in cost if specifications of transmitting device and a receiving device confirming to, for example, DVB-T.2 which is a digital broadcasting standard for fixed terminals can be implemented without any change if possible.

Here, LDPC codes of two code lengths, that is, the code lengths N of 64 k bits and 16 k bits are specified in DVB-T.2.

If an LDPC code specified in DVB-T.2 is employed in digital broadcasting for mobile terminals, since an LDPC code of a short code length rather than an LDPC code of a long code length is advantages in reducing a memory or a delay necessary at the time of LDPC code decoding or the like, it is desirable to employ the LDPC code having the short code length of 16 k bits in the LDPC codes of the two code lengths specified in DVB-T.2 in digital broadcasting for mobile terminals.

However, in mobile terminals, in order to reduce a load necessary for processing such as LDPC code decoding, for example, a repeat count (repeated decoding number C) of LDPC code decoding may be more restricted than in fixed terminals, and in digital broadcasting for mobile terminals, the LDPC code of 16 k bits specified in DVB-T.2 may not have sufficient tolerance for an error.

In this regard, the transmitting device 11 (FIG. 7) can perform digital broadcasting for mobile terminals using a new LDPC code of 16 k bits having more tolerance for an error than the LDPC code of 16 k bits specified in DVB-T.2 as an LDPC code (hereinafter, also referred to as a "mobile LDPC code") suitable for digital broadcasting for mobile terminals.

In the mobile LDPC code, in order to maintain compatibility with DVB-T.2 as much as possible, a parity matrix $H_T$ of a parity check matrix H has the staircase structure (FIG. 11), similarly to the LDPC code specified in DVB-T.2.

Further, in the mobile LDPC code, similarly to the LDPC code specified in DVB-T.2, the information matrix $H_A$ of the parity check matrix H has the cyclic structure, and the unit column number P of the cyclic structure is assumed to be 360.

FIGS. 35 to 43 are diagrams illustrating examples of a parity check matrix initial value table of the (mobile) LDPC code in which the code length N is 16 k bits.

In other words, FIG. 35 illustrates a parity check matrix initial value table for a parity check matrix H in which the code length N is 16 k bits and the coding rate r is 1/5.

FIG. 36 illustrates a parity check matrix initial value table for a parity check matrix H in which the code length N is 16 k bits and the coding rate r is 4/15.

FIG. 37 illustrates a parity check matrix initial value table for a parity check matrix H in which the code length N is 16 k bits and the coding rate r is 1/3.

FIG. 38 illustrates a parity check matrix initial value table for a parity check matrix H in which the code length N is 16 k bits and the coding rate r is 2/5.

FIG. 39 illustrates a parity check matrix initial value table for a parity check matrix H in which the code length N is 16 k bits and the coding rate r is 4/9.

FIG. 40 illustrates a parity check matrix initial value table for a parity check matrix H in which the code length N is 16 k bits and the coding rate r is 7/15.

FIG. 41 illustrates a parity check matrix initial value table for a parity check matrix H in which the code length N is 16 k bits and the coding rate r is 8/15.

FIG. 42 illustrates a parity check matrix initial value table for a parity check matrix H in which the code length N is 16 k bits and the coding rate r is 3/5.

FIG. 43 illustrates a parity check matrix initial value table for a parity check matrix H in which the code length N is 16 k bits and the coding rate r is 2/3.

The LDPC encoder 115 (FIGS. 8 and 31) performs encoding to an LDPC code in which the code length N is 16 k bits and the coding rate r is one of nine types of 1/5, 4/15, 1/3, 2/5, 4/9, 7/15, 8/15, 3/5, and 2/3 for digital broadcasting for mobile terminal using the parity check matrix H obtained from the parity check matrix initial value tables illustrated in FIGS. 35 to 43.

An LDPC code obtained using the parity check matrix H obtained from the parity check matrix initial value tables of FIGS. 35 to 43 is an LDPC code having excellent performance.

Here, the LDPC code having excellent performance is an LDPC code obtained from an appropriate parity check matrix H.

Further, the appropriate parity check matrix H is a parity check matrix that is low in BER (Bit Error Rate) and satisfies a predetermined condition when the LDPC code obtained from the parity check matrix H is transmitted at low $E_s/N_0$ (a signal power to noise power ratio per symbol) or at low $E_b/N_o$ (a signal power to noise power ratio per bit).

For example, the appropriate parity check matrix H can be obtained by performing simulation of measuring BER when LDPC codes obtained from various check matrices satisfying a predetermined condition are transmitted at low $E_s/N_o$.

Examples of the predetermined condition that has to be satisfied by the appropriate parity check matrix H include a condition that an analysis result obtained by a code performance analysis method called a density evolution is good and a condition that there is no loop of elements of 1 called cycle 4.

Here, when elements of 1 are densely arranged in the information matrix $H_A$ as in cycle 4, LDPC code decoding performance is known to deteriorate, and for this reason, a condition that there is no cycle 4 is necessary as the predetermined condition that has to be satisfied by the appropriate parity check matrix H.

Further, the predetermined condition that has to be satisfied by the appropriate parity check matrix H may be appropriately decided from a point of view of improvement in LDPC code decoding performance or easiness (simplification) of an LDPC code decoding process.

Figure 44:
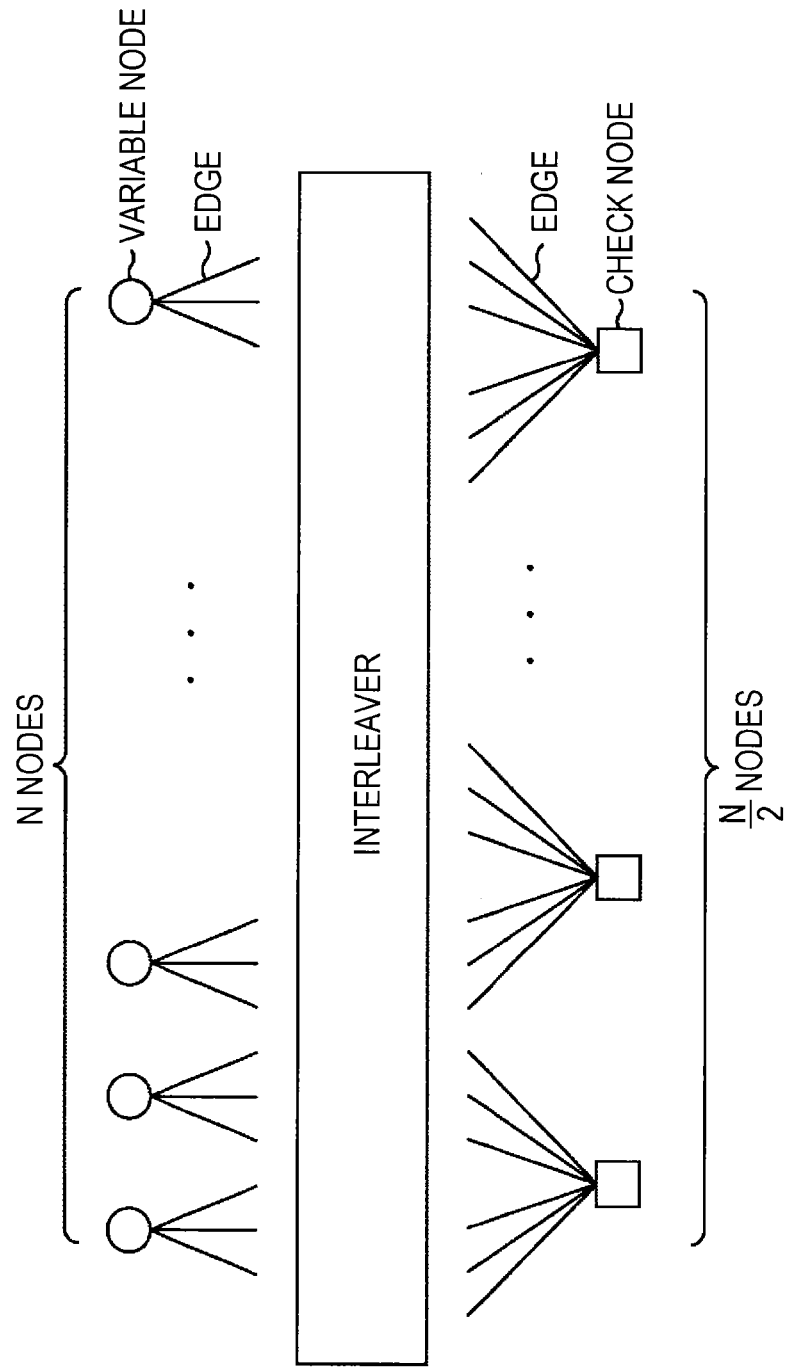
FIG. 44 is a diagram illustrating an example of a tanner graph of an ensemble of a degree sequence in which a column weight is 3 and a row weight is 6.
Figure 45:
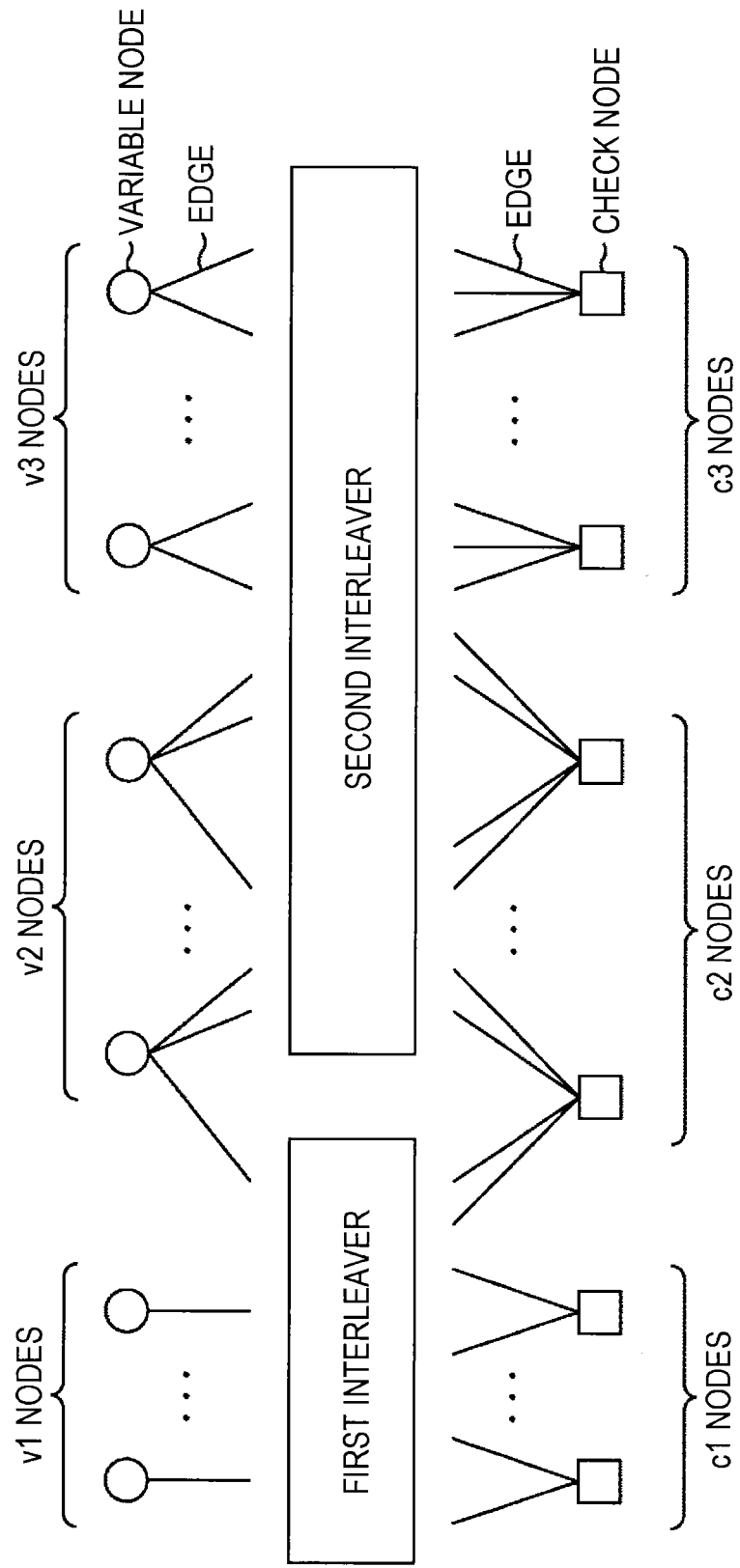
FIG. 45 is a diagram illustrating an example of a tanner graph of an ensemble of a multi-edge type.

FIGS. 44 and 45 are diagrams for describing a density evolution by which an analysis result serving as the predetermined condition that has to be satisfied by the appropriate parity check matrix H is obtained.

The density evolution is a code analysis technique of calculating an expectation value of an error probability on all LDPC codes (an ensemble) in which the code length N characterized by a degree sequence which will be described later is infinite (∞).

For example, when a variance value of noise continuously increases from 0 on an AWGN channel, an expectation value of an error probability of a certain ensemble is 0 at the beginning but is not 0 when a variance value of noise is a certain threshold value or more.

According to the density evolution, it can be decided whether performance of an ensemble is good or bad (a parity check matrix is appropriate or not) by comparing a threshold value (hereinafter, also referred to as a "performance threshold value") of the variance value of noise from which an expectation value of an error probability is not 0.

Further, when an ensemble to which a specific LDPC code belongs is decided for the specific LDPC code and then the density evolution is performed on the ensemble, rough performance of the LDPC code can be predicted.

Thus, when an ensemble having excellent performance is found, an LDPC code having excellent performance can be found from LDPC codes belonging to the ensemble.

Here, the degree sequence represents a ratio at which a variable node and a check node having a weight of each value are present on the code length N of the LDPC code.

For example, a regular (3, 6) LDPC code in which the coding rate is 1/2 belongs to an ensemble characterized by a degree sequence in which weights (column weights) of all variable nodes are 3 and weights (row weights) of all check nodes are 6.

FIG. 44 illustrates a tanner graph of such an ensemble.

In the tanner graph of FIG. 44, variable nodes indicated by a circle mark (○ mark) are present by N that is equal to the code length N, and check nodes indicated by a rectangle (□ mark) are present by N/2 that is equal to a multiplication value obtained by multiplying the code length N by the coding rate 1/2.

Three (which is equal to a column weight) edges are connected to each variable node, and thus edges connected to N variable nodes are present by 3N in total.

Further, six (which is equal to a row weight) edges are connected to each check node, and thus edges connected to N/2 check nodes are present by 3N in total.

Further, in the tanner graph of FIG. 44, there is one interleaver.

The interleaver randomly sorts the 3N edges connected to the N variable nodes, and connects each of the sorted edges to one of the 3N edges connected to the N/2 check nodes.

The number of sorting patterns of sorting the 3N edges connected to the N variable nodes is $(3N)!(=(3N)\times(3N-1)\times\ldots\times 1)$. Thus, an ensemble characterized by a degree sequence in which weights of all variable nodes are 3 and weights of all check nodes are 6 becomes a set of (3N)! LDPC codes.

In the simulation of obtaining an LDPC code having excellent performance (an appropriate parity check matrix), an ensemble of a multi-edge type was used in the density evolution.

In the multi-edge type, an interleaver through which an edge connected to a variable node and an edge connected to a check node pass is divided into two or more (multiple edges), and thus an ensemble is more strictly characterized.

FIG. 45 illustrates an example of a tanner graph of an ensemble of a multi-edge type.

In the tanner graph of FIG. 45, there are two interleavers, that is, a first interleaver and a second interleaver.

Further, in the tanner graph of FIG. 45, there are v1 variable nodes in which one edge is connected to the first interleaver and no edge is connected to the second interleaver, v2 variable nodes in which one edge is connected to the first interleaver and two edges are connected to the second interleaver, and v3 variable nodes in which no edge is connected to the first interleaver and two edges are connected to the second interleaver.

Further, in the tanner graph of FIG. 45, there are c1 check nodes in which two edges are connected to the first interleaver and no edge is connected to the second interleaver, c2 check nodes in which two edges are connected to the first interleaver and two edges are connected to the second interleaver, and c3 check nodes in which no edge is connected to the first interleaver and three edges are connected to the second interleaver.

Here, the density evolution and implementation thereof are described, for example, in "On the Design of Low-Density Parity-Check Codes within 0.0045 dB of the Shannon Limit," S. Y. Chung, G. D. Formey, T. J. Richardson, R. Urbanke, IEEE Communications Leggers, VOL. 5, NO. 2, Feb. 2001.

In the simulation of obtaining the mobile LDPC code (of the parity check matrix initial value table) of FIGS. 35 to 43, an ensemble in which a performance threshold value that is $E_b/N_0$ at which the BER starts to drop (starts to decrease) is a predetermined value or less is found by the density evolution of the multi-edge type, and among LDPC codes belonging to the ensemble, an LDPC code that is low in the BER in a plurality of modulation schemes used by digital broadcasting for mobile terminals such as 16QAM and 64QAM is elected as the LDPC code having excellent performance.

Here, since mobile terminals are lower in tolerance for an error than fixed terminals, in digital broadcasting for mobile terminals, in order to improve tolerance for an error, for example, a modulation scheme that is relatively small in the number of signal points such as QPSK, 16QAM, or 64QAM is employed.

The parity check matrix initial value tables of FIGS. 35 to 43 are the parity check matrix initial value tables of an LDPC code, in which the code length N is 16 k bits, which is obtained by the above simulation.

Figures 46, 47:
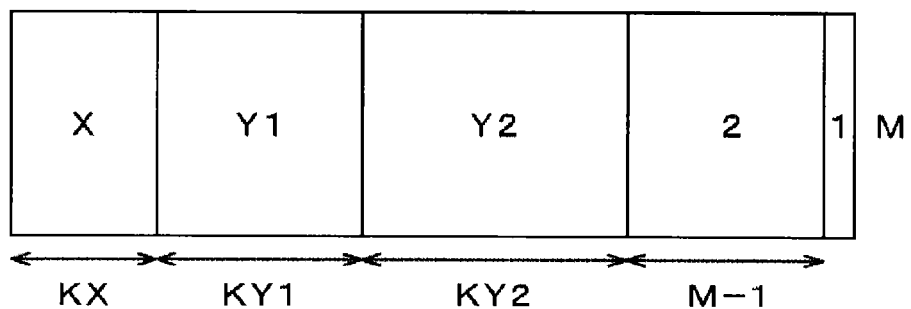
FIG. 46 is a diagram illustrating a minimum cycle length and a performance threshold value of a parity check matrix of an LDPC code having a code length of 16200.
FIG. 47 is a diagram for describing a parity check matrix of an LDPC code having a code length of 16200.

FIG. 46 is a diagram illustrating minimum cycle lengths and performance threshold values of parity check matrices H obtained from the parity check matrix initial value table of LDPC codes of FIGS. 35 to 43, where each LDPC code has the code length N of 16 k bits and one of nine types of 1/5, 4/15, 1/3, 2/5, 4/9, 7/15, 8/15, 3/5 and 2/3.

Among the parity check matrices H obtained from the parity check matrix initial value tables of FIGS. 35 to 43, the minimum cycle length of the parity check matrix H in which the coding rate r is 1/5, 4/15, or 3/5 is 8 cycles, and the minimum cycle length of the parity check matrix H in which the coding rate r is 1/3, 2/5, 4/9, 7/15, 8/15, or 2/3 is 6 cycles.

Thus, cycle 4 is not present in the parity check matrices H obtained from the parity check matrix initial value tables of FIGS. 35 to 43.

Further, since as the coding rate r decreases, redundancy of the LDPC code increases, the performance threshold value tends to be improved (decrease) as the coding rate r decreases.

FIG. 47 is a diagram for describing the parity check matrix H (hereinafter, also referred to as a parity check matrix H of a mobile LDPC code) (obtained from the parity check matrix initial value tables) of FIGS. 35 to 43.

The column weight for KX columns from the first column of the parity check matrix H of the mobile LDPC code is X, the column weight for subsequent KY1 columns is Y1, the column weight for subsequent KY2 columns is Y2, the column weight for subsequent (M−1) columns is 2, and the column weight for the last column is 1.

Here, KX+KY1+KY2+M−1+1 is equal to the code length N (=16200 bits)

FIG. 48 is a diagram illustrating the column numbers KX, KY1, KY2, and M, and the column weights X, Y1, and Y2 of FIG. 47 for the coding rates r (=1/5, 4/1, 1/3, 2/5, 4/9, 7/15, 8/15, 3/5, and 2/3) of the mobile LDPC code.

In the parity check matrix H of the mobile LDPC code in which the code length N is 16 k, similarly to the parity check matrix specified in DVB-T.2 described in FIGS. 12 and 13, a column at the beginning side (the left side) tends to be large in the column weight, and thus code bits at the beginning of the mobile LDPC code tend to be robust to an error (have tolerance for an error).

Figure 49:
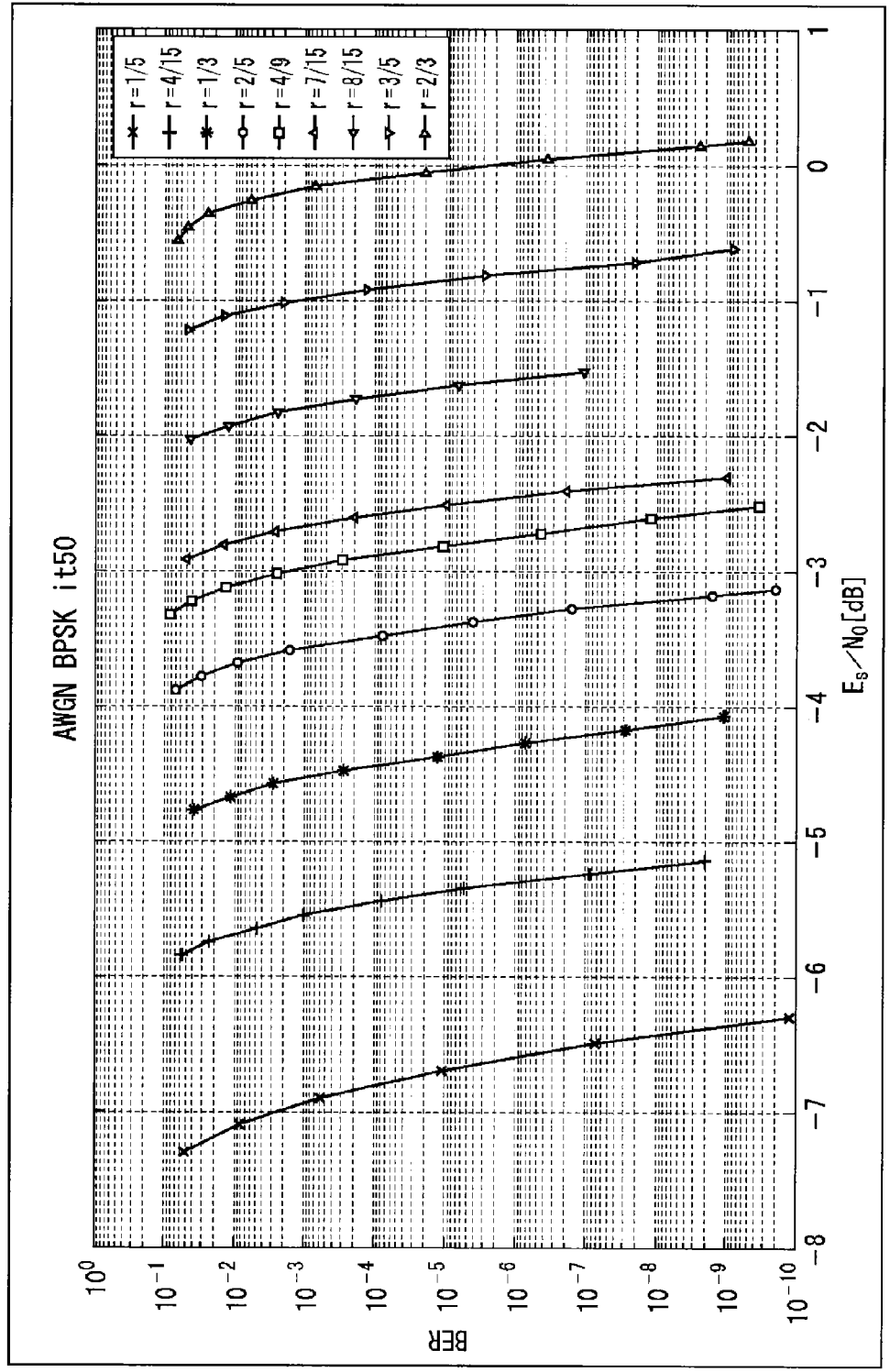
FIG. 49 is a diagram illustrating a simulation result of a BER of an LDPC code having a code length of 16200.

FIG. 49 is a diagram illustrating a BER simulation result of the mobile LDPC codes of FIGS. 35 to 43.

In the simulation, the AWGN communication path (channel) was assumed, BPSK was employed as a modulation scheme, and 50 was employed as the repeated decoding number C.

In FIG. 49, a horizontal axis represents $E_s/N_0$ (a signal power to noise power ratio per symbol), and a vertical axis represents a BER.

Here, among the coding rates r (=1/5, 4/15, 1/3, 2/5, 4/9, 7/15, 8/15, 3/5, and 2/3) of the mobile LDPC code, for 1/5, 1/3, 2/5, 4/9, 3/5, and 2/3, an LDPC code (hereinafter, also referred to as a "standard 16 k code") of the same coding rate in which the code length N is 16 k is specified in DVB-T.2.

In the simulation, for the mobile LDPC codes having the coding rates r of 1/5, 1/3, 2/5, 4/9, 3/5, and 2/3, the BER of an mobile LDPC code of any coding rate r is also specified in DVB-T.2 and known to be improved more than the BER of the standard 16 k code of the same coding rate, and thus tolerance for an error can be improved according to the mobile LDPC code.

Here, among 1/5, 4/15, 1/3, 2/5, 4/9, 7/15, 8/15, 3/5, and 2/3 which are the coding rates r of the mobile LDPC code, the same coding rates as 4/15, 7/15, and 8/15 are not present in the standard 16 k code.

In other words, the LDPC codes of the coding rates r (=4/15, 7/15, and 8/15), which are not present in the standard 16 k code, are present in the mobile LDPC code.

As described above, since the LDPC codes of the coding rates r (=4/15, 7/15, and 8/15), which are not present in the standard 16 k code, are present in the mobile LDPC code, the BERs for the coding rates r (=1/5, 4/15, 1/3, 2/5, 4/9, 7/15, 8/15, 3/5, and 2/3) of the mobile LDPC code are arranged at relatively equal intervals in which an interval in a $E_s/N_0$ direction is a short interval of a predetermined interval of about 1 dB or less, as illustrated in FIG. 49.

Meanwhile, since the standard 16 k code does not have 4/15, 7/15, and 8/15 as the coding rate r of the standard 16 k code, there are relatively large gaps of about 2 dB in a $E_s/N_0$ direction between the BER when the coding rate r is 1/5 (1/4 in the specification of DVB-T.2) and the BER when the coding rate r is 1/3 and between the BER when the coding rate r is 4/9 (1/2 in the specification of DVB-T.2) and the BER when the coding rate r is 3/5, and thus due to the large gaps, the BERs of the standard 16 k code are non-uniformly arranged.

For a broadcasting organization performing broadcasting of program through the transmitting device 11, rather than the standard 16 k code in which there is a large gap of about 2 db in the BER arrangement and the BER arrangement is not uniform, the mobile LDPC code in which the BERs are arranged at relatively small equal intervals of about 1 db or less has the advantage of easily selecting a coding rate used for broadcasting according to a status of a channel (the communication path 13) or the like.

[Exchange Process of LDPC Code Having Code Length N of 16200 Bits]

In digital broadcasting for mobile terminals, when the mobile LDPC code described above, that is, the LDPC code having the code length N of 16200 bits is employed, for example, tolerance for an error in the communication path 13 (FIG. 7) decreases compared to the LDPC code having the long code length N of 64800 bits specified in DVB-T.2.

In this regard, in digital broadcasting for mobile terminals, it is desirable to execute a countermeasure for improving tolerance for an error.

As a countermeasure for improving tolerance for an error, for example, there is an exchange process performed by the demultiplexer 25 (FIG. 9) as well as a method of employing a modulation scheme in which the number of signal points is relatively small such as 16QAM or 64QAM as described above.

In the exchange process, as an exchanging method of exchanging the code bits of the LDPC code specified in DVB-T.2 or the like, for example, the first to fourth exchanging methods and an exchanging method specified in DVB-T.2 or the like may be used.

Here, when digital broadcasting for mobile terminals is performed using the mobile LDPC code having the code length N of 16200 bits, it is desirable to employ the exchange process applied to the mobile LDPC code.

In other words, as the exchange process employed for the mobile LDPC code, it is desirable to employ an exchange process of further improving tolerance for an error.

In this regard, the demultiplexer 25 (FIG. 9) is configured to be able to perform the exchange process according to the allocation rule as described above with reference to FIG. 27.

The exchange process according to the allocation rule will be described below, but, before that, an exchange process according to an already proposed exchanging method (hereinafter, also referred to as a "current method") will be first described.

The exchange process will be described with reference to FIGS. 50 and 51 in connection with an example in which the demultiplexer 25 performs the exchange process on the LDPC code (hereinafter, also referred to as a "specified code") specified in DVB-T.2 or the like according to the current method.

Figure 50:
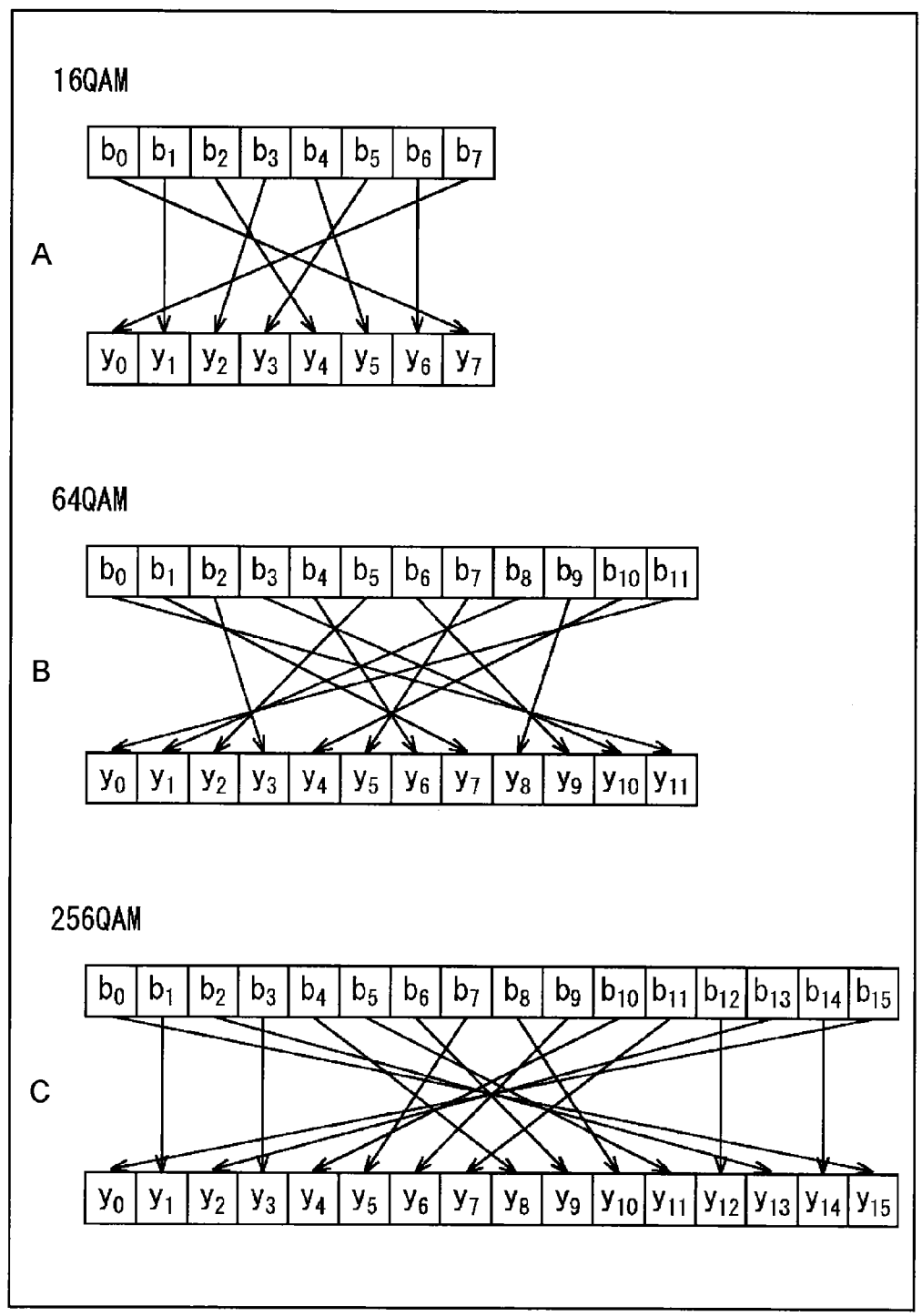
FIG. 50 is a diagram for describing an exchange process of a current method.

FIG. 50 illustrates an example of the exchange process of the current method when the LDPC code is an LDPC code in which the code length N is 64800 bits and the coding rate is 3/5, which is specified in the DVB-T.2.

In other words, A of FIG. 50 illustrates an example of the exchange process of the current method when the LDPC code is a specified code in which the code length N is 64800 bits, the coding rate is 3/5, the modulation scheme is 16QAM, and the multiple b is 2.

When the modulation scheme is 16QAM, 4 (=m) code bits are mapped to any one of 16 signal points set in 16QAM as a single symbol.

Further, when the code length N is 64800 bits and the multiple b is 2, the memory 31 of the demultiplexer 25 (FIGS. 18 and 19) includes 8 columns storing 4×2 (=mb) bits in the row direction and stores 64800/(4×2) bits in the column direction.

In the demultiplexer 25, when the code bits of the LDPC code are written in the memory 31 in the column direction, and writing of code bits (one code word) of 64800 bits ends, the code bits written in the memory 31 are read in the row direction in units of 4×2 (=mb) bits and then supplied to the exchange unit 32 (FIGS. 18 and 19).

The exchange unit 32 exchanges the code bits $b_0$ to $b_7$ of 4×2 (=mb) bits such that the code bits $b_0$, $b_1$, $b_2$, $b_3$, $b_4$, $b_5$, $b_6$, and $b_7$ of 4×2 (=mb) bits read from the memory 31 are allocated to the symbol bits $y_0$, $y_1$, $y_2$, $y_3$, $y_4$, $y_5$, $y_6$, and $y_7$ of 4×2 (=mb) bits of consecutive 2 (=b) symbols, for example, as illustrated in A FIG. 50.

In other words, the exchange unit 32 performs exchanging such that the code bit $b_0$ is allocated to the symbol bit $y_7$;
the code bit $b_1$ is allocated to the symbol bit $y_1$;
the code bit $b_2$ is allocated to the symbol bit $y_4$;
the code bit $b_3$ is allocated to the symbol bit $y_2$;
the code bit $b_4$ is allocated to the symbol bit $y_5$;
the code bit $b_5$ is allocated to the symbol bit $y_3$;

the code bit $b_6$ is allocated to the symbol bit $y_6$; and
the code bit $b_7$ is allocated to the symbol bit $y_0$.

B of FIG. 50 illustrates an example of the exchange process of the current method when the LDPC code is a specified code in which the code length N is 64800 bits, the coding rate is 3/5, the modulation scheme is 64QAM, and the multiple b is 2.

When the modulation scheme is 64QAM, 6 (=m) code bits are mapped to any one of 64 signal points set in 64QAM as a single symbol.

Further, when the code length N is 64800 bits and the multiple b is 2, the memory 31 of the demultiplexer 25 (FIGS. 18 and 19) includes 12 columns storing 6×2 (=mb) bits in the row direction and stores 64800/(6×2) bits in the column direction.

In the demultiplexer 25, when the code bits of the LDPC code are written in the memory 31 in the column direction, and writing of code bits (one code word) of 64800 bits ends, the code bits written in the memory 31 are read in the row direction in units of 6×2 (=mb) bits and then supplied to the exchange unit 32 (FIGS. 18 and 19).

The exchange unit 32 exchanges the code bits $b_0$ to $b_{11}$ of 6×2 (=mb) bits such that the code bits $b_0$, $b_1$, $b_2$, $b_3$, $b_4$, $b_5$, $b_6$, $b_7$, $b_8$, $b_9$, $b_{10}$, and $b_{11}$ of 6×2 (=mb) bits read from the memory 31 are allocated to the symbol bits $y_0$, $y_1$, $y_2$, $y_3$, $y_4$, $y_5$, $y_6$, $y_7$, $y_8$, $y_9$, $y_{10}$ and $y_{11}$ of 6×2 (=mb) bits of consecutive 2 (=b) symbols, for example, as illustrated in B FIG. 50.

In other words, the exchange unit 32 performs exchanging such that
the code bit $b_0$ is allocated to the symbol bit $y_{11}$,
the code bit $b_1$ is allocated to the symbol bit $y_7$;
the code bit $b_2$ is allocated to the symbol bit $y_3$;
the code bit $b_3$ is allocated to the symbol bit $y_{10}$;
the code bit $b_4$ is allocated to the symbol bit $y_6$;
the code bit $b_5$ is allocated to the symbol bit $y_2$;
the code bit $b_6$ is allocated to the symbol bit $y_9$;
the code bit $b_7$ is allocated to the symbol bit $y_5$;
the code bit $b_8$ is allocated to the symbol bit $y_1$;
the code bit $b_9$ is allocated to the symbol bit $y_8$;
the code bit $b_{10}$ is allocated to the symbol bit $y_4$; and
the code bit $b_{11}$ is allocated to the symbol bit $y_0$.

C of FIG. 50 illustrates an example of the exchange process of the current method when the LDPC code is a specified code in which the code length N is 64800 bits, the coding rate is 3/5, the modulation scheme is 256QAM, and the multiple b is 2.

When the modulation scheme is 256QAM, 8 (=m) code bits are mapped to any one of 256 signal points set in 256QAM as a single symbol.

Further, when the code length N is 64800 bits and the multiple b is 2, the memory 31 of the demultiplexer 25 (FIGS. 18 and 19) includes 16 columns storing 8×2 (=mb) bits in the row direction and stores 64800/(8×2) bits in the column direction.

In the demultiplexer 25, when the code bits of the LDPC code are written in the memory 31 in the column direction, and writing of code bits (one code word) of 64800 bits ends, the code bits written in the memory 31 are read in the row direction in units of 8×2 (=mb) bits and then supplied to the exchange unit 32 (FIGS. 18 and 19).

The exchange unit 32 exchanges the code bits $b_0$ to $b_{15}$ of 8×2 (=mb) bits such that the code bits $b_0$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and $b_{15}$ of 8×2 (=mb) bits read from the memory 31 are allocated to the symbol bits $y_0$, $y_1$, $y_2$, $y_3$, $y_4$, $y_5$, $y_6$, $y_7$, $y_8$, $y_9$, $y_{10}$, $y_{11}$, $y_{12}$, $y_{13}$, $y_{14}$, and $y_{15}$ of 8×2 (=mb) bits of consecutive 2 (=b) symbols, for example, as illustrated in C FIG. 50.

In other words, the exchange unit 32 performs exchanging such that
the code bit $b_0$ is allocated to the symbol bit $y_{15}$,
the code bit $b_1$ is allocated to the symbol bit $y_1$;
the code bit $b_2$ is allocated to the symbol bit $y_{13}$;
the code bit $b_3$ is allocated to the symbol bit $y_3$;
the code bit $b_4$ is allocated to the symbol bit $y_8$;
the code bit $b_5$ is allocated to the symbol bit $y_{11}$;
the code bit $b_6$ is allocated to the symbol bit $y_9$;
the code bit $b_7$ is allocated to the symbol bit $y_5$;
the code bit $b_8$ is allocated to the symbol bit $y_{10}$;
the code bit $b_9$ is allocated to the symbol bit $y_6$;
the code bit $b_{10}$ is allocated to the symbol bit $y_4$;
the code bit $b_{11}$ is allocated to the symbol bit $y_7$;
the code bit $b_{12}$ is allocated to the symbol bit $y_{12}$;
the code bit $b_{13}$ is allocated to the symbol bit $y_2$;
the code bit $b_{14}$ is allocated to the symbol bit $y_{14}$; and
the code bit $b_{15}$ is allocated to the symbol bit $y_0$.

Figure 51:
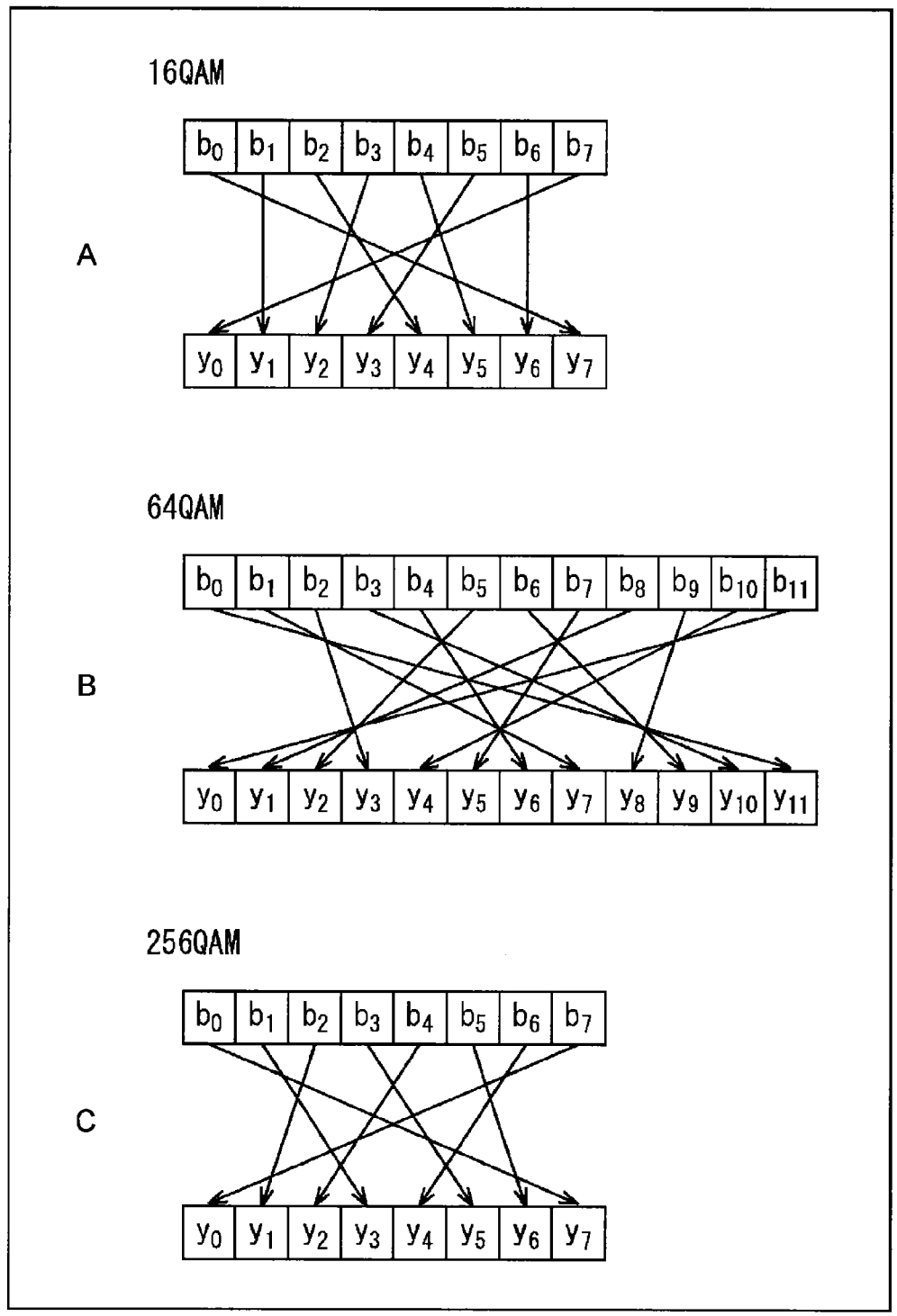
FIG. 51 is a diagram for describing an exchange process of a current method.

FIG. 51 illustrates an example of the exchange process of the current method when the LDPC code is a specified code in which the code length N is 16200 bits and the coding rate is 3/5.

In other words, A of FIG. 51 illustrates an example of the exchange process of the current method when the LDPC code is an LDPC code in which the code length N is 16200 bits, the coding rate is 3/5, the modulation scheme is 16QAM, and the multiple b is 2.

When the modulation scheme is 16QAM, 4 (=m) code bits are mapped to any one of 16 signal points set in 16QAM as a single symbol.

Further, when the code length N is 16200 bits and the multiple b is 2, the memory 31 of the demultiplexer 25 (FIGS. 18 and 19) includes 8 columns storing 4×2 (=mb) bits in the row direction and stores 16200/(4×2) bits in the column direction.

In the demultiplexer 25, when the code bits of the LDPC code are written in the memory 31 in the column direction, and writing of code bits (one code word) of 16200 bits ends, the code bits written in the memory 31 are read in the row direction in units of 4×2 (=mb) bits and then supplied to the exchange unit 32 (FIGS. 18 and 19).

The exchange unit 32 exchanges the code bits $b_0$ to $b_7$ of 4×2 (=mb) bits such that the code bits $b_0$, $b_1$, $b_2$, $b_3$, $b_4$, $b_5$, $b_6$, and $b_7$ of 4×2 (=mb) bits read from the memory 31 are allocated to the symbol bits $y_0$, $y_1$, $y_2$, $y_3$, $y_4$, $y_5$, $y_6$, and $y_7$ of 4×2 (=mb) bits of consecutive 2 (=b) symbols, for example, as illustrated in A FIG. 51.

In other words, the exchange unit 32 performs exchanging such that the code bits $b_0$ to $b_7$ are allocated to the symbol bits $y_0$ to $y_7$, similarly to the example of A of FIG. 50.

B of FIG. 51 illustrates an example of the exchange process of the current method when the LDPC code is a specified code in which the code length N is 16200 bits, the coding rate is 3/5, the modulation scheme is 64QAM, and the multiple b is 2.

When the modulation scheme is 64QAM, 6 (=m) code bits are mapped to any one of 64 signal points set in 64QAM as a single symbol.

Further, when the code length N is 16200 bits and the multiple b is 2, the memory 31 of the demultiplexer 25 (FIGS. 18 and 19) includes 12 columns storing 6×2 (=mb) bits in the row direction and stores 16200/(6×2) bits in the column direction.

In the demultiplexer 25, when the code bits of the LDPC code are written in the memory 31 in the column direction, and writing of code bits (one code word) of 16200 bits ends, the code bits written in the memory 31 are read in the row direction in units of 6×2 (=mb) bits and then supplied to the exchange unit 32 (FIGS. 18 and 19).

The exchange unit 32 exchanges the code bits $b_0$ to $b_{11}$ of 6×2 (=mb) bits such that the code bits $b_0$, $b_1$, $b_2$, $b_3$, $b_4$, $b_5$, $b_6$, $b_7$, $b_8$, $b_9$, $b_{10}$, and $b_{11}$ of 6×2 (=mb) bits read from the memory 31 are allocated to the symbol bits $y_0$, $y_1$, $y_2$, $y_3$, $y_4$, $y_5$, $y_6$, $y_7$, $y_8$, $y_9$, $y_{10}$, and $y_{11}$ of 6×2 (=mb) bits of consecutive 2 (=b) symbols, for example, as illustrated in B FIG. 51.

In other words, the exchange unit 32 performs exchanging such that the code bits $b_0$ to $b_{11}$ are allocated to the symbol bits $y_0$ to $y_{11}$, similarly to the example of B of FIG. 50.

C of FIG. 51 illustrates an example of the exchange process of the current method when the LDPC code is a specified code in which the code length N is 16200 bits, the coding rate is 3/5, the modulation scheme is 256QAM, and the multiple b is 1.

When the modulation scheme is 256QAM, 8 (=m) code bits are mapped to any one of 256 signal points set in 256QAM as a single symbol.

Further, when the code length N is 16200 bits and the multiple b is 1, the memory 31 of the demultiplexer 25 (FIGS. 18 and 19) includes 8 columns storing 8×1 (=mb) bits in the row direction and stores 16200/(8×1) bits in the column direction.

In the demultiplexer 25, when the code bits of the LDPC code are written in the memory 31 in the column direction, and writing of code bits (one code word) of 16200 bits ends, the code bits written in the memory 31 are read in the row direction in units of 8×1 (=mb) bits and then supplied to the exchange unit 32 (FIGS. 18 and 19).

The exchange unit 32 exchanges the code bits $b_0$ to $b_7$ of 8×1 (=mb) bits such that the code bits $b_0$, $b_1$, $b_2$, $b_3$, $b_4$, $b_5$, $b_6$, and $b_7$ of 8×1 (=mb) bits read from the memory 31 are allocated to the symbol bits $y_0$, $y_1$, $y_2$, $y_3$, $y_4$, $y_5$, $y_6$, and $y_7$ of 8×1 (=mb) bits of 1 (=b) symbol, for example, as illustrated in C of FIG. 51.

In other words, the exchange unit 32 performs exchanging such that the code bit $b_0$ is allocated to the symbol bit $y_7$,
the code bit $b_1$ is allocated to the symbol bit $y_3$;
the code bit $b_2$ is allocated to the symbol bit $y_1$;
the code bit $b_3$ is allocated to the symbol bit $y_5$;
the code bit $b_4$ is allocated to the symbol bit $y_2$;
the code bit $b_5$ is allocated to the symbol bit $y_6$;
the code bit $b_6$ is allocated to the symbol bit $y_4$; and
the code bit $b_7$ is allocated to the symbol bit $y_0$.

Next, the exchange process according to the allocation rule (hereinafter, also referred to as an "exchange process of a new exchanging method") will be described.

In digital broadcasting for mobile terminals, a modulation scheme having a small number of signal points such as QPSK, 16QAM, or 64QAM is employed, and the new exchanging method will be described in connection with an example in which the modulation scheme is 16QAM and an example in which the modulation scheme is 64QAM.

Further, when the modulation scheme is QPSK, since symbol bits $y_0$ and $y_1$ of 2 bits representing four symbols (signal points) of QPSK do not have a relation in which one is robust to an error and the other is weak to an error which is described above with reference to FIGS. 14 to 17, it is unnecessary to perform the exchange process (even when the exchange process is performed, tolerance for an error does not change).

Figure 52:
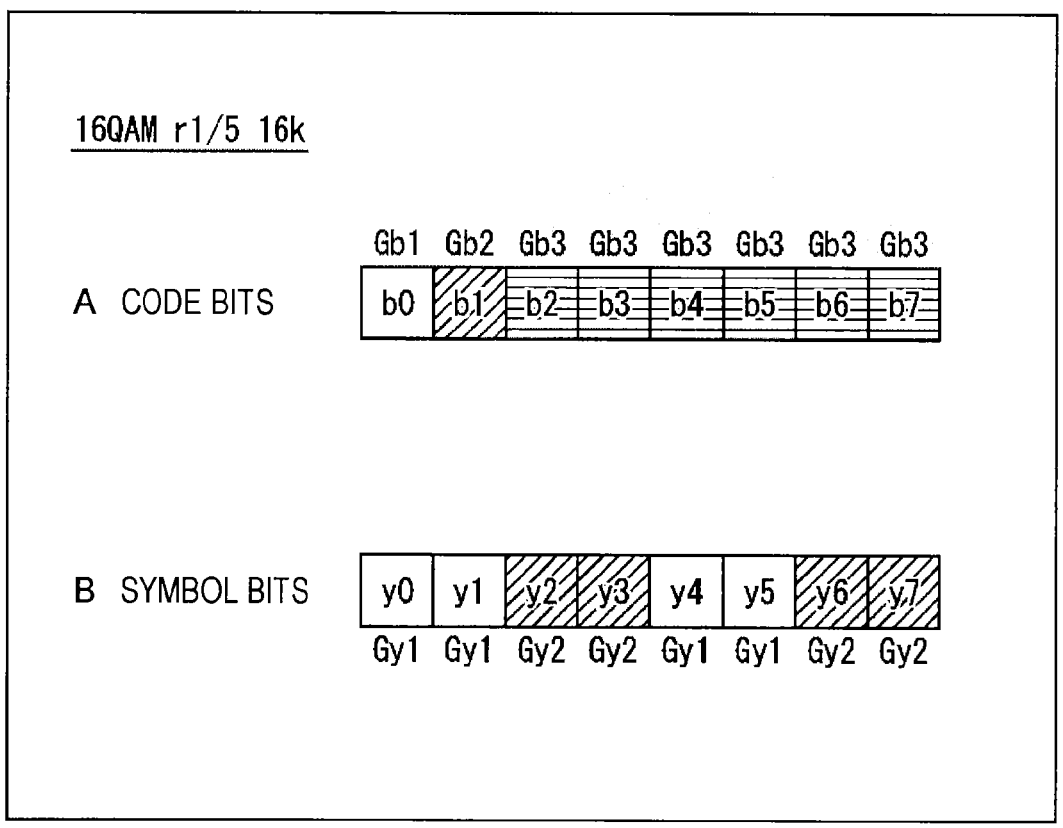
FIG. 52 is a diagram illustrating a code bit group and a symbol bit group when an LDPC code having a code length of 16200 and a coding rate of 1/5 is modulated by 16QAM, and a multiple b is 2.
Figure 53:
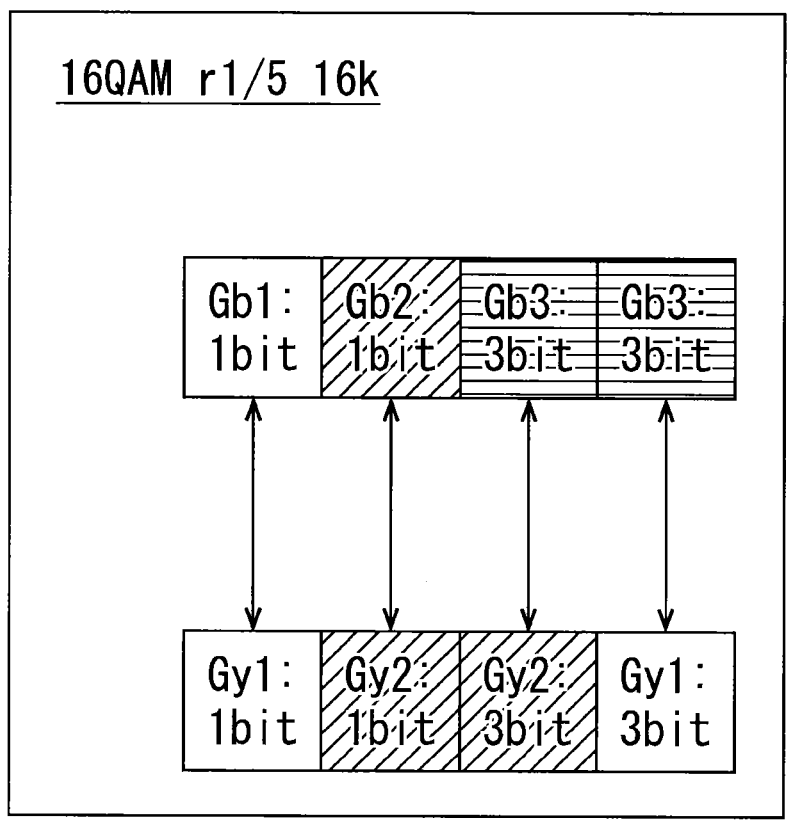
FIG. 53 is a diagram illustrating an allocation rule when an LDPC code having a code length of 16200 and a coding rate of 1/5 is modulated by 16QAM, and a multiple b is 2.

FIGS. 52 to 54 (and FIGS. 55 to 105) are diagrams for describing the new exchanging method.

In the new exchanging method, the exchange unit 32 of the demultiplexer 25 performs exchanging of code bits of mb bits according to a predetermined allocation rule.

The allocation rule is a rule of allocating the code bits of the LDPC code to the symbol bits. The allocation rule specifies a group set that is a combination of a code bit group of code bits and a symbol bit group of symbol bits to which code bits of the code bit group are allocated, and bit numbers (hereinafter, also referred to as a "group bit number") of code bits and symbol bits of the code bit group and the symbol bit group of the group set.

Here, as described above, there is a difference in an error probability between code bits, and there is a difference in an error probability between symbol bits. The code bit group is a group for grouping code bits according an error probability, and the symbol bit group is a group of grouping symbol bits according to an error probability.

FIG. 52 illustrates a code bit group and a symbol bit group when an LDPC code is a mobile LDPC code in which the code length N is 16200 bits, the coding rate is 1/5, the modulation scheme is 16QAM (thus, m=4), and the multiple b is 2.

In this case, the code bits of 4×2 (=mb) bits read from the memory 31 may be grouped into 3 code bit groups Gb1, Gb2, and Gb3 according to the difference in the error probability as illustrated in A of FIG. 52.

Here, in a code bit group Gb#i, the smaller a suffix #i is, the better (smaller) a group is in the error probability of code bits belonging to the code bit group Gb#i.

In the following, among code bits of mb bits read from the memory 31 in the row direction, a (#i+1)-th bit from the most significant bit is also represented by a bit b#i, and among symbol bits of mb bits of consecutive b symbols, a (#i+1)-th bit from the most significant bit is also represented by a bit y#i.

In A of FIG. 52, the code bit b0 belongs to the code bit group Gb1, the code bit b1 belongs to the code bit group Gb2, and code bits b2, b3, b4, b5, b6, and b7 belong to the code bit group Gb3.

When the modulation scheme is 16QAM and the multiple b is 2, the symbol bits of 4×2 (=mb) bits may be grouped into two symbol bit groups Gy1 and Gy2 according to the difference in the error probability as illustrated in B of FIG. 52.

Here, in a symbol bit group Gy#i, similarly to the code bit group, the smaller a suffix #i is, the better a group is in the error probability of the symbol bits belonging to the symbol bit group Gy#i.

In B of FIG. 52, the symbol bits y0, y1, y4, and y5 belong to the symbol bit group Gy1, and the symbol bits y2, y3, y6, and y7 belong to the symbol bit group Gy2.

FIG. 53 illustrates an allocation rule when an LDPC code is a mobile LDPC code in which the code length N is 16200 bits, the coding rate is 1/5, the modulation scheme is 16QAM, and the multiple b is 2.

In the allocation rule of FIG. 53, a combination of the code bit group Gb1 and the symbol bit group Gy1 is specified as one group set. Further, the group bit number of the group set is specified as 1.

Here, in the following, the group set and the group bit number thereof are referred to collectively as a "group set information." Further, for example, the group set of the code bit group Gb1 and the symbol bit group Gy1 and 1 which is the group bit number of the group set are represented by group set information (Gb1, Gy1, 1).

In the allocation rule of FIG. 53, in addition to the group set information (Gb1, Gy1, 1), pieces of group set information (Gb2, Gy2, 1), (Gb3, Gy2, 3), and (Gb3, Gy1, 3) are specified.

For example, the group set information (Gb1, Gy1, 1) means that 1 bit of the code bits belonging to the code bit group Gb1 is allocated to 1 bit of the symbol bits belonging to the symbol bit group Gy1.

In this regard, the allocation rule of FIG. 53 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

1 bit of the code bits of the code bit group Gb2 having the second highest error probability is allocated to 1 bit of the symbol bits of the symbol bit group Gy2 having the second highest error probability based on the group set information (Gb2, Gy2, 1);

3 bits of the code bits of the code bit group Gb3 having the third highest error probability are allocated to 3 bits of the symbol bits of the symbol bit group Gy2 having the second highest error probability based on the group set information (Gb3, Gy2, 3); and 3 bits of the code bits of the code bit group Gb3 having the third highest error probability are allocated to 3 bits of the symbol bits of the symbol bit group Gy1 having the highest error probability based on the group set information (Gb3, Gy1, 3).

As described above, the code bit group is a group for grouping code bits according the error probability, and the symbol bit group is a group of grouping symbol bits according to the error probability. Thus, it can be said that the allocation rule specifies a combination of the error probability of code bits and the error probability of symbol bits to which the code bits are allocated.

The allocation rule specifying a combination of the error probability of code bits and the error probability of symbol bits to which the code bits are allocated as described above is decide to further improve tolerance for an error (tolerance for noise), for example, through simulation of measuring a BER.

Further, even when an allocation destination of a code bit of a certain code bit group is changed among bits of the same symbol bit group, tolerance for an error is not (or hardly) affected.

Thus, in order to improve tolerance for an error, preferably, group set information causing a BER (Bit Error Rate) to be minimum, that is, a combination (a group set) of a code bit group of code bits and a symbol bit group of symbol bits to which the code bits of the code bit group are allocated and a bit number (a group bit number) of code bits and symbol bits of the code bit group and the symbol bit group of the group set are specified as the allocation rule, and exchanging of code bits is performed according to the allocation rule such that code bits are allocated to symbol bits.

Here, a concrete allocation method of allocating code bits to symbol bit according to the allocation rule need be decided in advance between the transmitting device 11 and the receiving device 12 (FIG. 7).

FIG. 54 illustrates an example of exchanging of code bits according to the allocation rule of FIG. 53.

In other words, A of FIG. 54 illustrates a first example of exchanging of code bits according to the allocation rule of FIG. 53 when an LDPC code is a mobile LDPC code in which the code length N is 16200 bits, the coding rate is 1/5, the modulation scheme is 16QAM, and the multiple b is 2.

When an LDPC code is a mobile LDPC code in which the code length N is 16200 bits, the coding rate is 1/5, the modulation scheme is 16QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 53 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 54.

In other words, the exchange unit 32 performs exchanging such that the code bit b0 is allocated to the symbol bit y4;
the code bit b1 is allocated to the symbol bit y3;
the code bit b2 is allocated to the symbol bit y2;
the code bit b3 is allocated to the symbol bit y1;
the code bit b4 is allocated to the symbol bit y6;
the code bit b5 is allocated to the symbol bit y5;
the code bit b6 is allocated to the symbol bit y7; and
the code bit b7 is allocated to the symbol bit y0.

B of FIG. 54 illustrates a second example of exchanging of code bits according to the allocation rule of FIG. 53 when an LDPC code is a mobile LDPC code in which the code length N is 16200 bits, the coding rate is 1/5, the modulation scheme is 16QAM, and the multiple b is 2.

According to B of FIG. 54, the exchange unit 32 exchanges the code bits b0 to b7 of 4×2 (=mb) bits read from the memory 31 according to the allocation rule of FIG. 53 such that the code bit b0 is allocated to the symbol bit y0;
the code bit b1 is allocated to the symbol bit y7;
the code bit b2 is allocated to the symbol bit y3;
the code bit b3 is allocated to the symbol bit y4;
the code bit b4 is allocated to the symbol bit y5;
the code bit b5 is allocated to the symbol bit y2;
the code bit b6 is allocated to the symbol bit y6; and
the code bit b7 is allocated to the symbol bit y1.

Here, both of the methods of allocating the code bit b#i to the symbol bit y#i illustrated in A and B of FIG. 54 follow the allocation rule of FIG. 53 (observes the allocation rule).

Figure 55:
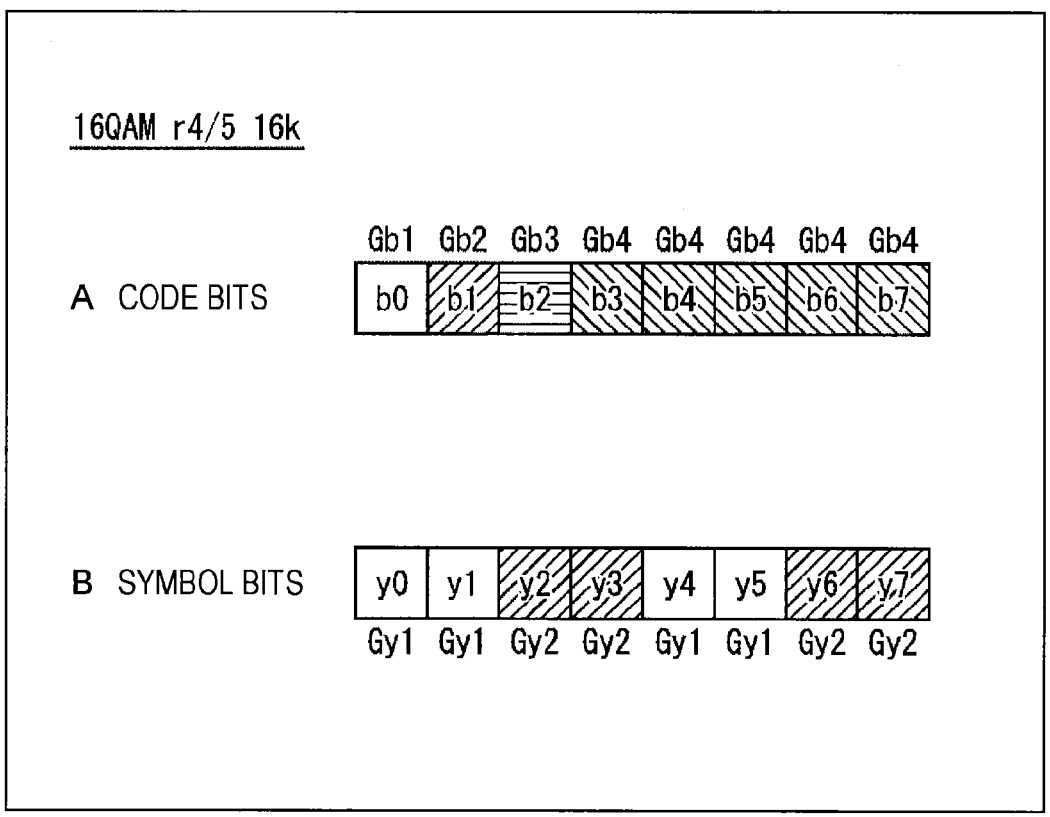
FIG. 55 is a diagram illustrating a code bit group and a symbol bit group when an LDPC code having a code length of 16200 and a coding rate of 4/15 is modulated by 16QAM, and a multiple b is 2.

FIG. 55 illustrates a code bit group and a symbol bit group when an LDPC code is a mobile LDPC code in which the code length N is 16200 bits, the coding rate is 4/15, the modulation scheme is 16QAM, and the multiple b is 2.

In this case, the code bits of 4×2 (=mb) bits read from the memory 31 may be grouped into 4 code bit groups Gb1, Gb2, Gb3, and Gb4 according to the difference in the error probability as illustrated in A of FIG. 55.

In A of FIG. 55, the code bit b0 belongs to the code bit group Gb1, the code bit b1 belongs to the code bit group Gb2, the code bit b2 belongs to the code bit group Gb3, and the code bits b3 to b7 belong to the code bit group Gb4.

When the modulation scheme is 16QAM and the multiple b is 2, the symbol bits of 4×2 (=mb) bits may be grouped into two symbol bit groups Gy1 and Gy2 according to the difference in the error probability as illustrated in B of FIG. 55.

In B of FIG. 55, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 56:
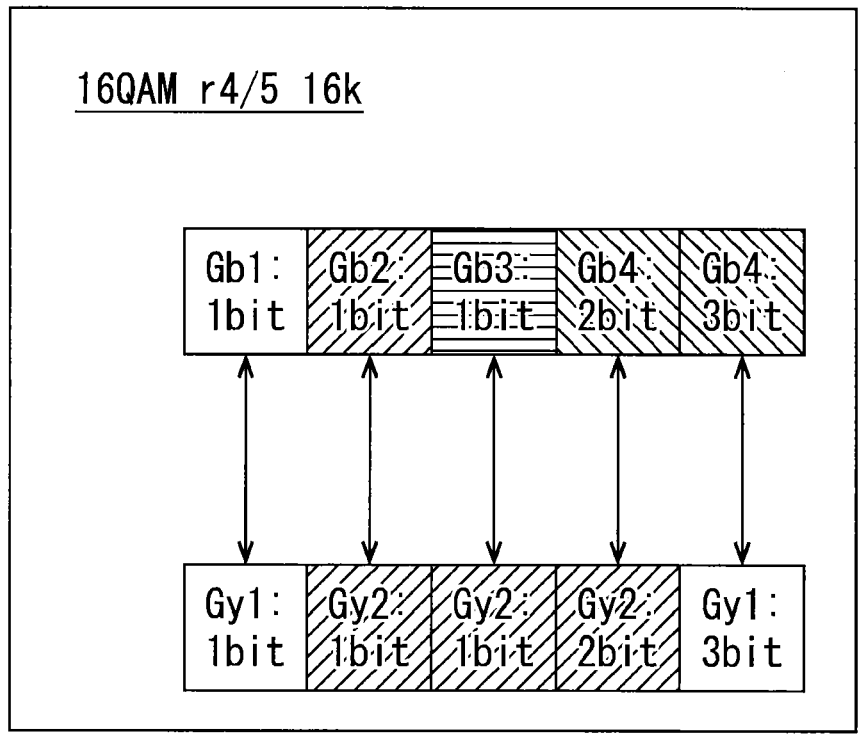
FIG. 56 is a diagram illustrating an allocation rule when an LDPC code having a code length of 16200 and a coding rate of 4/15 is modulated by 16QAM, and a multiple b is 2.

FIG. 56 illustrates an allocation rule when an LDPC code is a mobile LDPC code in which the code length N is 16200 bits, the coding rate is 4/15, the modulation scheme is 16QAM, and the multiple b is 2.

In the allocation rule of FIG. 56, pieces of group set information (Gb1, Gy1, 1), (Gb2, Gy2, 1), (Gb3, Gy2, 1), (Gb4, Gy2, 2), and (Gb4, Gy1, 3) are specified.

In other words, the allocation rule of FIG. 56 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

1 bit of the code bits of the code bit group Gb2 having the second highest error probability is allocated to 1 bit of the symbol bits of the symbol bit group Gy2 having the second highest error probability based on the group set information (Gb2, Gy2, 1);

1 bit of the code bits of the code bit group Gb3 having the third highest error probability is allocated to 1 bit of the symbol bits of the symbol bit group Gy2 having the second highest error probability based on the group set information (Gb3, Gy2, 1);

2 bits of the code bits of the code bit group Gb4 having the fourth highest error probability are allocated to 2 bits of the symbol bits of the symbol bit group Gy2 having the second highest error probability based on the group set information (Gb4, Gy2, 2); and 3 bits of the code bits of the code bit group Gb4 having the fourth highest error probability are allocated to 3 bits of the symbol bits of the symbol bit group Gy1 having the highest error probability based on the group set information (Gb4, Gy1, 3).

Figure 57:
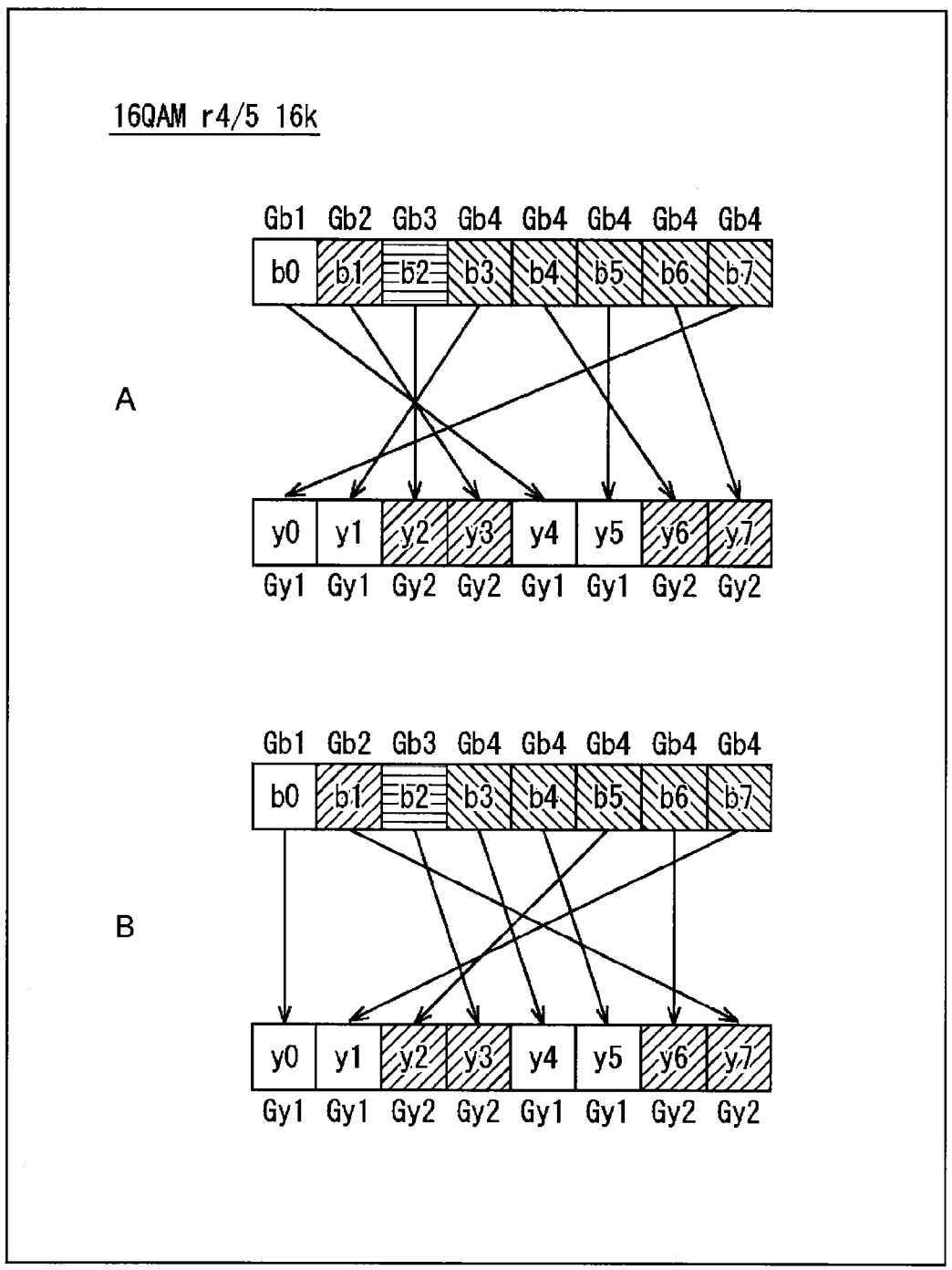
FIG. 57 is a diagram illustrating exchanging of code bits according to an allocation rule when an LDPC code having a code length of 16200 and a coding rate of 4/15 is modulated by 16QAM, and a multiple b is 2.

FIG. 57 illustrates an example of exchanging of code bits according to the allocation rule of FIG. 56.

In other words, A of FIG. 57 illustrates a first example of exchanging of code bits according to the allocation rule of FIG. 56 when an LDPC code is a mobile LDPC code in which the code length N is 16200 bits, the coding rate is 4/15, the modulation scheme is 16QAM, and the multiple b is 2.

When an LDPC code is a mobile LDPC code in which the code length N is 16200 bits, the coding rate is 4/15, the modulation scheme is 16QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 56 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 57.

In other words, the exchange unit 32 performs exchanging such that the code bit b0 is allocated to the symbol bit y4;
the code bit b1 is allocated to the symbol bit y3;
the code bit b2 is allocated to the symbol bit y2;
the code bit b3 is allocated to the symbol bit y1;
the code bit b4 is allocated to the symbol bit y6;
the code bit b5 is allocated to the symbol bit y5;
the code bit b6 is allocated to the symbol bit y7; and
the code bit b7 is allocated to the symbol bit y0.

B of FIG. 57 illustrates a second example of exchanging of code bits according to the allocation rule of FIG. 56 when an LDPC code is a mobile LDPC code in which the code length N is 16200 bits, the coding rate is 4/15, the modulation scheme is 16QAM, and the multiple b is 2.

According to B of FIG. 57, the exchange unit 32 exchanges the code bits b0 to b7 of 4×2 (=mb) bits read from the memory 31 according to the allocation rule of FIG. 56 such that the code bit b0 is allocated to the symbol bit y0;
the code bit b1 is allocated to the symbol bit y7;
the code bit b2 is allocated to the symbol bit y3;
the code bit b3 is allocated to the symbol bit y4;
the code bit b4 is allocated to the symbol bit y5;
the code bit b5 is allocated to the symbol bit y2;
the code bit b6 is allocated to the symbol bit y6; and
the code bit b7 is allocated to the symbol bit y1.

Figure 58:
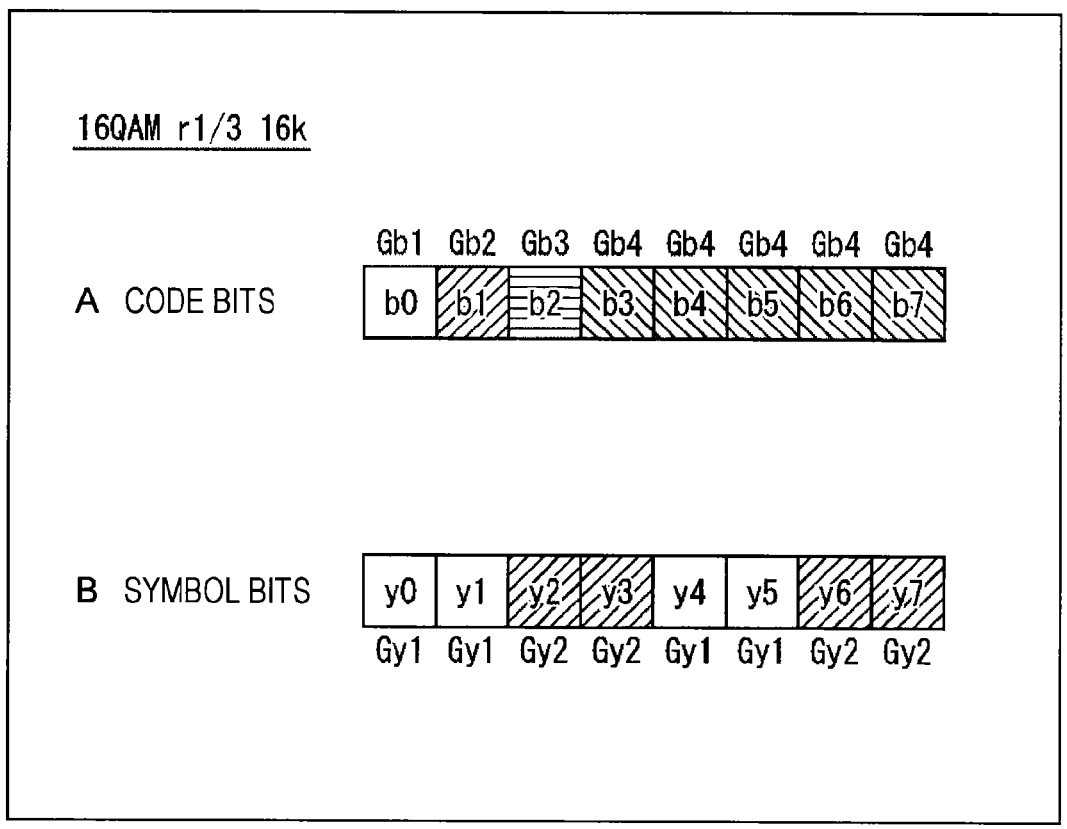
FIG. 58 is a diagram illustrating a code bit group and a symbol bit group when an LDPC code having a code length of 16200 and a coding rate of 1/3 is modulated by 16QAM, and a multiple b is 2.

FIG. 58 illustrates a code bit group and a symbol bit group when an LDPC code is a mobile LDPC code in which the code length N is 16200 bits, the coding rate is 1/3, the modulation scheme is 16QAM, and the multiple b is 2.

In this case, the code bits of 4×2 (=mb) bits read from the memory 31 may be grouped into 4 code bit groups Gb1, Gb2, Gb3, and Gb4 according to the difference in the error probability as illustrated in A of FIG. 58.

In A of FIG. 58, the code bit b0 belongs to the code bit group Gb1, the code bit b1 belongs to the code bit group Gb2, the code bit b2 belongs to the code bit group Gb3, and the code bits b3 to b7 belong to the code bit group Gb4.

When the modulation scheme is 16QAM and the multiple b is 2, the symbol bits of 4×2 (=mb) bits may be grouped into two symbol bit groups Gy1 and Gy2 according to the difference in the error probability as illustrated in B of FIG. 58.

In B of FIG. 58, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 59:
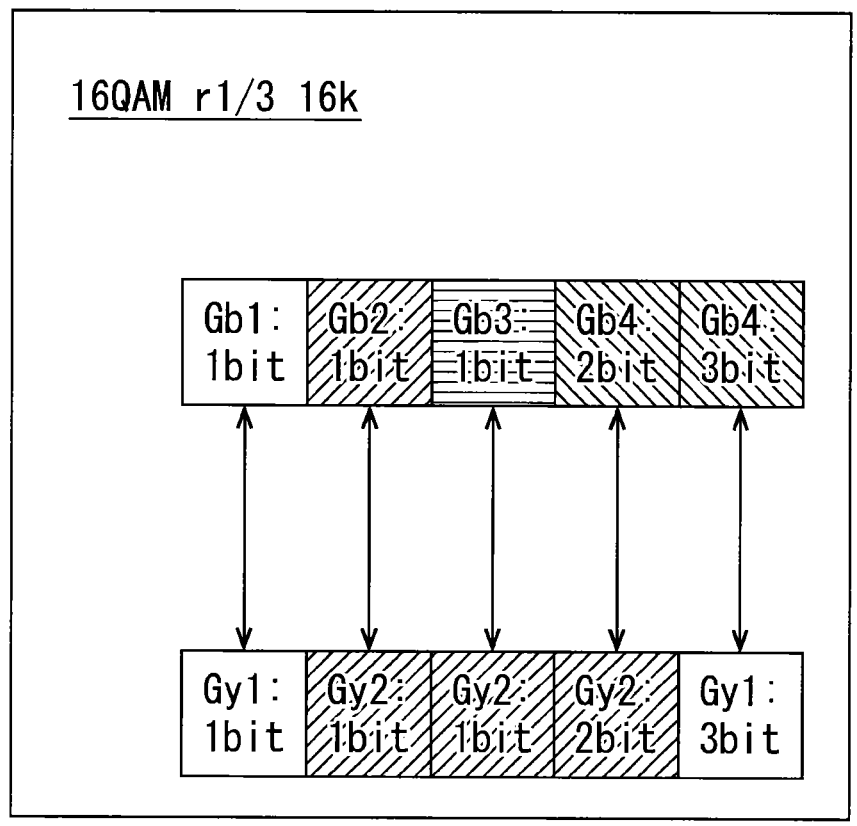
FIG. 59 is a diagram illustrating an allocation rule when an LDPC code having a code length of 16200 and a coding rate of 1/3 is modulated by 16QAM, and a multiple b is 2.

FIG. 59 illustrates an allocation rule when an LDPC code is a mobile LDPC code in which the code length N is 16200 bits, the coding rate is 1/3, the modulation scheme is 16QAM, and the multiple b is 2.

In the allocation rule of FIG. 59, pieces of group set information (Gb1, Gy1, 1), (Gb2, Gy2, 1), (Gb3, Gy2, 1), (Gb4, Gy2, 2), and (Gb4, Gy1, 3) are specified.

In other words, the allocation rule of FIG. 59 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

1 bit of the code bits of the code bit group Gb2 having the second highest error probability is allocated to 1 bit of the symbol bits of the symbol bit group Gy2 having the second highest error probability based on the group set information (Gb2, Gy2, 1);

1 bit of the code bits of the code bit group Gb3 having the third highest error probability is allocated to 1 bit of the symbol bits of the symbol bit group Gy2 having the second highest error probability based on the group set information (Gb3, Gy2, 1);

2 bits of the code bits of the code bit group Gb4 having the fourth highest error probability are allocated to 2 bits of the symbol bits of the symbol bit group Gy2 having the second highest error probability based on the group set information (Gb4, Gy2, 2); and 3 bits of the code bits of the code bit group Gb4 having the fourth highest error probability are allocated to 3 bits of the symbol bits of the symbol bit group Gy1 having the highest error probability based on the group set information (Gb4, Gy1, 3).

Figure 60:
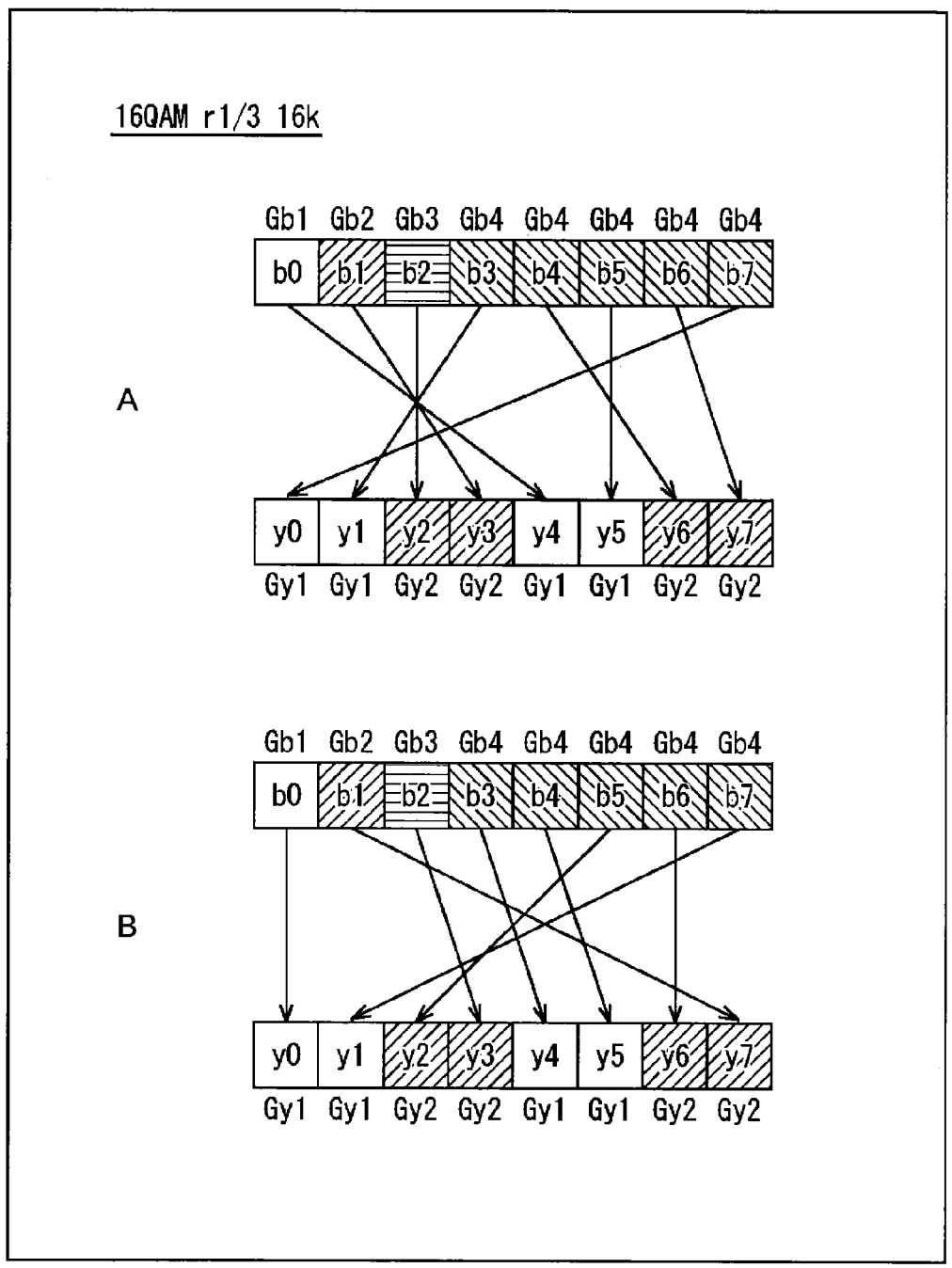
FIG. 60 is a diagram illustrating exchanging of code bits according to an allocation rule when an LDPC code having a code length of 16200 and a coding rate of 1/3 is modulated by 16QAM, and a multiple b is 2.

FIG. 60 illustrates an example of exchanging of code bits according to the allocation rule of FIG. 59.

In other words, A of FIG. 60 illustrates a first example of exchanging of code bits according to the allocation rule of FIG. 59 when an LDPC code is a mobile LDPC code in which the code length N is 16200 bits, the coding rate is 1/3, the modulation scheme is 16QAM, and the multiple b is 2.

When an LDPC code is a mobile LDPC code in which the code length N is 16200 bits, the coding rate is 1/3, the modulation scheme is 16QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 59 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 60.

In other words, the exchange unit 32 performs exchanging such that the code bit b0 is allocated to the symbol bit y4;
the code bit b1 is allocated to the symbol bit y3;
the code bit b2 is allocated to the symbol bit y2;
the code bit b3 is allocated to the symbol bit y1;
the code bit b4 is allocated to the symbol bit y6;
the code bit b5 is allocated to the symbol bit y5;
the code bit b6 is allocated to the symbol bit y7; and
the code bit b7 is allocated to the symbol bit y0.

B of FIG. 60 illustrates a second example of exchanging of code bits according to the allocation rule of FIG. 59 when an LDPC code is a mobile LDPC code in which the code length N is 16200 bits, the coding rate is 1/3, the modulation scheme is 16QAM, and the multiple b is 2.

According to B of FIG. 60, the exchange unit 32 exchanges the code bits b0 to b7 of 4×2 (=mb) bits read from the memory 31 according to the allocation rule of FIG. 59 such that the code bit b0 is allocated to the symbol bit y0;
the code bit b1 is allocated to the symbol bit y7;
the code bit b2 is allocated to the symbol bit y3;
the code bit b3 is allocated to the symbol bit y4;
the code bit b4 is allocated to the symbol bit y5;
the code bit b5 is allocated to the symbol bit y2;
the code bit b6 is allocated to the symbol bit y6; and
the code bit b7 is allocated to the symbol bit y1.

Figure 61:
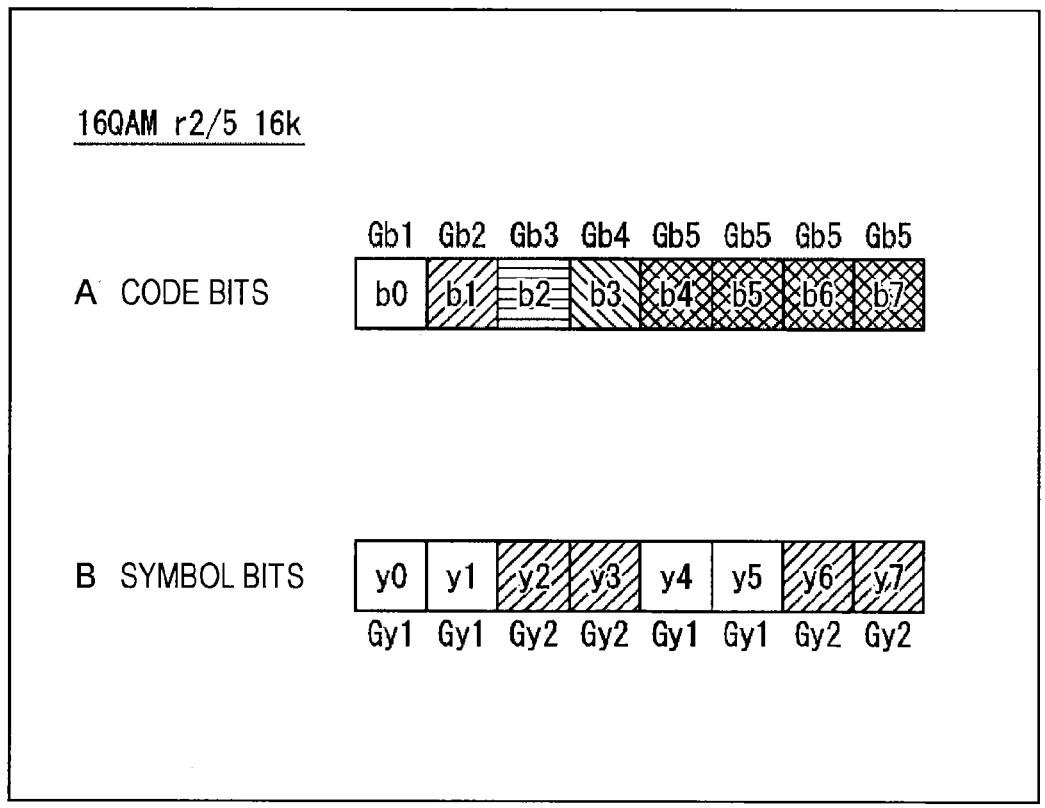
FIG. 61 is a diagram illustrating a code bit group and a symbol bit group when an LDPC code having a code length of 16200 and a coding rate of 2/5 is modulated by 16QAM, and a multiple b is 2.

FIG. 61 illustrates a code bit group and a symbol bit group when an LDPC code is a mobile LDPC code in which the code length N is 16200 bits, the coding rate is 2/5, the modulation scheme is 16QAM, and the multiple b is 2.

In this case, the code bits of 4×2 (=mb) bits read from the memory 31 may be grouped into 5 code bit groups Gb1, Gb2, Gb3, Gb4, and Gb5 according to the difference in the error probability as illustrated in A of FIG. 61.

In A of FIG. 61, the code bit b0 belongs to the code bit group Gb1, the code bit b1 belongs to the code bit group Gb2, the code bit b2 belongs to the code bit group Gb3, the code bit b3 belongs to the code bit group Gb4, and the code bits b4 to b7 belong to the code bit group Gb5.

When the modulation scheme is 16QAM and the multiple b is 2, the symbol bits of 4×2 (=mb) bits may be grouped into two symbol bit groups Gy1 and Gy2 according to the difference in the error probability as illustrated in B of FIG. 61.

In B of FIG. 61, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 62:
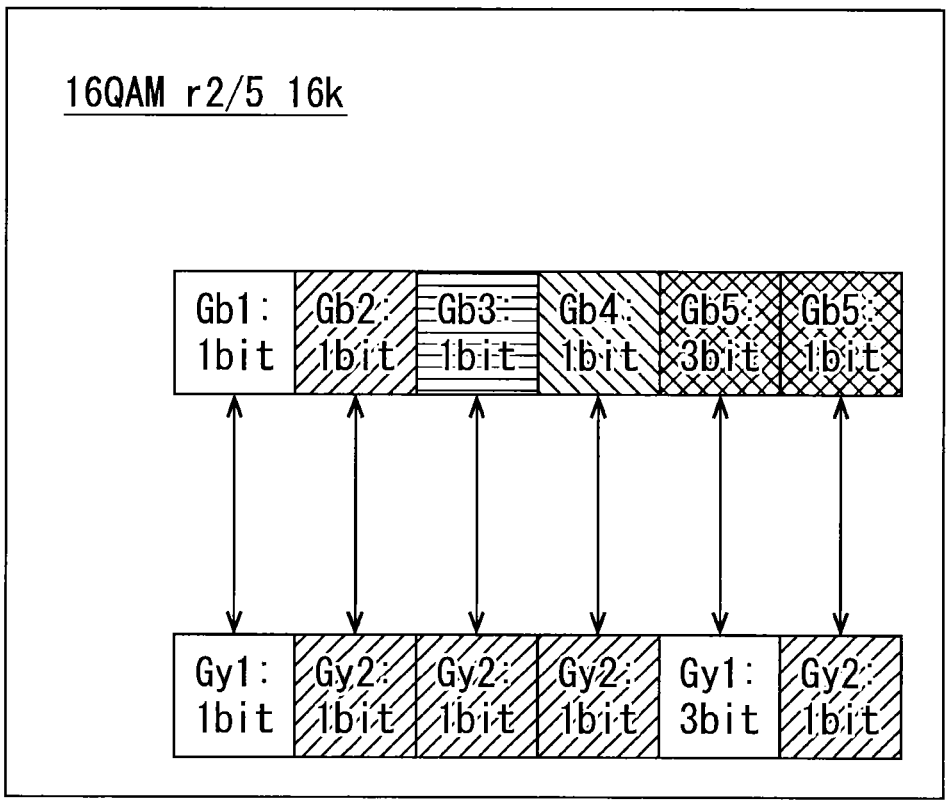
FIG. 62 is a diagram illustrating an allocation rule when an LDPC code having a code length of 16200 and a coding rate of 2/5 is modulated by 16QAM, and a multiple b is 2.

FIG. 62 illustrates an allocation rule when an LDPC code is a mobile LDPC code in which the code length N is 16200 bits, the coding rate is 2/5, the modulation scheme is 16QAM, and the multiple b is 2.

In the allocation rule of FIG. 62, pieces of group set information (Gb1, Gy1, 1), (Gb2, Gy2, 1), (Gb3, Gy2, 1), (Gb4, Gy2, 1), (Gb5, Gy1, 3), and (Gb5, Gy2, 1) are specified.

In other words, the allocation rule of FIG. 62 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

1 bit of the code bits of the code bit group Gb2 having the second highest error probability is allocated to 1 bit of the symbol bits of the symbol bit group Gy2 having the second highest error probability based on the group set information (Gb2, Gy2, 1);

1 bit of the code bits of the code bit group Gb3 having the third highest error probability is allocated to 1 bit of the symbol bits of the symbol bit group Gy2 having the second highest error probability based on the group set information (Gb3, Gy2, 1);

1 bit of the code bits of the code bit group Gb4 having the fourth highest error probability is allocated to 1 bit of the symbol bits of the symbol bit group Gy2 having the second highest error probability based on the group set information (Gb4, Gy2, 1);

3 bits of the code bits of the code bit group Gb5 having the fifth highest error probability are allocated to 3 bits of the symbol bits of the symbol bit group Gy1 having the highest error probability based on the group set information (Gb5, Gy1, 3); and 1 bit of the code bits of the code bit group Gb5 having the fifth highest error probability is allocated to 1 bit of the symbol bits of the symbol bit group Gy2 having the second highest error probability based on the group set information (Gb5, Gy2, 1).

FIG. 63 illustrates an example of exchanging of code bits according to the allocation rule of FIG. 62.

In other words, A of FIG. 63 illustrates a first example of exchanging of code bits according to the allocation rule of FIG. 62 when an LDPC code is a mobile LDPC code in which the code length N is 16200 bits, the coding rate is 2/5, the modulation scheme is 16QAM, and the multiple b is 2.

When an LDPC code is a mobile LDPC code in which the code length N is 16200 bits, the coding rate is 2/5, the modulation scheme is 16QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 62 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 63.

In other words, the exchange unit 32 performs exchanging such that the code bit b0 is allocated to the symbol bit y0;
the code bit b1 is allocated to the symbol bit y2;
the code bit b2 is allocated to the symbol bit y6;
the code bit b3 is allocated to the symbol bit y3;
the code bit b4 is allocated to the symbol bit y4;
the code bit b5 is allocated to the symbol bit y1;
the code bit b6 is allocated to the symbol bit y5; and
the code bit b7 is allocated to the symbol bit y7.

B of FIG. 63 illustrates a second example of exchanging of code bits according to the allocation rule of FIG. 62 when an LDPC code is a mobile LDPC code in which the code length N is 16200 bits, the coding rate is 2/5, the modulation scheme is 16QAM, and the multiple b is 2.

According to B of FIG. 63, the exchange unit 32 exchanges the code bits b0 to b7 of 4×2 (=mb) bits read from the memory 31 according to the allocation rule of FIG. 62 such that the code bit b0 is allocated to the symbol bit y0;
the code bit b1 is allocated to the symbol bit y2;
the code bit b2 is allocated to the symbol bit y3;
the code bit b3 is allocated to the symbol bit y6;
the code bit b4 is allocated to the symbol bit y4;
the code bit b5 is allocated to the symbol bit y5;

the code bit b6 is allocated to the symbol bit y1; and the code bit b7 is allocated to the symbol bit y7.

Figure 64:
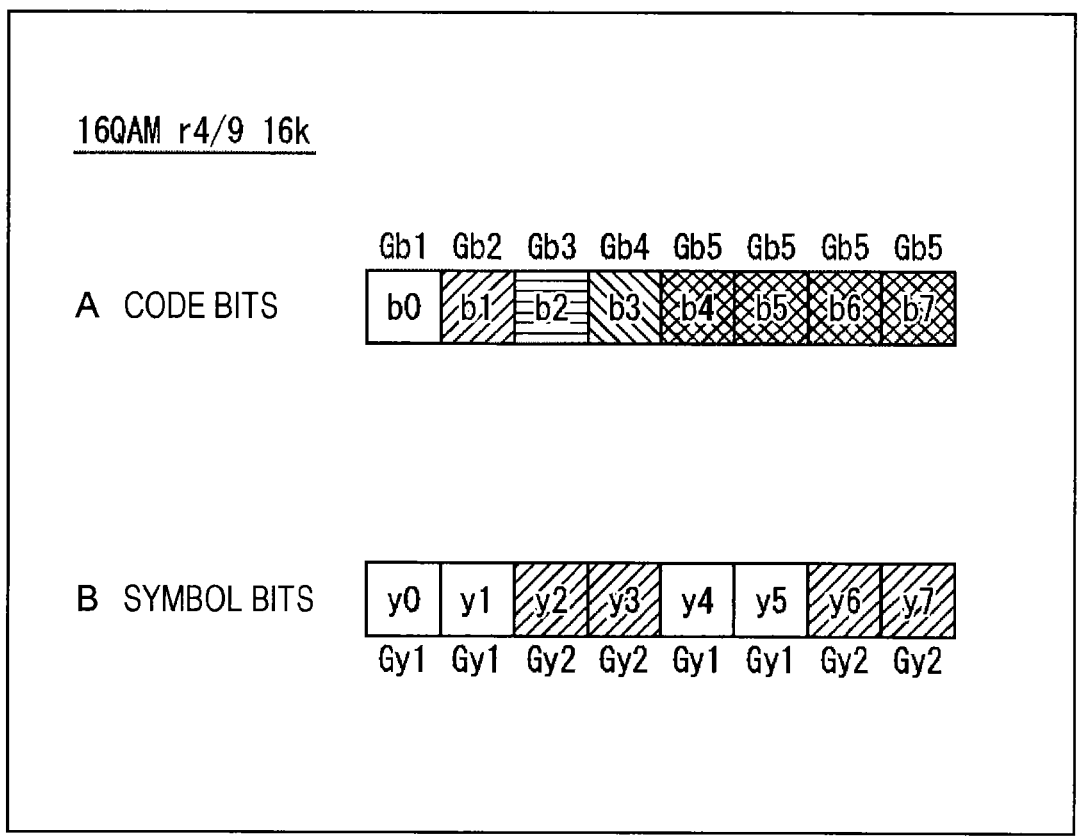
FIG. 64 is a diagram illustrating a code bit group and a symbol bit group when an LDPC code having a code length of 16200 and a coding rate of 4/9 is modulated by 16QAM, and a multiple b is 2.

FIG. 64 illustrates a code bit group and a symbol bit group when an LDPC code is a mobile LDPC code in which the code length N is 16200 bits, the coding rate is 4/9, the modulation scheme is 16QAM, and the multiple b is 2.

In this case, the code bits of 4×2 (=mb) bits read from the memory 31 may be grouped into 5 code bit groups Gb1, Gb2, Gb3, Gb4, and Gb5 according to the difference in the error probability as illustrated in A of FIG. 64.

In A of FIG. 64, the code bit b0 belongs to the code bit group Gb1, the code bit b1 belongs to the code bit group Gb2, the code bit b2 belongs to the code bit group Gb3, the code bit b3 belongs to the code bit group Gb4, and the code bits b4 to b7 belong to the code bit group Gb5.

When the modulation scheme is 16QAM and the multiple b is 2, the symbol bits of 4×2 (=mb) bits may be grouped into two symbol bit groups Gy1 and Gy2 according to the difference in the error probability as illustrated in B of FIG. 64.

In B of FIG. 64, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 65:
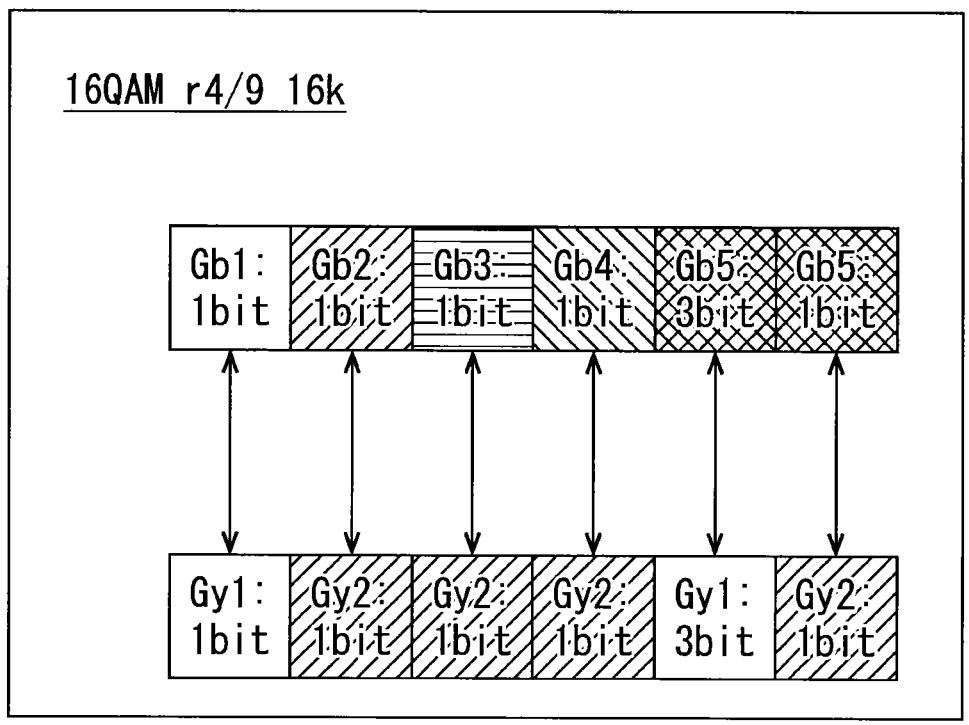
FIG. 65 is a diagram illustrating an allocation rule when an LDPC code having a code length of 16200 and a coding rate of 4/9 is modulated by 16QAM, and a multiple b is 2.

FIG. 65 illustrates an allocation rule when an LDPC code is a mobile LDPC code in which the code length N is 16200 bits, the coding rate is 4/9, the modulation scheme is 16QAM, and the multiple b is 2.

In the allocation rule of FIG. 65, pieces of group set information (Gb1, Gy1, 1), (Gb2, Gy2, 1), (Gb3, Gy2, 1), (Gb4, Gy2, 1), (Gb5, Gy1, 3), and (Gb5, Gy2, 1) are specified.

In other words, the allocation rule of FIG. 65 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

1 bit of the code bits of the code bit group Gb2 having the second highest error probability is allocated to 1 bit of the symbol bits of the symbol bit group Gy2 having the second highest error probability based on the group set information (Gb2, Gy2, 1);

1 bit of the code bits of the code bit group Gb3 having the third highest error probability is allocated to 1 bit of the symbol bits of the symbol bit group Gy2 having the second highest error probability based on the group set information (Gb3, Gy2, 1);

1 bit of the code bits of the code bit group Gb4 having the fourth highest error probability is allocated to 1 bit of the symbol bits of the symbol bit group Gy2 having the second highest error probability based on the group set information (Gb4, Gy2, 1);

3 bits of the code bits of the code bit group Gb5 having the fifth highest error probability are allocated to 3 bits of the symbol bits of the symbol bit group Gy1 having the highest error probability based on the group set information (Gb5, Gy1, 3); and 1 bit of the code bits of the code bit group Gb5 having the fifth highest error probability is allocated to 1 bit of the symbol bits of the symbol bit group Gy2 having the second highest error probability based on the group set information (Gb5, Gy2, 1).

Figure 66:
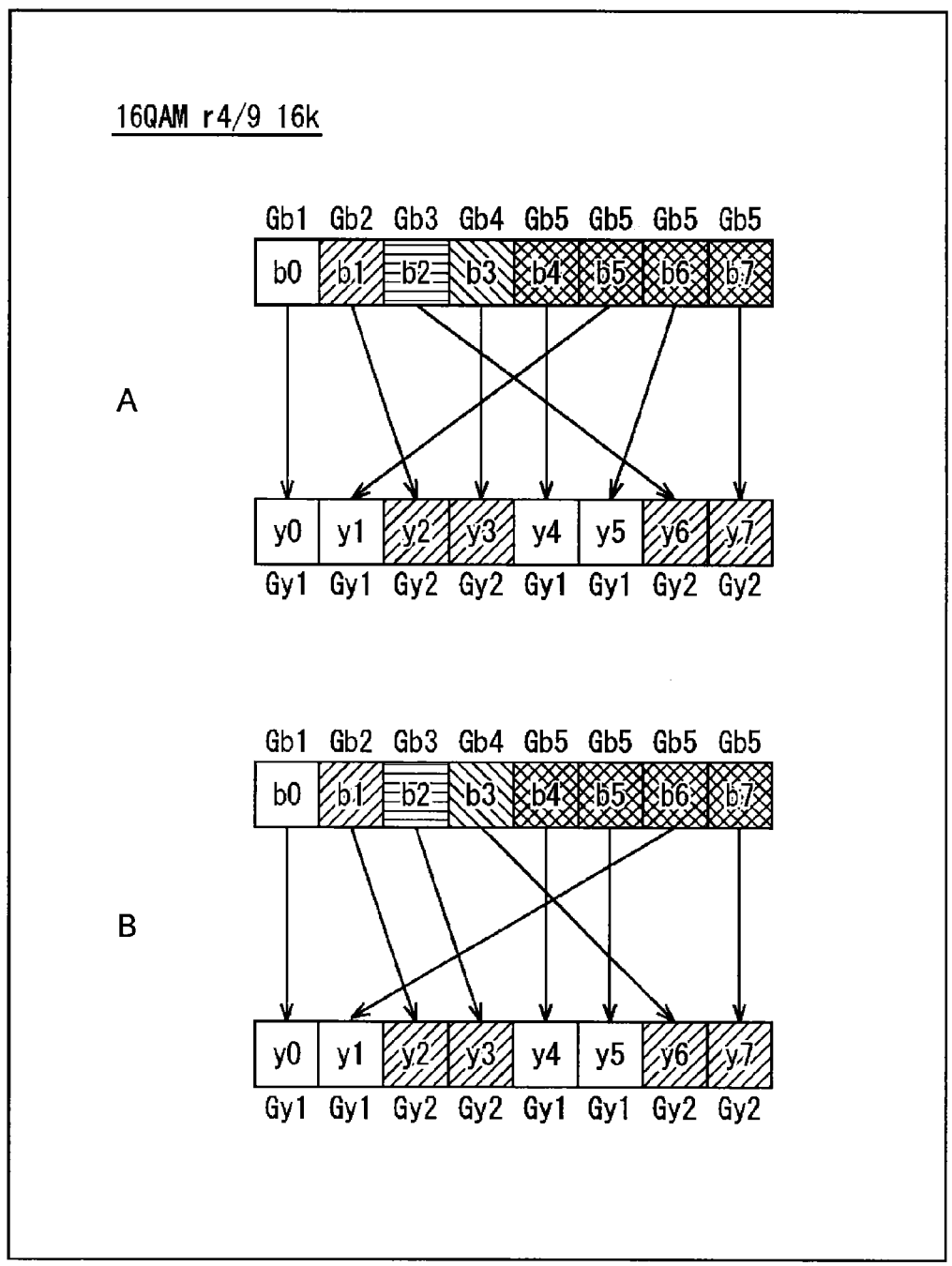
FIG. 66 is a diagram illustrating exchanging of code bits according to an allocation rule when an LDPC code having a code length of 16200 and a coding rate of 4/9 is modulated by 16QAM, and a multiple b is 2.

FIG. 66 illustrates an example of exchanging of code bits according to the allocation rule of FIG. 65.

In other words, A of FIG. 66 illustrates a first example of exchanging of code bits according to the allocation rule of FIG. 65 when an LDPC code is a mobile LDPC code in which the code length N is 16200 bits, the coding rate is 4/9, the modulation scheme is 16QAM, and the multiple b is 2.

When an LDPC code is a mobile LDPC code in which the code length N is 16200 bits, the coding rate is 4/9, the modulation scheme is 16QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 65 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 66.

In other words, the exchange unit 32 performs exchanging such that the code bit b0 is allocated to the symbol bit y0;

the code bit b1 is allocated to the symbol bit y2;

the code bit b2 is allocated to the symbol bit y6;

the code bit b3 is allocated to the symbol bit y3;

the code bit b4 is allocated to the symbol bit y4;

the code bit b5 is allocated to the symbol bit y1;

the code bit b6 is allocated to the symbol bit y5; and the code bit b7 is allocated to the symbol bit y7.

B of FIG. 66 illustrates a second example of exchanging of code bits according to the allocation rule of FIG. 65 when an LDPC code is a mobile LDPC code in which the code length N is 16200 bits, the coding rate is 4/9, the modulation scheme is 16QAM, and the multiple b is 2.

According to B of FIG. 66, the exchange unit 32 exchanges the code bits b0 to b7 of 4×2 (=mb) bits read from the memory 31 according to the allocation rule of FIG. 65 such that the code bit b0 is allocated to the symbol bit y0;

the code bit b1 is allocated to the symbol bit y2;

the code bit b2 is allocated to the symbol bit y3;

the code bit b3 is allocated to the symbol bit y6;

the code bit b4 is allocated to the symbol bit y4;

the code bit b5 is allocated to the symbol bit y5;

the code bit b6 is allocated to the symbol bit y1; and the code bit b7 is allocated to the symbol bit y7.

Figure 67:
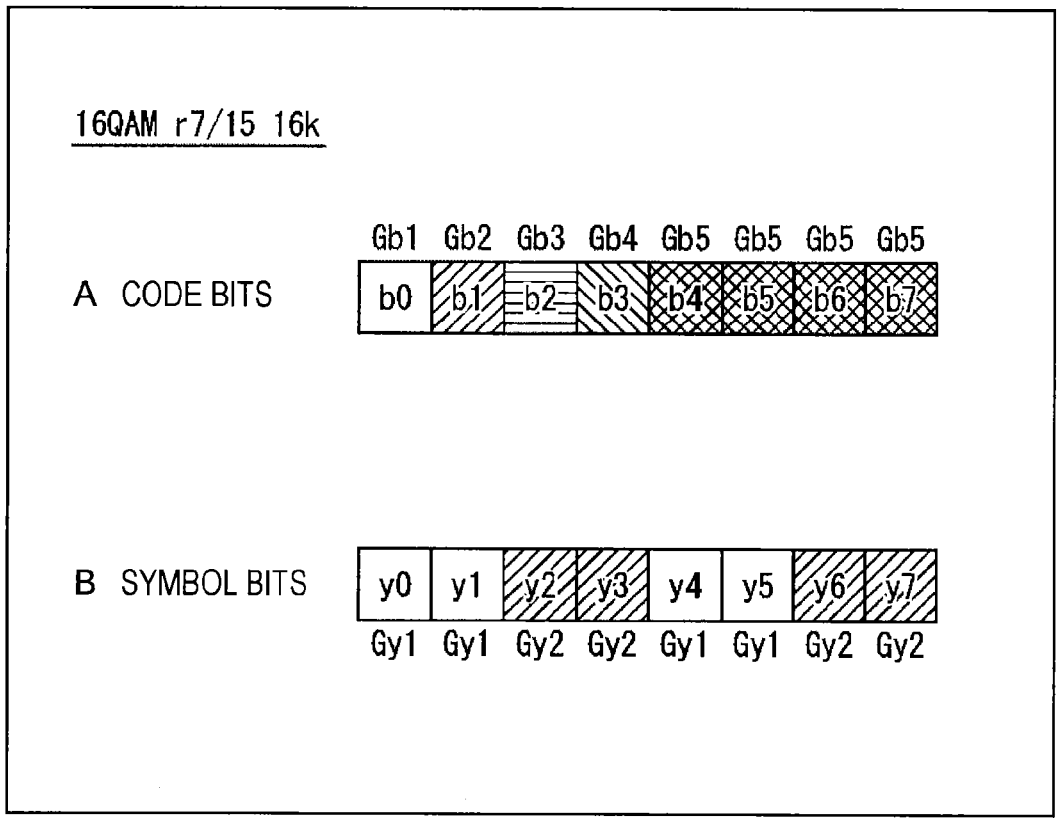
FIG. 67 is a diagram illustrating a code bit group and a symbol bit group when an LDPC code having a code length of 16200 and a coding rate of 7/15 is modulated by 16QAM, and a multiple b is 2.

FIG. 67 illustrates a code bit group and a symbol bit group when an LDPC code is a mobile LDPC code in which the code length N is 16200 bits, the coding rate is 7/15, the modulation scheme is 16QAM, and the multiple b is 2.

In this case, the code bits of 4×2 (=mb) bits read from the memory 31 may be grouped into 5 code bit groups Gb1, Gb2, Gb3, Gb4, and Gb5 according to the difference in the error probability as illustrated in A of FIG. 67.

In A of FIG. 67, the code bit b0 belongs to the code bit group Gb1, the code bit b1 belongs to the code bit group Gb2, the code bit b2 belongs to the code bit group Gb3, the code bit b3 belongs to the code bit group Gb4, and the code bits b4 to b7 belong to the code bit group Gb5.

When the modulation scheme is 16QAM and the multiple b is 2, the symbol bits of 4×2 (=mb) bits may be grouped into two symbol bit groups Gy1 and Gy2 according to the difference in the error probability as illustrated in B of FIG. 67.

In B of FIG. 67, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 68:
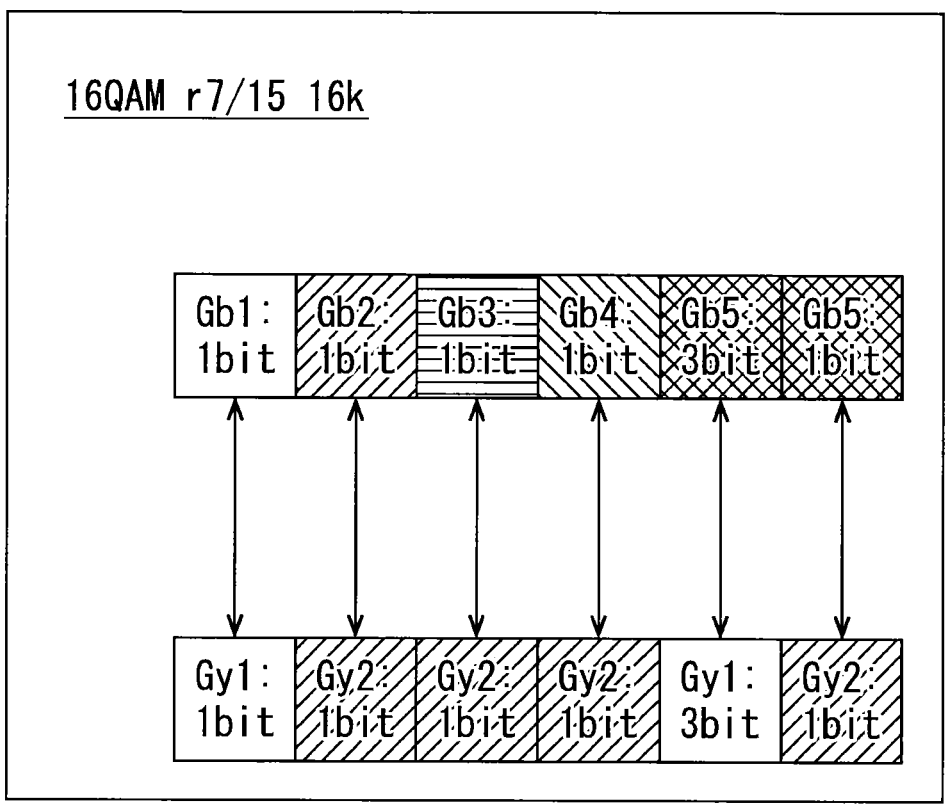
FIG. 68 is a diagram illustrating an allocation rule when an LDPC code having a code length of 16200 and a coding rate of 7/15 is modulated by 16QAM, and a multiple b is 2.

FIG. 68 illustrates an allocation rule when an LDPC code is a mobile LDPC code in which the code length N is 16200 bits, the coding rate is 7/15, the modulation scheme is 16QAM, and the multiple b is 2.

In the allocation rule of FIG. 68, pieces of group set information (Gb1, Gy1, 1), (Gb2, Gy2, 1), (Gb3, Gy2, 1), (Gb4, Gy2, 1), (Gb5, Gy1, 3), and (Gb5, Gy2, 1) are specified.

In other words, the allocation rule of FIG. 68 specifies that 1 bit of the code bits of the code bit group Gb1 having the highest error probability is allocated to 1 bit of the symbol bits of the symbol bit group Gy1 having the highest error probability based on the group set information (Gb1, Gy1, 1);

1 bit of the code bits of the code bit group Gb2 having the second highest error probability is allocated to 1 bit of the symbol bits of the symbol bit group Gy2 having the second highest error probability based on the group set information (Gb2, Gy2, 1);

1 bit of the code bits of the code bit group Gb3 having the third highest error probability is allocated to 1 bit of the symbol bits of the symbol bit group Gy2 having the second highest error probability based on the group set information (Gb3, Gy2, 1);

1 bit of the code bits of the code bit group Gb4 having the fourth highest error probability is allocated to 1 bit of the symbol bits of the symbol bit group Gy2 having the second highest error probability based on the group set information (Gb4, Gy2, 1);

3 bits of the code bits of the code bit group Gb5 having the fifth highest error probability are allocated to 3 bits of the symbol bits of the symbol bit group Gy1 having the highest error probability based on the group set information (Gb5, Gy1, 3); and 1 bit of the code bits of the code bit group Gb5 having the fifth highest error probability is allocated to 1 bit of the symbol bits of the symbol bit group Gy2 having the second highest error probability based on the group set information (Gb5, Gy2, 1).

Figure 69:
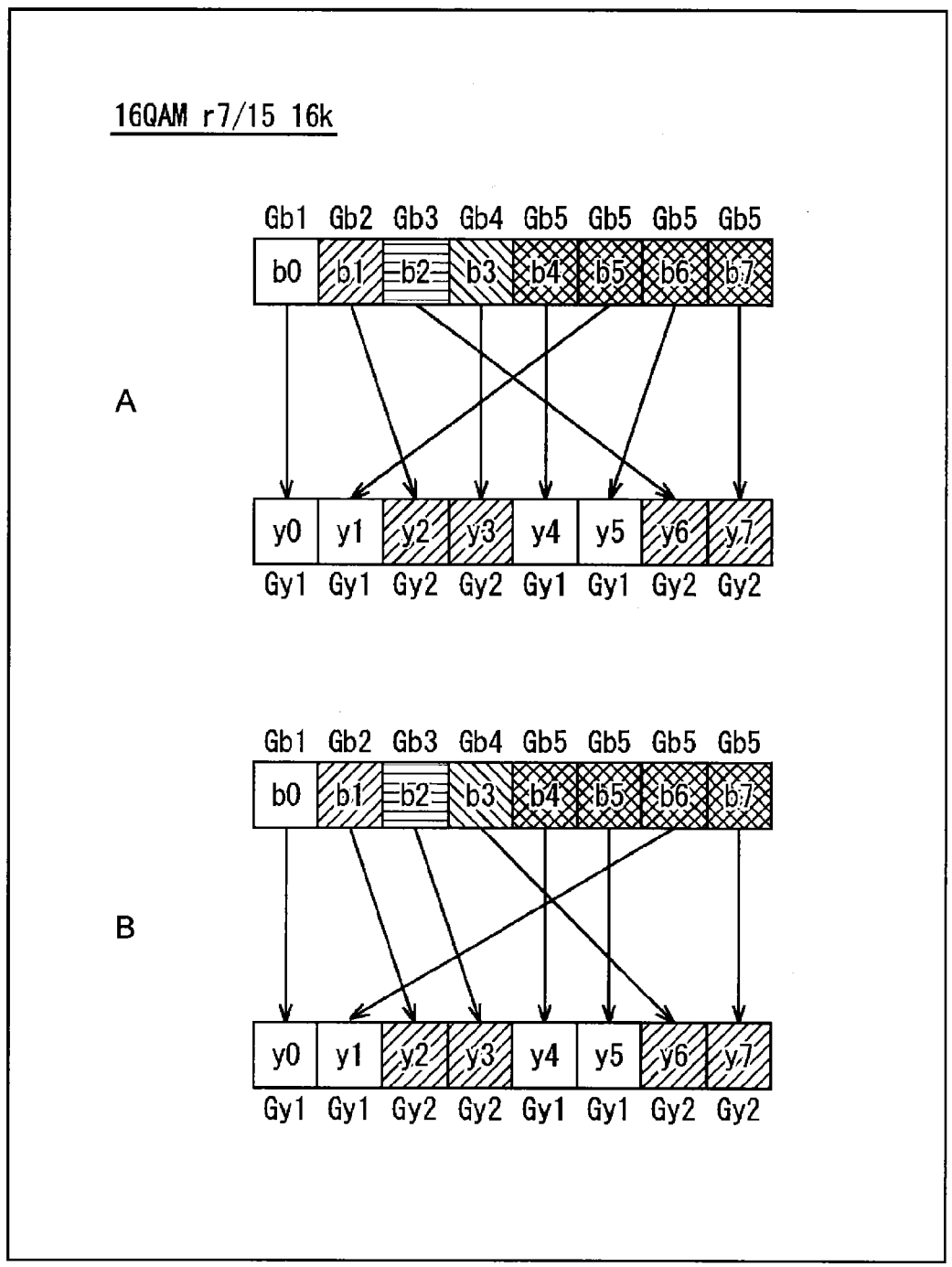
FIG. 69 is a diagram illustrating exchanging of code bits according to an allocation rule when an LDPC code having a code length of 16200 and a coding rate of 7/15 is modulated by 16QAM, and a multiple b is 2.

FIG. 69 illustrates an example of exchanging of code bits according to the allocation rule of FIG. 68.

In other words, A of FIG. 69 illustrates a first example of exchanging of code bits according to the allocation rule of FIG. 68 when an LDPC code is a mobile LDPC code in which the code length N is 16200 bits and the coding rate is 7/15, the modulation scheme is 16QAM, and the multiple b is 2.

When an LDPC code is a mobile LDPC code in which the code length N is 16200 bits and the coding rate is 7/15, the modulation scheme is 16QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 68 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 69.

In other words, the exchange unit 32 performs exchanging such that the code bit b0 is allocated to the symbol bit y0,
the code bit b1 is allocated to the symbol bit y2,
the code bit b2 is allocated to the symbol bit y6,
the code bit b3 is allocated to the symbol bit y3,
the code bit b4 is allocated to the symbol bit y4,
the code bit b5 is allocated to the symbol bit y1,
the code bit b6 is allocated to the symbol bit y5, and
the code bit b7 is allocated to the symbol bit y7.

B of FIG. 69 illustrates a second example of exchanging of code bits according to the allocation rule of FIG. 68 when an LDPC code is a mobile LDPC code in which the code length N is 16200 bits and the coding rate is 7/15, the modulation scheme is 16QAM, and the multiple b is 2.

According to B of FIG. 69, the exchange unit 32 exchanges the code bits b0 to b7 of 4×2 (=mb) bits read from the memory 31 according to the allocation rule of FIG. 68 such that the code bit b0 is allocated to the symbol bit y0,
the code bit b1 is allocated to the symbol bit y2,
the code bit b2 is allocated to the symbol bit y3,
the code bit b3 is allocated to the symbol bit y6,
the code bit b4 is allocated to the symbol bit y4,
the code bit b5 is allocated to the symbol bit y5,
the code bit b6 is allocated to the symbol bit y1, and
the code bit b7 is allocated to the symbol bit y7.

Figure 70:
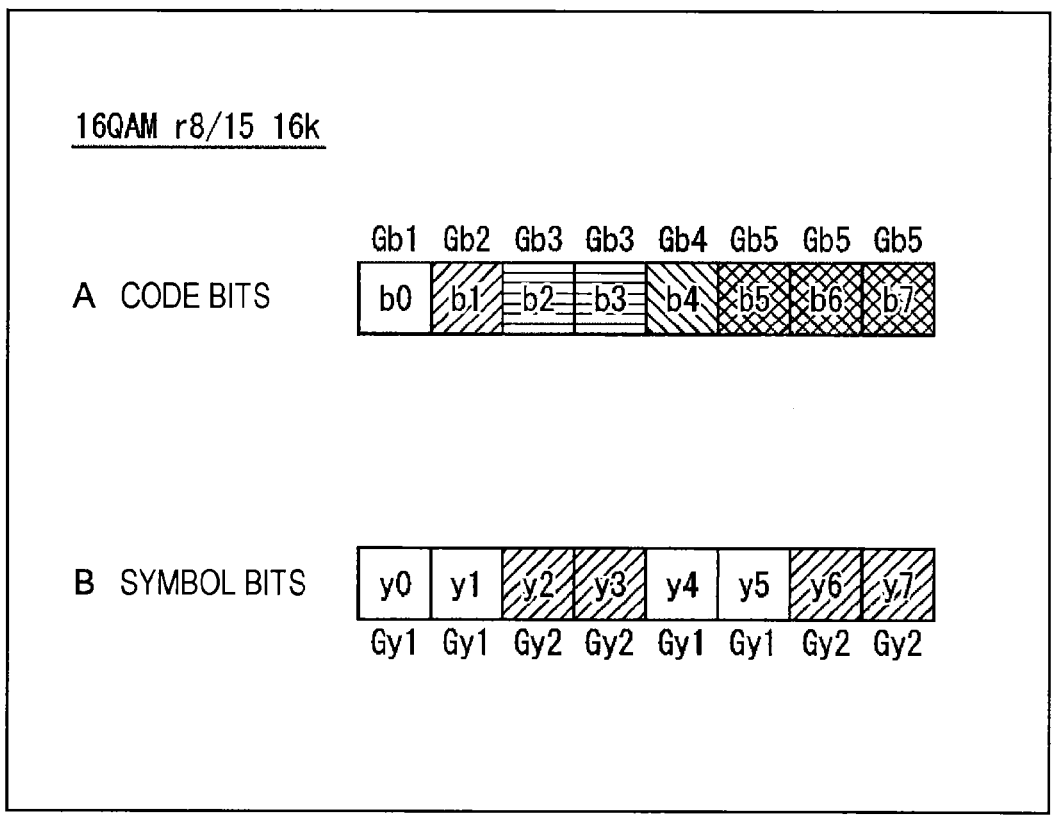
FIG. 70 is a diagram illustrating a code bit group and a symbol bit group when an LDPC code having a code length of 16200 and a coding rate of 8/15 is modulated by 16QAM, and a multiple b is 2.

FIG. 70 illustrates a code bit group and a symbol bit group when an LDPC code is a mobile LDPC code in which the code length N is 16200 bits and the coding rate is 8/15, the modulation scheme is 16QAM, and the multiple b is 2.

In this case, the code bits of 4×2 (=mb) bits read from the memory 31 may be grouped into 5 code bit groups Gb1, Gb2, Gb3, Gb4, and Gb5 according to the difference in the error probability as illustrated in A of FIG. 70.

In A of FIG. 70, the code bit b0 belongs to the code bit group Gb1, the code bit b1 belongs to the code bit group Gb2, the code bits b2 and b3 belong to the code bit group Gb3, the code bit b4 belongs to the code bit group Gb4, and the code bits b5 to b7 belong to the code bit group Gb5.

When the modulation scheme is 16QAM and the multiple b is 2, the symbol bits of 4×2 (=mb) bits may be grouped into two symbol bit groups Gy1 and Gy2 according to the difference in the error probability as illustrated in B of FIG. 70.

In B of FIG. 70, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 71:
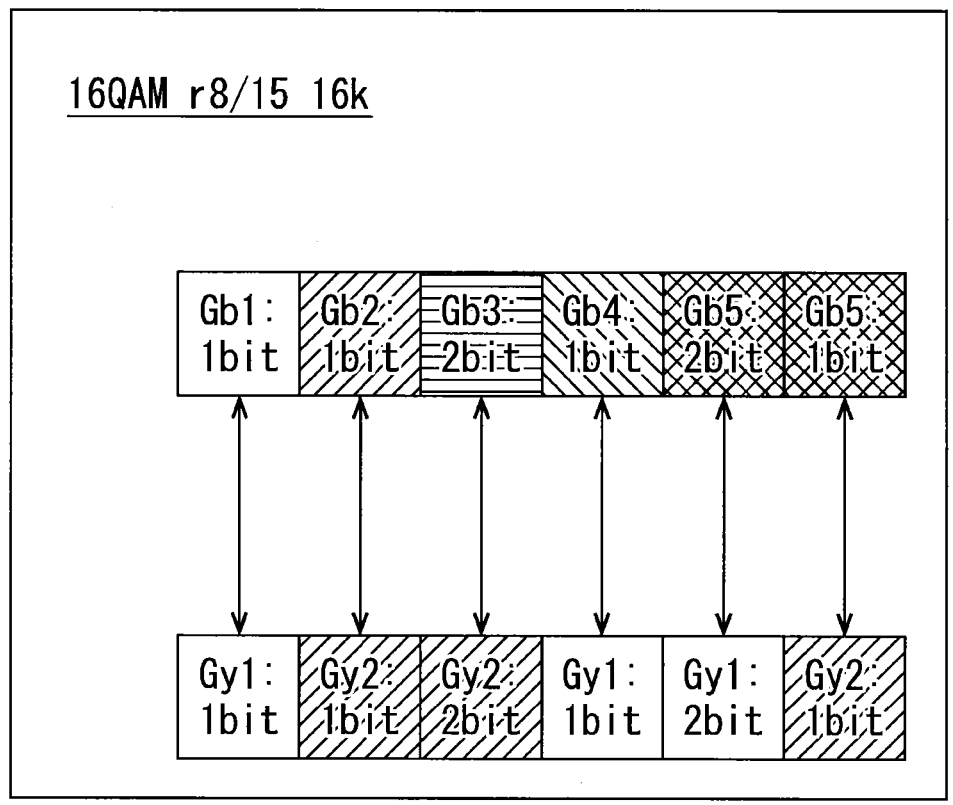
FIG. 71 is a diagram illustrating an allocation rule when an LDPC code having a code length of 16200 and a coding rate of 8/15 is modulated by 16QAM, and a multiple b is 2.

FIG. 71 illustrates an allocation rule when an LDPC code is a mobile LDPC code in which the code length N is 16200 bits, and the coding rate is 8/15, the modulation scheme is 16QAM, and the multiple b is 2.

In the allocation rule of FIG. 71, pieces of group set information (Gb1, Gy1, 1), (Gb2, Gy2, 1), (Gb3, Gy2, 2), (Gb4, Gy1, 1), (Gb5, Gy1, 2), and (Gb5, Gy2, 1) are specified.

In other words, the allocation rule of FIG. 71 specifies that a 1 bit of the code bits of the code bit group Gb1 having the highest error probability is allocated to a 1 bit of the symbol bits of the symbol bit group Gy1 having the highest error probability based on the group set information (Gb1, Gy1, 1), a 1 bit of the code bits of the code bit group Gb2 having the second highest error probability is allocated to a 1 bit of the symbol bits of the symbol bit group Gy2 having the second highest error probability based on the group set information (Gb2, Gy2, 1), 2 bits of the code bits of the code bit group Gb3 having the third highest error probability is allocated to 2 bits of the symbol bits of the symbol bit group Gy2 having the second highest error probability based on the group set information (Gb3, Gy2, 2), a 1 bit of the code bits of the code bit group Gb4 having the fourth highest error probability is allocated to a 1 bit of the symbol bits of the symbol bit group Gy1 having the highest error probability based on the group set information (Gb4, Gy1, 1), 2 bits of the code bits of the code bit group Gb5 having the fifth highest error probability is allocated to 2 bits of the symbol bits of the symbol bit group Gy1 having the highest error probability based on the group set information (Gb5, Gy1, 2), and a 1 bit of the code bits of the code bit group Gb5 having the fifth highest error probability is allocated to a 1 bit of the symbol bits of the symbol bit group Gy2 having the second highest error probability based on the group set information (Gb5, Gy2, 1).

Figure 72:
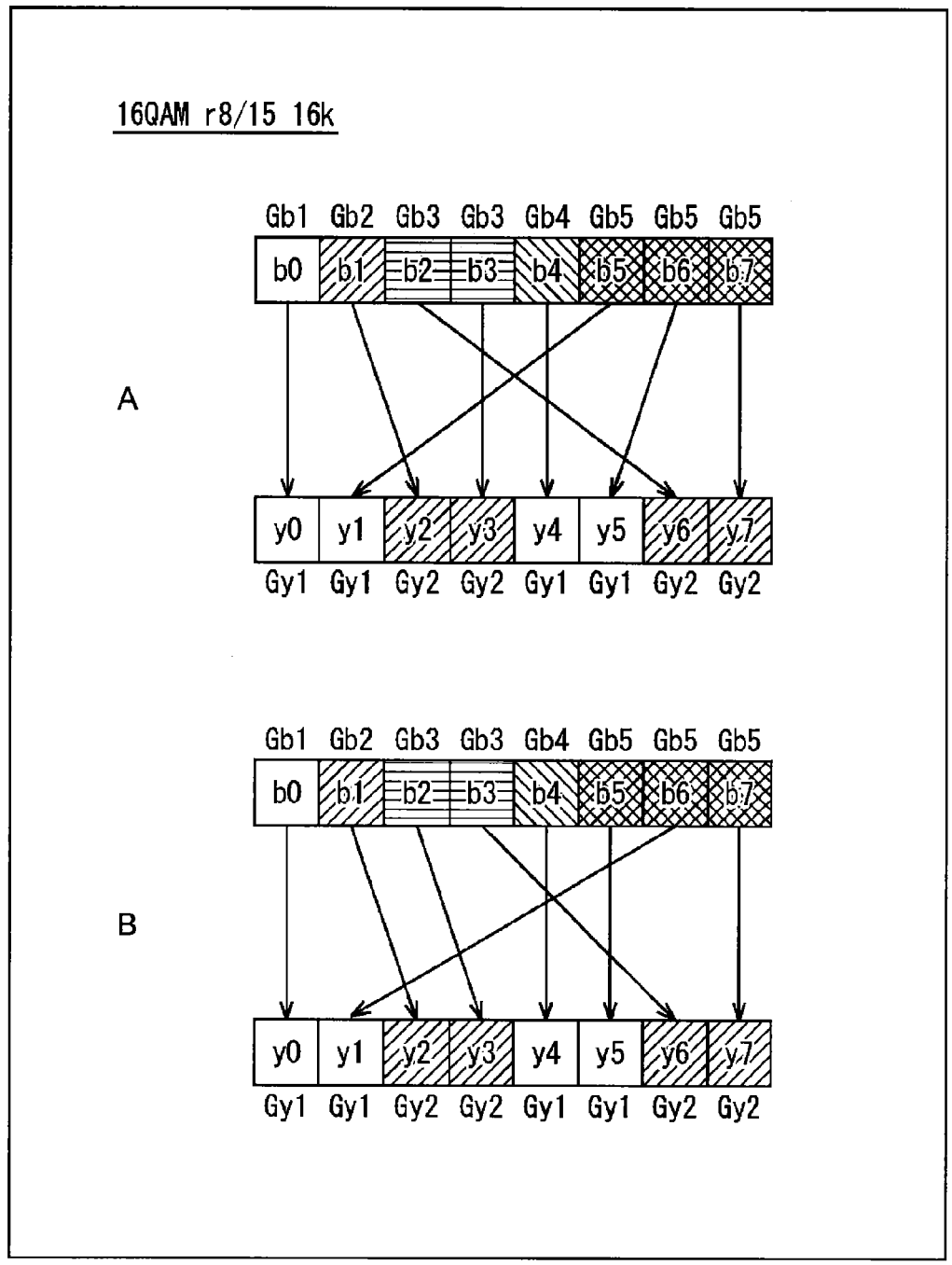
FIG. 72 is a diagram illustrating exchanging of code bits according to an allocation rule when an LDPC code having a code length of 16200 and a coding rate of 8/15 is modulated by 16QAM, and a multiple b is 2.

FIG. 72 illustrates an example of exchanging of code bits according to the allocation rule of FIG. 71.

In other words, A of FIG. 72 illustrates a first example of exchanging of code bits according to the allocation rule of FIG. 71 when an LDPC code is a mobile LDPC code in which the code length N is 16200 bits and the coding rate is 8/15, the modulation scheme is 16QAM, and the multiple b is 2.

When an LDPC code is a mobile LDPC code in which the code length N is 16200 bits and the coding rate is 8/15, the modulation scheme is 16QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 71 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 72.

In other words, the exchange unit 32 performs exchanging such that
the code bit b0 is allocated to the symbol bit y0,
the code bit b1 is allocated to the symbol bit y2,
the code bit b2 is allocated to the symbol bit y6,
the code bit b3 is allocated to the symbol bit y3,
the code bit b4 is allocated to the symbol bit y4,
the code bit b5 is allocated to the symbol bit y1,
the code bit b6 is allocated to the symbol bit y5, and
the code bit b7 is allocated to the symbol bit y7.

B of FIG. 72 illustrates a second example of exchanging of code bits according to the allocation rule of FIG. 71 when an LDPC code is a mobile LDPC code in which the code length N is 16200 bits and the coding rate is 8/15, the modulation scheme is 16QAM, and the multiple b is 2.

According to B of FIG. 72, the exchange unit 32 exchanges the code bits b0 to b7 of 4×2 (=mb) bits read from the memory 31 according to the allocation rule of FIG. 71 such that
the code bit b0 is allocated to the symbol bit y0,
the code bit b1 is allocated to the symbol bit y2,
the code bit b2 is allocated to the symbol bit y3,
the code bit b3 is allocated to the symbol bit y6,
the code bit b4 is allocated to the symbol bit y4,
the code bit b5 is allocated to the symbol bit y5,
the code bit b6 is allocated to the symbol bit y1, and
the code bit b7 is allocated to the symbol bit y7.

Figure 73:
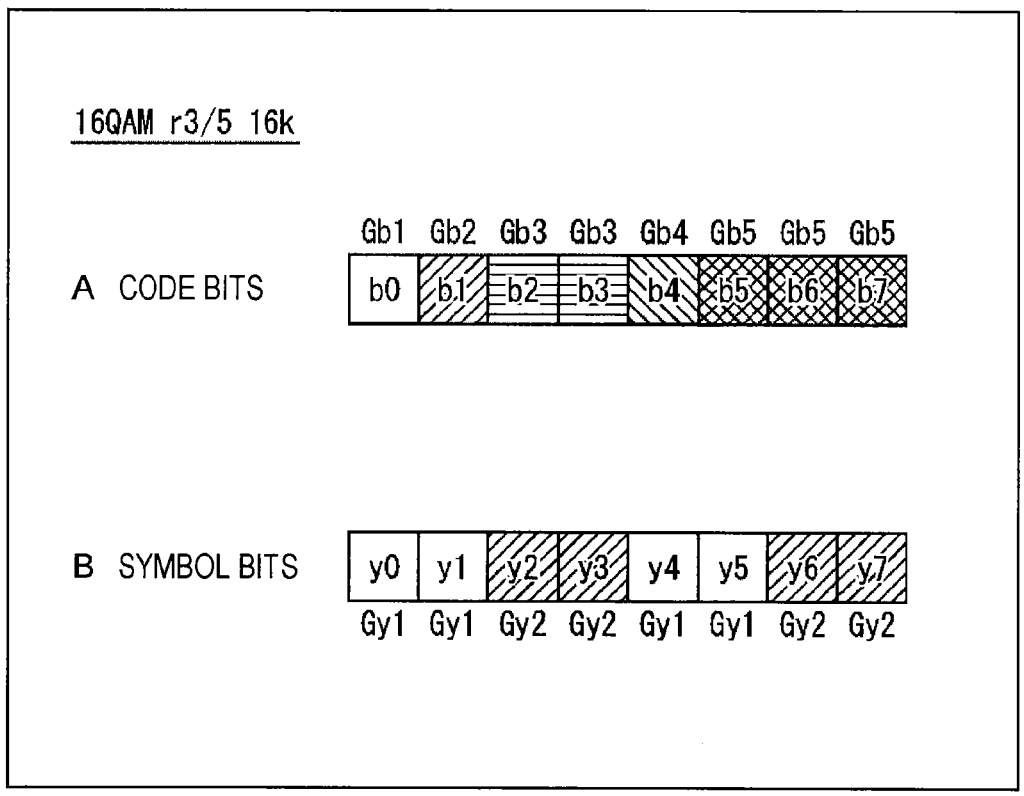
FIG. 73 is a diagram illustrating a code bit group and a symbol bit group when an LDPC code having a code length of 16200 and a coding rate of 3/5 is modulated by 16QAM, and a multiple b is 2.

FIG. 73 illustrates a code bit group and a symbol bit group when an LDPC code is a mobile LDPC code in which the code length N is 16200 bits and the coding rate is 3/5, the modulation scheme is 16QAM, and the multiple b is 2.

In this case, the code bits of 4×2 (=mb) bits read from the memory 31 may be grouped into 5 code bit groups Gb1, Gb2, Gb3, Gb4, and Gb5 according to the difference in the error probability as illustrated in A of FIG. 73.

In A of FIG. 73, the code bit b0 belongs to the code bit group Gb1, the code bit b1 belongs to the code bit group Gb2, the code bits b2 and b3 belong to the code bit group Gb3, the code bit b4 belongs to the code bit group Gb4, and the code bits b5 to b7 belong to the code bit group Gb5.

When the modulation scheme is 16QAM and the multiple b is 2, the symbol bits of 4×2 (=mb) bits may be grouped into two symbol bit groups Gy1 and Gy2 according to the difference in the error probability as illustrated in B of FIG. 73.

In B of FIG. 73, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 74:
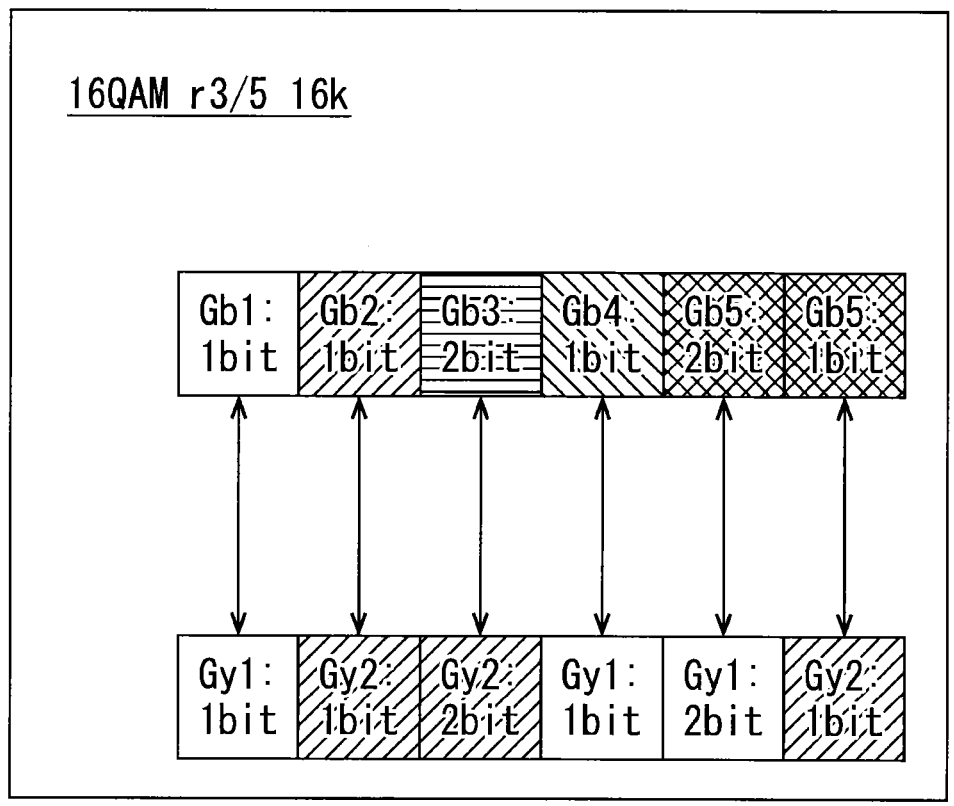
FIG. 74 is a diagram illustrating an allocation rule when an LDPC code having a code length of 16200 and a coding rate of 3/5 is modulated by 16QAM, and a multiple b is 2.

FIG. 74 illustrates an allocation rule when an LDPC code is a mobile LDPC code in which the code length N is 16200 bits, and the coding rate is 3/5, the modulation scheme is 16QAM, and the multiple b is 2.

In the allocation rule of FIG. 74, pieces of group set information (Gb1, Gy1, 1), (Gb2, Gy2, 1), (Gb3, Gy2, 2), (Gb4, Gy1, 1), (Gb5, Gy1, 2), and (Gb5, Gy2, 1) are specified.

In other words, the allocation rule of FIG. 74 specifies
that a 1 bit of the code bits of the code bit group Gb1 having the highest error probability is allocated to a 1 bit of the symbol bits of the symbol bit group Gy1 having the highest error probability based on the group set information (Gb1, Gy1, 1),
a 1 bit of the code bits of the code bit group Gb2 having the second highest error probability is allocated to a 1 bit of the symbol bits of the symbol bit group Gy2 having the second highest error probability based on the group set information (Gb2, Gy2, 1),
2 bits of the code bits of the code bit group Gb3 having the third highest error probability is allocated to 2 bits of the symbol bits of the symbol bit group Gy2 having the second highest error probability based on the group set information (Gb3, Gy2, 2),
a 1 bit of the code bits of the code bit group Gb4 having the fourth highest error probability is allocated to a 1 bit of the symbol bits of the symbol bit group Gy1 having the highest error probability based on the group set information (Gb4, Gy1, 1),
2 bits of the code bits of the code bit group Gb5 having the fifth highest error probability is allocated to 2 bits of the symbol bits of the symbol bit group Gy1 having the highest error probability based on the group set information (Gb5, Gy1, 2), and
a 1 bit of the code bits of the code bit group Gb5 having the fifth highest error probability is allocated to a 1 bit of the symbol bits of the symbol bit group Gy2 having the second highest error probability based on the group set information (Gb5, Gy2, 1).

Figure 75:
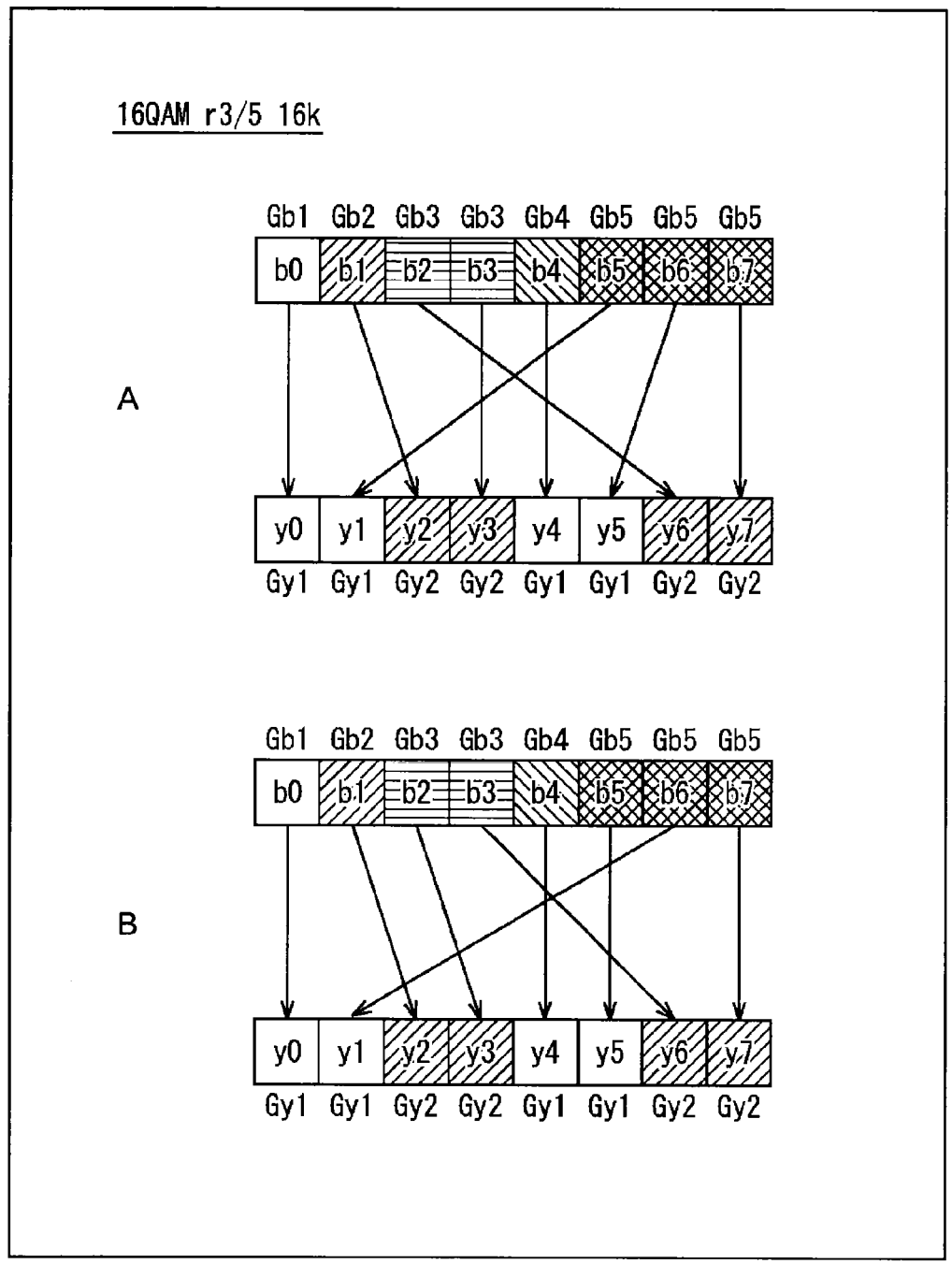
FIG. 75 is a diagram illustrating exchanging of code bits according to an allocation rule when an LDPC code having a code length of 16200 and a coding rate of 3/5 is modulated by 16QAM, and a multiple b is 2.

FIG. 75 illustrates an example of exchanging of code bits according to the allocation rule of FIG. 74.

In other words, A of FIG. 75 illustrates a first example of exchanging of code bits according to the allocation rule of FIG. 74 when an LDPC code is a mobile LDPC code in which the code length N is 16200 bits and the coding rate is 3/5, the modulation scheme is 16QAM, and the multiple b is 2.

When an LDPC code is a mobile LDPC code in which the code length N is 16200 bits and the coding rate is 3/5, the modulation scheme is 16QAM, and the multiple b is 2, the demultiplexer 25 reads code bits written in the memory 31 in which column direction×row direction is (16200/(4×2))×(4×2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 74 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 75.

In other words, the exchange unit 32 performs exchanging such that
the code bit b0 is allocated to the symbol bit y0;
the code bit b1 to the symbol bit y2;

the code bit b2 to the symbol bit y6;
the code bit b3 to the symbol bit y3;
the code bit b4 to the symbol bit y4;
the code bit b5 to the symbol bit y1;
the code bit b6 to the symbol bit y5; and
the code bit b7 to the symbol bit y7.

B of FIG. 75 illustrates a second example of exchanging of code bits according to the allocation rule of FIG. 74 when an LDPC code is a mobile LDPC code in which the code length N is 16200 bits and the coding rate is 3/5, the modulation scheme is 16QAM, and the multiple b is 2.

According to B of FIG. 75, the exchange unit 32 exchanges the code bits b0 to b7 of 4×2 (=mb) bits read from the memory 31 according to the allocation rule of FIG. 74 such that
the code bit b0 is allocated to the symbol bit y0,
the code bit b1 is allocated to the symbol bit y2,
the code bit b2 is allocated to the symbol bit y3,
the code bit b3 is allocated to the symbol bit y6,
the code bit b4 is allocated to the symbol bit y4,
the code bit b5 is allocated to the symbol bit y5,
the code bit b6 is allocated to the symbol bit y1, and
the code bit b7 is allocated to the symbol bit y7.

Figure 76:
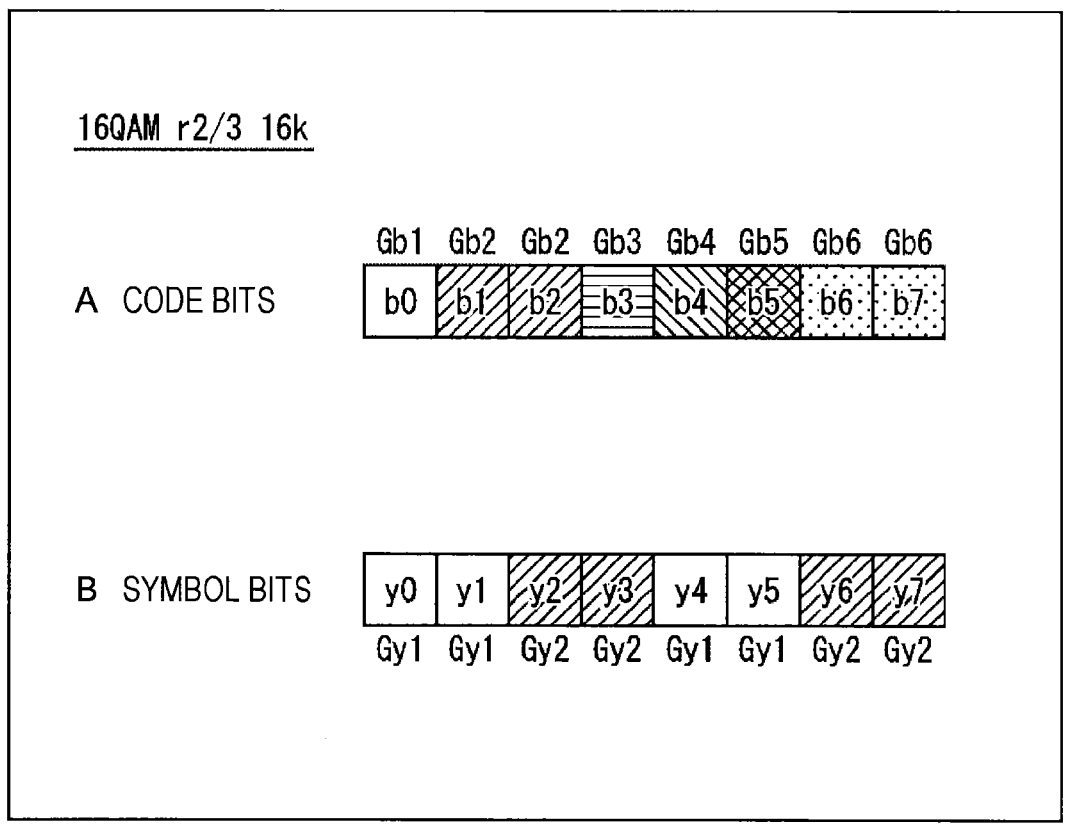
FIG. 76 is a diagram illustrating a code bit group and a symbol bit group when an LDPC code having a code length of 16200 and a coding rate of 2/3 is modulated by 16QAM, and a multiple b is 2.

FIG. 76 illustrates a code bit group and a symbol bit group when an LDPC code is a mobile LDPC code in which the code length N is 16200 bits and the coding rate is 2/3, the modulation scheme is 16QAM, and the multiple b is 2.

In this case, the code bits of 4×2 (=mb) bits read from the memory 31 may be grouped into 6 code bit groups Gb1, Gb2, Gb3, Gb4, Gb5, and Gb6 according to the difference in the error probability as illustrated in A of FIG. 76.

In A of FIG. 76, the code bit b0 belongs to the code bit group Gb1, the code bits b1 and b2 belong to the code bit group Gb2, the code bit b3 belongs to the code bit group Gb3, the code bit b4 belongs to the code bit group Gb4, the code bit b5 belongs to the code bit group Gb5, and the code bits b6 and b7 belong to the code bit group Gb6.

When the modulation scheme is 16QAM and the multiple b is 2, the symbol bits of 4×2 (=mb) bits may be grouped into two symbol bit groups Gy1 and Gy2 according to the difference in the error probability as illustrated in B of FIG. 76.

In B of FIG. 76, the symbol bits y0, y1, y4, and y5 belong to the symbol bit group Gy1, and the symbol bits y2, y3, y6, and y7 belong to the symbol bit group Gy2, similarly to the example of B of FIG. 52.

Figure 77:
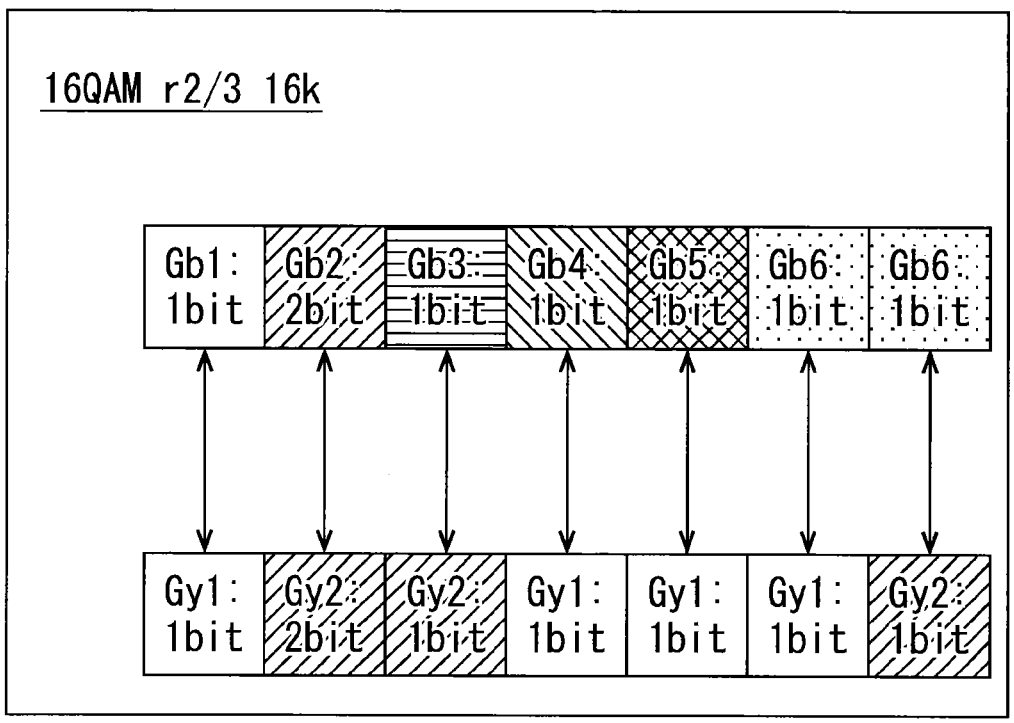
FIG. 77 is a diagram illustrating an allocation rule when an LDPC code having a code length of 16200 and a coding rate of 2/3 is modulated by 16QAM, and a multiple b is 2.

FIG. 77 illustrates an allocation rule when an LDPC code is a mobile LDPC code in which the code length N is 16200 bits, and the coding rate is 2/3, the modulation scheme is 16QAM, and the multiple b is 2.

In the allocation rule of FIG. 77, pieces of group set information (Gb1, Gy1, 1), (Gb2, Gy2, 2), (Gb3, Gy2, 1), (Gb4, Gy1, 1), (Gb5, Gy1, 1), (Gb6, Gy1, 1), and (Gb6, Gy2, 1) are specified.

In other words, the allocation rule of FIG. 77 specifies
that a 1 bit of the code bits of the code bit group Gb1 having the highest error probability is allocated to a 1 bit of the symbol bits of the symbol bit group Gy1 having the highest error probability based on the group set information (Gb1, Gy1, 1), 2 bits of the code bits of the code bit group Gb2 having the second highest error probability is allocated to 2 bits of the symbol bits of the symbol bit group Gy2 having the second highest error probability based on the group set information (Gb2, Gy2, 2), a 1 bit of the code bits of the code bit group Gb3 having the third highest error probability is allocated to a 1 bit of the symbol bits of the symbol bit group Gy2 having the second highest error probability based on the group set information (Gb3, Gy2, 1), a 1 bit of the code bits of the code bit group Gb4 having the fourth highest error probability is allocated to a 1 bit of the symbol bits of the symbol bit group Gy1 having the highest error probability based on the group set information (Gb4, Gy1, 1), a 1 bit of the code bits of the code bit group Gb5 having the fifth highest error probability is allocated to a 1 bit of the symbol bits of the symbol bit group Gy1 having the highest error probability based on the group set information (Gb5, Gy1, 1), a 1 bit of the code bits of the code bit group Gb6 having the sixth highest error probability is allocated to a 1 bit of the symbol bits of the symbol bit group Gy1 having the highest error probability based on the group set information (Gb6, Gy1, 1), and a 1 bit of the code bits of the code bit group Gb6 having the sixth highest error probability is allocated to a 1 bit of the symbol bits of the symbol bit group Gy2 having the second highest error probability based on the group set information (Gb6, Gy2, 1).

FIG. 78 illustrates an example of exchanging of code bits according to the allocation rule of FIG. 77.

In other words, A of FIG. 78 illustrates a first example of exchanging of code bits according to the allocation rule of FIG. 77 when an LDPC code is a mobile LDPC code in which the code length N is 16200 bits and the coding rate is 2/3, the modulation scheme is 16QAM, and the multiple b is 2.

When an LDPC code is a mobile LDPC code in which the code length N is 16200 bits and the coding rate is 2/3, the modulation scheme is 16QAM, and the multiple b is 2, the demultiplexer 25 reads code bits written in the memory 31 in which column direction×row direction is (16200/(4×2))×(4× 2) bits in the row direction in units of 4×2 (=mb) bits, and supplies the read code bits to the exchange unit 32 (FIGS. 18 and 19).

The exchange unit 32 exchanges the code bits b0 to b7 of 4×2 (=mb) bits according to the allocation rule of FIG. 77 such that the code bits b0 to b7 of 4×2 (=mb) bits read from the memory 31 are allocated to the symbol bits y0 to y7 of 4×2 (=mb) bits of 2 (=b) symbols, for example, as illustrated in A of FIG. 78.

In other words, the exchange unit 32 performs exchanging such that
the code bit b0 is allocated to the symbol bit y0,
the code bit b1 is allocated to the symbol bit y2,
the code bit b2 is allocated to the symbol bit y6,
the code bit b3 is allocated to the symbol bit y3,
the code bit b4 is allocated to the symbol bit y4,
the code bit b5 is allocated to the symbol bit y1,
the code bit b6 is allocated to the symbol bit y5, and
the code bit b7 is allocated to the symbol bit y7.

B of FIG. 78 illustrates a second example of exchanging of code bits according to the allocation rule of FIG. 77 when an LDPC code is a mobile LDPC code in which the code length N is 16200 bits and the coding rate is 2/3, the modulation scheme is 16QAM, and the multiple b is 2.

According to B of FIG. 78, the exchange unit 32 exchanges the code bits b0 to b7 of 4×2 (=mb) bits read from the memory 31 according to the allocation rule of FIG. 77 such that
the code bit b0 is allocated to the symbol bit y0,
the code bit b1 is allocated to the symbol bit y2,
the code bit b2 is allocated to the symbol bit y3,
the code bit b3 is allocated to the symbol bit y6, the code bit b4 is allocated to the symbol bit y4,
the code bit b5 is allocated to the symbol bit y5,
the code bit b6 is allocated to the symbol bit y1,
and the code bit b7 is allocated to the symbol bit y7.

FIG. 79 illustrates a code bit group and a symbol bit group when an LDPC code is a mobile LDPC code in which the code length N is 16200 bits and the coding rate is 1/5, the modulation scheme is 64QAM (thus, m=6), and the multiple b is 2.

In this case, the code bits of 6×2 (=mb) bits read from the memory 31 may be grouped into 4 code bit groups Gb1, Gb2, Gb3, and Gb4 according to the difference in the error probability as illustrated in A of FIG. 79.

In A of FIG. 79, the code bit b0 belongs to the code bit group Gb1, the code bit b1 belongs to the code bit group Gb2, the code bit b2 belongs to the code bit group Gb3, and the code bits b3 and b11 belong to the code bit group Gb4.

When the modulation scheme is 64QAM and the multiple b is 2, the symbol bits of 6×2 (=mb) bits may be grouped into three symbol bit groups Gy1, Gy2, and Gy3 according to the difference in the error probability as illustrated in B of FIG. 79.

In B of FIG. 79, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3.

Figure 80:
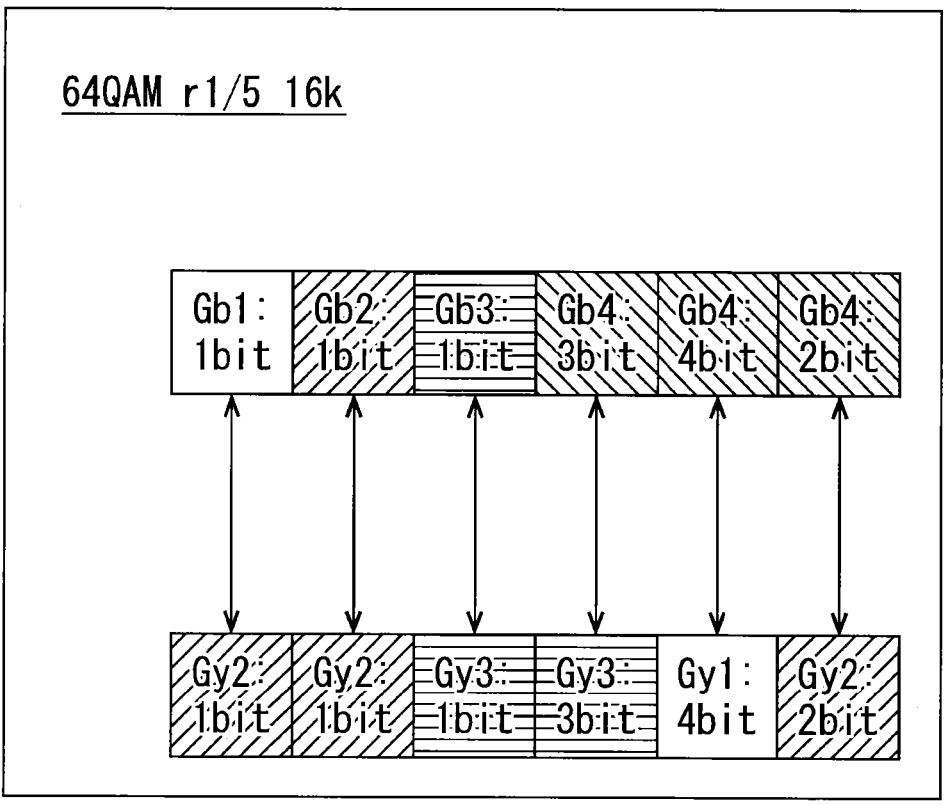
FIG. 80 is a diagram illustrating an allocation rule when an LDPC code having a code length of 16200 and a coding rate of 1/5 is modulated by 64QAM, and a multiple b is 2.

FIG. 80 illustrates an allocation rule when an LDPC code is a mobile LDPC code in which the code length N is 16200 bits, and the coding rate is 1/5, the modulation scheme is 64QAM, and the multiple b is 2.

In the allocation rule of FIG. 80, pieces of group set information (Gb1, Gy2, 1), (Gb2, Gy2, 1), (Gb3, Gy3, 1), (Gb4, Gy3, 3), (Gb4, Gy1, 4), and (Gb4, Gy2, 2) are specified.

In other words, the allocation rule of FIG. 80 specifies
that a 1 bit of the code bits of the code bit group Gb1 having the highest error probability is allocated to a 1 bit of the symbol bits of the symbol bit group Gy2 having the second highest error probability based on the group set information (Gb1, Gy2, 1),
a 1 bit of the code bits of the code bit group Gb2 having the second highest error probability is allocated to a 1 bit of the symbol bits of the symbol bit group Gy2 having the second highest error probability based on the group set information (Gb2, Gy2, 1),
a 1 bit of the code bits of the code bit group Gb3 having the third highest error probability is allocated to a 1 bit of the symbol bits of the symbol bit group Gy3 having the third highest error probability based on the group set information (Gb3, Gy3, 1),
3 bits of the code bits of the code bit group Gb4 having the fourth highest error probability is allocated to 3 bits of the symbol bits of the symbol bit group Gy3 having the third highest error probability based on the group set information (Gb4, Gy3, 3),
4 bits of the code bits of the code bit group Gb4 having the fourth highest error probability is allocated to 4 bits of the symbol bits of the symbol bit group Gy1 having the highest error probability based on the group set information (Gb4, Gy1, 4), and
2 bits of the code bits of the code bit group Gb4 having the fourth highest error probability is allocated to 2 bits of the symbol bits of the symbol bit group Gy2 having the second highest error probability based on the group set information (Gb4, Gy2, 2).

Figure 81:
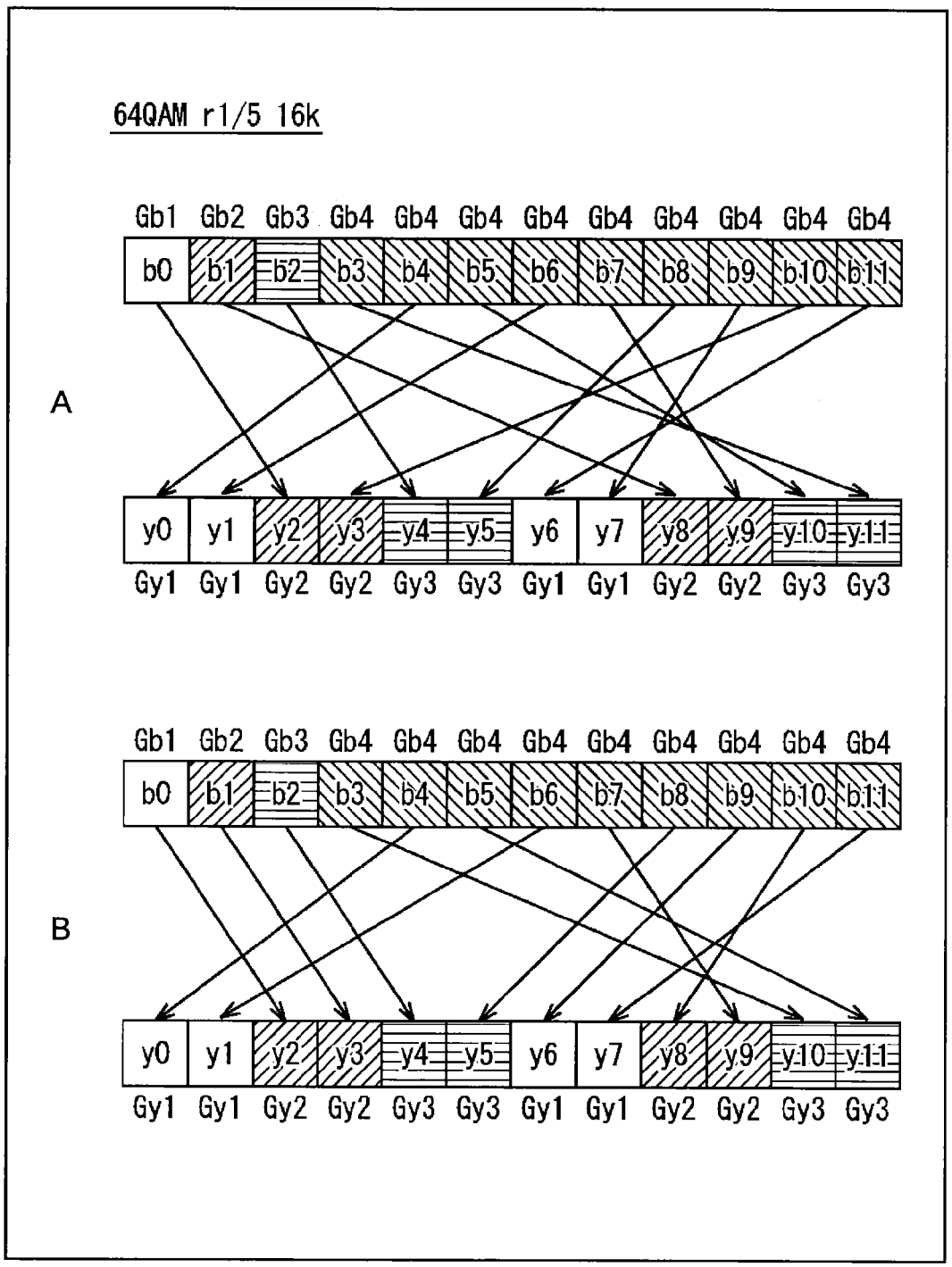
FIG. 81 is a diagram illustrating exchanging of code bits according to an allocation rule when an LDPC code having a code length of 16200 and a coding rate of 1/5 is modulated by 64QAM, and a multiple b is 2.

FIG. 81 illustrates an example of exchanging of code bits according to the allocation rule of FIG. 80.

In other words, A of FIG. 81 illustrates a first example of exchanging of code bits according to the allocation rule of FIG. 80 when an LDPC code is a mobile LDPC code in which the code length N is 16200 bits and the coding rate is 1/5, the modulation scheme is 64QAM, and the multiple b is 2.

When an LDPC code is a mobile LDPC code in which the code length N is 16200 bits and the coding rate is 1/5, the modulation scheme is 64QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 80 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 81.

In other words, the exchange unit 32 performs exchanging such that
the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y6.

B of FIG. 81 illustrates a second example of exchanging of code bits according to the allocation rule of FIG. 80 when an LDPC code is a mobile LDPC code in which the code length N is 16200 bits and the coding rate is 1/5, the modulation scheme is 64QAM, and the multiple b is 2.

According to B of FIG. 81, the exchange unit 32 exchanges the code bits b0 to b11 of 6×2 (=mb) bits read from the memory 31 according to the allocation rule of FIG. 80 such that
the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8,
and the code bit b11 is allocated to the symbol bit y7.

FIG. 82 illustrates a code bit group and a symbol bit group when an LDPC code is a mobile LDPC code in which the code length N is 16200 bits and the coding rate is 4/15, the modulation scheme is 64QAM (thus, m=6), and the multiple b is 2.

In this case, the code bits of 6×2 (=mb) bits read from the memory 31 may be grouped into 5 code bit groups Gb1, Gb2, Gb3, Gb4, and Gb5 according to the difference in the error probability as illustrated in A of FIG. 82.

In A of FIG. 82, the code bit b0 belongs to the code bit group Gb1, the code bit b1 belongs to the code bit group Gb2, the code bit b2 belongs to the code bit group Gb3, the code bit b3 belongs to the code bit group Gb4, and the code bits b4 and b11 belong to the code bit group Gb5.

When the modulation scheme is 64QAM and the multiple b is 2, the symbol bits of 6×2 (=mb) bits may be grouped into three symbol bit groups Gy1, Gy2, and Gy3 according to the difference in the error probability as illustrated in B of FIG. 82.

In B of FIG. 82, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 83:
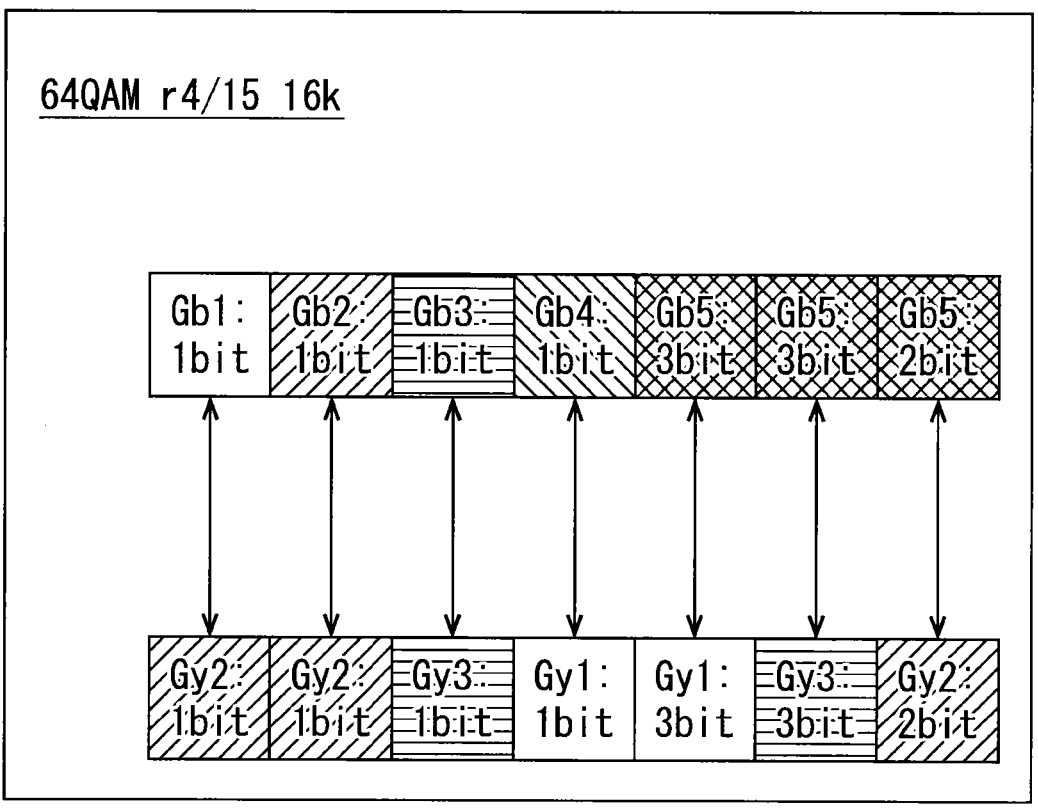
FIG. 83 is a diagram illustrating an allocation rule when an LDPC code having a code length of 16200 and a coding rate of 4/15 is modulated by 64QAM, and a multiple b is 2.

FIG. 83 illustrates an allocation rule when an LDPC code is a mobile LDPC code in which the code length N is 16200 bits, and the coding rate is 4/15, the modulation scheme is 64QAM, and the multiple b is 2.

In the allocation rule of FIG. 83, pieces of group set information (Gb1, Gy2, 1), (Gb2, Gy2, 1), (Gb3, Gy3, 1), (Gb4, Gy1, 1), (Gb5, Gy1, 3), (Gb5, Gy3, 3), and (Gb5, Gy2, 2) are specified.

In other words, the allocation rule of FIG. 83 specifies that a 1 bit of the code bits of the code bit group Gb1 having the highest error probability is allocated to a 1 bit of the symbol bits of the symbol bit group Gy2 having the second highest error probability based on the group set information (Gb1, Gy2, 1), a 1 bit of the code bits of the code bit group Gb2 having the second highest error probability is allocated to a 1 bit of the symbol bits of the symbol bit group Gy2 having the second highest error probability based on the group set information (Gb2, Gy2, 1), a 1 bit of the code bits of the code bit group Gb3 having the third highest error probability is allocated to a 1 bit of the symbol bits of the symbol bit group Gy3 having the third highest error probability based on the group set information (Gb3, Gy3, 1), a 1 bit of the code bits of the code bit group Gb4 having the fourth highest error probability is allocated to a 1 bit of the symbol bits of the symbol bit group Gy1 having the highest error probability based on the group set information (Gb4, Gy1, 1), 3 bits of the code bits of the code bit group Gb5 having the fifth highest error probability is allocated to 3 bits of the symbol bits of the symbol bit group Gy1 having the highest error probability based on the group set information (Gb5, Gy1, 3), 3 bits of the code bits of the code bit group Gb5 having the fifth highest error probability is allocated to 3 bits of the symbol bits of the symbol bit group Gy3 having the third highest error probability based on the group set information (Gb5, Gy3, 3), and 2 bits of the code bits of the code bit group Gb5 having the fifth highest error probability is allocated to 2 bits of the symbol bits of the symbol bit group Gy2 having the second highest error probability based on the group set information (Gb5, Gy2, 2).

Figure 84:
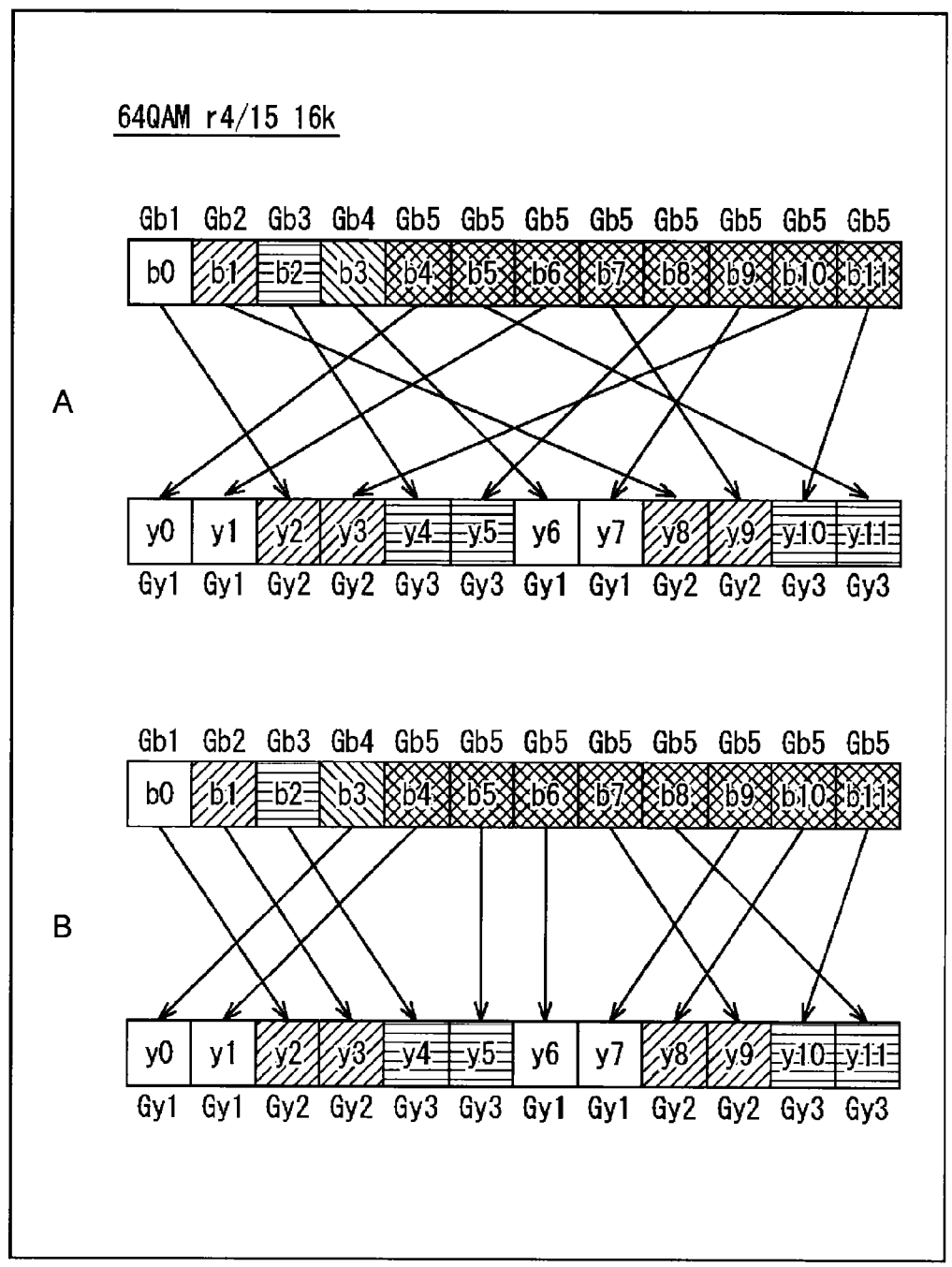
FIG. 84 is a diagram illustrating exchanging of code bits according to an allocation rule when an LDPC code having a code length of 16200 and a coding rate of 4/15 is modulated by 64QAM, and a multiple b is 2.

FIG. 84 illustrates an example of exchanging of code bits according to the allocation rule of FIG. 83.

In other words, A of FIG. 84 illustrates a first example of exchanging of code bits according to the allocation rule of FIG. 83 when an LDPC code is a mobile LDPC code in which the code length N is 16200 bits and the coding rate is 4/15, the modulation scheme is 64QAM, and the multiple b is 2.

When an LDPC code is a mobile LDPC code in which the code length N is 16200 bits and the coding rate is 4/15, the modulation scheme is 64QAM, and the multiple b is 2, the demultiplexer 25 reads code bits written in the memory 31 in which column direction×row direction is (16200/(6×2))×(6× 2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 83 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 84.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y6,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y10.

B of FIG. 84 illustrates a second example of exchanging of code bits according to the allocation rule of FIG. 83 when an LDPC code is a mobile LDPC code in which the code length N is 16200 bits and the coding rate is 4/15, the modulation scheme is 64QAM, and the multiple b is 2.

According to B of FIG. 84, the exchange unit 32 exchanges the code bits b0 to b11 of 6×2 (=mb) bits read from the memory 31 according to the allocation rule of FIG. 83 such that the code bit b0 is allocated to the symbol bit y2,
the code bit b1 is allocated to the symbol bit y3,
the code bit b2 is allocated to the symbol bit y4,
the code bit b3 is allocated to the symbol bit y0,
the code bit b4 is allocated to the symbol bit y1,
the code bit b5 is allocated to the symbol bit y5,
the code bit b6 is allocated to the symbol bit y6,
the code bit b7 is allocated to the symbol bit y9,
the code bit b8 is allocated to the symbol bit y11,
the code bit b9 is allocated to the symbol bit y7,
the code bit b10 is allocated to the symbol bit y8, and
the code bit b11 is allocated to the symbol bit y10.

FIG. 85 illustrates a code bit group and a symbol bit group when an LDPC code is a mobile LDPC code in which the code length N is 16200 bits and the coding rate is 1/3, the modulation scheme is 64QAM, and the multiple b is 2.

In this case, the code bits of 6×2 (=mb) bits read from the memory 31 may be grouped into 5 code bit groups Gb1, Gb2, Gb3, Gb4, and Gb5 according to the difference in the error probability as illustrated in A of FIG. 85.

In A of FIG. 85, the code bit b0 belongs to the code bit group Gb1, the code bit b1 belongs to the code bit group Gb2, the code bit b2 belongs to the code bit group Gb3, the code bit b3 belongs to the code bit group Gb4, and the code bits b4 and b11 belong to the code bit group Gb5.

When the modulation scheme is 64QAM and the multiple b is 2, the symbol bits of 6×2 (=mb) bits may be grouped into three symbol bit groups Gy1, Gy2, and Gy3 according to the difference in the error probability as illustrated in B of FIG. 85.

In B of FIG. 85, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 86:
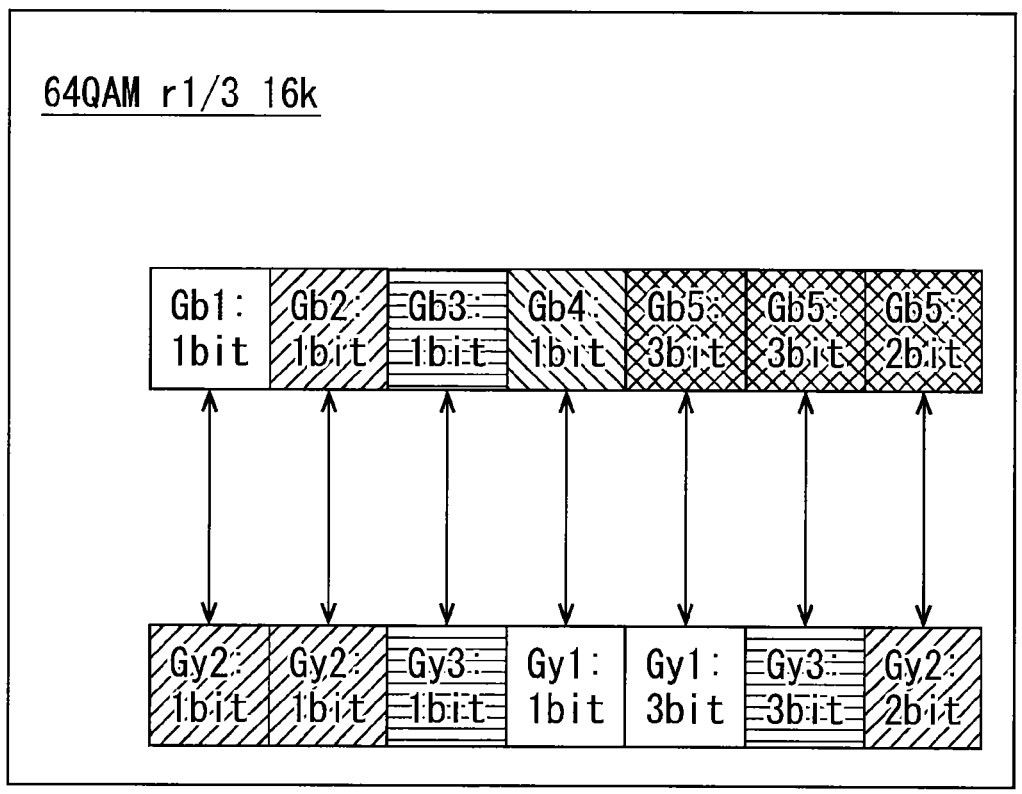
FIG. 86 is a diagram illustrating an allocation rule when an LDPC code having a code length of 16200 and a coding rate of 1/3 is modulated by 64QAM, and a multiple b is 2.

FIG. 86 illustrates an allocation rule when an LDPC code is a mobile LDPC code in which the code length N is 16200 bits, and the coding rate is 1/3, the modulation scheme is 64QAM, and the multiple b is 2.

In the allocation rule of FIG. 86, pieces of group set information (Gb1, Gy2, 1), (Gb2, Gy2, 1), (Gb3, Gy3, 1), (Gb4, Gy1, 1), (Gb5, Gy1, 3), (Gb5, Gy3, 3), and (Gb5, Gy2, 2) are specified.

In other words, the allocation rule of FIG. 86 specifies that a 1 bit of the code bits of the code bit group Gb1 having the highest error probability is allocated to a 1 bit of the symbol bits of the symbol bit group Gy2 having the second highest error probability based on the group set information (Gb1, Gy2, 1), a 1 bit of the code bits of the code bit group Gb2 having the second highest error probability is allocated to a 1 bit of the symbol bits of the symbol bit group Gy2 having the second highest error probability based on the group set information (Gb2, Gy2, 1), a 1 bit of the code bits of the code bit group Gb3 having the third highest error probability is allocated to a 1 bit of the symbol bits of the symbol bit group Gy3 having the third highest error probability based on the group set information (Gb3, Gy3, 1), a 1 bit of the code bits of the code bit group Gb4 having the fourth highest error probability is allocated to a 1 bit of the symbol bits of the symbol bit group Gy1 having the highest error probability based on the group set information (Gb4, Gy1, 1), 3 bits of the code bits of the code bit group Gb5 having the highest error probability is allocated to 3 bits of the symbol bits of the symbol bit group Gy1 having the highest error probability based on the group set information (Gb5, Gy1, 3), 3 bits of the code bits of the code bit group Gb5 having the fifth highest error probability is allocated to 3 bits of the symbol bits of the symbol bit group Gy3 having the third highest error probability based on the group set information (Gb5, Gy3, 3), and 2 bits of the code bits of the code bit group Gb5 having the fifth highest error probability is allocated to 2 bits of the symbol bits of the symbol bit group Gy2 having the second highest error probability based on the group set information (Gb5, Gy2, 2).

Figure 87:
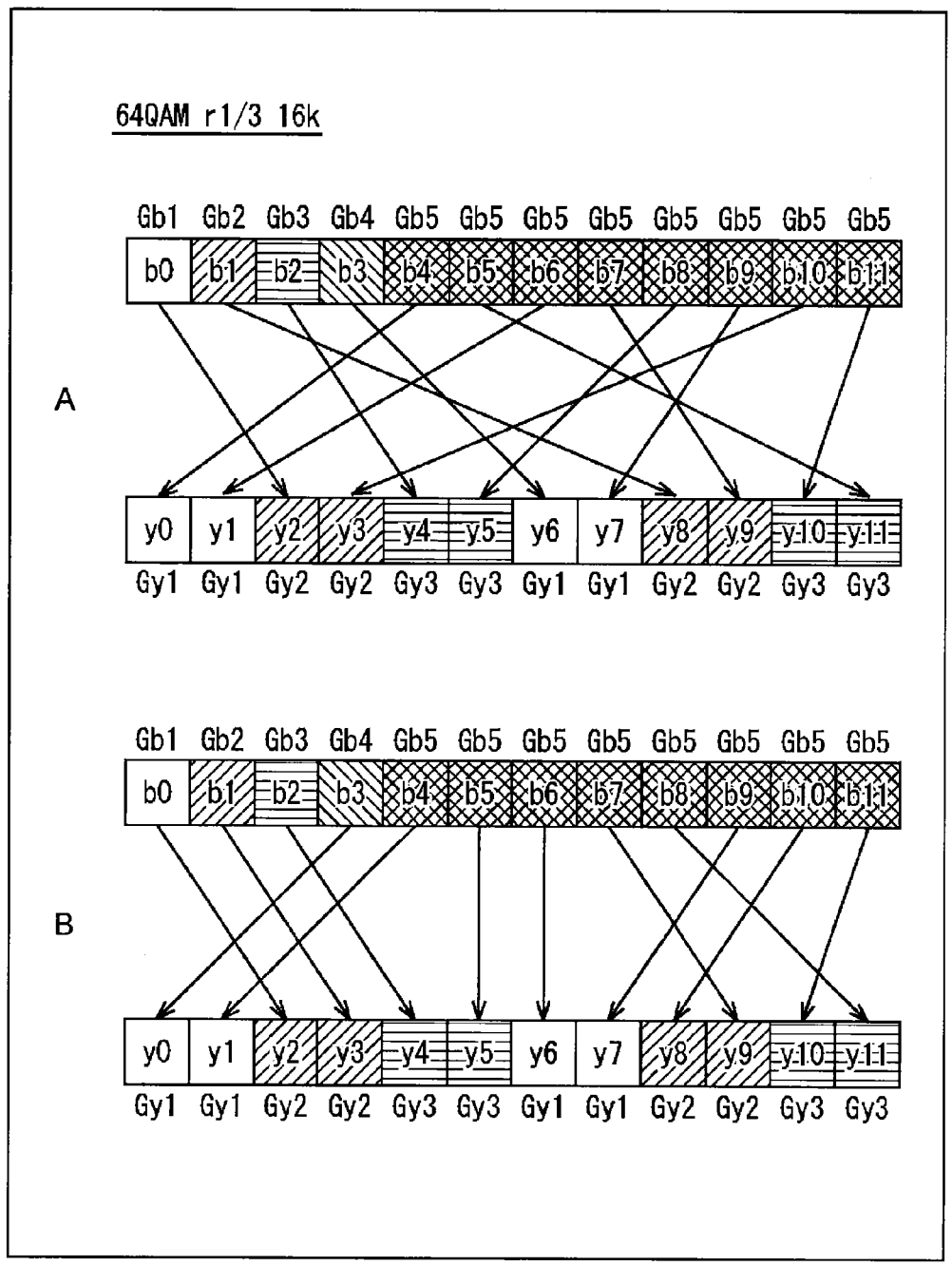
FIG. 87 is a diagram illustrating exchanging of code bits according to an allocation rule when an LDPC code having a code length of 16200 and a coding rate of 1/3 is modulated by 64QAM, and a multiple b is 2.

FIG. 87 illustrates an example of exchanging of code bits according to the allocation rule of FIG. 86.

In other words, A of FIG. 87 illustrates a first example of exchanging of code bits according to the allocation rule of FIG. 86 when an LDPC code is a mobile LDPC code in which the code length N is 16200 bits and the coding rate is 1/3, the modulation scheme is 64QAM, and the multiple b is 2.

When an LDPC code is a mobile LDPC code in which the code length N is 16200 bits and the coding rate is 1/3, the modulation scheme is 64QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 86 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 87.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y6,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit $y_{10}$.

B of FIG. 87 illustrates a second example of exchanging of code bits according to the allocation rule of FIG. 86 when an LDPC code is a mobile LDPC code in which the code length N is 16200 bits and the coding rate is 1/3, the modulation scheme is 64QAM, and the multiple b is 2.

According to B of FIG. 87, the exchange unit 32 exchanges the code bits b0 to b11 of 6×2 (=mb) bits read from the memory 31 according to the allocation rule of FIG. 86 such that the code bit b0 is allocated to the symbol bit y2,
the code bit b1 is allocated to the symbol bit y3,
the code bit b2 is allocated to the symbol bit y4,
the code bit b3 is allocated to the symbol bit y0,
the code bit b4 is allocated to the symbol bit y1,
the code bit b5 is allocated to the symbol bit y5,
the code bit b6 is allocated to the symbol bit y6,
the code bit b7 is allocated to the symbol bit y9,
the code bit b8 is allocated to the symbol bit y11,
the code bit b9 is allocated to the symbol bit y7,
the code bit b10 is allocated to the symbol bit y8, and
the code bit b11 is allocated to the symbol bit y10.

FIG. 88 illustrates a code bit group and a symbol bit group when an LDPC code is a mobile LDPC code in which the code length N is 16200 bits, the coding rate is 2/5, the modulation scheme is 64QAM, and the multiple b is 2.

In this case, the code bits of 6×2 (=mb) bits read from the memory 31 may be grouped into 5 code bit groups Gb1, Gb2, Gb3, Gb4, and Gb5 according to the difference in the error probability as illustrated in A of FIG. 88.

In A of FIG. 88, the code bit b0 belongs to the code bit group Gb1, the code bits b1 and b2 belong to the code bit group Gb2, the code bit b3 belongs to the code bit group Gb3, the code bit b4 belongs to the code bit group Gb4, and the code bits b5 to b11 belong to the code bit group Gb5.

When the modulation scheme is 64QAM and the multiple b is 2, the symbol bits of 6×2 (=mb) bits may be grouped into three symbol bit groups Gy1, Gy2, and Gy3 according to the difference in the error probability as illustrated in B of FIG. 88.

In B of FIG. 88, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 89:
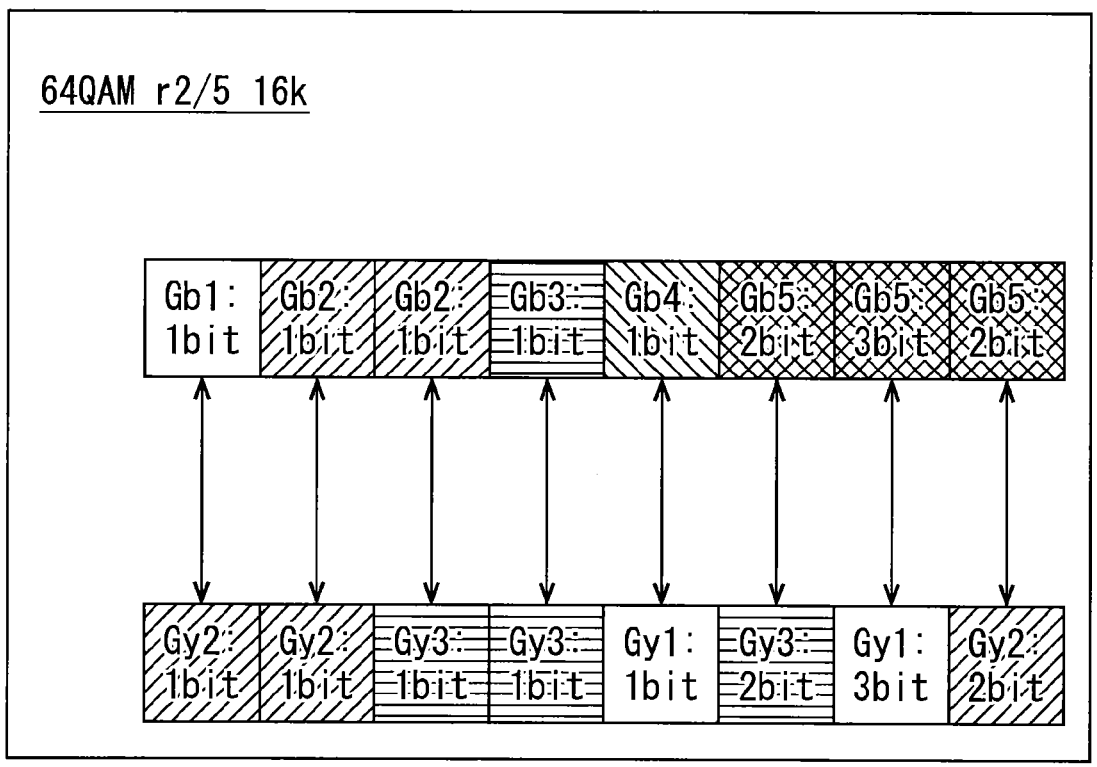
FIG. 89 is a diagram illustrating an allocation rule when an LDPC code having a code length of 16200 and a coding rate of 2/5 is modulated by 64QAM, and a multiple b is 2.

FIG. 89 illustrates an allocation rule when an LDPC code is a mobile LDPC code in which the code length N is 16200 bits, and the coding rate is 2/5, the modulation scheme is 64QAM, and the multiple b is 2.

In the allocation rule of FIG. 89, pieces of group set information (Gb1, Gy2, 1), (Gb2, Gy2, 1), (Gb2, Gy3, 1), (Gb3, Gy3, 1), (Gb4, Gy1, 1), (Gb5, Gy3, 2), (Gb5, Gy1, 3), and (Gb5, Gy2, 2) are specified.

In other words, the allocation rule of FIG. 89 specifies
that a 1 bit of the code bits of the code bit group Gb1 having the highest error probability is allocated to a 1 bit of the symbol bits of the symbol bit group Gy2 having the second highest error probability based on the group set information (Gb1, Gy2, 1), a 1 bit of the code bits of the code bit group Gb2 having the second highest error probability is allocated to a 1 bit of the symbol bits of the symbol bit group Gy2 having the second highest error probability based on the group set information (Gb2, Gy2, 1), a 1 bit of the code bits of the code bit group Gb2 having the second highest error probability is allocated to a 1 bit of the symbol bits of the symbol bit group Gy3 having the third highest error probability based on the group set information (Gb2, Gy3, 1), a 1 bit of the code bits of the code bit group Gb3 having the third highest error probability is allocated to a 1 bit of the symbol bits of the symbol bit group Gy3 having the third highest error probability based on the group set information (Gb3, Gy3, 1), a 1 bit of the code bits of the code bit group Gb4 having the fourth highest error probability is allocated to a 1 bit of the symbol bits of the symbol bit group Gy1 having the highest error probability based on the group set information (Gb4, Gy1, 1), 2 bits of the code bits of the code bit group Gb5 having the fifth highest error probability is allocated to 2 bits of the symbol bits of the symbol bit group Gy3 having the third highest error probability based on the group set information (Gb5, Gy3, 2), 3 bits of the code bits of the code bit group Gb5 having the fifth highest error probability is allocated to 3 bits of the symbol bits of the symbol bit group Gy1 having the highest error probability based on the group set information (Gb5, Gy1, 3), and 2 bits of the code bits of the code bit group Gb5 having the fifth highest error probability is allocated to 2 bits of the symbol bits of the symbol bit group Gy2 having the second highest error probability based on the group set information (Gb5, Gy2, 2).

Figure 90:
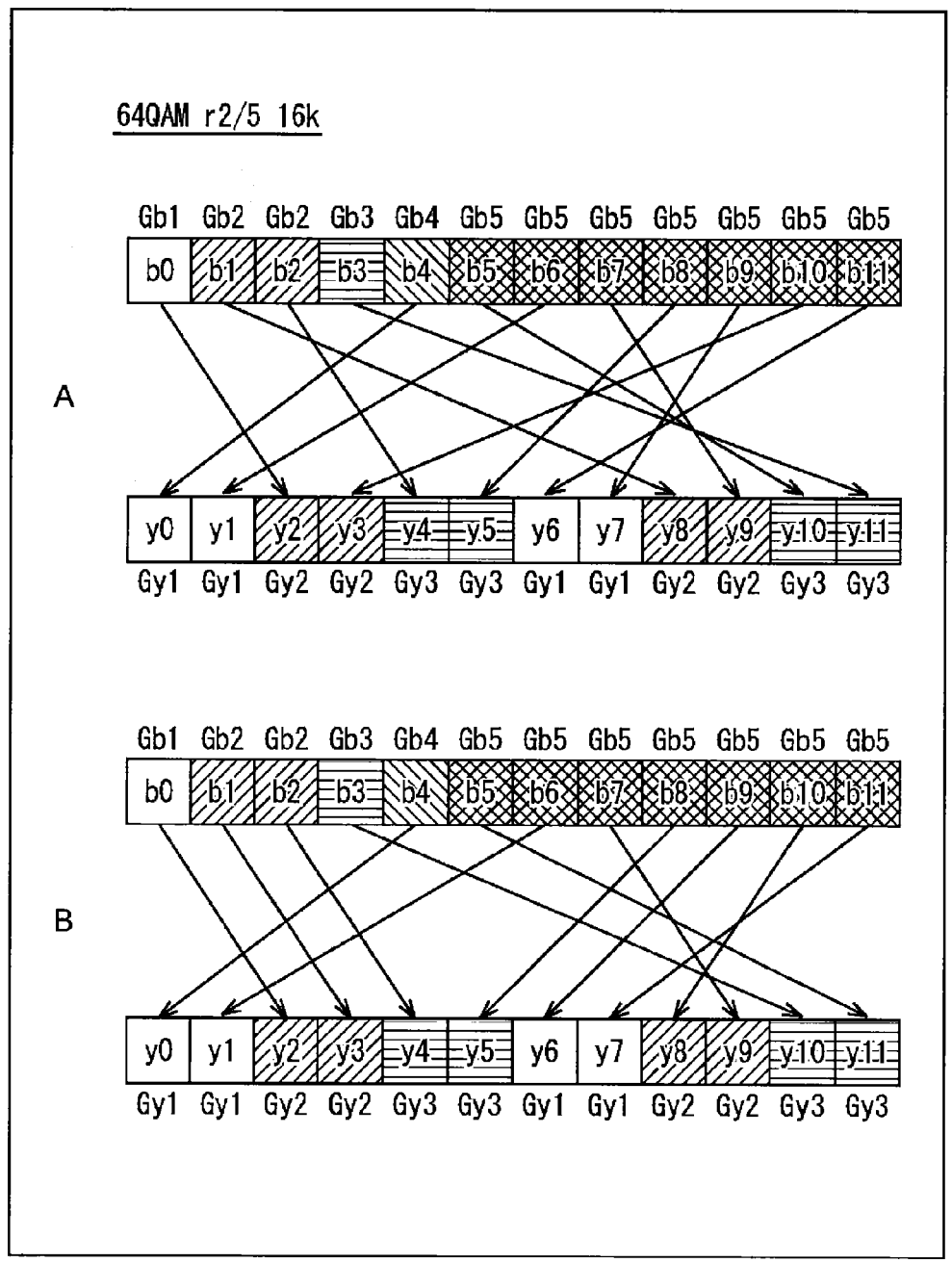
FIG. 90 is a diagram illustrating exchanging of code bits according to an allocation rule when an LDPC code having a code length of 16200 and a coding rate of 2/5 is modulated by 64QAM, and a multiple b is 2.

FIG. 90 illustrates an example of exchanging of code bits according to the allocation rule of FIG. 89.

In other words, A of FIG. 90 illustrates a first example of exchanging of code bits according to the allocation rule of FIG. 89 when an LDPC code is a mobile LDPC code in which the code length N is 16200 bits and the coding rate is 2/5, the modulation scheme is 64QAM, and the multiple b is 2.

When an LDPC code is a mobile LDPC code in which the code length N is 16200 bits and the coding rate is 2/5, the modulation scheme is 64QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 89 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 90.

In other words, the exchange unit 32 performs exchanging such that
the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y6.

B of FIG. 90 illustrates a second example of exchanging of code bits according to the allocation rule of FIG. 89 when an LDPC code is a mobile LDPC code in which the code length N is 16200 bits and the coding rate is 2/5, the modulation scheme is 64QAM, and the multiple b is 2.

According to B of FIG. 90, the exchange unit 32 exchanges the code bits b0 to b11 of 6×2 (=mb) bits read from the memory 31 according to the allocation rule of FIG. 89 such that
the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8, and
the code bit b11 is allocated to the symbol bit y7.

Figure 91:
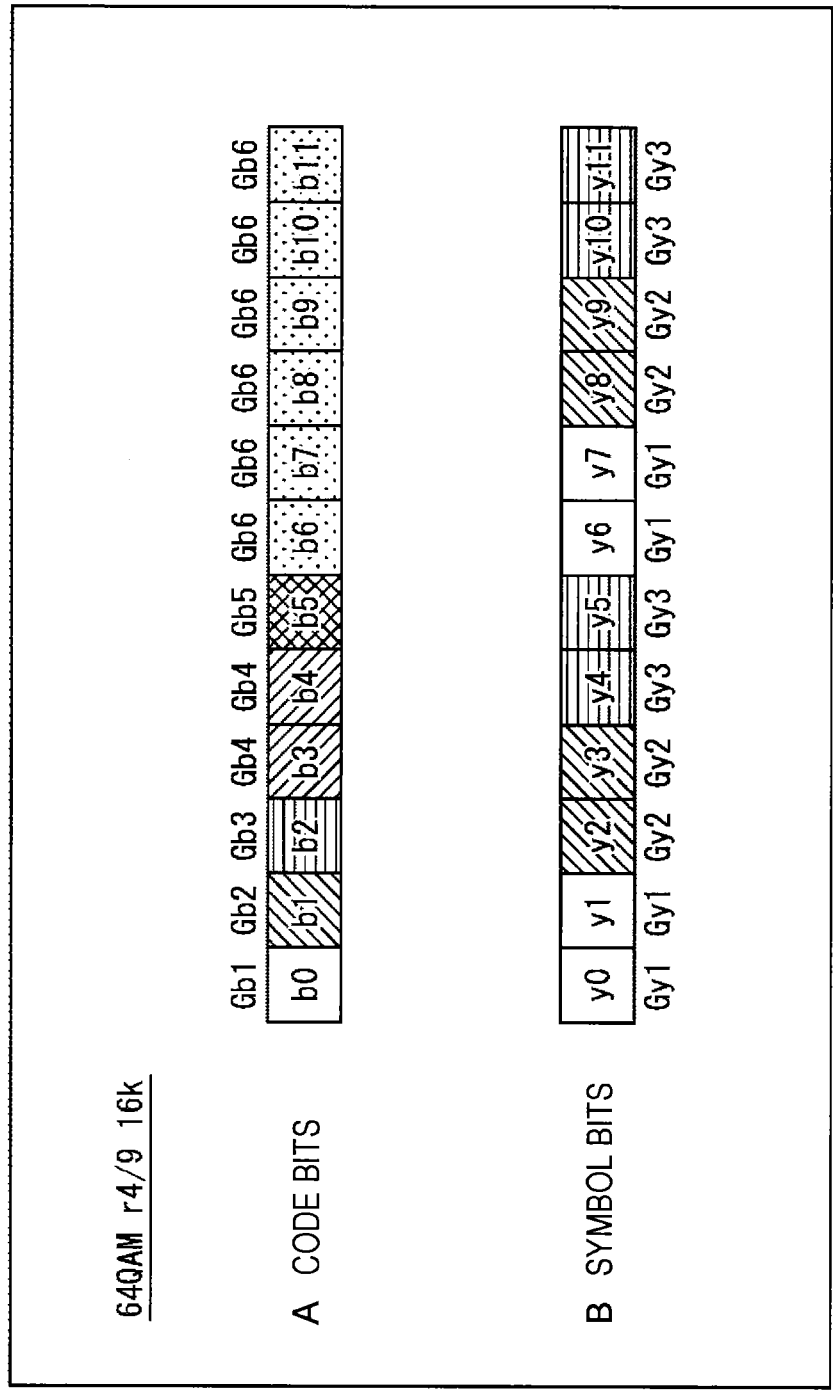
FIG. 91 is a diagram illustrating a code bit group and a symbol bit group when an LDPC code having a code length of 16200 and a coding rate of 4/9 is modulated by 64QAM, and a multiple b is 2.

FIG. 91 illustrates a code bit group and a symbol bit group when an LDPC code is a mobile LDPC code in which the code length N is 16200 bits and the coding rate is 4/9, the modulation scheme is 64QAM, and the multiple b is 2.

In this case, the code bits of 6×2 (=mb) bits read from the memory 31 may be grouped into 6 code bit groups Gb1, Gb2, Gb3, Gb4, Gb5, and Gb6 according to the difference in the error probability as illustrated in A of FIG. 91.

In A of FIG. 91, the code bit b0 belongs to the code bit group Gb1, the code bit b1 belongs to the code bit group Gb2, the code bit b2 belongs to the code bit group Gb3, the code bits b3 and b4 belong to the code bit group Gb4, the code bit b5 belongs to the code bit group Gb5, and the code bits b6 to b11 belong to the code bit group Gb6.

When the modulation scheme is 64QAM and the multiple b is 2, the symbol bits of 6×2 (=mb) bits may be grouped into three symbol bit groups Gy1, Gy2, and Gy3 according to the difference in the error probability as illustrated in B of FIG. 91.

In B of FIG. 91, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 92:
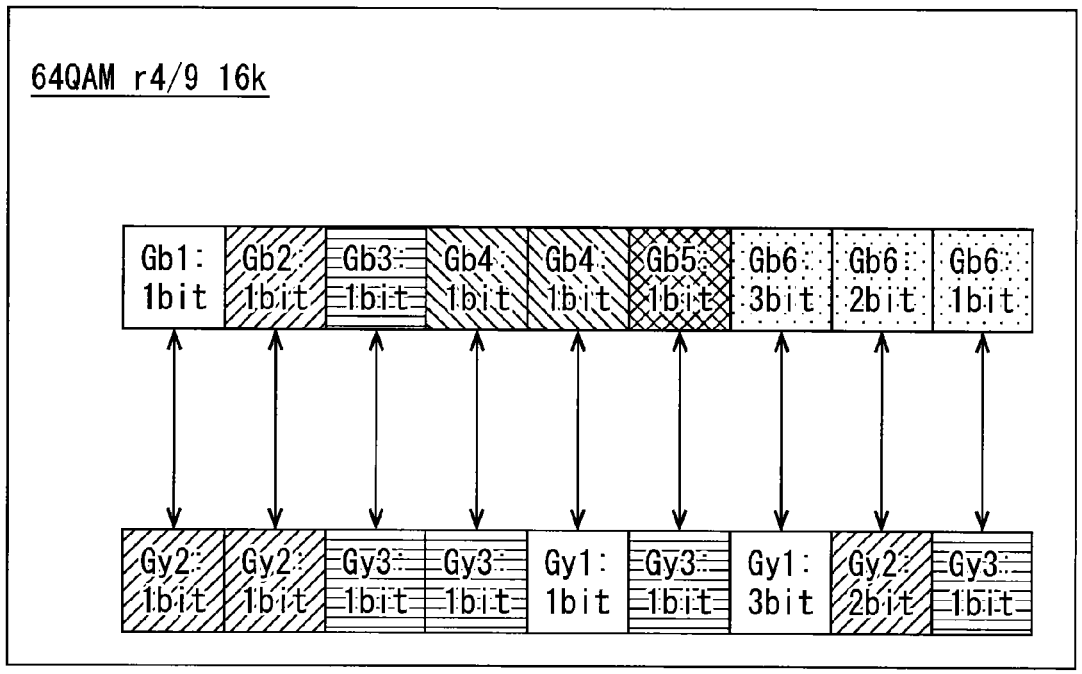
FIG. 92 is a diagram illustrating an allocation rule when an LDPC code having a code length of 16200 and a coding rate of 4/9 is modulated by 64QAM, and a multiple b is 2.

FIG. 92 illustrates an allocation rule when an LDPC code is a mobile LDPC code in which the code length N is 16200 bits, and the coding rate is 4/9, the modulation scheme is 64QAM, and the multiple b is 2.

In the allocation rule of FIG. 92, pieces of group set information (Gb1, Gy2, 1), (Gb2, Gy2, 1), (Gb3, Gy3, 1), (Gb4, Gy3, 1), (Gb4, Gy1, 1), (Gb5, Gy3, 1), (Gb6, Gy1, 3), (Gb6, Gy2, 2), and (Gb6, Gy3, 1) are specified.

In other words, the allocation rule of FIG. 92 specifies
that a 1 bit of the code bits of the code bit group Gb1 having the highest error probability is allocated to a 1 bit of the symbol bits of the symbol bit group Gy2 having the second highest error probability based on the group set information (Gb1, Gy2, 1), a 1 bit of the code bits of the code bit group Gb2 having the second highest error probability is allocated to a 1 bit of the symbol bits of the symbol bit group Gy2 having the second highest error probability based on the group set information (Gb2, Gy2, 1), a 1 bit of the code bits of the code bit group Gb3 having the third highest error probability is allocated to a 1 bit of the symbol bits of the symbol bit group Gy3 having the third highest error probability based on the group set information (Gb3, Gy3, 1), a 1 bit of the code bits of the code bit group Gb4 having the fourth highest error probability is allocated to a 1 bit of the symbol bits of the symbol bit group Gy3 having the third highest error probability based on the group set information (Gb4, Gy3, 1), a 1 bit of the code bits of the code bit group Gb4 having the fourth highest error probability is allocated to a 1 bit of the symbol bits of the symbol bit group Gy1 having the highest error probability based on the group set information (Gb4, Gy1, 1), a 1 bit of the code bits of the code bit group Gb5 having the fifth highest error probability is allocated to a 1 bit of the symbol bits of the symbol bit group Gy3 having the third highest error probability based on the group set information (Gb5, Gy3, 1), 3 bits of the code bits of the code bit group Gb6 having the sixth highest error probability is allocated to 3 bits of the symbol bits of the symbol bit group Gy1 having the highest error probability based on the group set information (Gb6, Gy1, 3), 2 bits of the code bits of the code bit group Gb6 having the sixth highest error probability is allocated to 2 bits of the symbol bits of the symbol bit group Gy2 having the second highest error probability based on the group set information (Gb6, Gy2, 2), and a 1 bit of the code bits of the code bit group Gb6 having the sixth highest error probability is allocated to a 1 bit of the symbol bits of the symbol bit group Gy3 having the third highest error probability based on the group set information (Gb6, Gy3, 1).

Figure 93:
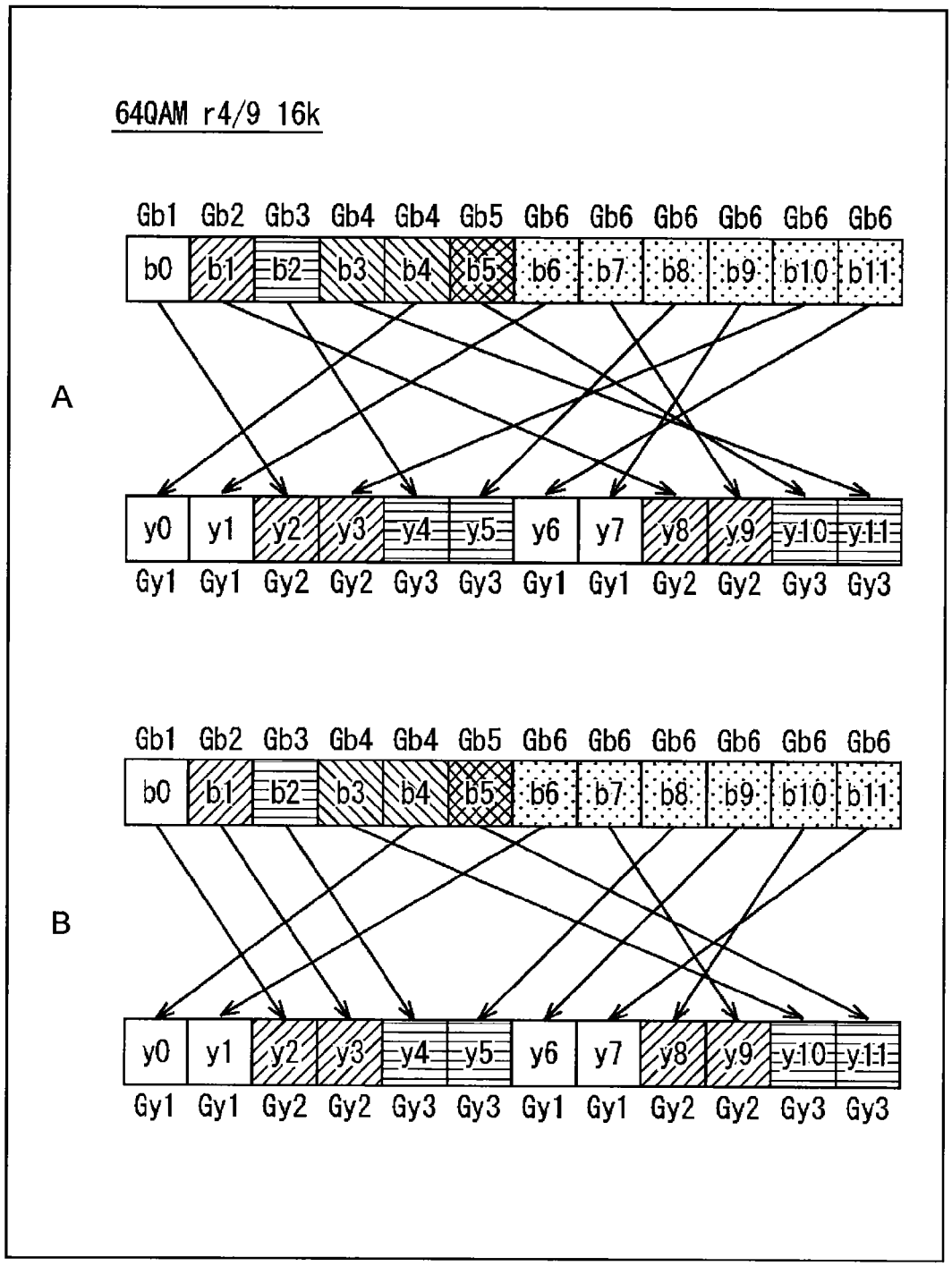
FIG. 93 is a diagram illustrating exchanging of code bits according to an allocation rule when an LDPC code having a code length of 16200 and a coding rate of 4/9 is modulated by 64QAM, and a multiple b is 2.

FIG. 93 illustrates an example of exchanging of code bits according to the allocation rule of FIG. 92.

In other words, A of FIG. 93 illustrates a first example of exchanging of code bits according to the allocation rule of FIG. 92 when an LDPC code is a mobile LDPC code in which the code length N is 16200 bits and the coding rate is 4/9, the modulation scheme is 64QAM, and the multiple b is 2.

When an LDPC code is a mobile LDPC code in which the code length N is 16200 bits and the coding rate is 4/9, the modulation scheme is 64QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 92 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 93.

In other words, the exchange unit 32 performs exchanging such that
the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y6.

B of FIG. 93 illustrates a second example of exchanging of code bits according to the allocation rule of FIG. 92 when an LDPC code is a mobile LDPC code in which the code length N is 16200 bits and the coding rate is 4/9, the modulation scheme is 64QAM, and the multiple b is 2.

According to B of FIG. 93, the exchange unit 32 exchanges the code bits b0 to b11 of 6×2 (=mb) bits read from the memory 31 according to the allocation rule of FIG. 92 such that
the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8, and
the code bit b11 is allocated to the symbol bit y7.

FIG. 94 illustrates a code bit group and a symbol bit group when an LDPC code is a mobile LDPC code in which the code length N is 16200 bits and the coding rate is 7/15, the modulation scheme is 64QAM, and the multiple b is 2.

In this case, the code bits of 6×2 (=mb) bits read from the memory 31 may be grouped into 7 code bit groups Gb1, Gb2, Gb3, Gb4, Gb5, Gb6, and Gb7 according to the difference in the error probability as illustrated in A of FIG. 94.

In A of FIG. 94, the code bit b0 belongs to the code bit group Gb1, the code bit b1 belongs to the code bit group Gb2, the code bit b2 belongs to the code bit group Gb3, the code bit b3 belongs to the code bit group Gb4, the code bit b4 belongs to the code bit group Gb5, the code bit b5 belongs to the code bit group Gb6, and the code bits b6 to b11 belong to the code bit group Gb7.

When the modulation scheme is 64QAM and the multiple b is 2, the symbol bits of 6×2 (=mb) bits may be grouped into three symbol bit groups Gy1, Gy2, and Gy3 according to the difference in the error probability as illustrated in B of FIG. 94.

In B of FIG. 94, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 95:
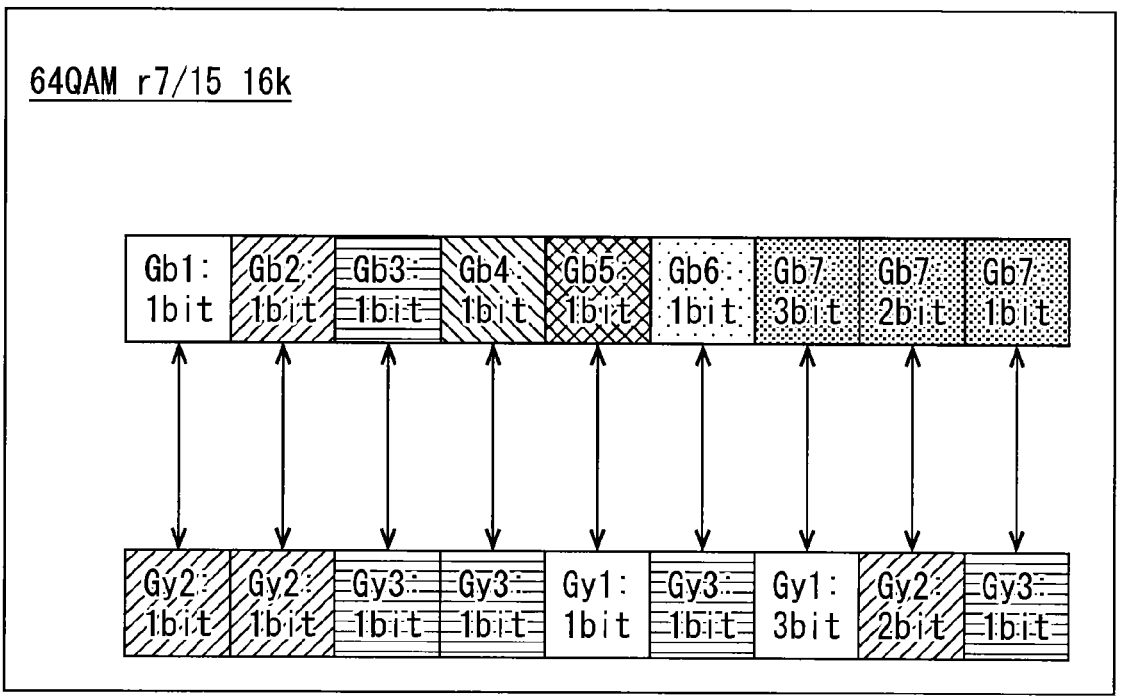
FIG. 95 is a diagram illustrating an allocation rule when an LDPC code having a code length of 16200 and a coding rate of 7/15 is modulated by 64QAM, and a multiple b is 2.

FIG. 95 illustrates an allocation rule when an LDPC code is a mobile LDPC code in which the code length N is 16200 bits, and the coding rate is 7/15, the modulation scheme is 64QAM, and the multiple b is 2.

In the allocation rule of FIG. 95, pieces of group set information (Gb1, Gy2, 1), (Gb2, Gy2, 1), (Gb3, Gy3, 1), (Gb4, Gy3, 1), (Gb5, Gy1, 1), (Gb6, Gy3, 1), (Gb7, Gy1, 3), (Gb7, Gy2, 2), and (Gb7, Gy3, 1) are specified.

In other words, the allocation rule of FIG. 95 specifies
that a 1 bit of the code bits of the code bit group Gb1 having the highest error probability is allocated to a 1 bit of the symbol bits of the symbol bit group Gy2 having the second highest error probability based on the group set information (Gb1, Gy2, 1), a 1 bit of the code bits of the code bit group Gb2 having the second highest error probability is allocated to a 1 bit of the symbol bits of the symbol bit group Gy2 having the second highest error probability based on the group set information (Gb2, Gy2, 1), a 1 bit of the code bits of the code bit group Gb3 having the third highest error probability is allocated to a 1 bit of the symbol bits of the symbol bit group Gy3 having the third highest error probability based on the group set information (Gb3, Gy3, 1), a 1 bit of the code bits of the code bit group Gb4 having the fourth highest error probability is allocated to a 1 bit of the symbol bits of the symbol bit group Gy3 having the third highest error probability based on the group set information (Gb4, Gy3, 1), a 1 bit of the code bits of the code bit group Gb5 having the fifth highest error probability is allocated to a 1 bit of the symbol bits of the symbol bit group Gy1 having the highest error probability based on the group set information (Gb5, Gy1, 1), a 1 bit of the code bits of the code bit group Gb6 having the sixth highest error probability is allocated to a 1 bit of the symbol bits of the symbol bit group Gy3 having the third highest error probability based on the group set information (Gb6, Gy3, 1), 3 bits of the code bits of the code bit group Gb7 having the seventh highest error probability is allocated to 3 bits of the symbol bits of the symbol bit group Gy1 having the highest error probability based on the group set information (Gb7, Gy1, 3), 2 bits of the code bits of the code bit group Gb7 having the seventh highest error probability is allocated to 2 bits of the symbol bits of the symbol bit group Gy2 having the second highest error probability based on the group set information (Gb7, Gy2, 2), and a 1 bit of the code bits of the code bit group Gb7 having the seventh highest error probability is allocated to a 1 bit of the symbol bits of the symbol bit group Gy3 having the third highest error probability based on the group set information (Gb7, Gy3, 1).

Figure 96:
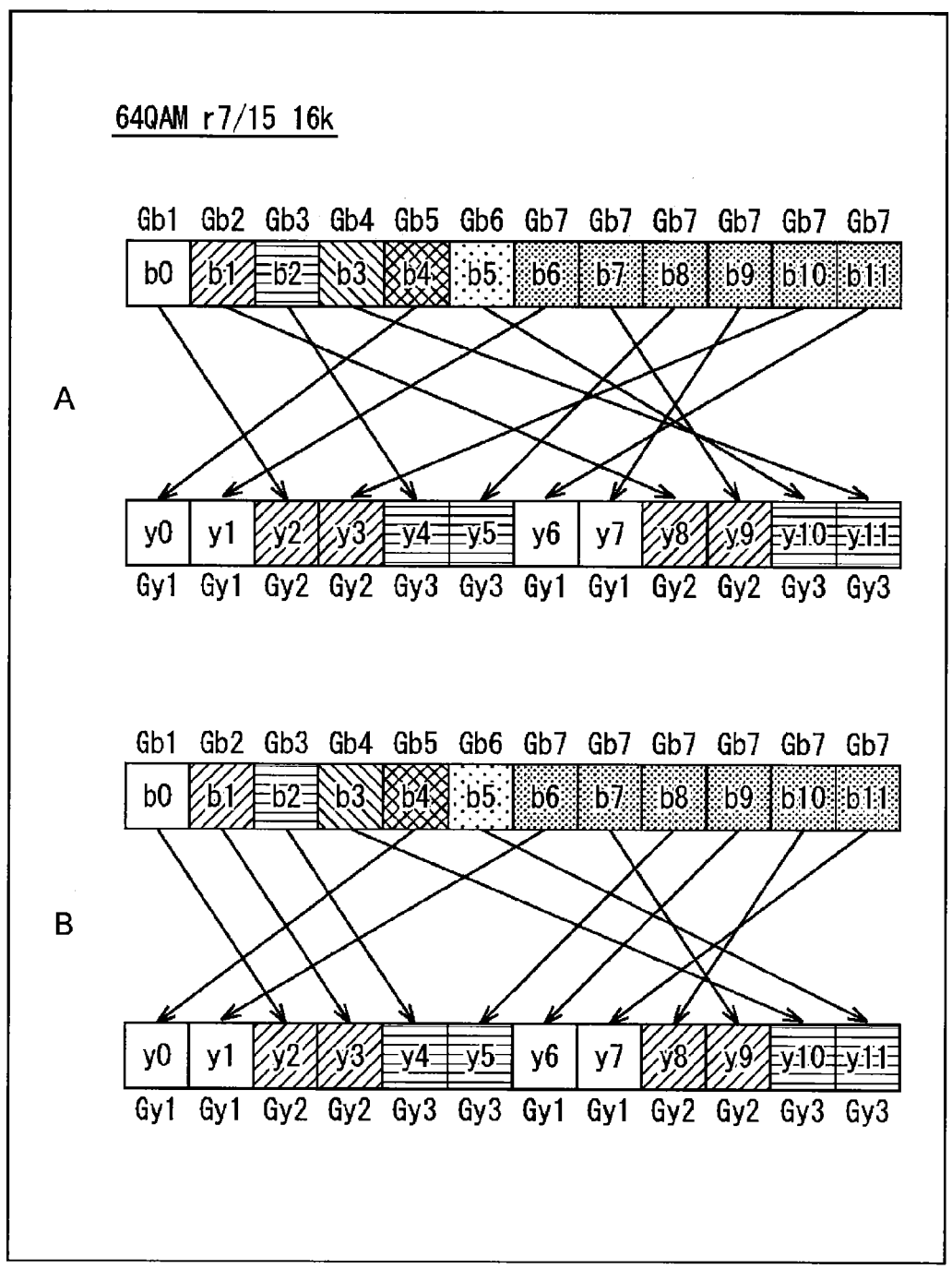
FIG. 96 is a diagram illustrating exchanging of code bits according to an allocation rule when an LDPC code having a code length of 16200 and a coding rate of 7/15 is modulated by 64QAM, and a multiple b is 2.

FIG. 96 illustrates an example of exchanging of code bits according to the allocation rule of FIG. 95.

In other words, A of FIG. 96 illustrates a first example of exchanging of code bits according to the allocation rule of FIG. 95 when an LDPC code is a mobile LDPC code in which the code length N is 16200 bits and the coding rate is 7/15, the modulation scheme is 64QAM, and the multiple b is 2.

When an LDPC code is a mobile LDPC code in which the code length N is 16200 bits and the coding rate is 7/15, the modulation scheme is 64QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 95 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 96.

In other words, the exchange unit 32 performs exchanging such that
the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3,
the code bit b11 is allocated to the symbol bit y6.

B of FIG. 96 illustrates a second example of exchanging of code bits according to the allocation rule of FIG. 95 when an LDPC code is a mobile LDPC code in which the code length N is 16200 bits and the coding rate is 7/15, the modulation scheme is 64QAM, and the multiple b is 2.

According to B of FIG. 96, the exchange unit 32 exchanges the code bits b0 to b11 of 6×2 (=mb) bits read from the memory 31 according to the allocation rule of FIG. 95 such that
the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8, and
the code bit b11 is allocated to the symbol bit y7.

FIG. 97 illustrates a code bit group and a symbol bit group when an LDPC code is a mobile LDPC code in which the code length N is 16200 bits and the coding rate is 8/15, the modulation scheme is 64QAM, and the multiple b is 2.

In this case, the code bits of 6×2 (=mb) bits read from the memory 31 may be grouped into 6 code bit groups Gb1, Gb2, Gb3, Gb4, Gb5, and Gb6 according to the difference in the error probability as illustrated in A of FIG. 97.

In A of FIG. 97, the code bit b0 belongs to the code bit group Gb1, the code bit b1 belongs to the code bit group Gb2, the code bit b2 belongs to the code bit group Gb3, the code bits b3 to b5 belong to the code bit group Gb4, the code bit b6 belongs to the code bit group Gb5, and the code bits b7 to b11 belong to the code bit group Gb6.

When the modulation scheme is 64QAM and the multiple b is 2, the symbol bits of 6×2 (=mb) bits may be grouped into three symbol bit groups Gy1, Gy2, and Gy3 according to the difference in the error probability as illustrated in B of FIG. 97.

In B of FIG. 97, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 98:
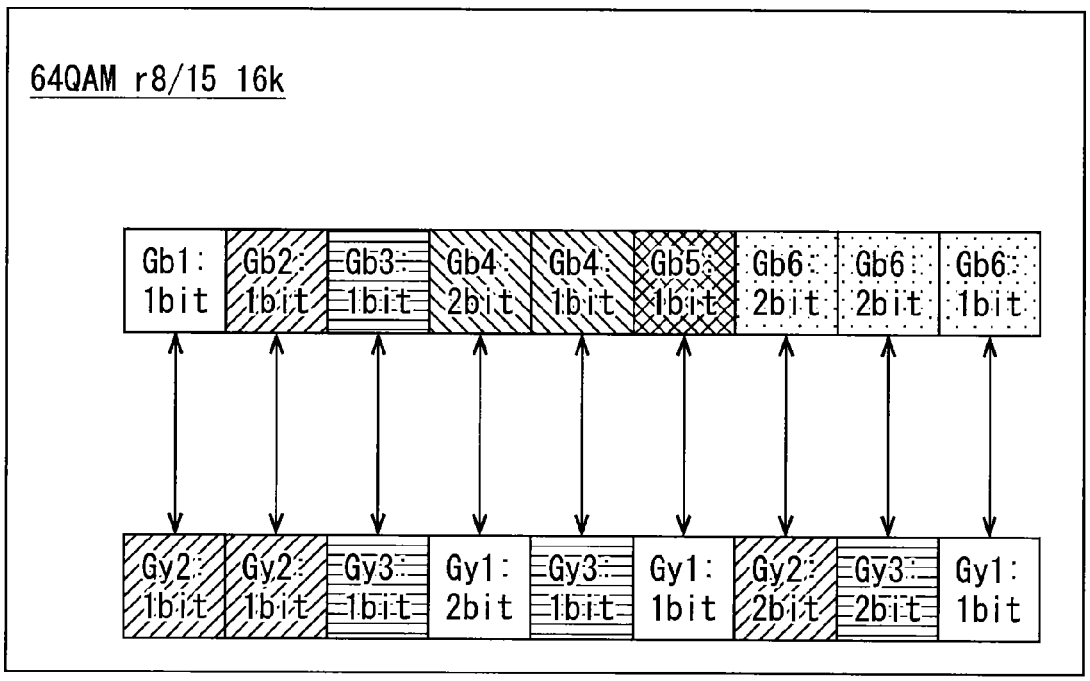
FIG. 98 is a diagram illustrating an allocation rule when an LDPC code having a code length of 16200 and a coding rate of 8/15 is modulated by 64QAM, and a multiple b is 2.

FIG. 98 illustrates an allocation rule when an LDPC code is a mobile LDPC code in which the code length N is 16200 bits, and the coding rate is 8/15, the modulation scheme is 64QAM, and the multiple b is 2.

In the allocation rule of FIG. 98, pieces of group set information (Gb1, Gy2, 1), (Gb2, Gy2, 1), (Gb3, Gy3, 1), (Gb4, Gy1, 2), (Gb4, Gy3, 1), (Gb5, Gy1, 1), (Gb6, Gy2, 2), (Gb6, Gy3, 2), and (Gb6, Gy1, 1) are specified.

In other words, the allocation rule of FIG. 98 specifies that a 1 bit of the code bits of the code bit group Gb1 having the highest error probability is allocated to a 1 bit of the symbol bits of the symbol bit group Gy2 having the second highest error probability based on the group set information (Gb1, Gy2, 1), a 1 bit of the code bits of the code bit group Gb2 having the second highest error probability is allocated to a 1 bit of the symbol bits of the symbol bit group Gy2 having the second highest error probability based on the group set information (Gb2, Gy2, 1), a 1 bit of the code bits of the code bit group Gb3 having the third highest error probability is allocated to a 1 bit of the symbol bits of the symbol bit group Gy3 having the third highest error probability based on the group set information (Gb3, Gy3, 1), 2 bits of the code bits of the code bit group Gb4 having the fourth highest error probability is allocated to 2 bits of the symbol bits of the symbol bit group Gy1 having the fourth highest error probability based on the group set information (Gb4, Gy1, 2), a 1 bit of the code bits of the code bit group Gb4 having the fourth highest error probability is allocated to a 1 bit of the symbol bits of the symbol bit group Gy3 having the third highest error probability based on the group set information (Gb4, Gy3, 1), a 1 bit of the code bits of the code bit group Gb5 having the fifth highest error probability is allocated to a 1 bit of the symbol bits of the symbol bit group Gy1 having the highest error probability based on the group set information (Gb5, Gy1, 1), 2 bits of the code bits of the code bit group Gb6 having the sixth highest error probability is allocated to 2 bits of the symbol bits of the symbol bit group Gy2 having the second highest error probability based on the group set information (Gb6, Gy2, 2), 2 bits of the code bits of the code bit group Gb6 having the sixth highest error probability is allocated to 2 bits of the symbol bits of the symbol bit group Gy3 having the third highest error probability based on the group set information (Gb6, Gy3, 2), and a 1 bit of the code bits of the code bit group Gb6 having the sixth highest error probability is allocated to a 1 bit of the symbol bits of the symbol bit group Gy1 having the highest error probability based on the group set information (Gb6, Gy1, 1).

Figure 99:
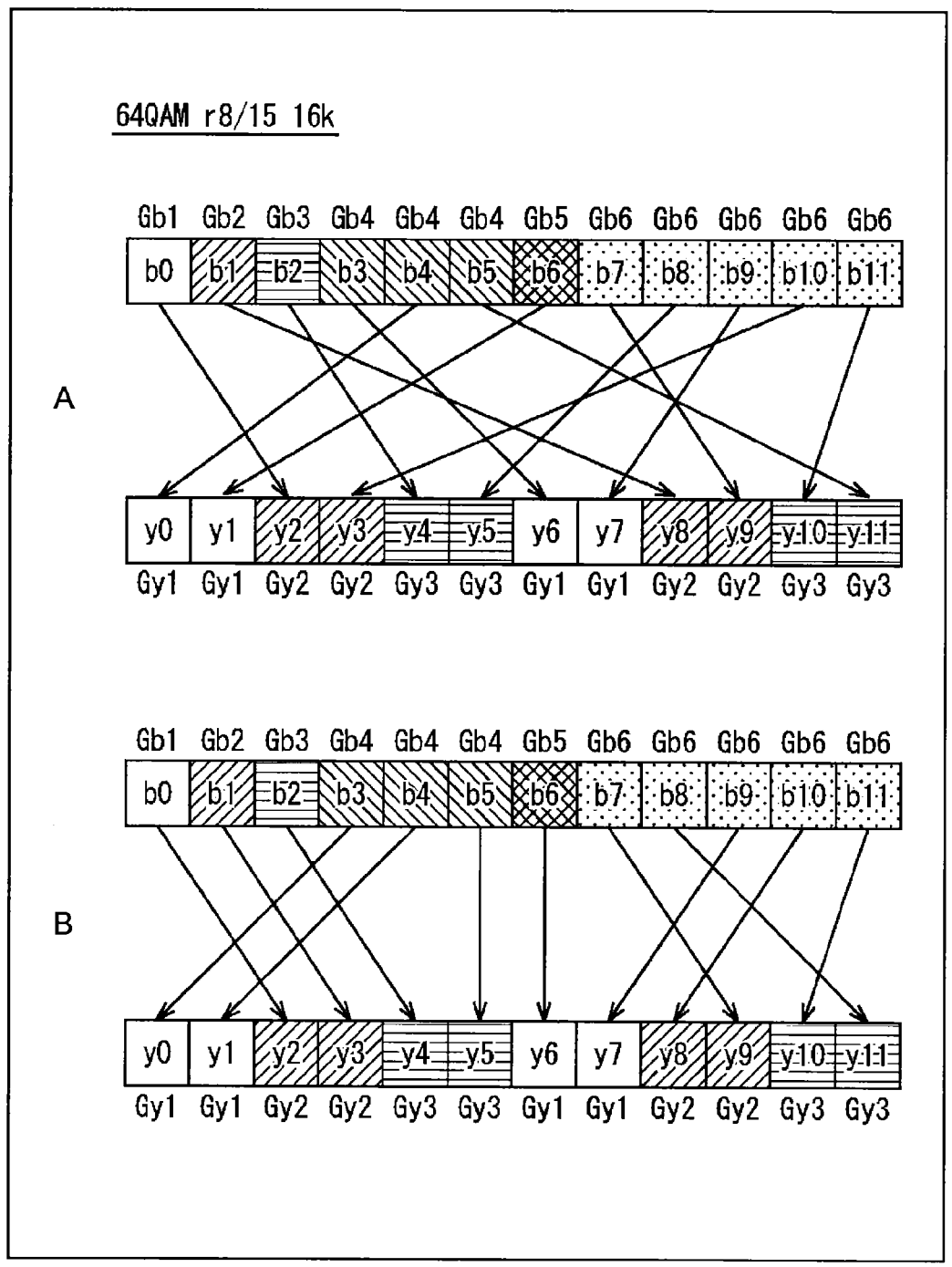
FIG. 99 is a diagram illustrating exchanging of code bits according to an allocation rule when an LDPC code having a code length of 16200 and a coding rate of 8/15 is modulated by 64QAM, and a multiple b is 2.

FIG. 99 illustrates an example of exchanging of code bits according to the allocation rule of FIG. 98.

In other words, A of FIG. 99 illustrates a first example of exchanging of code bits according to the allocation rule of FIG. 98 when an LDPC code is a mobile LDPC code in which the code length N is 16200 bits and the coding rate is 8/15, the modulation scheme is 64QAM, and the multiple b is 2.

When an LDPC code is a mobile LDPC code in which the code length N is 16200 bits and the coding rate is 8/15, the modulation scheme is 64QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 98 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 99.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y6,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y10.

B of FIG. 99 illustrates a second example of exchanging of code bits according to the allocation rule of FIG. 98 when an LDPC code is a mobile LDPC code in which the code length N is 16200 bits and the coding rate is 8/15, the modulation scheme is 64QAM, and the multiple b is 2.

Figure 100:
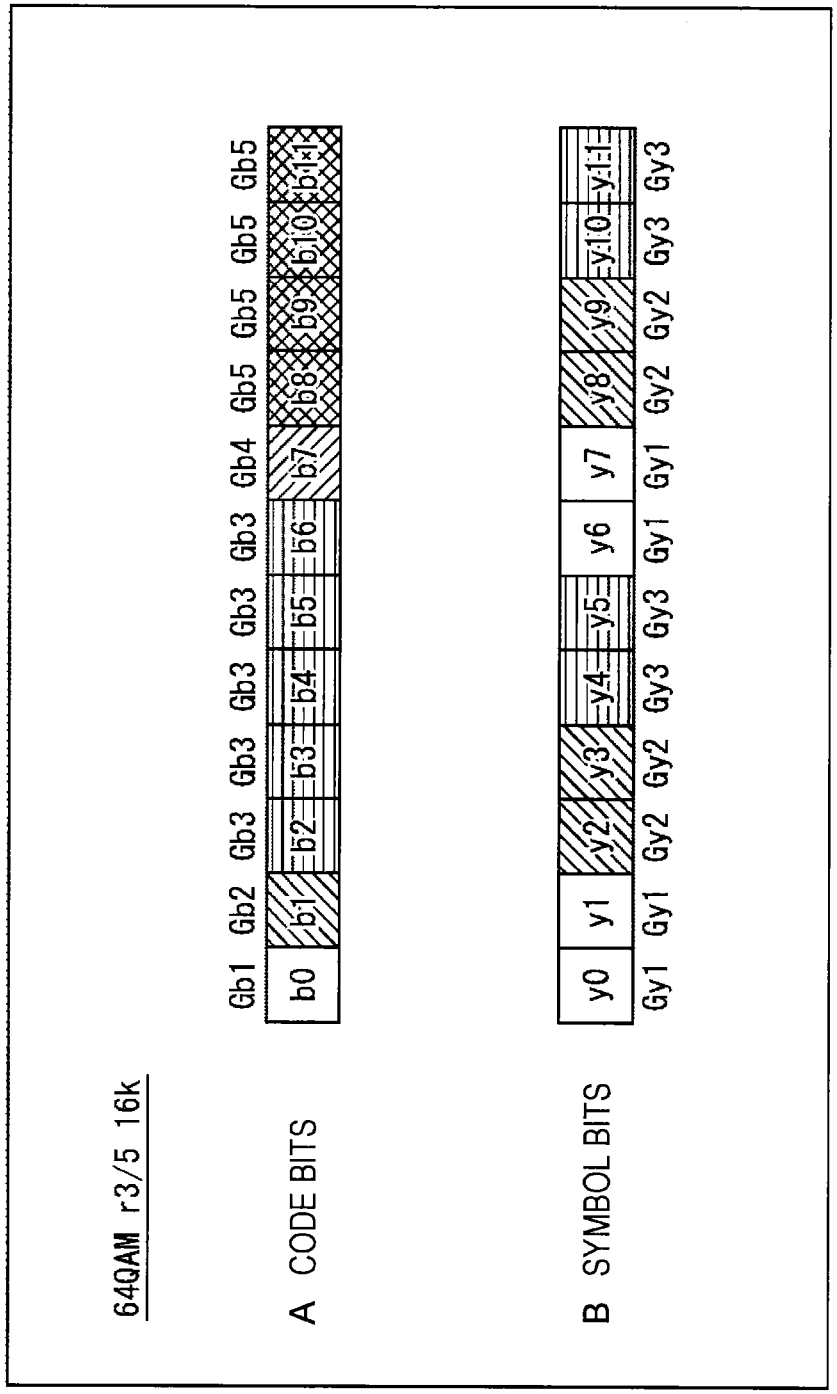
FIG. 100 is a diagram illustrating a code bit group and a symbol bit group when an LDPC code having a code length of 16200 and a coding rate of 3/5 is modulated by 64QAM, and a multiple b is 2.

According to B of FIG. 99, the exchange unit 32 exchanges the code bits b0 to b11 of 6×2 (=mb) bits read from the memory 31 according to the allocation rule of FIG. 98 such that the code bit b0 is allocated to the symbol bit y2,
the code bit b1 is allocated to the symbol bit y3,
the code bit b2 is allocated to the symbol bit y4,
the code bit b3 is allocated to the symbol bit y0,
the code bit b4 is allocated to the symbol bit y1,
the code bit b5 is allocated to the symbol bit y5,
the code bit b6 is allocated to the symbol bit y6,
the code bit b7 is allocated to the symbol bit y9,
the code bit b8 is allocated to the symbol bit y11,
the code bit b9 is allocated to the symbol bit y7,
the code bit b10 is allocated to the symbol bit y8, and
the code bit b11 is allocated to the symbol bit y10, FIG. 100 illustrates a code bit group and a symbol bit group when an LDPC code is a mobile LDPC code in which the code length N is 16200 bits and the coding rate is 3/5, the modulation scheme is 64QAM, and the multiple b is 2.

In this case, the code bits of 6×2 (=mb) bits read from the memory 31 may be grouped into 5 code bit groups Gb1, Gb2, Gb3, Gb4, and Gb5 according to the difference in the error probability as illustrated in A of FIG. 100.

In A of FIG. 100, the code bit b0 belongs to the code bit group Gb1, the code bit b1 belongs to the code bit group Gb2, the code bits b2 to b6 belong to the code bit group Gb3, the code bit b7 belongs to the code bit group Gb4, and the code bits b8 to b11 belong to the code bit group Gb5.

When the modulation scheme is 64QAM and the multiple b is 2, the symbol bits of 6×2 (=mb) bits may be grouped into three symbol bit groups Gy1, Gy2, and Gy3 according to the difference in the error probability as illustrated in FIG. B of FIG. 100.

In B of FIG. 100, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 101:
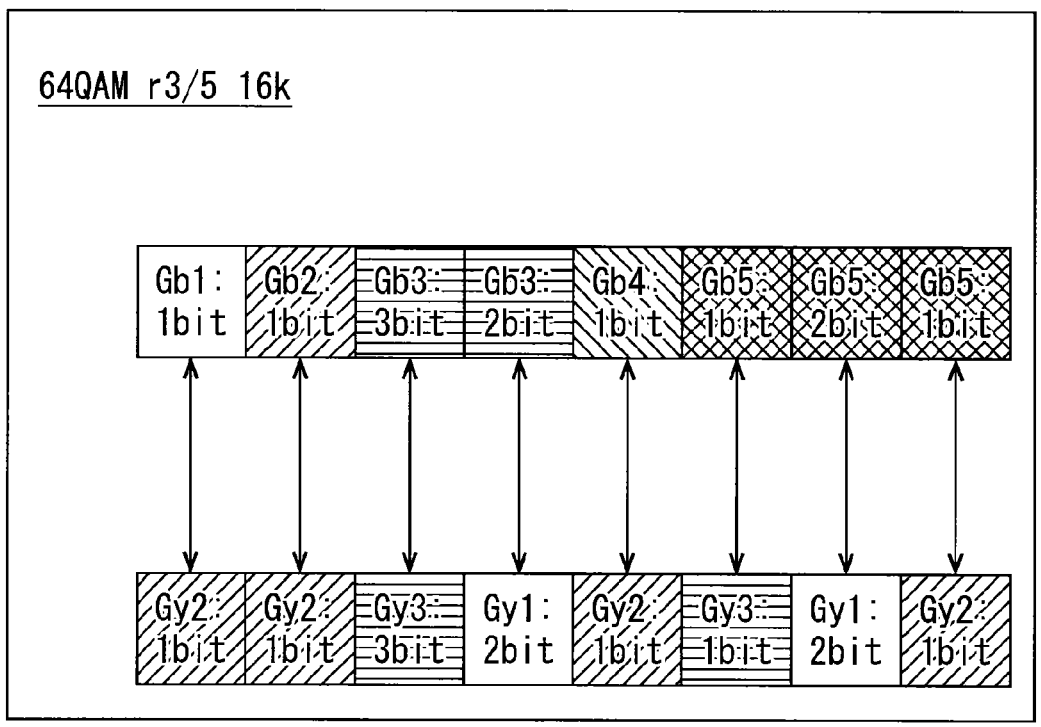
FIG. 101 is a diagram illustrating an allocation rule when an LDPC code having a code length of 16200 and a coding rate of 3/5 is modulated by 64QAM, and a multiple b is 2.

FIG. 101 illustrates an allocation rule when an LDPC code is a mobile LDPC code in which the code length N is 16200 bits, and the coding rate is 3/5, the modulation scheme is 64QAM, and the multiple b is 2.

In the allocation rule of FIG. 101, pieces of group set information (Gb1, Gy2, 1), (Gb2, Gy2, 1), (Gb3, Gy3, 3), (Gb3, Gy1, 2), (Gb4, Gy2, 1), (Gb5, Gy3, 1), (Gb5, Gy1, 2), and (Gb5, Gy2, 1) are specified.

In other words, the allocation rule of FIG. 101 specifies
that 1 bit of the code bits of the code bit group Gb1 having the highest error probability is allocated to 1 bit of the symbol bits of the symbol bit group Gy2 having the second highest error probability based on the group set information (Gb1, Gy2, 1),
that 1 bit of the code bits of the code bit group Gb2 having the second highest error probability is allocated to 1 bit of the symbol bits of the symbol bit group Gy2 having the second highest error probability based on the group set information (Gb2, Gy2, 1),
that 3 bits of the code bits of the code bit group Gb3 having the third highest error probability is allocated to 3 bits of the symbol bits of the symbol bit group Gy3 having the third highest error probability based on the group set information (Gb3, Gy3, 3),
that 2 bits of the code bits of the code bit group Gb3 having the third highest error probability is allocated to 1 bit of the symbol bits of the symbol bit group Gy1 having the highest error probability based on the group set information (Gb3, Gy1, 2),
that 1 bit of the code bits of the code bit group Gb4 having the fourth highest error probability is allocated to 1 bit of the symbol bits of the symbol bit group Gy2 having the second highest error probability based on the group set information (Gb4, Gy2, 1),
that 1 bit of the code bits of the code bit group Gb5 having the fifth highest error probability is allocated to 1 bit of the symbol bits of the symbol bit group Gy3 having the third highest error probability based on the group set information (Gb5, Gy3, 1),
that 2 bits of the code bits of the code bit group Gb5 having the fifth highest error probability is allocated to 2 bits of the symbol bits of the symbol bit group Gy1 having the highest error probability based on the group set information (Gb5, Gy1, 2), and
that 1 bit of the code bits of the code bit group Gb5 having the fifth highest error probability is allocated to 1 bit of the symbol bits of the symbol bit group Gy2 having the second highest error probability based on the group set information (Gb5, Gy2, 1).

Figure 102:
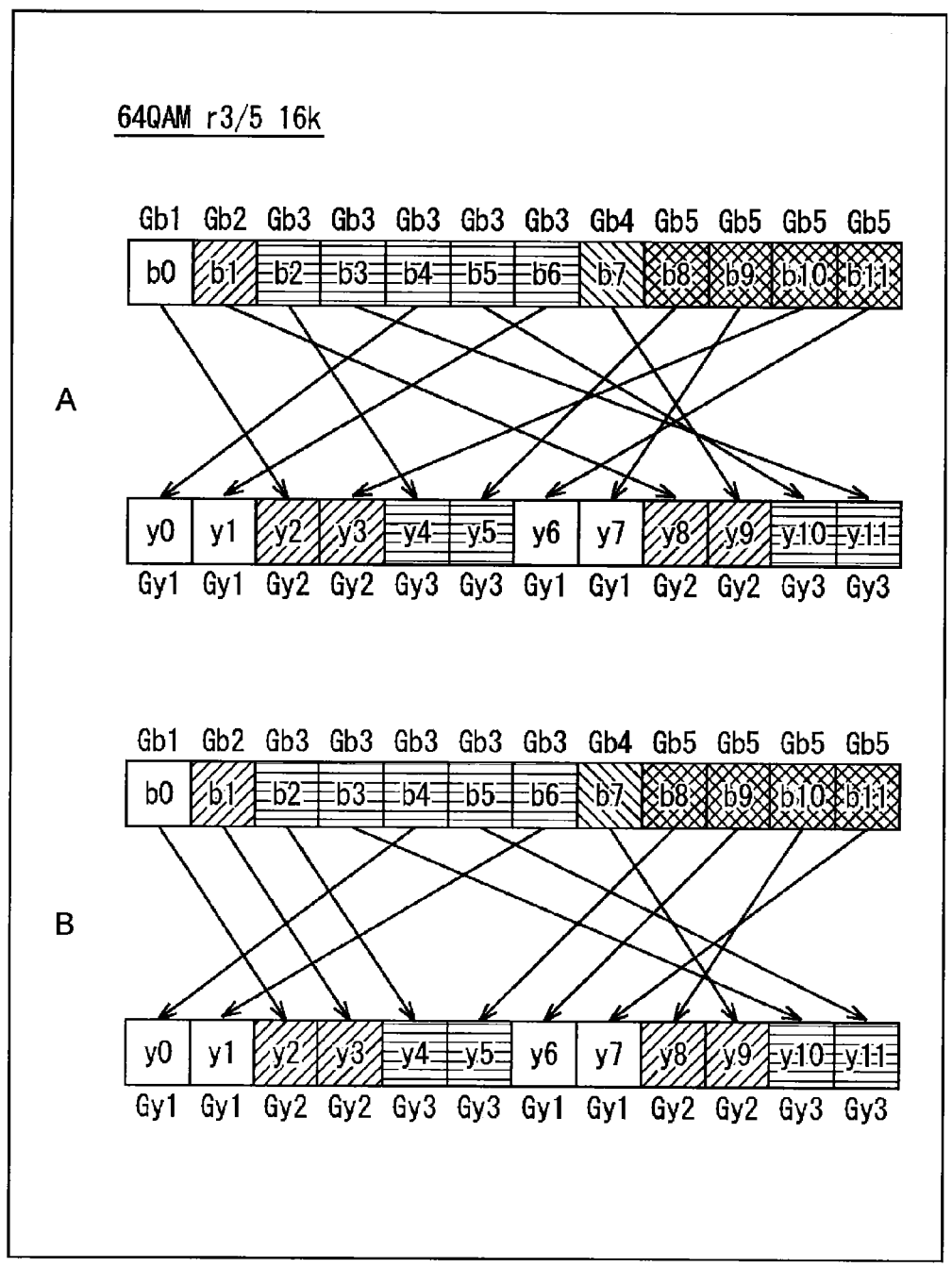
FIG. 102 is a diagram illustrating exchanging of code bits according to an allocation rule when an LDPC code having a code length of 16200 and a coding rate of 3/5 is modulated by 64QAM, and a multiple b is 2.

FIG. 102 illustrates an example of exchanging of code bits according to the allocation rule of FIG. 101.

In other words, A of FIG. 102 illustrates a first example of exchanging of code bits according to the allocation rule of FIG. 101 when an LDPC code is a mobile LDPC code in which the code length N is 16200 bits and the coding rate is 3/5, the modulation scheme is 64QAM, and the multiple b is 2.

When an LDPC code is a mobile LDPC code in which the code length N is 16200 bits and the coding rate is 3/5, the modulation scheme is 64QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 101 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 102.

In other words, the exchange unit 32 performs exchanging such that
the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y6.

B of FIG. 102 illustrates a second example of exchanging of code bits according to the allocation rule of FIG. 101 when an LDPC code is a mobile LDPC code in which the code length N is 16200 bits and the coding rate is 3/5, the modulation scheme is 64QAM, and the multiple b is 2.

According to B of FIG. 102, the exchange unit 32 exchanges the code bits b0 to b11 of 6×2 (=mb) bits read from the memory 31 according to the allocation rule of FIG. 101 such that
the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8, and
the code bit b11 is allocated to the symbol bit y7.

FIG. 103 illustrates a code bit group and a symbol bit group when an LDPC code is a mobile LDPC code in which the code length N is 16200 bits and the coding rate is 2/3, the modulation scheme is 64QAM, and the multiple b is 2.

In this case, the code bits of 6×2 (=mb) bits read from the memory 31 may be grouped into 6 code bit groups Gb1, Gb2, Gb3, Gb4, Gb5, and Gb6 according to the difference in the error probability as illustrated in A of FIG. 103.

In A of FIG. 103, the code bit b0 belongs to the code bit group Gb1, the code bit b1 belongs to the code bit group Gb2, the code bits b2 to b4 belong to the code bit group Gb3, the code bit b5 belongs to the code bit group Gb4, the code bit b6 and b7 belong to the code bit group Gb5, and the code bits b8 to b11 belong to the code bit group Gb6.

When the modulation scheme is 64QAM and the multiple b is 2, the symbol bits of 6×2 (=mb) bits may be grouped into three symbol bit groups Gy1, Gy2, and Gy3 according to the difference in the error probability as illustrated in FIG. B of FIG. 103.

In B of FIG. 103, the symbol bits y0, y1, y6, and y7 belong to the symbol bit group Gy1, the symbol bits y2, y3, y8, and y9 belong to the symbol bit group Gy2, and the symbol bits y4, y5, y10, and y11 belong to the symbol bit group Gy3, similarly to B of FIG. 79.

Figure 104:
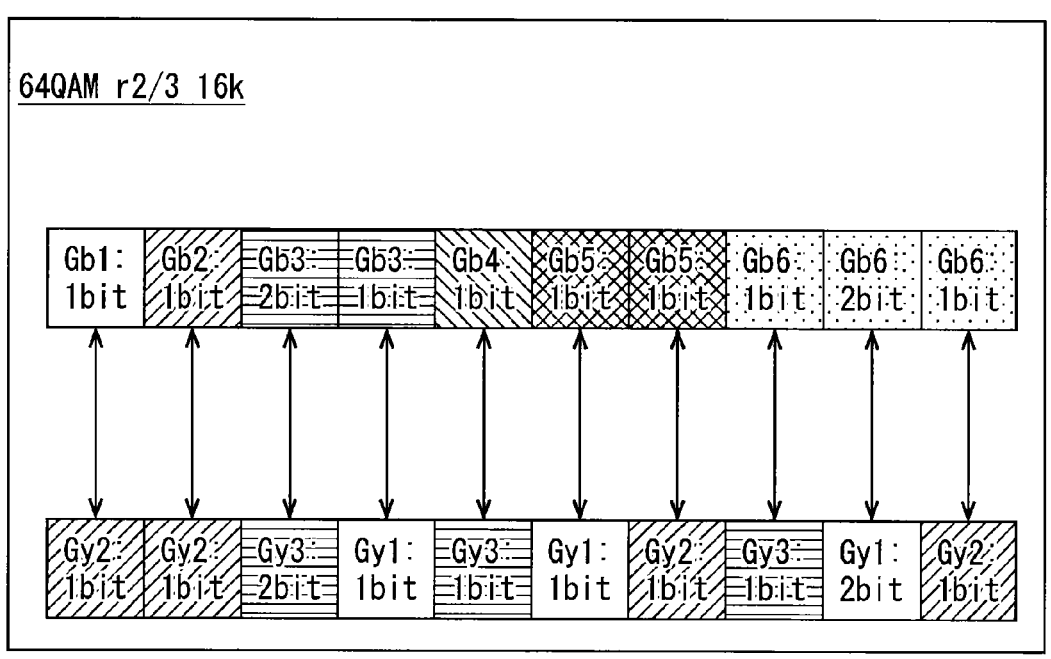
FIG. 104 is a diagram illustrating an allocation rule when an LDPC code having a code length of 16200 and a coding rate of 2/3 is modulated by 64QAM, and a multiple b is 2.

FIG. 104 illustrates an allocation rule when an LDPC code is a mobile LDPC code in which the code length N is 16200 bits, and the coding rate is 2/3, the modulation scheme is 64QAM, and the multiple b is 2.

In the allocation rule of FIG. 104, pieces of group set information (Gb1, Gy2, 1), (Gb2, Gy2, 1), (Gb3, Gy3, 2), (Gb3, Gy1, 1), (Gb4, Gy3, 1), (Gb5, Gy1, 1), (Gb5, Gy2, 1), (Gb6, Gy3, 1), (Gb6, Gy1, 2), and (Gb6, Gy2, 1) are specified.

In other words, the allocation rule of FIG. 104 specifies that 1 bit of the code bits of the code bit group Gb1 having the highest error probability is allocated to 1 bit of the symbol bits of the symbol bit group Gy2 having the second highest error probability based on the group set information (Gb1, Gy2, 1), that 1 bit of the code bits of the code bit group Gb2 having the second highest error probability is allocated to 1 bit of the symbol bits of the symbol bit group Gy2 having the second highest error probability based on the group set information (Gb2, Gy2, 1), that 2 bits of the code bits of the code bit group Gb3 having the third highest error probability is allocated to 2 bits of the symbol bits of the symbol bit group Gy3 having the third highest error probability based on the group set information (Gb3, Gy3, 2), that 2 bits of the code bits of the code bit group Gb3 having the third highest error probability is allocated to 1 bit of the symbol bits of the symbol bit group Gy1 having the highest error probability based on the group set information (Gb3, Gy1, 1), that 1 bit of the code bits of the code bit group Gb4 having the fourth highest error probability is allocated to 1 bit of the symbol bits of the symbol bit group Gy3 having the third highest error probability based on the group set information (Gb4, Gy3, 1), that 1 bit of the code bits of the code bit group Gb5 having the fifth highest error probability is allocated to 1 bit of the symbol bits of the symbol bit group Gy1 having the highest error probability based on the group set information (Gb5, Gy1, 1), that 1 bit of the code bits of the code bit group Gb5 having the fifth highest error probability is allocated to 1 bit of the symbol bits of the symbol bit group Gy2 having the second highest error probability based on the group set information (Gb5, Gy2, 1), and that 1 bit of the code bits of the code bit group Gb6 having the sixth highest error probability is allocated to 1 bit of the symbol bits of the symbol bit group Gy3 having the third highest error probability based on the group set information (Gb6, Gy3, 1), that 2 bits of the code bits of the code bit group Gb6 having the sixth highest error probability is allocated to 2 bits of the symbol bits of the symbol bit group Gy1 having the highest error probability based on the group set information (Gb6, Gy1, 2), and that 1 bit of the code bits of the code bit group Gb6 having the sixth highest error probability is allocated to 1 bit of the symbol bits of the symbol bit group Gy2 having the second highest error probability based on the group set information (Gb6, Gy2, 1).

Figure 105:
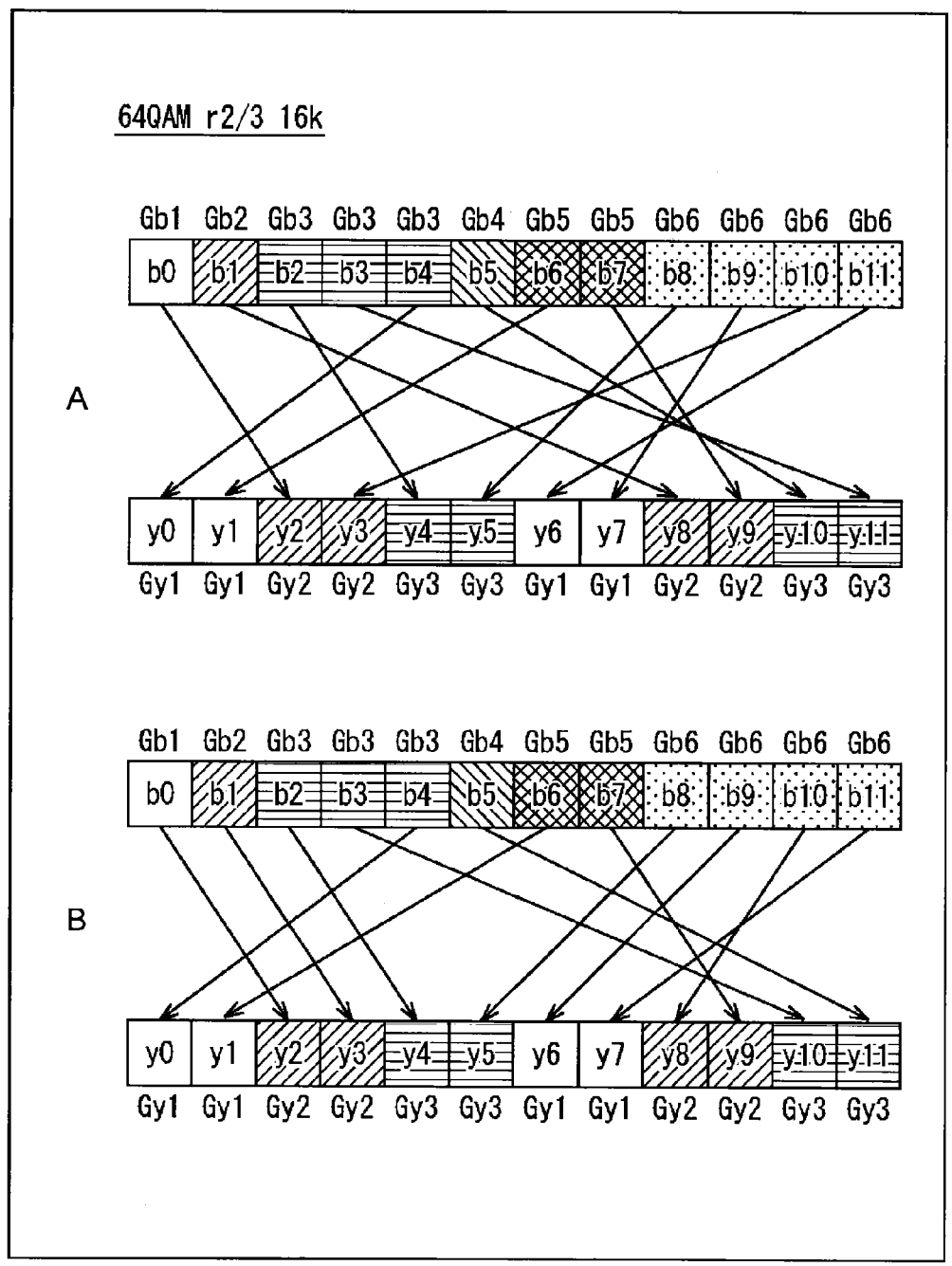
FIG. 105 is a diagram illustrating exchanging of code bits according to an allocation rule when an LDPC code having a code length of 16200 and a coding rate of 2/3 is modulated by 64QAM, and a multiple b is 2.

FIG. 105 illustrates an example of exchanging of code bits according to the allocation rule of FIG. 104.

In other words, A of FIG. 105 illustrates a first example of exchanging of code bits according to the allocation rule of FIG. 104 when an LDPC code is a mobile LDPC code in which the code length N is 16200 bits and the coding rate is 2/3, the modulation scheme is 64QAM, and the multiple b is 2.

When an LDPC code is a mobile LDPC code in which the code length N is 16200 bits and the coding rate is 2/3, the modulation scheme is 64QAM, and the multiple b is 2, the demultiplexer 25 reads code bits written in the memory 31 in which column direction×row direction is (16200/(6×2))×(6×2) bits in the row direction in units of 6×2 (=mb) bits, and supplies the read code bits to the exchange unit 32 (FIGS. 18 and 19).

The exchange unit 32 exchanges the code bits b0 to b11 of 6×2 (=mb) bits according to the allocation rule of FIG. 104 such that the code bits b0 to b11 of 6×2 (=mb) bits read from the memory 31 are allocated to the symbol bits y0 to y11 of 6×2 (=mb) bits of 2 (=b) symbols, for example, as illustrated in A of FIG. 105.

In other words, the exchange unit 32 performs exchanging such that the code bit b0 is allocated to the symbol bit y2,
the code bit b1 is allocated to the symbol bit y8,
the code bit b2 is allocated to the symbol bit y4,
the code bit b3 is allocated to the symbol bit y11,
the code bit b4 is allocated to the symbol bit y0,
the code bit b5 is allocated to the symbol bit y10,
the code bit b6 is allocated to the symbol bit y1,
the code bit b7 is allocated to the symbol bit y9,
the code bit b8 is allocated to the symbol bit y5,
the code bit b9 is allocated to the symbol bit y7,
the code bit b10 is allocated to the symbol bit y3, and
the code bit b11 is allocated to the symbol bit y6.

B of FIG. 105 illustrates a second example of exchanging of code bits according to the allocation rule of FIG. 104 when an LDPC code is a mobile LDPC code in which the code length N is 16200 bits and the coding rate is 2/3, the modulation scheme is 64QAM, and the multiple b is 2.

According to B of FIG. 105, the exchange unit 32 exchanges the code bits b0 to b11 of 6×2 (=mb) bits read from the memory 31 according to the allocation rule of FIG. 104 such that the code bit b0 is allocated to the symbol bit y2,
the code bit b1 is allocated to the symbol bit y3,
the code bit b2 is allocated to the symbol bit y4,
the code bit b3 is allocated to the symbol bit y10,
the code bit b4 is allocated to the symbol bit y0,
the code bit b5 is allocated to the symbol bit y11,
the code bit b6 is allocated to the symbol bit y1,
the code bit b7 is allocated to the symbol bit y9,
the code bit b8 is allocated to the symbol bit y5,
the code bit b9 is allocated to the symbol bit y6,
the code bit b10 is allocated to the symbol bit y8, and
the code bit b11 is allocated to the symbol bit y7.

According to the simulation performed by the inventor (s) of the present application, it has been found out that when the exchange process of the new exchanging method is performed, compared to when the exchange process is not performed, the BER has been improved, and thus according to the exchange process of the new exchanging method, tolerance for an error can be improved.

Here, as the exchanging method of the code bits of the LDPC code by the exchange process through the exchange unit 32, that is, an allocation pattern (hereinafter, also referred to as a "bit allocation pattern") of the code bits of the LDPC code and the symbol bits representing a symbol, for each of LDPC codes having different coding rates, a bit allocation pattern dedicated for a corresponding LDPC code may be employed.

However, when a bit allocation pattern dedicated for a corresponding LDPC code may be employed for each of LDPC codes having different coding rates, it is necessary to implement a plurality of bit allocation patterns in the transmitting device 11, and it is necessary to change (switch) a bit allocation pattern for each of LDPC codes having different types of coding rates.

Meanwhile, according to the exchange process described above with reference to FIGS. 52 to 105, the number of bit allocation patterns implemented in the transmitting device 11 can be reduced.

In other words, when the modulation scheme is 16QAM, for mobile LDPC codes having the coding rates of 1/5, 4/15 and 1/3, employed is a bit allocation pattern of allocating the code bits b0 to b7 to the symbol bits y4, y3, y2, y1, y6, y5, y7, y0, respectively, which are illustrated in A of FIGS. 54, 57, and 60, and for mobile LDPC codes having the coding rates of 2/5, 4/9, 7/15, 8/15, 3/5, and 2/3, employed is a bit allocation pattern of allocating the code bits b0 to b7 to the symbol bits y0, y2, y6, y3, y4, y1, y5, y7, respectively, which are illustrated in A of FIGS. 63, 66, 69, 72, 75, and 78, and thus the transmitting device 11 needs only to implement the bit allocation patterns of the two patterns.

Further, when the modulation scheme is 64QAM, for mobile LDPC codes having the coding rates of 1/5, 2/5, 4/9, 7/15, 3/5, and 2/3, employed is a bit allocation pattern of allocating the code bits b0 to b11 to the symbol bits y2, y8, y4, y11, y0, y10, y1, y9, y5, y7, y3, y6, respectively, which are illustrated in A of FIGS. 81, 90, 93, 96, 102, and 105, and for mobile LDPC codes having the coding rates of 4/15, 1/3, and 8/15, employed is a bit allocation pattern of allocating the code bits b0 to b11 to the symbol bits y2, y8, y4, y6, y0, y11, y1, y9, y5, y7, y3, y10, respectively, which are illustrated in A of FIGS. 84, 87, and 99, and thus the transmitting device 11 needs only to implement the bit allocation patterns of the two patterns.

In the present embodiment, for the sake of convenience of description, the demultiplexer 25 is configured to perform the exchange process on the code bits read from the memory 31 through the exchange unit 32, but the exchange process may be performed by controlling writing and reading of code bits to and from the memory 31.

In other words, for example, the exchange process may be performed by controlling an address (read address) to read a code bit such that code bits are read from the memory 31 in the order of exchanged code bits.

[Configuration Example of Receiving Device 12]

Figure 106:
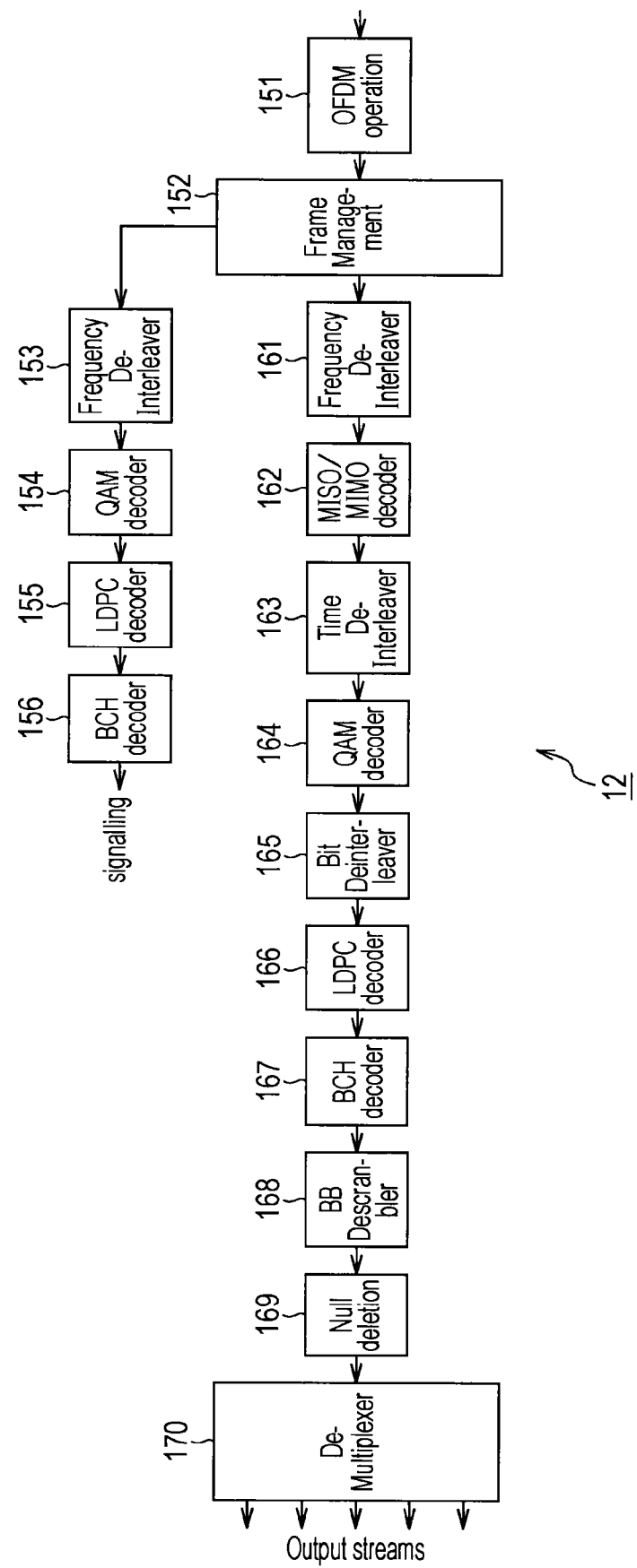
FIG. 106 is a block diagram illustrating a configuration example of a receiving device 12.

FIG. 106 is a block diagram illustrating a configuration example of the receiving device 12 of FIG. 7.

An OFDM processing unit (OFDM operation) 151 receives an OFDM signal from the transmitting device 11 (FIG. 7), and performs the signal processing of the OFDM signal. Data (symbol) obtained by performing the signal processing through the OFDM processing unit 151 is supplied to a frame management unit 152.

The frame management unit 152 performs processing (frame interpretation) of a frame configured with the symbol supplied from the OFDM processing unit 151, and supplies a symbol of the resultant target data and a symbol of control data to frequency deinterleavers 161 and 153, respectively.

The frequency deinterleaver 153 performs frequency deinterleaving on the symbol from the frame management unit 152 in units of symbols, and supplies the resultant data to a QAM decoder 154.

The QAM decoder 154 performs orthogonal demodulation by performing de-mapping (signal point arrangement decoding) on the symbol (symbol arranged on the signal point) from the frequency deinterleaver 153, and supplies the resultant data (LDPC code) to an LDPC decoder 155.

The LDPC decoder 155 performs LDPC decoding on the LDPC code from the QAM decoder 154, and supplies the resultant LDPC target data (here, a BCH code) to a BCH decoder 156.

The BCH decoder 156 performs BCH decoding on the LDPC target data from the LDPC decoder 155, and outputs the resultant control data (signalling).

Meanwhile, the frequency deinterleaver 161 performs frequency deinterleaving on the symbol from the frame management unit 152 in units of symbols, and supplies the resultant data to a the MISO/MIMO decoder 162.

The MISO/MIMO decoder 162 performs time-space decoding on the data (symbol) from the frequency deinterleaver 161, and supplies the resultant data to a time deinterleaver 163.

The time deinterleaver 163 performs time deinterleaving on the data (symbol) from the MISO/MIMO decoder 162 in units of symbols, and supplies the resultant data to a QAM decoder 164.

The QAM decoder 164 performs orthogonal demodulation by performing de-mapping (signal point arrangement decoding) on the symbol (the symbol arranged on the signal point) from the time deinterleaver 163, and supplies the resultant data (symbol) to a bit deinterleaver 165.

The bit deinterleaver 165 performs bit deinterleaving on the data (symbol) from the QAM decoder 164, and supplies a result LDPC code to an LDPC decoder 166.

The LDPC decoder 166 performs LDPC decoding on the LDPC code from the bit deinterleaver 165, and supplies resultant LDPC target data (here, a BCH code) to a BCH decoder 167.

The BCH decoder 167 performs BCH decoding on the LDPC target data from the LDPC decoder 155, and supplies the resultant data to a BB descrambler 168.

The BB descrambler 168 executes a reverse energy diffusion process on the data from the BCH decoder 167, and supplies the resultant data to a null deletion unit 169.

The null deletion unit 169 deletes null data include by the padder 112 of FIG. 8 from the data from the BB descrambler 168, and supplies the resultant data to a demultiplexer 170.

The demultiplexer 170 demultiplexes one or more streams (target data) multiplexed on the data from the null deletion unit 169, and outputs the resultant data as an output stream.

Figure 107:
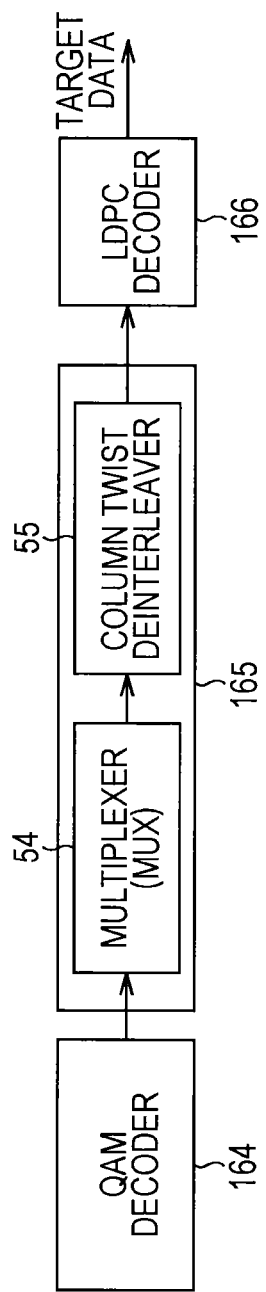
FIG. 107 is a block diagram illustrating a configuration example of a bit deinterleaver 165.

FIG. 107 is a block diagram illustrating a configuration example of the bit deinterleaver 165 of FIG. 106.

The bit deinterleaver 165 is configured with a multiplexer (MUX) 54 and a column twist deinterleaver 55, and performs (bit) deinterleaving the symbol bits of the symbol from the QAM decoder 164 (FIG. 106).

In other words, the multiplexer 54 performs a reverse exchange process (the reverse process of the exchange process) corresponding to the exchange process performed by the demultiplexer 25 of FIG. 9, that is, the reverse exchange process of restoring the positions of the code bits (symbol bits) of the LDPC code exchanged by the exchange process to the original positions on the symbol bits of the symbol from the QAM decoder 164, and supplies the resultant LDPC code to the column twist deinterleaver 55.

For example, the column twist deinterleaver 55 performs column twist deinterleaving (the reverse process of column twist interleaving) corresponding to column twist deinterleaving serving as the sorting process performed by the column twist interleaver 24 of FIG. 9, that is, column twist deinterleaving serving as the reverse sorting process of restoring the code bits of the LDPC code whose sequence has been changed by column twist interleaving serving as the sorting process on the LDPC code from the multiplexer 54 to the original sequence.

Specifically, the column twist deinterleaver 55 performs column twist deinterleaving by writing and reading the code bits of the LDPC code to and from a memory for deinterleaving having the same configuration as the memory 31 illustrated in FIG. 24 and the like.

Here, in the column twist deinterleaver 55, the writing of the code bit is performed in the row direction of the memory for deinterleaving using a read address at the time of reading of the code bit from the memory 31 as a write address. Further, the writing of the code bit is performed in the column direction of the memory for deinterleaving using a write address at the time of writing of the code bit from the memory 31 as a read address.

The LDPC code obtained as a result of performing column twist deinterleaving is supplied to the LDPC decoder 166 from the column twist deinterleaver 55.

Here, parity interleaving, column twist interleaving, and the exchange process are performed on the LDPC code supplied from the QAM decoder 164 to the bit deinterleaver 165 in the described order, but the bit deinterleaver 165 performs only the reverse exchange process corresponding to the exchange process and column twist deinterleaving corresponding to column twist interleaving, and thus parity deinterleaving (the reverse process of parity interleaving), that is, parity deinterleaving of restoring the code bits of the LDPC code whose sequence has been changed by parity interleaving to the original sequence is not performed.

Thus, the LDPC code that has been subjected to the reverse exchange process and column twist deinterleaving but not subjected to parity deinterleaving is supplied from (the column twist deinterleaver 55) of the bit deinterleaver 165 to the LDPC decoder 166.

The LDPC decoder 166 performs LDPC decoding of the LDPC code from the bit deinterleaver 165 using the conversion parity check matrix obtained by performing at least the column replacement corresponding to parity interleaving on the parity check matrix H used for LDPC coding by the LDPC encoder 115 of FIG. 8, and outputs the resultant data as a decoding result of the LDPC target data.

Figure 108:
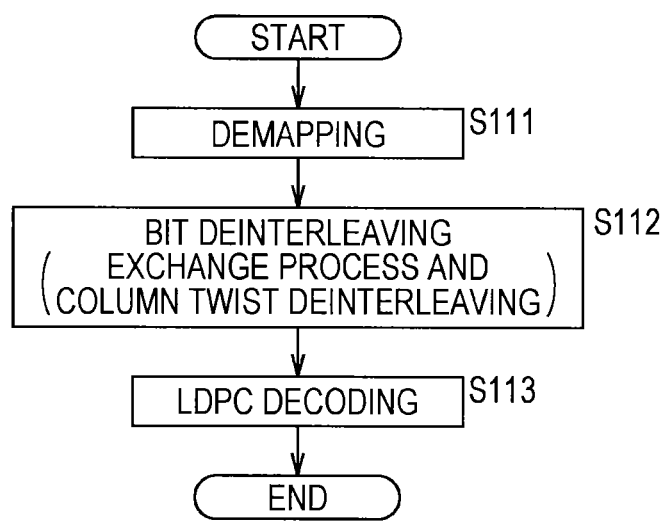
FIG. 108 is a flowchart for describing processing performed by a QAM decoder 164, the bit deinterleaver 165, and an LDPC decoder 166.

FIG. 108 is a flowchart for describing processing performed by the QAM decoder 164, the bit deinterleaver 165, and the LDPC decoder 166 of FIG. 107.

In step S111, the QAM decoder 164 performs orthogonal demodulation by de-mapping the symbol (the symbol mapped to the signal point) from the time deinterleaver 163, and supplies the resultant data to the bit deinterleaver 165, and then the process proceeds to step S112.

In step S112, the bit deinterleaver 165 performs deinterleaving (bit deinterleaving) of the symbol bits of the symbol from the QAM decoder 164, and then the process proceeds to step S113.

In other words, in step S112, in the bit deinterleaver 165, the multiplexer 54 performs the reverse exchange process on the symbol bits of the symbol from the QAM decoder 164, and supplies the code bits of the resultant LDPC code to the column twist deinterleaver 55.

The column twist deinterleaver 55 performs column twist deinterleaving on the LDPC code from the multiplexer 54, and supplies the resultant LDPC code to the LDPC decoder 166.

In step S113, the LDPC decoder 166 performs LDPC decoding of the LDPC code from the column twist deinterleaver 55 using the conversion parity check matrix obtained by performing at least the column replacement corresponding to parity interleaving on the parity check matrix H used for LDPC coding by the LDPC encoder 115 of FIG. 8, and outputs the resultant data to the BCH decoder 167 as a decoding result of the LDPC target data.

In FIG. 107, similarly to the example of FIG. 9, for sake of convenience of description, the multiplexer 54 performing the reverse exchange process is configured separately from the column twist deinterleaver 55 performing column twist deinterleaving, but the multiplexer 54 may be configured integrally with the column twist deinterleaver 55.

Further, when the bit interleaver 116 of FIG. 9 does not perform column twist interleaving, it is unnecessary to dispose the column twist deinterleaver 55 in the bit deinterleaver 165 of FIG. 107.

Next, LDPC decoding performed by the LDPC decoder 166 of FIG. 106 will be further described.

In the LDPC decoder 166 of FIG. 106, as described above, LDPC decoding of the LDPC code from the column twist deinterleaver 55 which has been subjected to the reverse exchange process and column twist deinterleaving but not subjected to parity deinterleaving is performed using the conversion parity check matrix obtained by performing at least the column replacement corresponding to parity interleaving on the parity check matrix H used for LDPC coding by the LDPC encoder 115 of FIG. 8.

Here, LDPC decoding capable of suppressing the circuit size and suppressing an operation frequency to a sufficiently feasible range by performing the LDPC decoding using the conversion parity check matrix has been previously proposed (for example, see Japanese Patent No. 4224777).

In this regard, first of all, LDPC decoding using the conversion parity check matrix which has been previously proposed will be described with reference to FIGS. 109 to 112.

Figure 109:
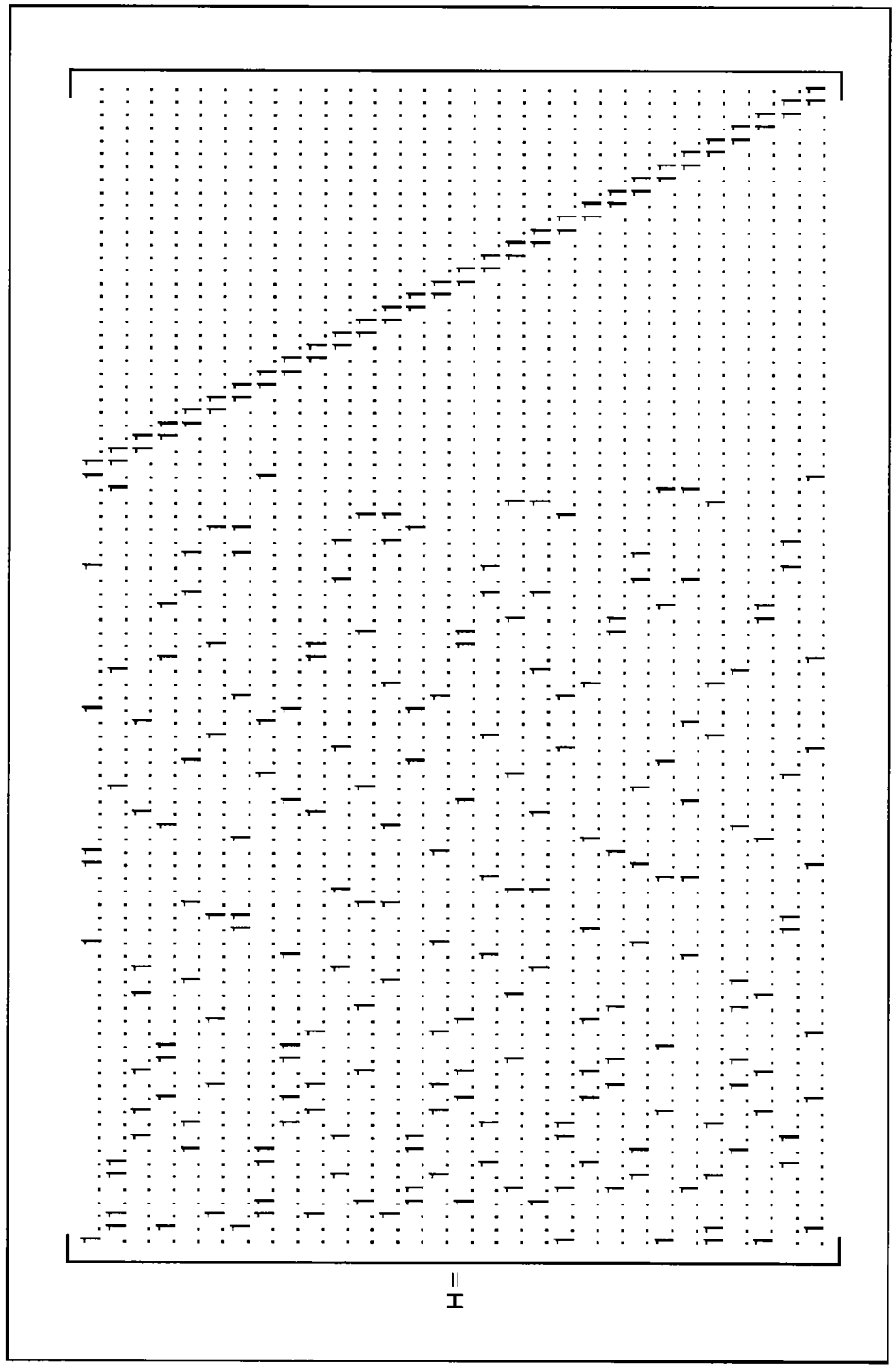
FIG. 109 is a diagram illustrating an example of a parity check matrix of an LDPC code.

FIG. 109 illustrates an example of a parity check matrix H of an LDPC code in which the code length N 90 and the coding rate is 2/3.

In FIG. 109 (similarly in FIGS. 110 and 111 which will be described later), 0 is represented by a period (.).

In the parity check matrix H of FIG. 109, the parity matrix has the staircase structure.

Figure 110:
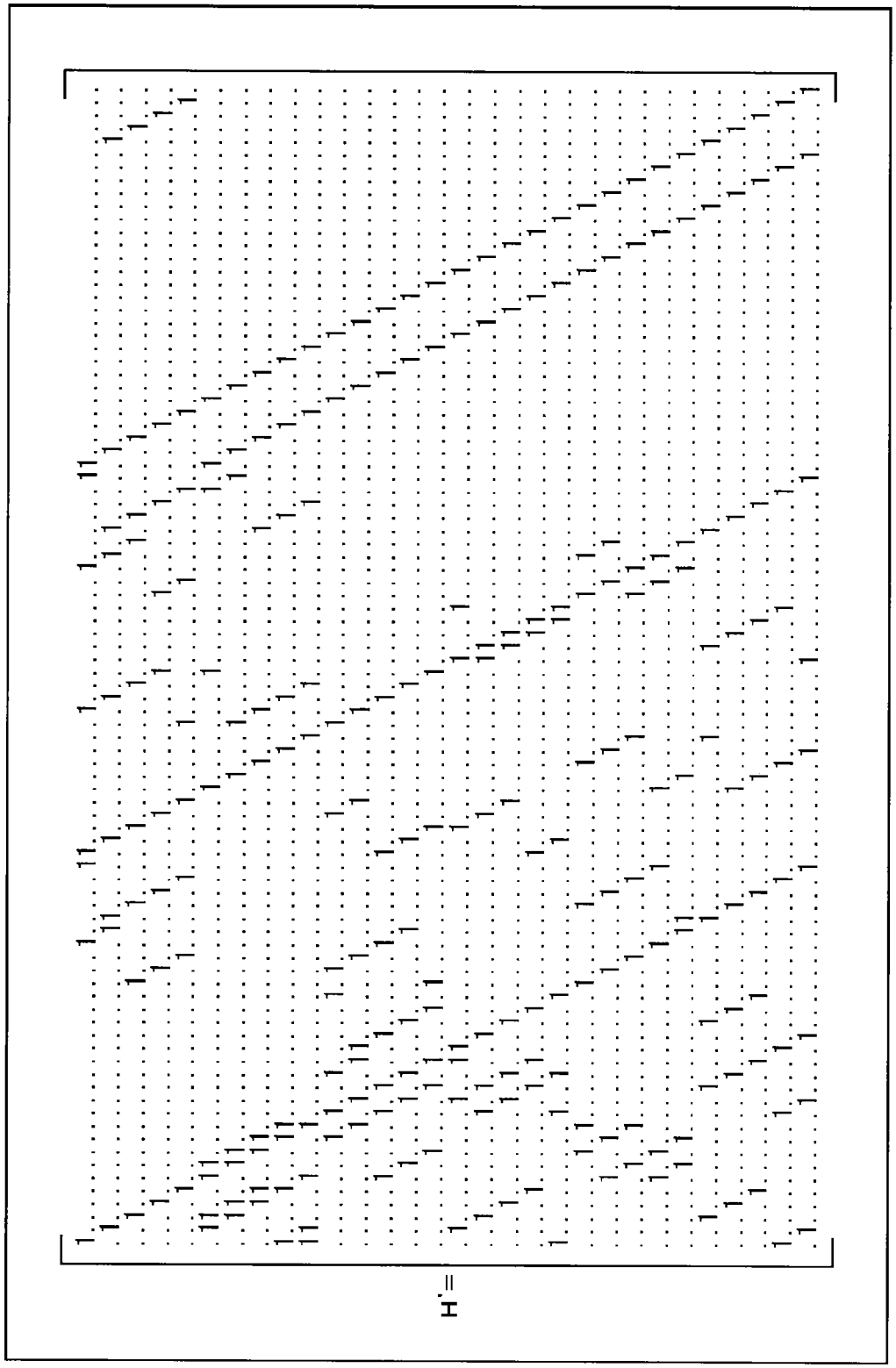
FIG. 110 is a diagram illustrating a matrix (conversion parity check matrix) obtained by executing row replacement and column replacement on a parity check matrix.

FIG. 110 illustrates a parity check matrix H' obtained by executing row replacement of Formula (11) and column replacement of Formula (12) on the parity check matrix H of FIG. 109.

$$\text{Row replacement:}(6s+t+1)\text{-th row} \to (5t+s+1)\text{-th row} \qquad (11)$$

$$\text{Column replacement:}(6x+y+61)\text{-th column} \to (5y+x+61)\text{-th column} \qquad (12)$$

Here, in Formulas (11) and (12), s, t, x, and y are integers having ranges of $0 \leq s < 5$, $0 \leq t < 6$, $0 \leq x < 5$, and $0 \leq t < 6$, respectively.

According to row replacement of Formula (11), replacement is performed such that 1-st, 7-th, 13-th, 19-th, and 25-th rows in which the remainder is 1 when divided by 6 are replaced with 1-st, 2-nd, 3-rd, 4-th, and 5-th rows, respectively, and 2-nd, 8-th, 14-th, 20-th, and 26-th rows in which the remainder is 2 when divided by 6 are replaced with 6-th, 7-th, 8-th, 9-th, and 10-th rows, respectively.

Further, according to column replacement of Formula (12), a 61-st column and subsequent columns (parity matrices) are replaced such that 61-st, 67-th, 73-rd, 79-th, and 85-th columns in which the remainder is 1 when divided by 6 are replaced with 61-st, 62-nd, 63-rd, 64-th, and 65-th columns, respectively, and 62-nd, 68-th, 74-th, 80-th, and 86-th columns in which the remainder is 2 when divided by 6 are replaced with 66-th, 67-th, 68-th, 69-th, and 70-th columns, respectively.

A matrix obtained by performing row and column replacements on the parity check matrix H of FIG. 109 as described above is the parity check matrix H' of FIG. 110.

Here, even when the row replacement of the parity check matrix H is performed, the sequence of the code bits of the LDPC code is not affected.

Further, the column replacement of Formula (12) corresponds to parity interleaving of interleaving the (K+qx+y+

1)-th code bit to the position of the (K+Py+x+1)-th code bit, that is, parity interleaving when the information length K is 60, the unit column number P of the cyclic structure is 5, and the divisor q (=M/P) of the parity length M (here, 30) is 6.

When the parity check matrix (hereinafter, referred to appropriately as a "conversion parity check matrix") H' of FIG. 110 is multiplied by one obtained by performing the same replacement as in Formula (12) on the LDPC code of the parity check matrix (hereinafter, referred to appropriately as an "original parity check matrix") H of FIG. 109, a 0 vector is output. In other words, when a row vector obtained by executing column replacement of Formula (12) on the row vector c serving as the LDPC code (one code word) of the original parity check matrix H is represented by c', since $Hc^T$ becomes a 0 vector due to the property of the parity check matrix, $H'c'^T$ also becomes a 0 vector.

Thus, the conversion parity check matrix H' of FIG. 110 is a parity check matrix of an LDPC code c' obtained by performing the column replacement of Formula (12) on the LDPC code c of the original parity check matrix H.

Thus, by performing the column replacement of Formula (12) on the LDPC code c of the original parity check matrix H, performing decoding (LDPC decoding) on the LDPC code c' that has been subjected to the column replacement using the conversion parity check matrix H' of FIG. 110, and executing inverse replacement of the column replacement of Formula (12) on the decoding result, it is possible to obtain the same decoding result as when the LDPC code of the original parity check matrix H is decoded using the parity check matrix H.

FIG. 111 illustrates the conversion parity check matrix H' of FIG. 110 having intervals of units of 5×5 matrices.

In FIG. 111, the conversion parity check matrix H' is represented by a 5×5 unit matrix, a matrix (hereinafter, referred to appropriately as a "quasi unit matrix") in which one or more of 1s of the unit matrix are 0, a matrix (hereinafter, referred to appropriately as a "shift matrix") obtained by cyclic-shifting a unit matrix or a quasi unit matrix, a sum (hereinafter, referred to appropriately as a "sum matrix") of two or more of unit matrices, quasi unit matrices, or shift matrices, and a combination of 5×5 0 matrices.

It can be said that the conversion parity check matrix H' of FIG. 111 is configured with a 5×5 unit matrix, a quasi unit matrix, a shift matrix, a sum matrix, and a 0 matrix. In this regard, the 5×5 matrices configuring the conversion parity check matrix H' is hereinafter referred to appropriately as "constitutive matrix."

An architecture of simultaneously performing P check node calculations and variable node calculations may be used for LDPC code decoding of the parity check matrix represented by a P×P constitutive matrix.

Figure 112:
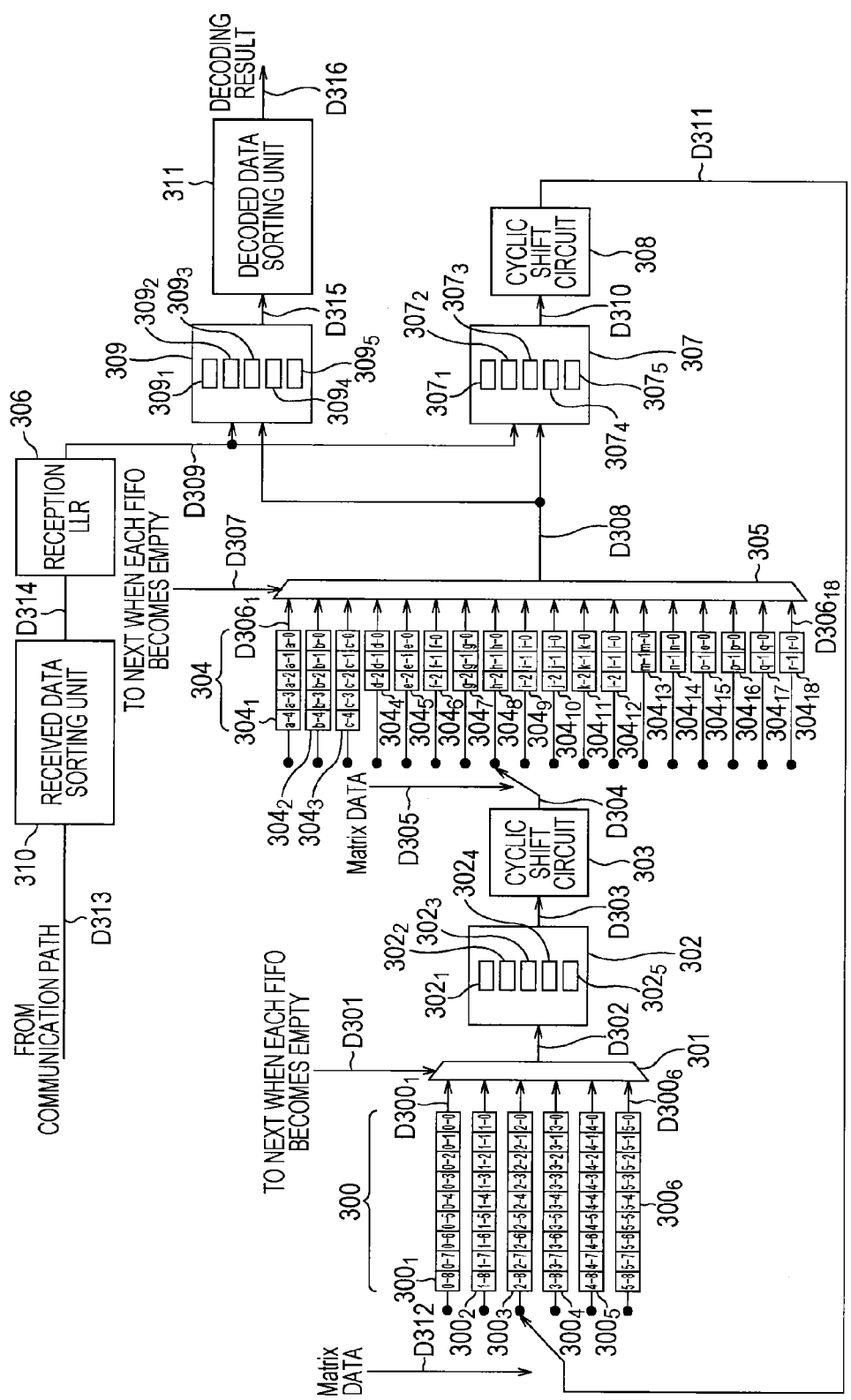
FIG. 112 is a block diagram illustrating a configuration example of a decoding device performing P node calculations together.

FIG. 112 is a block diagram illustrating a configuration example of a decoding device performing the decoding.

In other words, FIG. 112 illustrates a configuration example of a decoding device that performs LDPC code decoding using the conversion parity check matrix H' of FIG. 111 obtained by performing at least the column replacement of Formula (12) on the original parity check matrix H of FIG. 109.

The decoding device of FIG. 112 includes a memory 300 for branch data storage including six FIFOs $300_1$ to $300_6$, a selector 301 selecting the FIFO $300_1$ to $300_6$, a check node calculation unit 302, two cyclic shift circuits 303 and 308, a memory 304 for branch data storage including 18 FIFO $304_1$ to $304_{18}$, a selector 305 selecting the FIFO $304_1$ to $304_{18}$, a memory 306 for received data storing received data, a variable node calculation unit 307, a decoded word calculation unit 309, a received data sorting unit 310, and a decoded data sorting unit 311.

First of all, a method of storing data in the memories 300 and 304 for branch data storage will be described.

The memory 300 for branch data storage includes 6 FIFOs $300_1$ to $300_6$ in which the number of FIFOs, that is, 6 is equal to a number obtained by dividing the row number 30 of the conversion parity check matrix H' of FIG. 111 by the row number 5 of the constitutive matrix. The FIFO $300_y$ (y 1, 2, . . . , 6) includes storage regions of two or more stages, and the storage region of each stage is configured to simultaneously read and write messages corresponding to 5 edges which are equal in number to the row number and the column number of the constitutive matrix. Further, the number of stages of the storage region of the FIFO $300_y$ is 9 which is a maximum of the number of 1s (Hamming weight) of the conversion parity check matrix of FIG. 111 in the row direction.

In the FIFO $300_1$, pieces of data (the message $v_i$ from the variable node) corresponding to the positions of 1s of from the first row to the fifth row of the conversion parity check matrix H' of FIG. 111 are stored such that pieces of data are filled in respective rows in the lateral direction (such that 0 is ignored). In other words, when a j-th row j-th column is represented by (j,i), pieces of data corresponding to the positions of 1s of a 5×5 unit matrix of from (1,1) to (5,5) of the conversion parity check matrix H' are stored in the storage region of the first stage of the FIFO $300_1$. Pieces of data corresponding to the positions of 1s of a shift matrix (a shift matrix obtained by cyclic-shifting the 5×5 unit matrix in the right direction by 3) of from (1,21) to (5,25) of the conversion parity check matrix H' are stored in the storage region of the second stage. Similarly, pieces of data are stored in the storage regions of the third to eighth stages in association with the conversion parity check matrix H'. Further, pieces of data corresponding to the positions of 1s of a shift matrix (a shift matrix obtained by replacing 1 in the first row of the 5×5 unit matrix with 0 and cyclic-shifting the 5×5 unit matrix in the left direction by 1) of from (1,86) to (5,90) of the conversion parity check matrix H' are stored in the storage region of the ninth stage.

In the FIFO $300_2$, pieces of data corresponding to the positions of 1s of from the sixth row to the tenth row of the conversion parity check matrix H' of FIG. 111 are stored. In other words, pieces of data corresponding to the positions of 1s of a first shift matrix configuring a sum matrix (a sum matrix which is a sum of the first shift matrix obtained by cyclic-shifting the 5×5 unit matrix in the right direction by 1 and a second shift matrix obtained by cyclic-shifting the 5×5 unit matrix in the right direction by 2) of from (6,1) to (10,5) of the conversion parity check matrix H' are stored in the storage region of the first stage of the FIFO $300_2$. Further, pieces of data corresponding to the positions of 1s of the second shift matrix configuring the sum matrix of from (6,1) to (10,5) of the conversion parity check matrix H' are stored in the storage region of the second stage.

In other words, for the constitutive matrix having the weight of 2 or more, when the constitutive matrix is represented by a P×P unit matrix having the weight of 1, a quasi unit matrix in which one or more of 1s of elements of the unit matrix is 0, or a form of a sum of two or more of shift matrices obtained by cyclic shifting the unit matrix or the quasi unit matrix, pieces of data (messages corresponding to edges belonging to a unit matrix, a quasi unit matrix, or a shift matrix) corresponding to the positions of 1s of the unit matrix, the quasi unit matrix, or the shift matrix having the weight of 1 are stored at the same address (the same FIFO among the FIFO $300_1$ to $300_6$).

Further, pieces of data are stored in the storage regions of the third to ninth stages in association with the conversion parity check matrix H'.

Similarly, pieces of data are stored in the FIFO $300_3$ to $300_6$ in association with the conversion parity check matrix H'.

The memory 304 for branch data storage includes 18 FIFO $304_1$ to $304_{18}$ in which the number of FIFOs, that is, 18 is equal to a number obtained by dividing the column number 90 of the conversion parity check matrix H' by the column number 5 of the constitutive matrix. The FIFO $304_x$ (x=1, 2, ..., 18) includes storage regions of two or more stages, and the storage region of each stage is configured to simultaneously read and write messages corresponding to 5 edges which are equal in number to the row number and the column number of the conversion constitutive matrix H'.

In the FIFO $304_1$, pieces of data (the message $u_j$ from the check node) corresponding to the positions of 1s of from the first row to the fifth row of the conversion parity check matrix H' of FIG. 111 are stored such that pieces of data are filled in respective rows in the longitudinal direction (such that 0 is ignored). In other words, pieces of data corresponding to the positions of 1s of a 5×5 unit matrix of from (1,1) to (5,5) of the conversion parity check matrix H' are stored in the storage region of the first stage of the FIFO $3040_1$. Pieces of data corresponding to the positions of 1s of a first shift matrix configuring a sum matrix (a sum matrix which is a sum of the first shift matrix obtained by cyclic-shifting the 5×5 unit matrix in the right direction by 1 and a second shift matrix obtained by cyclic-shifting the 5×5 unit matrix in the right direction by 2) of from (6,1) to (10,5) of the conversion parity check matrix H' are stored in the storage region of the second stage. Further, pieces of data corresponding to the positions of 1s of the second shift matrix configuring the sum matrix of from (6,1) to (10,5) of the conversion parity check matrix H' are stored in the storage region of the third stage.

In other words, for the constitutive matrix having the weight of 2 or more, when the constitutive matrix is represented by a P×P unit matrix having the weight of 1, a quasi unit matrix in which one or more of 1s of elements of the unit matrix is 0, or a form of a sum of two or more of shift matrices obtained by cyclic shifting the unit matrix or the quasi unit matrix, pieces of data (messages corresponding to edges belonging to a unit matrix, a quasi unit matrix, or a shift matrix) corresponding to the positions of 1s of the unit matrix, the quasi unit matrix, or the shift matrix having the weight of 1 are stored at the same address (the same FIFO among the FIFO $304_1$ to $304_{18}$).

Further, pieces of data are stored in the storage regions of the fourth and fifth stages in association with the conversion parity check matrix H'.

The number of stages of the storage regions the FIFO $304_1$ is 5 which is a maximum of the number of 1s (Hamming weight) of the first column and the fifth column of the conversion parity check matrix H' in the row direction.

Similarly, pieces of data are stored in the FIFO $304_2$ to $304_3$ in association with the conversion parity check matrix H', and the length (the number of stages) of each FIFO is 5. Similarly, pieces of data are stored in the FIFO $304_4$ to $304_{12}$ in association with the conversion parity check matrix H', and the length of each FIFO is 3. Similarly, pieces of data are stored in the FIFO $304_{13}$ to $304_{18}$ in association with the conversion parity check matrix H', and the length of each FIFO is 2.

Next, an operation of the decoding device of FIG. 112 will be described.

The memory 300 for branch data storage includes the 6 FIFO $300_1$ to $300_6$, and selects a FIFO storing data from among the FIFO $300_1$ to $300_6$ according to information (matrix data) D312 representing the row of the conversion parity check matrix H' to which 5 messages D311 supplied from the cyclic shift circuit 308 of the previous stage belong and collectively stores the 5 messages D311 in the selected FIFO in order. Further, when data is read, the memory 300 for branch data storage reads 5 messages $D300_1$ from the FIFO $300_1$ in order and supplies the read 5 messages $D300_1$ to the selector 301 of the next stage. After ending the reading of the messages from the FIFO $300_1$, the memory 300 for branch data storage reads messages from the FIFO $300_2$ to $300_6$ in order, and supplies the read messages to the selector 301.

The selector 301 selects five messages from a FIFO from which data is currently being read among the FIFO $300_1$ to $300_6$ according to a select signal D301, and supplies the selected message to the check node calculation unit 302 as messages D302.

The check node calculation unit 302 includes five check node calculators $302_1$ to $302_5$, and performs check node calculation according to Formula (7) using the messages D302 ($D302_1$ to $D302_5$) (the message $v_i$ of Formula (7)) supplied through the selector 301, and supplies the 5 messages D303 ($D303_1$ to $D303_5$) (the message $u_j$ of Formula (7)) obtained as a result of check node calculation to the cyclic shift circuit 303.

The cyclic shift circuit 303 cyclic shifts the 5 messages $D303_1$ to $D303_5$ obtained by the check node calculation unit 302 based on the information (matrix data) D305 representing the number of times in which a unit matrix having a corresponding edge as a source in the conversion parity check matrix H' is cyclic shifted, and supplies the resultant data to the memory 304 for branch data storage as messages D304.

The memory 304 for branch data storage includes the 18 FIFO $304_1$ to $304_{18}$, and selects a FIFO storing data from among the FIFO $304_1$ to $304_{18}$ according to information D305 representing the row of the conversion parity check matrix H' to which 5 messages D304 supplied from the cyclic shift circuit 303 of the previous stage belong and collectively stores the 5 messages D304 in the selected FIFO in order. Further, when data is read, the memory 304 for branch data storage reads 5 messages $D306_1$ from the FIFO $304_1$ in order and supplies the read 5 messages $D306_1$ to the selector 305 of the next stage. After ending the reading of the data from the FIFO $304_1$, the memory 304 for branch data storage reads messages from the FIFO $304_2$ to $304_{18}$ in order, and supplies the read messages to the selector 305.

The selector 305 selects five messages from a FIFO from which data is currently being read among the FIFO $304_1$ to $304_{18}$ according to a select signal D307, and supplies the selected message to the variable node calculation unit 307 and the decoded word calculation unit 309 as messages D308.

Meanwhile, the received data sorting unit 310 performs the column replacement of Formula (12) to sort a LDPC code D313 received through the communication path 13, and supplies the resultant data to the memory 306 for received data as received data D314. The memory 306 for received data calculates a reception LLR (log likelihood ratio) from the received data D314 supplied from the received data sorting unit 310 and stores the reception LLR, and collectively supplies the five reception LLRs to the variable node calculation unit 307 and the decoded word calculation unit 309 as a reception value D309.

The variable node calculation unit 307 includes five variable node calculators $307_1$ to $307_5$, and performs variable node calculation according to Formula (1) using the messages D308 (D308₁ to D308₅) (the message $u_j$ of Formula (1)) supplied through the selector 305 and the five reception values D309 (the reception value $u_{0i}$ of Formula (1)) supplied from the memory 306 for received data, and supplies the messages D310 (D310₁ to D310₅) (the message $v_i$ of Formula (1)) obtained as a result of calculation to the cyclic shift circuit 308.

The cyclic shift circuit 308 cyclic shifts the message D310₁ to D310₅ calculated by the variable node calculation unit 307 based on information representing the number of times in which a unit matrix having a corresponding edge as a source in the conversion parity check matrix H' is cyclic shifted, and supplies the resultant data to the memory 300 for branch data storage as messages D311.

As the above entire operation is performed once, single decoding of an LDPC code can be performed. The decoding device of FIG. 112 decodes an LDPC code a predetermined number of times, then obtains a final decoding result, and outputs the final decoding result to the decoded word calculation unit 309 and the decoded data sorting unit 311.

In other words, the decoded word calculation unit 309 includes five decoded word calculators 309₁ to 309₅, and calculates a decoding result (decoded word) based on Formula (5) as a final stage of decoding of multiple times using the five messages D308 (D308₁ to D308₅) (the message $u_j$ of Formula (5)) output from the selector 305 and the five reception values D309 (the reception value $u_0$ of Formula (5)) supplied from the memory 306 for received data, and supplies the resultant decoded data D315 to the decoded data sorting unit 311.

The decoded data sorting unit 311 performs the inverse replacement of the column replacement of Formula (12) on the decoded data D315 supplied from the decoded word calculation unit 309 to sort an order thereof, and outputs the resultant data as a final decoding result D316.

As described above, as either or both of the row replacement and the column replacement are executed to convert the parity check matrix (the original parity check matrix) to the parity check matrix (conversion parity check matrix) that can be represented by a combination, a P×P unit matrix, a quasi unit matrix in which one or more of 1s of elements are 0, a shift matrix obtained by cyclic shifting a unit matrix or a quasi unit matrix, a sum matrix that is a sum of two or more of unit matrices, quasi unit matrices, or shift matrices, and a P×P 0 matrix, that is, a combination of constitutive matrices, an architecture of simultaneously performing P check node calculations and variable node calculations can be employed for LDPC code decoding, and thus as P node calculations are simultaneously performed, it is possible to suppress an operation frequency to a feasible range and repeatedly perform decoding many times.

The LDPC decoder 166 configuring the receiving device 12 of FIG. 106 is configured to perform LDPC decoding by simultaneously performing P check node calculations and variable node calculations, similarly to the decoding device of FIG. 112.

In other words, here, when a parity check matrix of an LDPC code output from the LDPC encoder 115 configuring the transmitting device 11 of FIG. 8 is the parity check matrix H in which the parity matrix has the staircase structure, for example, as illustrated in FIG. 109 for the sake of simplification of description, in the parity interleaver 23 of the transmitting device 11, parity interleaving of interleaving the (K+qx+y+1)-th code bit to the position of the (K+Py+x+1)-th code bit is performed in a state in which the information length K is set to 60, the unit column number P of the cyclic structure is set to 5, and the divisor q (=M/P) of the parity length M is set to 6.

The parity interleaving corresponds to the column replacement of Formula (12) as described above, and thus the LDPC decoder 166 need not perform the column replacement of Formula (12).

For this reason, in the receiving device 12 of FIG. 106, an LDPC code that has not been subjected to parity deinterleaving, that is, an LDPC code on which the column replacement of Formula (12) has been performed is supplied from the column twist deinterleaver 55 to the LDPC decoder 166, and the LDPC decoder 166 performs processing similar to the decoding device of FIG. 112 except that the column replacement of Formula (12) is not performed.

Figure 113:
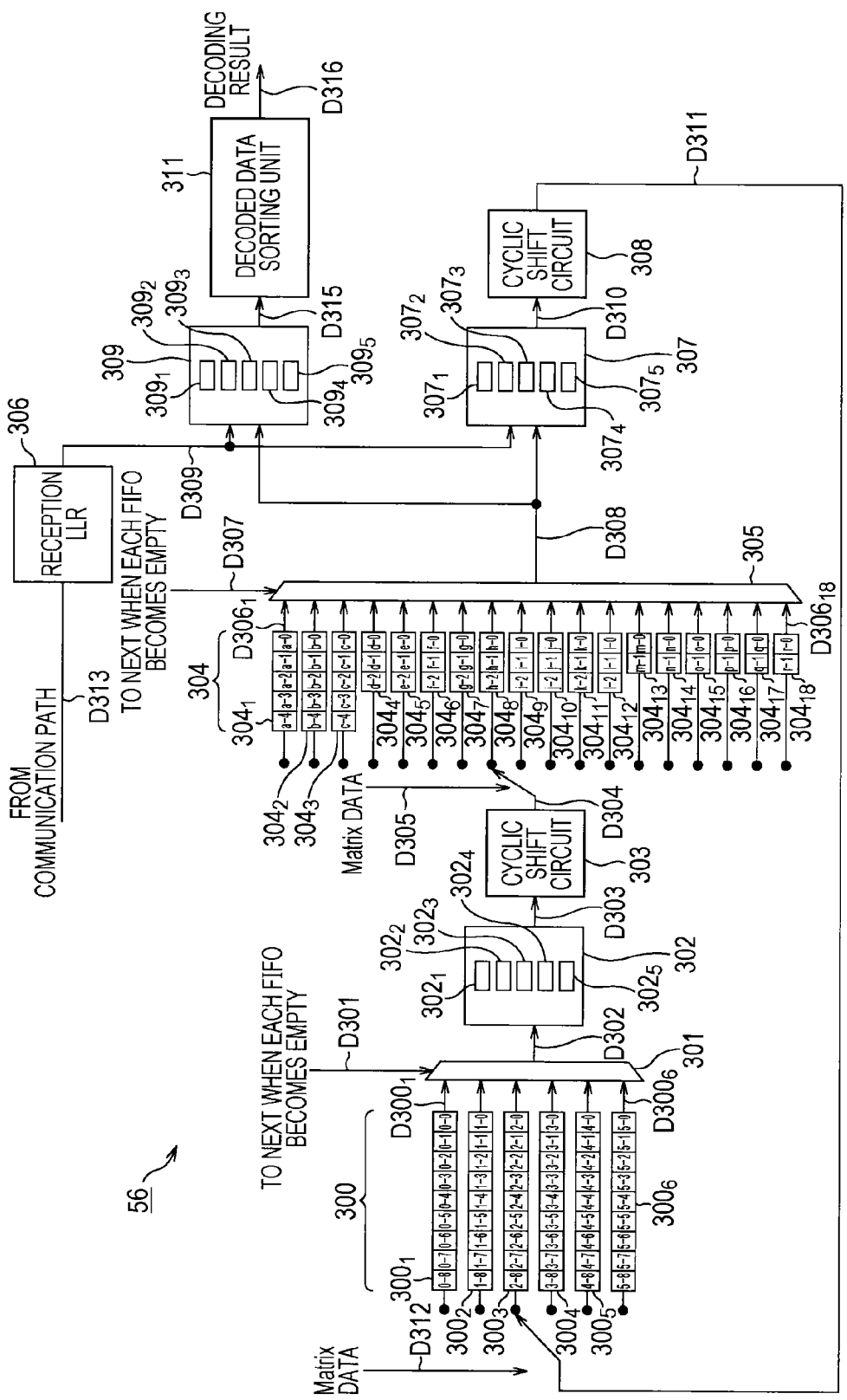
FIG. 113 is a block diagram illustrating a configuration example of the LDPC decoder 166.

In other words, FIG. 113 illustrates a configuration example of the LDPC decoder 166 of FIG. 106.

In FIG. 113, the LDPC decoder 166 has a configuration similar to the decoding device of FIG. 112 except that the received data sorting unit 310 of FIG. 112 is not disposed, and performs processing similar to the decoding device of FIG. 112 except that the column replacement of Formula (12) is not performed, and thus a description thereof will be omitted.

As described above, the LDPC decoder 166 can be configured not to include the received data sorting unit 310, and thus can be reduced to be smaller in the size than the decoding device of FIG. 112.

Further, in FIGS. 109 to 113, for the sake of simplification of description, the code length N of the LDPC code is set to 90, the information length K is set to 60, the unit column number P (the row number and the column number of the constitutive matrix) of the cyclic structure is set to 5, and the divisor q (=M/P) of the parity length M is set to 6, but the code length N, the information length K, the unit column number P of the cyclic structure, and the divisor q (=M/P) are not limited to the above values.

In other words, in the transmitting device 11 of FIG. 8, the LDPC encoder 115 outputs, for example, an LDPC code in which the code length N is 64800, 16200, or the like, the information length K is N−Pq (=N−M), the unit column number P of the cyclic structure is 360, and the divisor q is M/P, but the present invention can be applied to an example in which the LDPC decoder 166 of FIG. 113 performs LDPC decoding by simultaneously performing P check node calculations and variable node calculations on the LDPC code.

Figure 114:
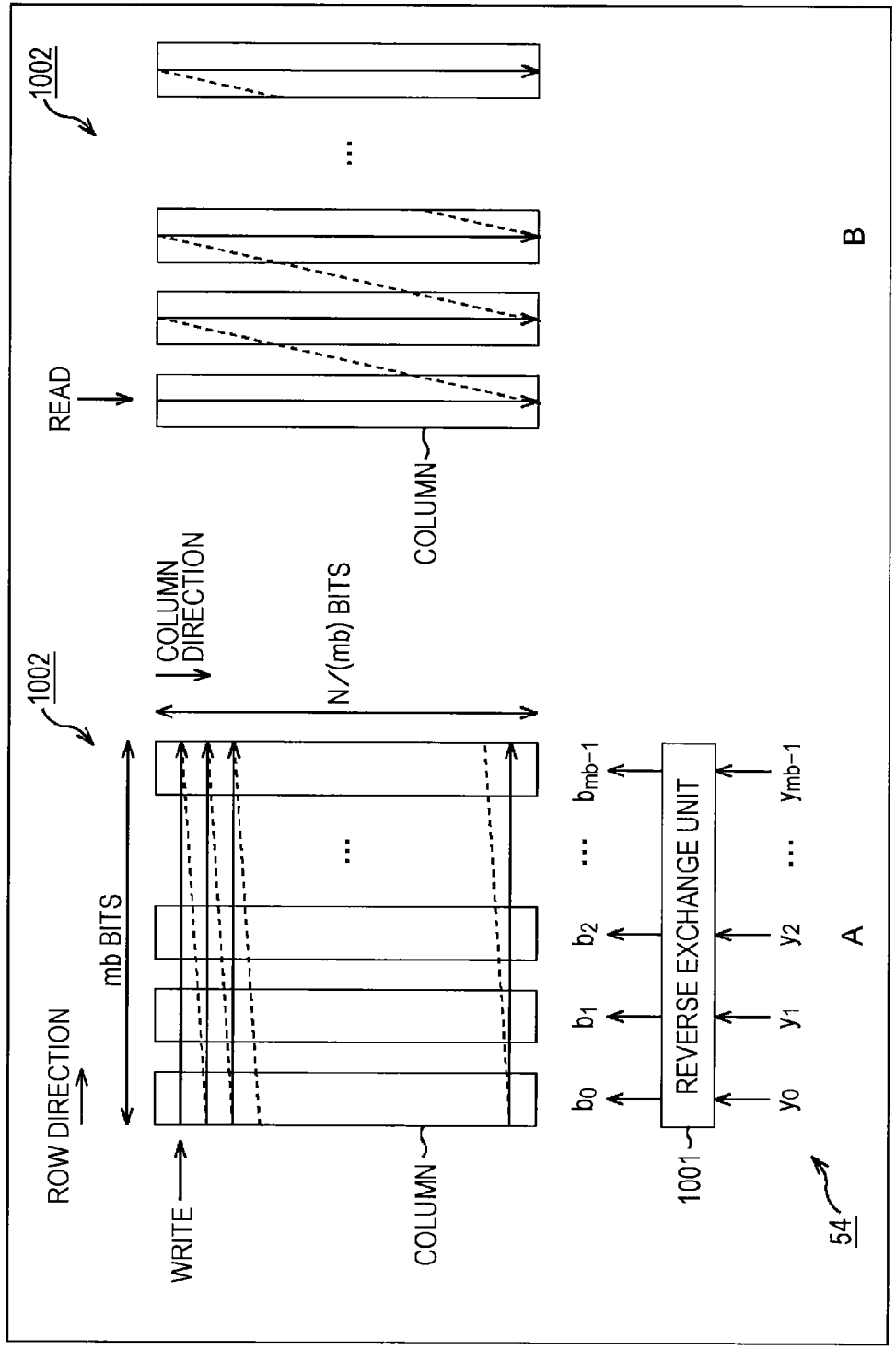
FIG. 114 is a diagram for describing processing of a multiplexer 54 configuring the bit deinterleaver 165.

FIG. 114 is a diagram for describing processing of the multiplexer 54 configuring the bit deinterleaver 165 of FIG. 107.

In other words, A of FIG. 114 illustrates a functional configuration example of the multiplexer 54.

The multiplexer 54 includes a reverse exchange unit 1001 and a memory 1002.

The multiplexer 54 performs a reverse exchange process (the reverse process of the exchange process) corresponding to the exchange process performed by the demultiplexer 25 of the transmitting device 11, that is, the reverse exchange process of restoring the positions of the code bits (symbol bits) of the LDPC code exchanged by the exchange process to the original positions on the symbol bits of the symbol supplied from the QAM decoder 164 of the previous stage, and supplies the resultant LDPC code to the column twist deinterleaver 55 of the subsequent stage.

In other words, in the multiplexer 54, symbol bits $y_0, y_1, \ldots, y_{mb-1}$ of mb bits of b symbols are supplied to the reverse exchange unit 1001 in units of b (consecutive) symbols.

The reverse exchange unit 1001 performs reverse exchanging of restoring the symbol bits $y_0$ to $y_{mb-1}$ of mb bits to a sequence of the original code bits $b_0$, $b_1$, $b_{mb-1}$ of mb bits (a sequence of the code bits $b_0$ to $b_{mb-1}$ before exchanging by the exchange unit 32 configuring the demultiplexer 25 at the transmitting device 11 side is performed), and outputs the resultant code bits $b_0$ to $b_{mb-1}$ of mb bits.

The memory 1002 has a storage capacity of storing mb bits in the row (lateral) direction and storing N/(mb) bits in the column (longitudinal) direction, similarly to the memory 31 configuring the demultiplexer 25 at the transmitting device 11 side. In other words, the memory 1002 includes mb columns storing N/(mb) bits.

Here, in the memory 1002, writing of the code bits of the LDPC code output from the reverse exchange unit 1001 is performed in the direction in which reading of the code bits from the memory 31 of the demultiplexer 25 of the transmitting device 11 is performed, and reading of the code bits written in the memory 1002 is performed in the direction in which writing of the code bits to the memory 31 is performed.

In other words, in the multiplexer 54 of the receiving device 12, as illustrated in FIG. A of FIG. 114, writing the code bits of the LDPC code output from the reverse exchange unit 1001 in the row direction in units of mb bits is sequentially performed from the first row of the memory 1002 to the lower rows.

Then, when writing of the code bits corresponding to one code length ends, the multiplexer 54 reads the code bits from the memory 1002 in the column direction, and supplies the read code bits to the column twist deinterleaver 55 of the subsequent stage.

Here, FIG. 114B is a diagram illustrating reading of the code bits from the memory 1002.

In the multiplexer 54, reading the code bits of the LDPC code downward (in the column direction) from the top of columns configuring the memory 1002 is performed from the left column to the right column.

Figure 115:
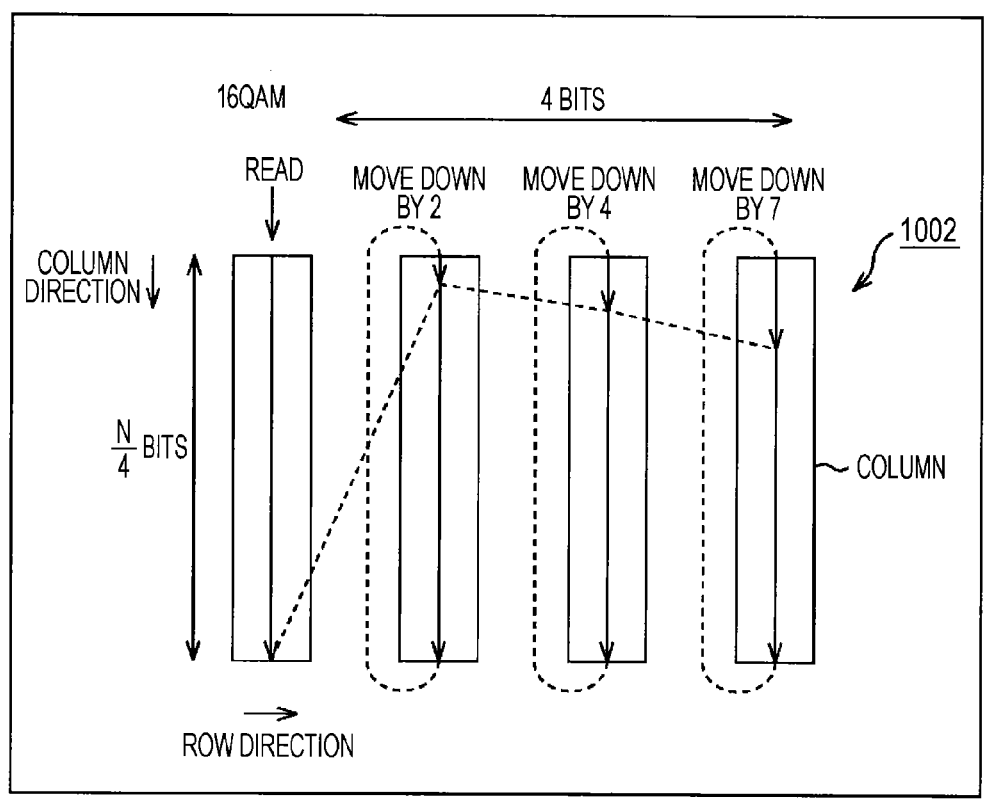
FIG. 115 is a diagram for describing processing of a column twist deinterleaver 55.

FIG. 115 is a diagram for describing processing of the column twist deinterleaver 55 configuring the bit deinterleaver 165 of FIG. 107.

In other words, FIG. 115 illustrates a configuration example of the memory 1002 of the multiplexer 54.

The memory 1002 has a storage capacity of storing mb bits in the column (longitudinal) direction and storing N/(mb) bits in the row (lateral) direction and includes mb columns.

The column twist deinterleaver 55 performs column twist deinterleaving by controlling the read start position from which the code bits of the LDPC code is written to the memory 1002 in the row direction and read from the memory 1002 in the column direction.

In other words, the column twist deinterleaver 55 appropriately controls the read start position at which reading of code bits starts on each of a plurality of columns, and performs the deinterleaving process of restoring a sequence of the code bits sorted by the column twist interleaving to the original sequence.

Here, FIG. 115 illustrates configuration example of the memory 1002 when the modulation scheme is 16QAM and the multiple b is 1 as illustrated in FIG. 24. Thus, the bit number m of a single symbol is 4 bits, and the memory 1002 is configured with 4 (=mb) columns.

The column twist deinterleaver 55 sequentially performs writing the code bits of the LDPC code output from the exchange unit 1001 in the row direction from the first row of the memory 1002 to the lower rows instead of the multiplexer 54.

Then, when writing of the code bits corresponding to one code length ends, the column twist deinterleaver 55 performs reading of the code bits downward (in the column direction) from the top of the memory 1002 from the left column to the right column.

Here, the column twist deinterleaver 55 performs reading of the code bits from the memory 1002 using the write start position from which the column twist interleaver 24 at the transmitting device 11 side writes the code bits as the read start position of the code bits.

In other words, in the column twist deinterleaver 55, when an address of a beginning (top) position of each column is 0 and addresses of positions in the column direction are represented by integers in the ascending order, if the modulation scheme is 16QAM and the multiple b is 1, a read start position of the leftmost column is set to the position having the address of 0, a read start position of a second column (from the left) is set to the position having the address of 2, a read start position of a third column is set to the position having the address of 4, and a read start position of a fourth column is set to the position having the address of 7.

Further, for a column whose read start position is a position other than the position having the address of 0, after code bits are written up to the lowest position, it returns to the beginning (the position having the address of 0), and reading is performed up to the position directly before the read start position. Thereafter, reading from a next (right) column is performed.

As column twist deinterleaving is performed as described above, a sequence of the code bits sorted by the column twist interleave is restored to the original sequence.

Figure 116:
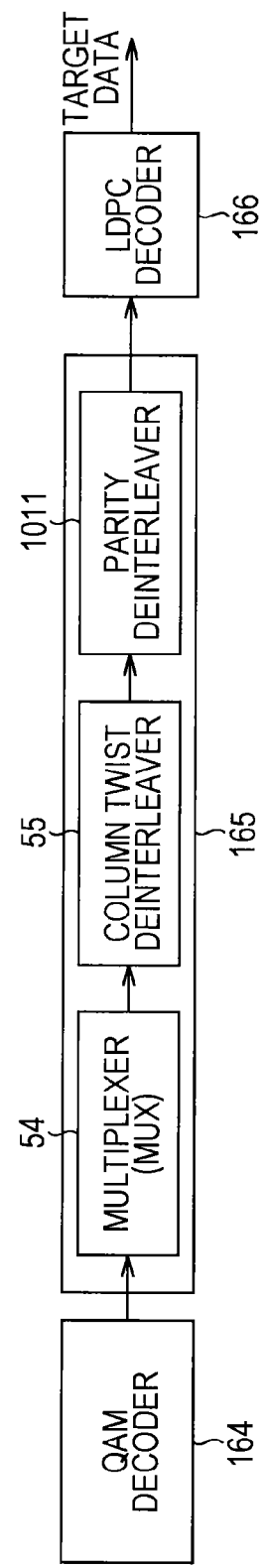
FIG. 116 is a block diagram illustrating another configuration example of the bit deinterleaver 165.

FIG. 116 is a block diagram illustrating another configuration example of the bit deinterleaver 165 of FIG. 106.

Further, components corresponding to the example of FIG. 107 are denoted by the same reference numerals, and a description thereof will be appropriately omitted below.

In other words, the bit deinterleaver 165 of FIG. 116 has a configuration similar to the example of FIG. 107 except that a parity deinterleaver 1011 is newly disposed.

In FIG. 116, the bit deinterleaver 165 includes a multiplexer (MUX) 54, the column twist deinterleaver 55, and the parity deinterleaver 1011, and performs bit deinterleaving of the code bits of the LDPC code from the QAM decoder 164.

In other words, the multiplexer 54 performs the reverse exchange process (the reverse process of the exchange process) corresponding to the exchange process performed by the demultiplexer 25 of the transmitting device 11, that is, the reverse exchange process of restoring the positions of the code bits exchanged by the exchange process to the original positions on the LDPC code from the QAM decoder 164, and the resultant LDPC code to the column twist deinterleaver 55.

The column twist deinterleaver 55 performs column twist deinterleaving corresponding to column twist interleaving serving as the sorting process performed by the column twist interleaver 24 of the transmitting device 11 on the LDPC code from the multiplexer 54.

The LDPC code obtained as a result of column twist deinterleaving is supplied from the column twist deinterleaver 55 to the parity deinterleaver 1011.

The parity deinterleaver 1011 performs parity deinterleaving (the reverse process of the parity interleaving) corresponding to parity interleaving performed by the parity interleaver 23 of the transmitting device 11, that is, parity deinterleaving of restoring the code bits of the LDPC code whose sequence has been changed by parity interleaving to the original sequence on the code bits that has been subjected to column twist deinterleaving by the column twist deinterleaver 55.

The LDPC code obtained as a result of parity deinterleaving is supplied from the parity deinterleaver 1011 to the LDPC decoder 166.

Thus, in the bit deinterleaver 165 of FIG. 116, the LDPC code that has been subjected to the reverse exchange process, column twist deinterleaving and parity deinterleaving, that is, the LDPC code obtained by LDPC coding according to the parity check matrix H is supplied to the LDPC decoder 166.

The LDPC decoder 166 performs LDPC decoding of the LDPC code from the bit deinterleaver 165 using the parity check matrix H used for LDPC coding by the LDPC encoder 115 of the transmitting device 11 or the conversion parity check matrix obtained by performing at least the column replace corresponding to parity interleaving on the parity check matrix H, and outputs the resultant data as a decoding result of the LDPC target data.

Here, in FIG. 116, since the LDPC code obtained by LDPC coding according to the parity check matrix H is supplied from (the parity deinterleaver 1011 of) the bit deinterleaver 165 to the LDPC decoder 166, when LDPC decoding of the LDPC code is performed using the parity check matrix H used for LDPC coding by the LDPC encoder 115 of the transmitting device 11, for example, the LDPC decoder 166 may be configured with a decoding device that performs LDPC decoding by a full serial decoding of sequentially performing a calculation of a message (the check node message and the variable node message) node by node or a decoding device that performs LDPC decoding by a full parallel decoding method of performing a calculation of a message on all nodes simultaneously (in parallel).

Further, in the LDPC decoder 166, when LDPC decoding of the LDPC code is performed using the conversion parity check matrix obtained by performing at least the column replacement corresponding to parity interleaving on the parity check matrix H used for LDPC coding by the LDPC encoder 115 of the transmitting device 11, the LDPC decoder 166 may be configured with a decoding device (FIG. 112) that has an architecture of simultaneously performing P (or a divisor of P other than 1) check node calculations and variable node calculations and has the received data sorting unit 310 of sorting the code bits of the LDPC code by executing column replacement similar to column replacement for obtaining the conversion parity check matrix on the LDPC code.

In FIG. 116, for the sake of convenience of description, the multiplexer 54 performing the reverse exchange process, the column twist deinterleaver 55 performing column twist deinterleaving, and the parity deinterleaver 1011 performing parity deinterleaving are configured separately from one another, but two or more of the multiplexer 54, the column twist deinterleaver 55, and the parity deinterleaver 1011 may be configured integrally with each other, similarly to the parity interleaver 23, the column twist interleaver 24, and the demultiplexer 25 of the transmitting device 11.

[Configuration Example of Reception System]

Figure 117:
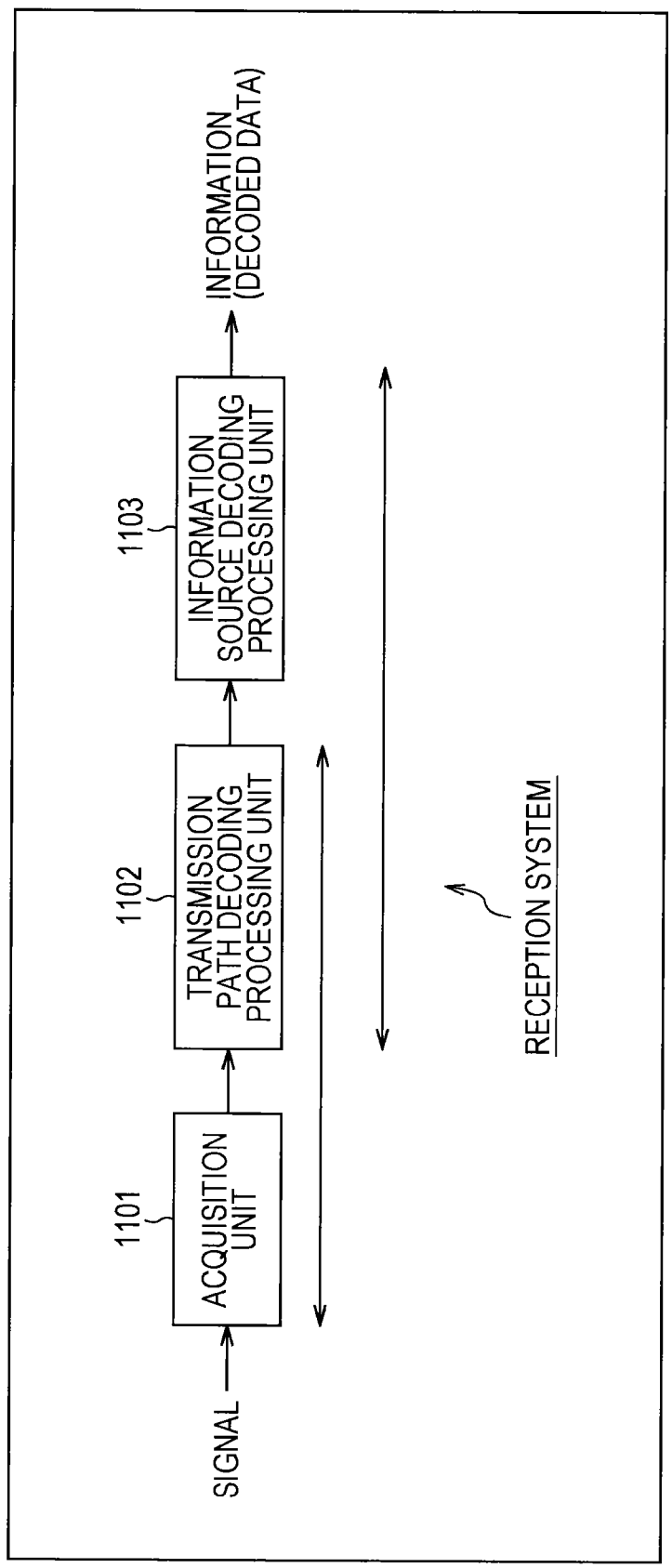
FIG. 117 is a block diagram illustrating a first configuration example of a reception system to which the receiving device 12 can be applied.

FIG. 117 is a block diagram illustrating a first configuration example of a reception system to which the receiving device 12 can be applied.

Referring to FIG. 117, the reception system include an acquisition unit 1101, a transmission path decoding processing unit 1102, and an information source decoding processing unit 1103.

The acquisition unit 1101 acquires a signal including an LDPC code obtained by performing at least LDPC coding on LDPC target data such as image data or audio data of a program or the like, for example, through a transmission path (not illustrated) such as terrestrial digital broadcasting, satellite digital broadcasting, a CATV network, the Internet, or any other network, and supplies the acquired signal to the transmission path decoding processing unit 1102.

Here, for example, when the signal acquired by the acquisition unit 1101 is broadcast from a broadcast station through a ground wave, a satellite wave, a CATV (Cable Television) network, or the like, the acquisition unit 1101 is configured with a tuner, an STB (Set Top Box), or the like. Further, for example, when the signal acquired by the acquisition unit 1101 is transmitted from a web server in a multicast manner as in an IPTV (Internet Protocol Television), the acquisition unit 1101 may be configured with a network I/F (interface) such as an NIC (Network Interface Card).

The transmission path decoding processing unit 1102 corresponds to the receiving device 12. The transmission path decoding processing unit 1102 executes a transmission path decoding process including at least a process of correcting an error occurring in the transmission path on the signal acquired through the transmission path by the acquisition unit 1101, and supplies the resultant signal to the information source decoding processing unit 1103.

In other words, the signal acquired through the transmission path by the acquisition unit 1101 is a signal obtained by performing at least error correction coding for correcting an error occurring in the transmission path, and the transmission path decoding processing unit 1102 executes the transmission path decoding process such as the error correction process on the signal.

Here, examples of error correction coding include LDPC coding and BCH coding. Here, as error correction coding, at least LDPC coding is performed.

Further, the transmission path decoding process may include demodulation of a modulated signal and the like.

The information source decoding processing unit 1103 executes an information source decoding process including at least a process of decompressing compressed information to original information on the signal that has been subjected to the transmission path decoding process.

In other words, the signal acquired through the transmission path by the acquisition unit 1101 may be subjected to compression coding of compressing information in order to reduce the amount of data such as an image or a sound serving as information, and in this case, the information source decoding processing unit 1103 executes an information source decoding process such as a process (decompression process) of decompressing compressed information to original information on the signal that has been subjected to the transmission path decoding process.

Further, when the signal acquired through the transmission path by the acquisition unit 1101 has not been subjected to compression coding, the information source decoding processing unit 1103 does not perform the process of decompressing compressed information to original information.

Here, as the decompression process, for example, there is MPEG decoding or the like. Further, the transmission path decoding process may include descrambling as well as the decompression process.

In the reception system having the above-described configuration, the acquisition unit 1101 executes compression coding such as MPEG coding on data such as an image or a sound and acquires the signal that has been subjected to error correction coding such as LDPC coding through the transmission path, and supplies the acquired signal to the transmission path decoding processing unit 1102.

The transmission path decoding processing unit 1102 executes, for example, the same process as the process performed by the receiving device 12 on the signal from the acquisition unit 1101 as the transmission path decoding process, and supplies the resultant signal to the information source decoding processing unit 1103.

The information source decoding processing unit 1103 executes the information source decoding process such as MPEG decoding on the signal from the transmission path decoding processing unit 1102 and outputs the resultant image or sound.

For example, the reception system of FIG. 117 can be applied to a television tuner receiving television broadcasting serving as digital broadcasting.

Further, each of the acquisition unit 1101, the transmission path decoding processing unit 1102, and the information source decoding processing unit 1103 may be configured as an independent device (hardware (for example, an IC (Integrated Circuit) or a software module).

Further, for the acquisition unit 1101, the transmission path decoding processing unit 1102, and the information source decoding processing unit 1103, each of a set of the acquisition unit 1101 and the transmission path decoding processing unit 1102, a set of the transmission path decoding processing unit 1102 and the information source decoding processing unit 1103, and a set of the acquisition unit 1101, the transmission path decoding processing unit 1102, and the information source decoding processing unit 1103 may be configured as an independent device.

Figure 118:
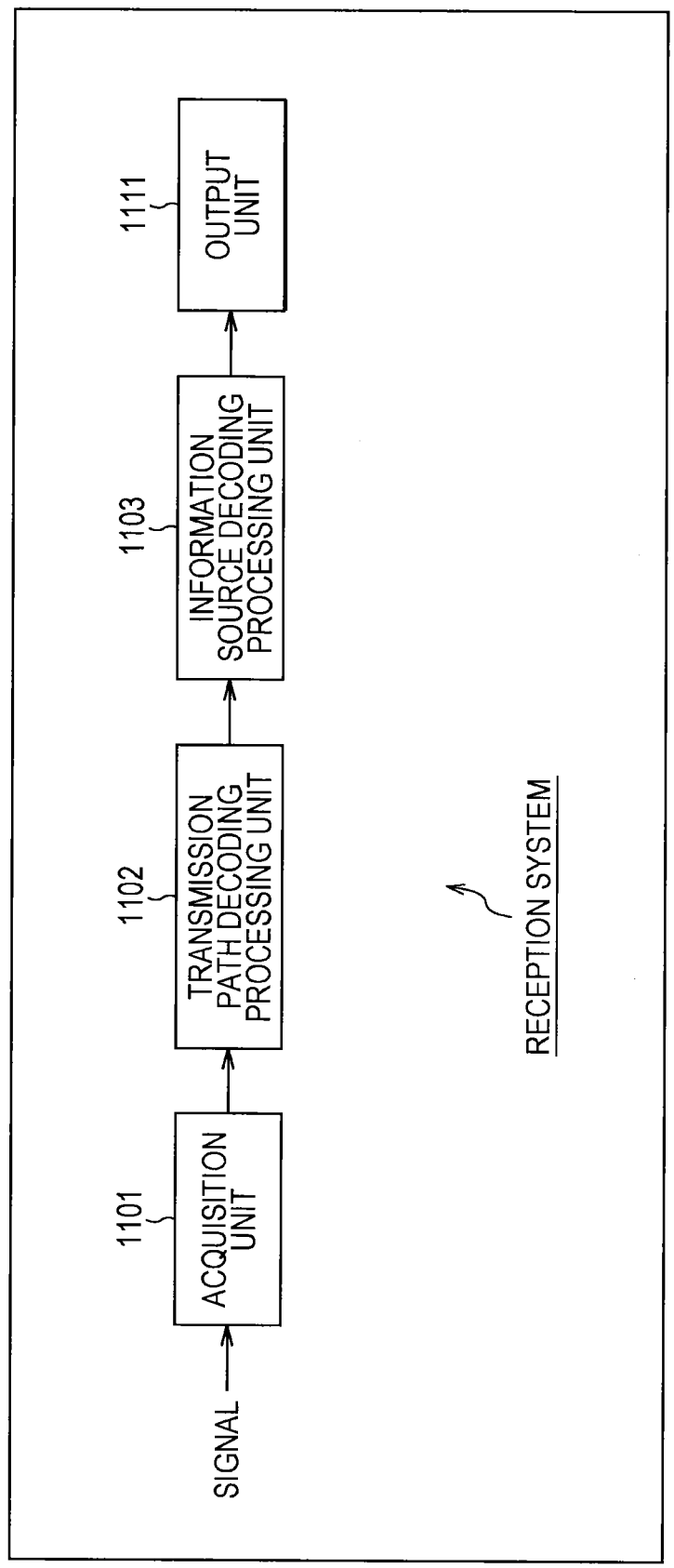
FIG. 118 is a block diagram illustrating a second configuration example of a reception system to which the receiving device 12 can be applied.

FIG. 118 is a block diagram illustrating a second configuration example of an reception system to which the receiving device 12 can be applied.

Further, components corresponding to the example of FIG. 117 are denoted by the same reference numerals, and a description thereof will be appropriately omitted.

The reception system of FIG. 118 is similar to the example of FIG. 117 in that the acquisition unit 1101, the transmission path decoding processing unit 1102, and the information source decoding processing unit 1103 are provided but different from the example of FIG. 117 in that an output unit 1111 is newly disposed.

For example, the output unit 1111 is a display device displaying an image or a speaker outputting a sound, and outputs an image or a sound as a signal output from the information source decoding processing unit 1103. In other words, the output unit 1111 displays an image or outputs a sound.

For example, the reception system of FIG. 118 can be applied to a television receiving television broadcasting serving as digital broadcasting or a radio receiver receiving radio broadcasting or the like.

Further, when the signal acquired by the acquisition unit 1101 has not been subjected to compression coding, the signal output from the transmission path decoding processing unit 1102 is supplied to the output unit 1111.

Figure 119:
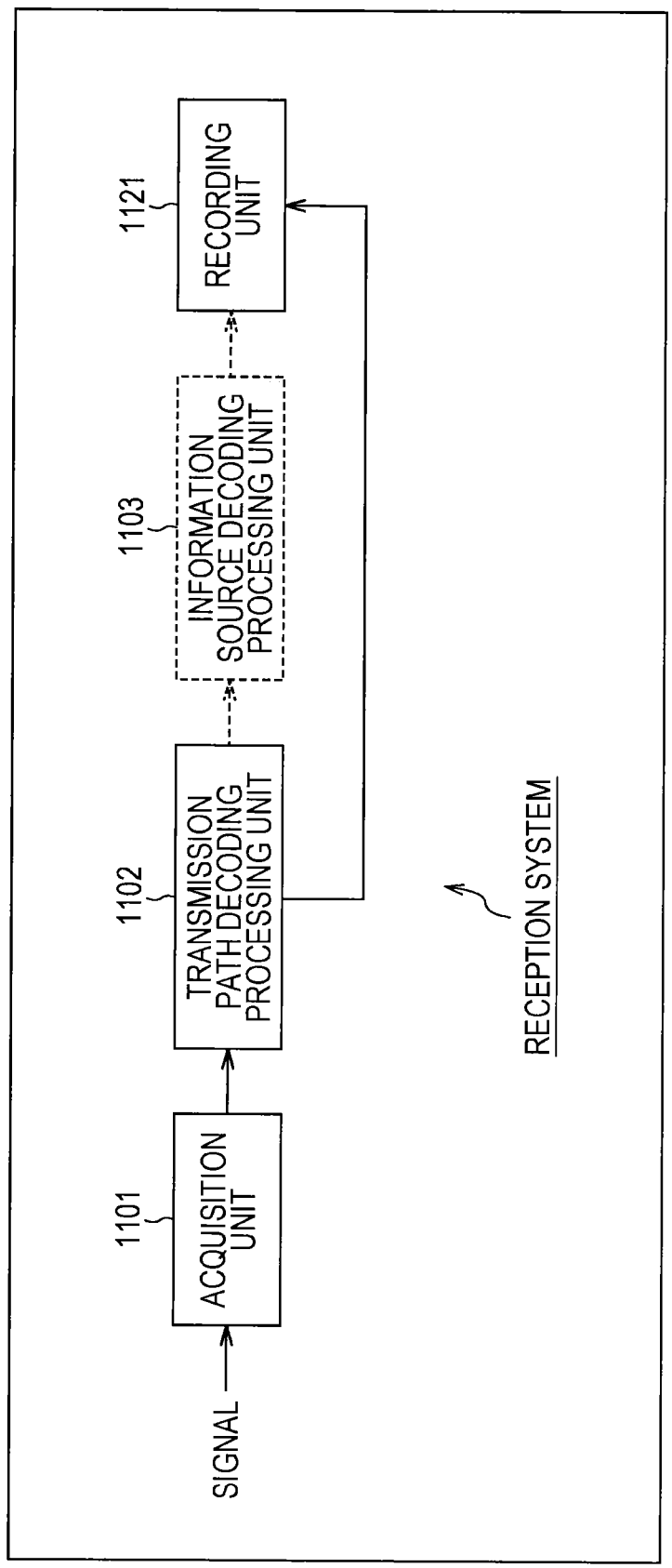
FIG. 119 is a block diagram illustrating a third configuration example of a reception system to which the receiving device 12 can be applied.

FIG. 119 is a block diagram illustrating a third configuration example of an reception system to which the receiving device 12 can be applied.

Further, components corresponding to the example of FIG. 117 are denoted by the same reference numerals, and a description thereof will be appropriately omitted.

The reception system of FIG. 119 is similar to the example of FIG. 117 in that the acquisition unit 1101 and the transmission path decoding processing unit 1102 are provided.

However, the reception system of FIG. 119 is different from the example of FIG. 117 in that the information source decoding processing unit 1103 is not provided, and a recording unit 1121 is newly disposed.

The recording unit 1121 records (stores) the signal (for example, a TS packet of MPEG TS) output from the transmission path decoding processing unit 1102 in a recording (storage) medium such as an optical disk, a hard disk (a magnetic disk), or a flash memory.

The reception system of FIG. 119 can be applied to, for example, a recorder recording television broadcasting.

In FIG. 119, the reception system is configured to include the information source decoding processing unit 1103, and can record the signal that has been subjected to the information source decoding process by the information source decoding processing unit 1103, that is, an image or a sound obtained by decoding through the recording unit 1121.

[Embodiment of Computer]

Next, the series of processes described above can be executed by hardware or can also be executed by software. When the series of processes is executed by software, a program that constructs such software is installed into a general-purpose computer or the like.

Figure 120:
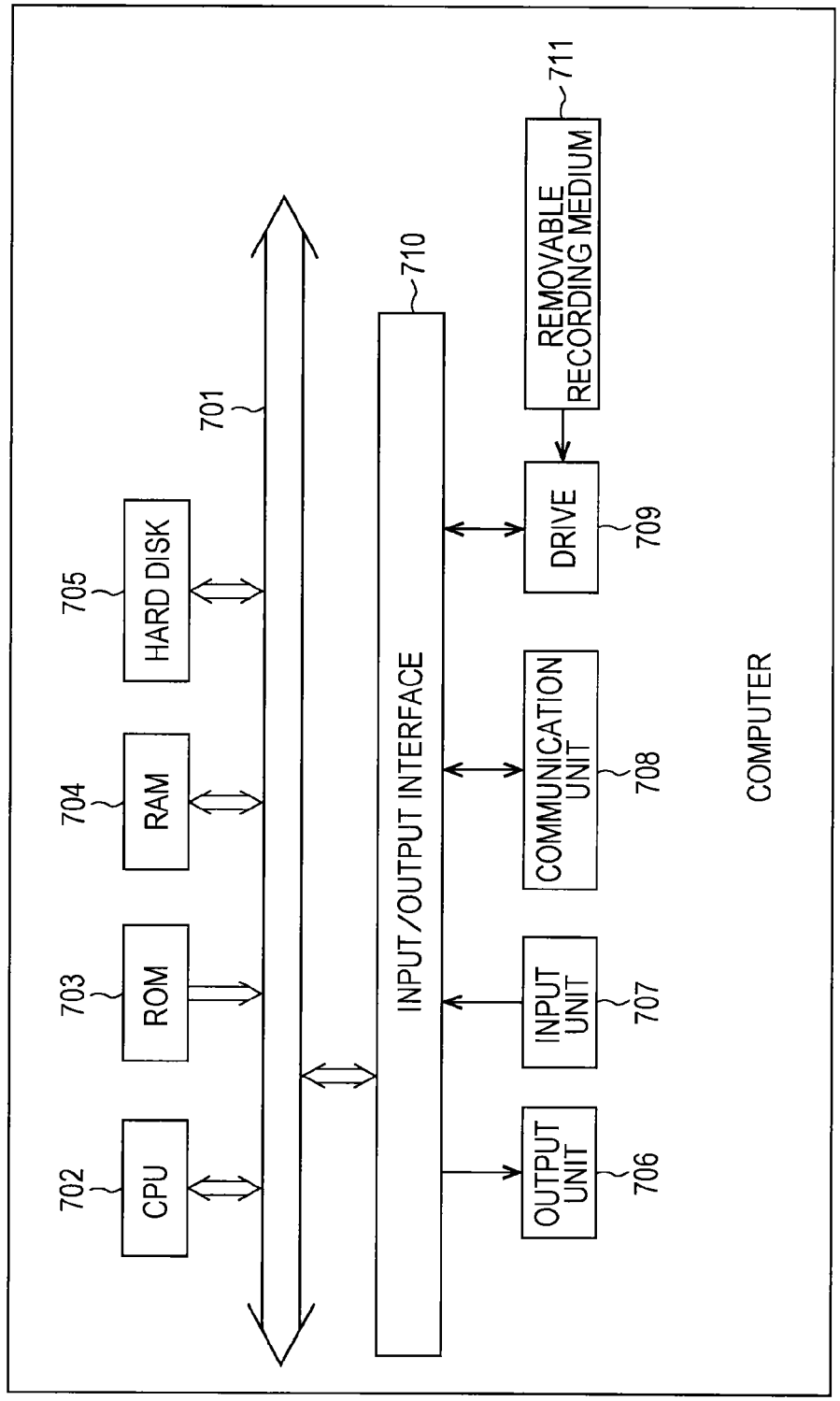
FIG. 120 is a block diagram illustrating a configuration example of a computer according to an embodiment of the present technology.

FIG. 120 illustrates a configuration example of an embodiment of a computer in which a program executing the series of processes is installed.

The program may be recorded in a hard disk 705 or a ROM 703 serving as a recording medium equipped in a computer in advance.

Alternatively, the program may be temporarily or permanently stored (recorded) in a removable recording medium 711 such as a flexible disk, a CD-ROM (Compact Disc Read Only Memory), a MO (Magneto Optical) disk, a DVD (Digital Versatile Disc), an optical disk, or a semiconductor memory. The removable recording medium 711 may be provided as so-called package software.

Further, the program can be installed in the computer from the removable recording medium 711, but the program can be transferred from a download site to the computer in a wireless manner through a satellite for digital satellite broadcasting or in a wired manner through a network such as a LAN (Local Area Network) or the Internet, and then the computer can receive the transferred program through a communication unit 708 and install the program in the built-in hard disk 705.

The computer includes a CPU (Central Processing Unit) 702 therein. The CPU 702 is connected to an input/output interface 710 via a bus 701, and when an instruction made as the user operates an input unit 707 configured with a keyboard, a mouse, a microphone, and the like is input through the input/output interface 710, the CPU 702 executes a program stored in a ROM (Read Only Memory) 703 in response to the instruction. Alternatively, the CPU 702 loads a program that is stored in the hard disk 705, a program that is transferred from a satellite or a network, received through the communication unit 708, and installed in the hard disk 705, or a program that is read from the removable recording medium 711 mounted in a drive 709 and installed in the hard disk 705 onto a RAM (Random Access Memory) 704, and executes the loaded program. Through this operation, the CPU 702 performs the process according to the above-described flowchart or the process performed by the configuration of the above-described block diagram. Further, for example, the CPU 702 causes the processing result to be output from an output unit 706 configured with an LCD (Liquid Crystal Display), a speaker, or the like through the input/output interface 710 or causes the processing result to be transmitted from the communication unit 708 or to be recorded in the hard disk 705 as necessary.

Here, in this disclosure, processing steps describing a program causing a computer to execute various kinds of processes need not be necessarily performed in time series according to the sequence described as a flowchart, and may include processes that are executed in parallel or individually (for example, a parallel processor a process based on an object).

Further, the program may be processed by a single computer or may be distributedly processed by a plurality of computers. The program may be transferred to a computer at a remote site and executed.

The embodiments of the present technology are not limited to the above embodiments, and various kinds of changes can be made within a range not departing from the gist of the present technology.

In other words, (a parity check matrix initial value table of) an LDPC code employed for digital broadcasting for mobile terminals described above or the like can be used for digital broadcasting for fixed terminals or the like.

Further, the present technology may have the following configurations.

<1>

A data-processing device, including:
an encoding unit that performs LDPC coding in which a code length is 16200 bits and a coding rate is 2/5 based on a parity check matrix of an LDPC code; and
an exchange unit that exchanges code bits of the LDPC code for symbol bits of a symbol corresponding to one of 16 signal points set in 16QAM,
wherein the exchange unit
in an exchange process of exchanging code bits of 4×2 bits grouped into 5 code bit groups according to an error probability to be allocated to symbol bits of 4×2 bits grouped into 2 symbol bit groups according to an error probability,
allocates 1 bit of code bits of a code bit group having the highest error probability to 1 bit of symbol bits of a symbol bit group having the highest error probability,
allocates 1 bit of code bits of a code bit group having the second highest error probability to 1 bit of symbol bits of a symbol bit group having the second highest error probability,
allocates 1 bit of code bits of a code bit group having the third highest error probability to 1 bit of symbol bits of a symbol bit group having the second highest error probability,
allocates 1 bit of code bits of a code bit group having the fourth highest error probability to 1 bit of symbol bits of a symbol bit group having the second highest error probability,
allocates 3 bits of code bits of a code bit group having the fifth highest error probability to 3 bits of symbol bits of a symbol bit group having the highest error probability, and
allocates 1 bit of code bits of a code bit group having the fifth highest error probability to 1 bit of symbol bits of a symbol bit group having the second highest error probability,
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represented for every 360 columns and is formed as follows:
13 88 136 188 398 794 855 918 954 1950 2762 2837 2847
4209 4342 5092 5334 5498 5731 5837 6150 6942 7127 7402
7936 8235 8307 8600 9001 9419 9442 9710
619 792 1002 1148 1528 1533 1925 2207 2766 3021 3267
3593 3947 4832 4873 5109 5488 5882 6079 6097 6276 6499
6584 6738 6795 7550 7723 7786 8732 9060 9270 9401 499
717 1551 1791 2535 3135 3582 3813 4047 4309 5126 5186
5219 5716 5977 6236 6406 6586 6591 7085 7199 7485 7726
7878 8027 8066 8425 8802 9309 9464 9553 9671 658 4058
7824 8512
3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763.

<2>

A data-processing device, including:
an encoding unit that performs LDPC coding in which a code length is 16200 bits and a coding rate is 2/5 based on a parity check matrix of an LDPC code; and
an exchange unit that exchanges code bits of the LDPC code for symbol bits of a symbol corresponding to one of 16 signal points set in 16QAM,
wherein the exchange unit exchanges
when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i,
a bit b0 for a bit y0,
a bit b1 for a bit y2,
a bit b2 for a bit y6,
a bit b3 for a bit y3,
a bit b4 for a bit y4,
a bit b5 for a bit y1,
a bit b6 for a bit y5, and
a bit b7 for a bit y7,
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represents for every 360 columns and is
13 88 136 188 398 794 855 918 954 1950 2762 2837 2847
4209 4342 509 2 5334 5498 5731 5837 6150 6942 7127 7402
7936 8235 8307 8600 9001 9419 9442 9710
619 792 1002 1148 1528 1533 1925 2207 2766 3021 3267
3593 3947 4832 4873 5109 5488 5882 6079 6097 6276 6499
6584 6738 6795 7550 7723 7786 8732 9060 9270 9401 499
717 1551 1791 2535 3135 3582 3813 4047 4309 5126 5186
5219 5716 5977 6236 6406 6586 6591 7085 7199 7485 7726
7878 8027 8066 8425 8802 9309 9464 9553 9671 658 4058
7824 8512
3245 4743 8117 9369
465 6559 8112 9461
975 2368 4444 6095
4128 5993 9182 9473
9 3822 5306 5320
4 8311 9571 9669
13 8122 8949 9656

3353 4449 5829 8053
7885 9118 9674
7575 9591 9670
431 8123 9271
4228 7587 9270
8847 9146 9556
11 5213 7763

<3>

A data-processing device, including:

an encoding unit that performs LDPC coding in which a code length is 16200 bits and a coding rate is 4/9 based on a parity check matrix of an LDPC code; and an exchange unit that exchanges code bits of the LDPC code for symbol bits of a symbol corresponding to one of 16 signal points set in 16QAM, wherein the exchange unit in an exchange process of exchanging code bits of 4×2 bits grouped into 5 code bit groups according to an error probability to be allocated to symbol bits of 4×2 bits grouped into 2 symbol bit groups according to an error probability, allocates a 1 bit of code bits of a code bit group having the highest error probability to a 1 bit of symbol bits of a symbol bit group having the highest error probability, allocates a 1 bit of code bits of a code bit group having the second highest error probability to a 1 bit of symbol bits of a symbol bit group having the second highest error probability, allocates a 1 bit of code bits of a code bit group having the third highest error probability to a 1 bit of symbol bits of a symbol bit group having the second highest error probability, allocates a 1 bit of code bits of a code bit group having the fourth highest error probability to a 1 bit of symbol bits of a symbol bit group having the second highest error probability, allocates a 1 bit of code bits of a code bit group having the fifth highest error probability to a 1 bit of symbol bits of a symbol bit group having the highest error probability, and allocates a 1 bit of code bits of a code bit group having the fifth highest error probability to a 1 bit of symbol bits of a symbol bit group having the second highest error probability, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is 567 1111 1821 2216 2255 2806 2860 3463 3697 3744 3839 3951 4212 4475 4884 5157 5679 6498 7043 7340 7403 7827 8233 8470 8699

18 24 1578 2569 3538 3714 4879 4922 5825 6417 7090 7285 7291 7451 7545 7758 7857 8180 8511 8687 8834 8877 8896 8923 8956

168 1839 1944 2745 2815 3874 4427 5366 6331 6396 6503 6512 7107 7608 7663 7742 8101 8223 8710 8722 8804 8825 8861 8909 8980

1 12 395 1035 1675 1946 2788 2823 3899 4097 4382 4741 4933 5267 7094 7503 7555 7929 8136 8377 8434 8668 8739 8756 8990

2635 4688 6722 6823
11 527 7081 7698
3930 4520 5817 7864
16 657 2009 8233
2965 5337 6600
521 6304 8963
1218 3326 6124
19 5853 8813

7129 8899 8962
3467 3632 8651
5895 6516 8973
2759 3422 8965
7205 8708 8961
4928 6921 8994
364 7206 8927
3918 4050 8435

<4>

A data-processing device, including:

an encoding unit that performs LDPC coding in which a code length is 16200 bits and a coding rate is 4/9 based on a parity check matrix of an LDPC code; and an exchange unit that exchanges code bits of the LDPC code for symbol bits of a symbol corresponding to one of 16 signal points set in 16QAM, wherein the exchange unit exchanges when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, a bit b0 for a bit y0,
a bit b1 for a bit y2,
a bit b2 for a bit y6,
a bit b3 for a bit y3,
a bit b4 for a bit y4,
a bit b5 for a bit y1,
a bit b6 for a bit y5, and
a bit b7 for a bit y7, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is 567 1111 1821 2216 2255 2806 2860 3463 3697 3744 3839 3951 4212 4475 4884 5157 5679 6498 7043 7340 7403 7827 8233 8470 8699

18 24 1578 2569 3538 3714 4879 4922 5825 6417 7090 7285 7291 7451 7545 7758 7857 8180 8511 8687 8834 8877 8896 8923 8956

168 1839 1944 2745 2815 3874 4427 5366 6331 6396 6503 6512 7107 7608 7663 7742 8101 8223 8710 8722 8804 8825 8861 8909 8980

1 12 395 1035 1675 1946 2788 2823 3899 4097 4382 4741 4933 5267 7094 7503 7555 7929 8136 8377 8434 8668 8739 8756 8990

2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994

364 7206 8927
3918 4050 8435

<5>

A data-processing device, including:

an encoding unit that performs LDPC coding in which a code length is 16200 bits and a coding rate is 8/15 based on a parity check matrix of an LDPC code; and an exchange unit that exchanges code bits of the LDPC code for symbol bits of a symbol corresponding to one of 16 signal points set in 16QAM;

wherein the exchange unit in an exchange process of exchanging code bits of 4×2 bits grouped into 5 code bit groups according to an error probability to be allocated to symbol bits of 4×2 bits grouped into 2 symbol bit groups according to an error probability, allocates a 1 bit of code bits of a code bit group having the highest error probability to a 1 bit of symbol bits of a symbol bit group having the highest error probability, allocates a 1 bit of code bits of a code bit group having the second highest error probability to a 1 bit of symbol bits of a symbol bit group having the second highest error probability, allocates a 1 bit of code bits of a code bit group having the third highest error probability to a 1 bit of symbol bits of a symbol bit group having the second highest error probability, allocates a 1 bit of code bits of a code bit group having the fourth highest error probability to a 1 bit of symbol bits of a symbol bit group having the highest error probability, allocates a 1 bit of code bits of a code bit group having the fifth highest error probability to a 1 bit of symbol bits of a symbol bit group having the highest error probability, and allocates a 1 bit of code bits of a code bit group having the fifth highest error probability to a 1 bit of symbol bits of a symbol bit group having the second highest error probability, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is 32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 664 0 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464

<6>

A data-processing device, including:

an encoding unit that performs LDPC coding in which a code length is 16200 bits and a coding rate is 8/15 based on a parity check matrix of an LDPC code; and an exchange unit that exchanges code bits of the LDPC code for symbol bits of a symbol corresponding to one of 16 signal points set in 16QAM, wherein the exchange unit exchanges when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, a bit b0 for a bit y0,
a bit b1 for a bit y2,
a bit b2 for a bit y6,
a bit b3 for a bit y3,
a bit b4 for a bit y4,
a bit b5 for a bit y1,
a bit b6 for a bit y5, and
a bit b7 for a bit y7, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is 32 384 430 591 1296 1976 1999 2137 2175 3638 4214 4304 4486 4662 4999 5174 5700 6969 7115 7138 7189

1788 1881 1910 2724 4504 4928 4973 5616 5686 5718 5846 6523 6893 6994 7074 7100 7277 7399 7476 7480 7537

2791 2824 2927 4196 4298 4800 4948 5361 5401 5688 5818 5862 5969 6029 6244 6645 6962 7203 7302 7454 7534

574 1461 1826 2056 2069 2387 2794 3349 3366 4951 5826 5834 5903 6640 6762 6786 6859 7043 7418 7431 7554

14 178 675 823 890 930 1209 1311 2898 4339 4600 5203 6485 6549 6970 7208 7218 7298 7454 7457 7462

4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464

<7>
A data-processing device, including:
an encoding unit that performs LDPC coding in which a code length is 16200 bits and a coding rate is 3/5 based on a parity check matrix of an LDPC code; and
an exchange unit that exchanges code bits of the LDPC code for symbol bits of a symbol corresponding to one of 16 signal points set in 16QAM;
wherein the exchange unit
in an exchange process of exchanging code bits of 4×2 bits grouped into 5 code bit groups according to an error probability to be allocated to symbol bits of 4×2 bits grouped into 2 symbol bit groups according to an error probability,
allocates a 1 bit of code bits of a code bit group having the highest error probability to a 1 bit of symbol bits of a symbol bit group having the highest error probability,
allocates a 1 bit of code bits of a code bit group having the second highest error probability to a 1 bit of symbol bits of a symbol bit group having the second highest error probability,
allocates a 1 bit of code bits of a code bit group having the third highest error probability to a 1 bit of symbol bits of a symbol bit group having the second highest error probability,
allocates a 1 bit of code bits of a code bit group having the fourth highest error probability to a 1 bit of symbol bits of a symbol bit group having the highest error probability,
allocates a 1 bit of code bits of a code bit group having the fifth highest error probability to a 1 bit of symbol bits of a symbol bit group having the highest error probability, and
allocates a 1 bit of code bits of a code bit group having the fifth highest error probability to a 1 bit of symbol bits of a symbol bit group having the second highest error probability,
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represents for every 360 columns and is
41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800
3103 4357 4685
1163 5127 6435
164 3202 3934
36 230 3514
<8>
A data-processing device, including:
an encoding unit that performs LDPC coding in which a code length is 16200 bits and a coding rate is 3/5 based on a parity check matrix of an LDPC code; and
an exchange unit that exchanges code bits of the LDPC code for symbol bits of a symbol corresponding to one of 16 signal points set in 16QAM,
wherein the exchange unit exchanges
when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i,
a bit b0 for a bit y0,
a bit b1 for a bit y2,
a bit b2 for a bit y6,
a bit b3 for a bit y3,
a bit b4 for a bit y4,
a bit b5 for a bit y1,
a bit b6 for a bit y5, and
a bit b7 for a bit y7,
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represents for every 360 columns and is
41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477

1286 4462 6159
3356 4359 4805
13 4416 4800
3103 4357 4685
1163 5127 6435
164 3202 3934
36 230 3514

<9>

A data-processing device, including:

an encoding unit that performs LDPC coding in which a code length is 16200 bits and a coding rate is 2/3 based on a parity check matrix of an LDPC code; and an exchange unit that exchanges code bits of the LDPC code for symbol bits of a symbol corresponding to one of 16 signal points set in 16QAM, wherein the exchange unit in an exchange process of exchanging code bits of 4×2 bits grouped into 6 code bit groups according to an error probability to be allocated to symbol bits of 4×2 bits grouped into 2 symbol bit groups according to an error probability, allocates a 1 bit of code bits of a code bit group having the highest error probability to a 1 bit of symbol bits of a symbol bit group having the highest error probability, allocates a 1 bit of code bits of a code bit group having the second highest error probability to a 1 bit of symbol bits of a symbol bit group having the second highest error probability, allocates a 1 bit of code bits of a code bit group having the third highest error probability to a 1 bit of symbol bits of a symbol bit group having the second highest error probability, allocates a 1 bit of code bits of a code bit group having the fourth highest error probability to a 1 bit of symbol bits of a symbol bit group having the highest error probability, allocates a 1 bit of code bits of a code bit group having the fifth highest error probability to a 1 bit of symbol bits of a symbol bit group having the highest error probability, allocates a 1 bit of code bits of a code bit group having the sixth highest error probability to a 1 bit of symbol bits of a symbol bit group having the highest error probability, and allocates a 1 bit of code bits of a code bit group having the sixth highest error probability to a 1 bit of symbol bits of a symbol bit group having the second highest error probability, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is 76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352

9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742

<10>

A data-processing device, including:

an encoding unit that performs LDPC coding in which a code length is 16200 bits and a coding rate is 2/3 based on a parity check matrix of an LDPC code; and an exchange unit that exchanges code bits of the LDPC code for symbol bits of a symbol corresponding to one of 16 signal points set in 16QAM, wherein the exchange unit exchanges when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, a bit b0 for a bit y0,
a bit b1 for a bit y2,
a bit b2 for a bit y6,
a bit b3 for a bit y3,
a bit b4 for a bit y4,
a bit b5 for a bit y1,
a bit b6 for a bit y5, and
a bit b7 for a bit y7, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is 76 545 1005 1029 1390 1970 2525 2971 3448 3845 4088 4114 4163 4373 4640 4705 4970 5094 14 463 600 1676 2239 2319 2326 2815 2887 4278 44 57 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352

9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742

<11>

A data-processing method, including:

an encoding step of performing LDPC coding in which a code length is 16200 bits and a coding rate is 2/5 based on a parity check matrix of an LDPC code; and an exchange step of exchanging code bits of the LDPC code for symbol bits of a symbol corresponding to one of 16 signal points set in 16QAM, wherein the exchange step includes in an exchange process of exchanging code bits of 4×2 bits grouped into 5 code bit groups according to an error probability to be allocated to symbol bits of 4×2 bits grouped into 2 symbol bit groups according to an error probability, allocating a 1 bit of code bits of a code bit group having the highest error probability to a 1 bit of symbol bits of a symbol bit group having the highest error probability, allocating a 1 bit of code bits of a code bit group having the second highest error probability to a 1 bit of symbol bits of a symbol bit group having the second highest error probability, allocating a 1 bit of code bits of a code bit group having the third highest error probability to a 1 bit of symbol bits of a symbol bit group having the second highest error probability, allocating a 1 bit of code bits of a code bit group having the fourth highest error probability to a 1 bit of symbol bits of a symbol bit group having the second highest error probability, allocating a 1 bit of code bits of a code bit group having the fifth highest error probability to a 1 bit of symbol bits of a symbol bit group having the highest error probability, and allocating a 1 bit of code bits of a code bit group having the fifth highest error probability to a 1 bit of symbol bits of a symbol bit group having the second highest error probability, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is 13 88 136 188 398 794 855 918 954 1950 2762 2837 2847 4209 4342 5092 5334 5498 5731 5837 6150 6942 7127 7402 7936 8235 8307 8600 9001 9419 9442 9710

619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401 499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671 658 4058 7824 8512

3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763

<12>

A data-processing method, including:

an encoding step of performing LDPC coding in which a code length is 16200 bits and a coding rate is 2/5 based on a parity check matrix of an LDPC code; and an exchange step of exchanging code bits of the LDPC code for symbol bits of a symbol corresponding to one of 16 signal points set in 16QAM, wherein the exchange step includes exchanging when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#1, and a (#i+1)-th bit from a most significant bit of the symbol bits of 8 bits of the 2 symbols is represented by a bit y#i, a bit b0 for a bit y0,
a bit b1 for a bit y2,
a bit b2 for a bit y6,
a bit b3 for a bit y3,
a bit b4 for a bit y4,
a bit b5 for a bit y1,
a bit b6 for a bit y5, and
a bit b7 for a bit y7, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is formed as follows:

13 88 136 188 398 794 855 918 954 1950 2762 2837 2847 4209 4342 5092 5334 5498 5731 5837 6150 6942 7127 7402 7936 8235 8307 8600 9001 9419 9442 9710

619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401 499 717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671 658 4058 7824 8512

3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670

431 8123 9271
4228 7587 9270
8847 9146 9556
11 5213 7763.

<13>

A data-processing method, including:

an encoding step of performing LDPC coding in which a code length is 16200 bits and a coding rate is 4/9 based on a parity check matrix of an LDPC code; and an exchange step of exchanging code bits of the LDPC code for symbol bits of a symbol corresponding to one of 16 signal points set in 16QAM, wherein the exchange step includes in an exchange process of exchanging code bits of 4×2 bits grouped into 5 code bit groups according to an error probability to be allocated to symbol bits of 4×2 bits grouped into 2 symbol bit groups according to an error probability, allocating 1 bit of code bits of a code bit group having the highest error probability to 1 bit of symbol bits of a symbol bit group having the highest error probability, allocating 1 bit of code bits of a code bit group having the second highest error probability to 1 bit of symbol bits of a symbol bit group having the second highest error probability, allocating 1 bit of code bits of a code bit group having the third highest error probability to 1 bit of symbol bits of a symbol bit group having the second highest error probability, allocating 1 bit of code bits of a code bit group having the fourth highest error probability to 1 bit of symbol bits of a symbol bit group having the second highest error probability, allocating 3 bits of code bits of a code bit group having the fifth highest error probability to 3 bits of symbol bits of a symbol bit group having the highest error probability, and allocating 1 bit of code bits of a code bit group having the fifth highest error probability to 1 bit of symbol bits of a symbol bit group having the second highest error probability, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is formed as follows:

567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435.

<14>

A data-processing method, including:

an encoding step of performing LDPC coding in which a code length is 16200 bits and a coding rate is 4/9 based on a parity check matrix of an LDPC code; and an exchange step of exchanging code bits of the LDPC code for symbol bits of a symbol corresponding to one of 16 signal points set in 16QAM, wherein the exchange step includes exchanging when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, a bit b0 for a bit y0,
a bit b1 for a bit y2,
a bit b2 for a bit y6,
a bit b3 for a bit y3,
a bit b4 for a bit y4,
a bit b5 for a bit y1,
a bit b6 for a bit y5, and
a bit b7 for a bit y7, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is formed as follows:

567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965
7205 8708 8961
4928 6921 8994
364 7206 8927
3918 4050 8435.

<15>
A data-processing method, including:
an encoding step of performing LDPC coding in which a code length is 16200 bits and a coding rate is 8/15 based on a parity check matrix of an LDPC code; and
an exchange step of exchanging code bits of the LDPC code for symbol bits of a symbol corresponding to one of 16 signal points set in 16QAM,
wherein the exchange step includes
in an exchange process of exchanging code bits of 4×2 bits grouped into 5 code bit groups according to an error probability to be allocated to symbol bits of 4×2 bits grouped into 2 symbol bit groups according to an error probability,
allocating 1 bit of code bits of a code bit group having the highest error probability to 1 bit of symbol bits of a symbol bit group having the highest error probability,
allocating 1 bit of code bits of a code bit group having the second highest error probability to 1 bit of symbol bits of a symbol bit group having the second highest error probability,
allocating 2 bits of code bits of a code bit group having the third highest error probability to 2 bits of symbol bits of a symbol bit group having the second highest error probability,
allocating 1 bit of code bits of a code bit group having the fourth highest error probability to 1 bit of symbol bits of a symbol bit group having the highest error probability,
allocating 2 bits of code bits of a code bit group having the fifth highest error probability to 2 bits of symbol bits of a symbol bit group having the highest error probability, and
allocating 1 bit of code bits of a code bit group having the fifth highest error probability to 1 bit of symbol bits of a symbol bit group having the second highest error probability,
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represents for every 360 columns and is formed as follows:
32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.
<16>
A data-processing method, including:
an encoding step of performing LDPC coding in which a code length is 16200 bits and a coding rate is 8/15 based on a parity check matrix of an LDPC code; and
an exchange step of exchanging code bits of the LDPC code for symbol bits of a symbol corresponding to one of 16 signal points set in 16QAM,
wherein the exchange step includes exchanging
when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i,
a bit b0 for a bit y0,
a bit b1 for a bit y2,
a bit b2 for a bit y6,
a bit b3 for a bit y3,
a bit b4 for a bit y4,
a bit b5 for a bit y1,
a bit b6 for a bit y5, and
a bit b7 for a bit y7,
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represents for every 360 columns and is formed as follows:
32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

<17>

A data-processing method, including:

an encoding step of performing LDPC coding in which a code length is 16200 bits and a coding rate is 3/5 based on a parity check matrix of an LDPC code; and an exchange step of exchanging code bits of the LDPC code for symbol bits of a symbol corresponding to one of 16 signal points set in 16QAM, wherein the exchange step includes in an exchange process of exchanging code bits of 4×2 bits grouped into 5 code bit groups according to an error probability to be allocated to symbol bits of 4×2 bits grouped into 2 symbol bit groups according to an error probability, allocating 1 bit of code bits of a code bit group having the highest error probability to 1 bit of symbol bits of a symbol bit group having the highest error probability, allocating 1 bit of code bits of a code bit group having the second highest error probability to 1 bit of symbol bits of a symbol bit group having the second highest error probability, allocating 2 bits of code bits of a code bit group having the third highest error probability to 2 bits of symbol bits of a symbol bit group having the second highest error probability, allocating 1 bit of code bits of a code bit group having the fourth highest error probability to 1 bit of symbol bits of a symbol bit group having the highest error probability, allocating 2 bits of code bits of a code bit group having the fifth highest error probability to 2 bits of symbol bits of a symbol bit group having the highest error probability, and allocating 1 bit of code bits of a code bit group having the fifth highest error probability to 1 bit of symbol bits of a symbol bit group having the second highest error probability, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is formed as follows:

41 588 1367 1831 1964 3424 3732 4590 4677 5455 5542 5627 6415

904 1706 2800 3732 3783 4217 4507 4999 6010 6218 6282 6363 6456

356 1871 2216 2629 2994 3719 5194 5585 6012 6273 6393 6457 6474

1676 2419 2604 3939 4186 5080 5400 5552 5971 6023 6324 6442 6445

3 770 2770 3457 3815 4253 4512 4671 5390 5393 5818 5978 6441

491 548 1033 1042 1187 3816 4378 4956 5049 5649 5684 6177 6475

1489 2817 3377 3716 4229 4512 4664 5065 5257 5477 5550 5950 6447

1546 2444 4684

15 3546 6220

1427 6199 6430

103 3629 5526

1330 6150 6255

363 5660 6422

4069 5586 5885

722 820 2823

204 2820 6181

3710 6077 6106

2655 5428 6264

1850 5989 6245

2701 5315 6477

1286 4462 6159

3356 4359 4805

13 4416 4800

3103 4357 4685

1163 5127 6435

164 3202 3934

36 230 3514.

<18>

A data-processing method, including:

an encoding step of performing LDPC coding in which a code length is 16200 bits and a coding rate is 3/5 based on a parity check matrix of an LDPC code; and an exchange step of exchanging code bits of the LDPC code for symbol bits of a symbol corresponding to one of 16 signal points set in 16QAM, wherein the exchange step includes exchanging when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, a bit b0 for a bit y0, a bit b1 for a bit y2, a bit b2 for a bit y6, a bit b3 for a bit y3, a bit b4 for a bit y4, a bit b5 for a bit y1, a bit b6 for a bit y5, and a bit b7 for a bit y7, the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represents for every 360 columns and is formed as follows:

41 588 1367 1831 1964 3424 3732 4590 4677 5455 5542 5627 6415

904 1706 2800 3732 3783 4217 4507 4999 6010 6218 6282 6363 6456

356 1871 2216 2629 2994 3719 5194 5585 6012 6273 6393 6457 6474

1676 2419 2604 3939 4186 5080 5400 5552 5971 6023 6324 6442 6445

3 770 2770 3457 3815 4253 4512 4671 5390 5393 5818 5978 6441

491 548 1033 1042 1187 3816 4378 4956 5049 5649 5684 6177 6475

1489 2817 3377 3716 4229 4512 4664 5065 5257 5477 5550 5950 6447

1546 2444 4684

15 3546 6220

1427 6199 6430

103 3629 5526

1330 6150 6255

363 5660 6422

4069 5586 5885

722 820 2823

204 2820 6181

3710 6077 6106

2655 5428 6264

1850 5989 6245

2701 5315 6477

1286 4462 6159
3356 4359 4805
13 4416 4800
3103 4357 4685
1163 5127 6435
164 3202 3934
36 230 3514.
<19>
A data-processing method, including:
an encoding step of performing LDPC coding in which a code length is 16200 bits and a coding rate is 2/3 based on a parity check matrix of an LDPC code; and
an exchange step of exchanging code bits of the LDPC code for symbol bits of a symbol corresponding to one of 16 signal points set in 16QAM,
wherein the exchange step includes
in an exchange process of exchanging code bits of 4×2 bits grouped into 6 code bit groups according to an error probability to be allocated to symbol bits of 4×2 bits grouped into 2 symbol bit groups according to an error probability,
allocating 1 bit of code bits of a code bit group having the highest error probability to 1 bit of symbol bits of a symbol bit group having the highest error probability,
allocating 2 bits of code bits of a code bit group having the second highest error probability to 2 bits of symbol bits of a symbol bit group having the second highest error probability,
allocating 1 bit of code bits of a code bit group having the third highest error probability to 1 bit of symbol bits of a symbol bit group having the second highest error probability,
allocating 1 bit of code bits of a code bit group having the fourth highest error probability to 1 bit of symbol bits of a symbol bit group having the highest error probability,
allocating 1 bit of code bits of a code bit group having the fifth highest error probability to 1 bit of symbol bits of a symbol bit group having the highest error probability,
allocating 1 bit of code bits of a code bit group having the sixth highest error probability to 1 bit of symbol bits of a symbol bit group having the highest error probability, and
allocating 1 bit of code bits of a code bit group having the sixth highest error probability to 1 bit of symbol bits of a symbol bit group having the second highest error probability,
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represents for every 360 columns and is formed as follows:
76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.
<20>
A data-processing method, including:
an encoding step of performing LDPC coding in which a code length is 16200 bits and a coding rate is 2/3 based on a parity check matrix of an LDPC code; and
an exchange step of exchanging code bits of the LDPC code for symbol bits of a symbol corresponding to one of 16 signal points set in 16QAM,
wherein the exchange step includes exchanging
when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i,
a bit b0 for a bit y0,
a bit b1 for a bit y2,
a bit b2 for a bit y6,
a bit b3 for a bit y3,
a bit b4 for a bit y4,
a bit b5 for a bit y1,
a bit b6 for a bit y5, and
a bit b7 for a bit y7,
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represents for every 360 columns and is formed as follows:
76 545 1005 1029 1390 1970 2525 2971 3448 3845 4088 4114 4163 4373 4640 4705 4970 5094 14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352

9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742.

<21>

A data-processing device, including:
a reverse exchange unit that exchanges symbol bits of a symbol corresponding to one of 16 signal points set in 16QAM for code bits of an LDPC code in which a code length is 16200 bits and a coding rate is 2/5; and
a decoding unit that decodes the LDPC code exchanged by the reverse exchange unit based on a parity check matrix of the LDPC code,
wherein the reverse exchange unit exchanges
when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i,
a bit y0 for a bit b0,
a bit y2 for a bit b1,
a bit y6 for a bit b2,
a bit y3 for a bit b3,
a bit y4 for a bit b4,
a bit y1 for a bit b5,
a bit y5 for a bit b6,
a bit y7 for a bit b7,
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represents for every 360 columns and is formed as follows:
13 88 136 188 398 794 855 918 954 1950 2762 2837 2847 4209 4342 5092 5334 5498 5731 5837 6150 6942 7127 7402 7936 8235 8307 8600 9001 9419 9442 9710
619 792 1002 1148 1528 1533 1925 2207 2766 3021 3267 3593 3947 4832 4873 5109 5488 5882 6079 6097 6276 6499 6584 6738 6795 7550 7723 7786 8732 9060 9270 9401 499
717 1551 1791 2535 3135 3582 3813 4047 4309 5126 5186 5219 5716 5977 6236 6406 6586 6591 7085 7199 7485 7726 7878 8027 8066 8425 8802 9309 9464 9553 9671 658 4058 7824 8512
3245 4743 8117 9369
465 6559 8112 9461
975 2368 4444 6095
4128 5993 9182 9473
9 3822 5306 5320
4 8311 9571 9669
13 8122 8949 9656
3353 4449 5829 8053
7885 9118 9674
7575 9591 9670
431 8123 9271
4228 7587 9270
8847 9146 9556
11 5213 7763.

<22>

A data-processing device, including:
a reverse exchange unit that exchanges symbol bits of a symbol corresponding to one of 16 signal points set in 16QAM for code bits of an LDPC code in which a code length is 16200 bits and a coding rate is 4/9; and
a decoding unit that decodes the LDPC code exchanged by the reverse exchange unit based on a parity check matrix of the LDPC code,
wherein when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, the reverse exchange unit exchanges
a bit y0 for a bit b0,
a bit y2 for a bit b1,
a bit y6 for a bit b2,
a bit y3 for a bit b3,
a bit y4 for a bit b4,
a bit y1 for a bit b5,
a bit y5 for a bit b6, and
a bit y7 for a bit b7.
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represented for every 360 columns and is formed as follows:
567 1111 1821 2216 2255 2806 2860 3463 3697 3744 3839 3951 4212 4475 4884 5157 5679 6498 7043 7340 7403 7827 8233 8470 8699
18 24 1578 2569 3538 3714 4879 4922 5825 6417 7090 7285 7291 7451 7545 7758 7857 8180 8511 8687 8834 8877 8896 8923 8956
168 1839 1944 2745 2815 3874 4427 5366 6331 6396 6503 6512 7107 7608 7663 7742 8101 8223 8710 8722 8804 8825 8861 8909 8980
1 12 395 1035 1675 1946 2788 2823 3899 4097 4382 4741 4933 5267 7094 7503 7555 7929 8136 8377 8434 8668 8739 8756 8990
2635 4688 6722 6823
11 527 7081 7698
3930 4520 5817 7864
16 657 2009 8233
2965 5337 6600
521 6304 8963
1218 3326 6124
19 5853 8813
7129 8899 8962
3467 3632 8651
5895 6516 8973
2759 3422 8965

7205 8708 8961
4928 6921 8994
364 7206 8927
3918 4050 8435.

<23>

A data-processing device, including:

a reverse exchange unit that exchanges symbol bits of a symbol corresponding to one of 16 signal points set in 16QAM for code bits of an LDPC code in which a code length is 16200 bits and a coding rate is 8/15; and a decoding unit that decodes the LDPC code exchanged by the reverse exchange unit based on a parity check matrix of the LDPC code, wherein when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, the reverse exchange unit exchanges a bit y0 for a bit b0,
a bit y2 for a bit b1,
a bit y6 for a bit b2,
a bit y3 for a bit b3,
a bit y4 for a bit b4,
a bit y1 for a bit b5,
a bit y5 for a bit b6, and
a bit y7 for a bit b7 the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represented for every 360 columns and is formed as follows:

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

<24>

A data-processing device, including:

a reverse exchange unit that exchanges symbol bits of a symbol corresponding to one of 16 signal points set in 16QAM for code bits of an LDPC code in which a code length is 16200 bits and a coding rate is 3/5; and a decoding unit that decodes the LDPC code exchanged by the reverse exchange unit based on a parity check matrix of the LDPC code, wherein when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, the reverse exchange unit exchanges a bit y0 for a bit b0,
a bit y2 for a bit b1,
a bit y6 for a bit b2,
a bit y3 for a bit b3,
a bit y4 for a bit b4,
a bit y1 for a bit b5,
a bit y5 for a bit b6, and
a bit y7 for a bit b7 the LDPC code includes an information bit and a parity bit, the parity check matrix includes an information matrix portion corresponding to the information bit and a parity matrix portion corresponding to the parity bit, the information matrix portion is represented by a parity check matrix initial value table, and the parity check matrix initial value table is a table in which a position of 1 of an element of the information matrix portion is represented for every 360 columns and is formed as follows:

41 588 1367 1831 1964 3424 3732 4590 4677 5455 5542 5627 6415
904 1706 2800 3732 3783 4217 4507 4999 6010 6218 6282 6363 6456
356 1871 2216 2629 2994 3719 5194 5585 6012 6273 6393 6457 6474
1676 2419 2604 3939 4186 5080 5400 5552 5971 6023 6324 6442 6445
3 770 2770 3457 3815 4253 4512 4671 5390 5393 5818 5978 6441
491 548 1033 1042 1187 3816 4378 4956 5049 5649 5684 6177 6475
1489 2817 3377 3716 4229 4512 4664 5065 5257 5477 5550 5950 6447
1546 2444 4684
15 3546 6220
1427 6199 6430
103 3629 5526
1330 6150 6255
363 5660 6422
4069 5586 5885
722 820 2823
204 2820 6181
3710 6077 6106
2655 5428 6264
1850 5989 6245
2701 5315 6477
1286 4462 6159
3356 4359 4805
13 4416 4800

3103 4357 4685
1163 5127 6435
164 3202 3934
36 230 3514.
<25>
A data-processing device, including:
a reverse exchange unit that exchanges symbol bits of a symbol corresponding to one of 16 signal points set in 16QAM for code bits of an LDPC code in which a code length is 16200 bits and a coding rate is 4/15; and
a decoding unit that decodes the LDPC code exchanged by the reverse exchange unit based on a parity check matrix of the LDPC code,
wherein when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#1, and a (#i+1)-th bit from a most significant bit of the symbol bits of 8 bits of the 2 symbols is represented by a bit y#i, the reverse exchange unit exchanges
 a bit y0 for a bit b0,
 a bit y2 for a bit b1,
 a bit y6 for a bit b2,
 a bit y3 for a bit b3,
 a bit y4 for a bit b4,
 a bit y1 for a bit b5,
 a bit y5 for a bit b6, and
 a bit y7 for a bit b7
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represented for every 360 columns and is formed as follows:
 76 545 1005 1029 1390 1970 2525 2971 3448 3845 4088 4114 4163 4373 4640 4705 4970 5094
 14 463 600 1676 2239 2319 2326 2815 2887 4278 4457 4493 4597 4918 4989 5038 5261 5384
 451 632 829 1006 1530 1723 2205 2587 2801 3041 3849 4382 4595 4727 5006 5156 5224 5286
 211 265 1293 1777 1926 2214 2909 2957 3178 3278 3771 4547 4563 4737 4879 5068 5232 5344
 6 2901 3925 5384
 2858 4152 5006 5202
 9 1232 2063 2768
 7 11 2781 3871
 12 2161 2820 4078
 3 3510 4668 5323
 253 411 3215 5241
 3919 4789 5040 5302
 12 5113 5256 5352
 9 1461 4004 5241
 1688 3585 4480 5394
 8 2127 3469 4360
 2827 4049 5084 5379
 1770 3331 5315 5386
 1885 2817 4900 5088
 2568 3854 4660
 1604 3565 5373
 2317 4636 5156
 2480 2816 4094
 14 4518 4826
 127 1192 3872
 93 2282 3663
 2962 5085 5314
 2078 4277 5089
 9 5280 5292
 50 2847 4742.

REFERENCE SIGNS LIST

11 Transmitting device
12 Receiving device
23 Parity interleaver
24 Column twist interleaver
25 Demultiplexer
31 Memory
32 Exchange unit
54 Multiplexer
55 Column twist interleaver
111 Mode adaptation/multiplexer
112 Padder
113 BB scrambler
114 BCH encoder
115 LDPC encoder
116 Bit interleaver
117 QAM encoder
118 Time interleaver
119 MISO/MIMO encoder
120 Frequency interleaver
121 BCH encoder
122 LDPC encoder
123 QAM encoder
124 Frequency interleaver
131 Frame builder/resource allocation unit
132 OFDM generation unit
151 OFDM processing unit
152 Frame management unit
153 Frequency deinterleaver
154 QAM decoder
155 LDPC decoder
156 BCH decoder
161 Frequency deinterleaver
162 MISO/MIMO decoder
163 Time deinterleaver
164 QAM decoder
165 Bit deinterleaver
166 LDPC decoder
167 BCH decoder
168 BB descrambler
169 Null deletion unit
170 Demultiplexer
300 Memory for branch data storage
301 Selector
302 Check node calculation unit
303 Cyclic shift circuit
304 Memory for branch data storage
305 Selector
306 Memory for received data
307 Variable node calculation unit
308 Cyclic shift circuit
309 Decoded word calculation unit
310 Received data sorting unit
311 Decoded data sorting unit
601 Coding processing unit
602 Storing unit
611 Coding rate setting unit
612 Initial value table reading unit
613 Parity check matrix generating unit 614 Information bit reading unit
615 Coding parity arithmetic unit
616 Control unit
701 Bus
702 CPU
703 ROM
704 RAM
705 Hard disk
706 Output unit
707 Input unit
708 Communication unit
709 Drive
710 Input/output interface
711 Removable recording medium
1001 Reverse exchange unit
1002 Memory
1011 Parity deinterleaver
1101 Acquiring unit
1101 Transmission path decoding processing unit
1103 Information source decoding processing unit
1111 Output unit
1121 Recording unit

The invention claimed is:
1. A data-processing device, comprising:
an encoding unit that performs LDPC coding in which a code length is 16200 bits and a coding rate is 7/15 based on a parity check matrix of an LDPC code; and
an exchange unit that exchanges code bits of the LDPC code for symbol bits of a symbol corresponding to one of 16 signal points set in 16QAM,
wherein, in an exchange process of exchanging code bits of 4×2 bits grouped into 5 code bit groups according to an error probability to be allocated to symbol bits of 4×2 bits grouped into 2 symbol bit groups according to an error probability, the exchange unit
allocates 1 bit of code bits of a code bit group having the highest error probability to 1 bit of symbol bits of a symbol bit group having the highest error probability,
allocates 1 bit of code bits of a code bit group having the second highest error probability to 1 bit of symbol bits of a symbol bit group having the second highest error probability,
allocates 1 bit of code bits of a code bit group having the third highest error probability to 1 bit of symbol bits of a symbol bit group having the second highest error probability,
allocates 1 bit of code bits of a code bit group having the fourth highest error probability to 1 bit of symbol bits of a symbol bit group having the second highest error probability,
allocates 3 bits of code bits of a code bit group having the fifth highest error probability to 3 bits of symbol bits of a symbol bit group having the highest error probability, and
allocates 1 bit of code bits of a code bit group having the fifth highest error probability to 1 bit of symbol bits of a symbol bit group having the second highest error probability,
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represented for every 360 columns and is formed as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

2. A data-processing device, comprising:
an encoding unit that performs LDPC coding in which a code length is 16200 bits and a coding rate is 7/15 based on a parity check matrix of an LDPC code; and
an exchange unit that exchanges code bits of the LDPC code for symbol bits of a symbol corresponding to one of 16 signal points set in 16 QAM,
wherein when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, the exchange unit exchanges
a bit b0 for a bit y0,
a bit b1 for a bit y2,
a bit b2 for a bit y6,
a bit b3 for a bit y3,
a bit b4 for a bit y4,
a bit b5 for a bit y1,
a bit b6 for a bit y5, and
a bit b7 for a bit y7,
the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represented for every 360 columns and is formed as follows:

3 137 314 327 983 1597 2028 3043 3217 4109 6020 6178
 6535 6560 7146 7180 7408 7790 7893 8123 8313 8526
 8616 8638
356 1197 1208 1839 1903 2712 3088 3537 4091 4301 4919
 5068 6025 6195 6324 6378 6686 6829 7558 7745 8042
 8382 8587 8602
18 187 1115 1417 1463 2300 2328 3502 3805 4677 4827
 5551 5968 6394 6412 6753 7169 7524 7695 7976 8069
 8118 8522 8582
714 2713 2726 2964 3055 3220 3334 3459 5557 5765 5841
 6290 6419 6573 6856 7786 7937 8156 8286 8327 8384
 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

3. The data-processing device according to claim 2, further comprising,
 a parity interleaving unit that interleaves only a parity bit among the code bits,
 wherein the exchange unit exchanges bits interleaved by the parity interleaving unit.

4. The data-processing device according to claim 2, further comprising,
 a column twist interleaving unit that performs column twist interleaving such that the code bits are recorded to be shifted in a column direction,
 wherein the exchange unit exchanges bits that have been subjected to the column twist interleaving.

5. The data-processing device according to claim 2, wherein a $(2+360\times(i-1))$-th column of the parity check matrix is a column in which a $(1+360\times(i-1))$-th column represented by the parity check matrix initial value table is cyclic shifted downward by q ($=M/360$) (i is a row number of the parity check matrix initial table, and M is a parity length).

6. The data-processing device according to claim 5, wherein q is 33.

7. The data-processing device according to claim 2, wherein the exchange unit exchanges code bits of 8 bits that are stored in a column direction and read in a row direction.

8. A data-processing method, comprising:
 an encoding step of performing LDPC coding in which a code length is 16200 bits and a coding rate is 7/15 based on a parity check matrix of an LDPC code; and
 an exchange step of exchanging code bits of the LDPC code for symbol bits of a symbol corresponding to one of 16 signal points set in 16 QAM,
 wherein, in an exchange process of exchanging code bits of 4×2 bits grouped into 5 code bit groups according to an error probability to be allocated to symbol bits of 4×2 bits grouped into 2 symbol bit groups according to an error probability, the exchange step includes
 allocating 1 bit of code bits of a code bit group having the highest error probability to 1 bit of symbol bits of a symbol bit group having the highest error probability,
 allocates 1 bit of code bits of a code bit group having the second highest error probability to 1 bit of symbol bits of a symbol bit group having the second highest error probability,
 allocates 1 bit of code bits of a code bit group having the third highest error probability to 1 bit of symbol bits of a symbol bit group having the second highest error probability,
 allocates 1 bit of code bits of a code bit group having the fourth highest error probability to 1 bit of symbol bits of a symbol bit group having the second highest error probability,
 allocates 3 bits of code bits of a code bit group having the fifth highest error probability to 3 bits of symbol bits of a symbol bit group having the highest error probability, and
 allocates 1 bit of code bits of a code bit group having the fifth highest error probability to 1 bit of symbol bits of a symbol bit group having the second highest error probability,
 the LDPC code includes an information bit and a parity bit,
 the parity check matrix includes an information matrix portion corresponding to the information bit and a parity matrix portion corresponding to the parity bit,
 the information matrix portion is represented by a parity check matrix initial value table, and
 the parity check matrix initial value table is a table in which a position of 1 of an element of the information matrix portion is represented for every 360 columns and is formed as follows:
3 137 314 327 983 1597 2028 3043 3217 4109 6020 6178
 6535 6560 7146 7180 7408 7790 7893 8123 8313 8526
 8616 8638
356 1197 1208 1839 1903 2712 3088 3537 4091 4301 4919
 5068 6025 6195 6324 6378 6686 6829 7558 7745 8042
 8382 8587 8602
18 187 1115 1417 1463 2300 2328 3502 3805 4677 4827
 5551 5968 6394 6412 6753 7169 7524 7695 7976 8069
 8118 8522 8582
714 2713 2726 2964 3055 3220 3334 3459 5557 5765 5841
 6290 6419 6573 6856 7786 7937 8156 8286 8327 8384
 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

9. A data-processing method, comprising:
 an encoding step of performing LDPC coding in which a code length is 16200 bits and a coding rate is 7/15 based on a parity check matrix of an LDPC code; and an exchange step of exchanging code bits of the LDPC code for symbol bits of a symbol corresponding to one of 16 signal points set in 16 QAM, wherein when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, the exchange step includes exchanging a bit b0 for a bit y0,
a bit b1 for a bit y2,
a bit b2 for a bit y6,
a bit b3 for a bit y3,
a bit b4 for a bit y4,
a bit b5 for a bit y1,
a bit b6 for a bit y5, and
a bit b7 for a bit y7, the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represented for every 360 columns and is formed as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

10. A data-processing device, comprising:
a reverse exchange unit that exchanges symbol bits of a symbol corresponding to one of 16 signal points set in 16 QAM for code bits of an LDPC code in which a code length is 16200 bits and a coding rate is 7/15; and
a decoding unit that decodes the LDPC code exchanged by the reverse exchange unit based on a parity check matrix of the LDPC code, wherein when code bits of 8 bits that are stored in 8 storing units having a storage capacity of 16200/8 bits and each of which is read from each storing unit are allocated to 2 consecutive symbols, a (#i+1)-th bit from a most significant bit of the code bits of 8 bits is represented by a bit b#i, and a (#i+1)-th bit from a most significant bit of the symbol bits of 8 bits of the 2 symbols is represented by a bit y#i, the reverse exchange unit exchanges a bit y0 for a bit b0,
a bit y2 for a bit b1,
a bit y6 for a bit b2,
a bit y3 for a bit b3,
a bit y4 for a bit b4,
a bit y1 for a bit b5,
a bit y5 for a bit b6, and
a bit y7 for a bit b7, the LDPC code includes an information bit and a parity bit,
the parity check matrix includes an information matrix portion corresponding to the information bit and a parity matrix portion corresponding to the parity bit,
the information matrix portion is represented by a parity check matrix initial value table, and
the parity check matrix initial value table is a table in which a position of 1 of an element of the information matrix portion is represented for every 360 columns and is formed as follows:

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

* * * * *